(12) United States Patent
Brindle et al.

(10) Patent No.: US 11,011,633 B2
(45) Date of Patent: *May 18, 2021

(54) METHOD AND APPARATUS FOR USE IN IMPROVING LINEARITY OF MOSFETS USING AN ACCUMULATED CHARGE SINK-HARMONIC WRINKLE REDUCTION

(71) Applicant: pSemi Corporation, San Diego, CA (US)

(72) Inventors: Christopher N. Brindle, Poway, CA (US); Jie Deng, South Burlington, VT (US); Alper Genc, San Diego, CA (US); Chieh-Kai Yang, Poway, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/739,093

(22) Filed: Jan. 9, 2020

(65) Prior Publication Data

US 2020/0321467 A1 Oct. 8, 2020

Related U.S. Application Data

(60) Continuation of application No. 16/377,026, filed on Apr. 5, 2019, now Pat. No. 10,790,390, which is a
(Continued)

(51) Int. Cl.
*H01L 27/12* (2006.01)
*H01L 29/78* (2006.01)
(Continued)

(52) U.S. Cl.
CPC ...... *H01L 29/7841* (2013.01); *H01L 27/1203* (2013.01); *H01L 28/00* (2013.01);
(Continued)

(58) Field of Classification Search
CPC ............... H03K 17/162; H03K 17/687; H03K 2217/0018; H01L 29/0649; H01L 29/1095;
(Continued)

(56) References Cited

U.S. PATENT DOCUMENTS 3,646,361 A 2/1972 Pfiffner
3,699,359 A 10/1972 Shelby
(Continued)

FOREIGN PATENT DOCUMENTS

JP 5575348 6/1980
JP 2003347553 12/2003
(Continued)

OTHER PUBLICATIONS

US 10,700,199 B1, 06/2020, Brindle (withdrawn)
(Continued)

*Primary Examiner* — Niki H Nguyen
(74) *Attorney, Agent, or Firm* — Berkeley Law & Technology Group, LLP

(57) ABSTRACT

A method and apparatus for use in improving linearity sensitivity of MOSFET devices having an accumulated charge sink (ACS) are disclosed. The method and apparatus are adapted to address degradation in second- and third-order intermodulation harmonic distortion at a desired range of operating voltage in devices employing an accumulated charge sink.

30 Claims, 27 Drawing Sheets

Related U.S. Application Data continuation of application No. 16/046,974, filed on Jul. 26, 2018, now Pat. No. 10,797,172, which is a continuation of application No. 15/693,182, filed on Aug. 31, 2017, now Pat. No. 10,074,746, which is a continuation of application No. 15/354,723, filed on Nov. 17, 2016, now Pat. No. 9,786,781, which is a continuation of application No. 14/804,198, filed on Jul. 20, 2015, now Pat. No. 9,653,601, which is a continuation of application No. 14/198,315, filed on Mar. 5, 2014, now Pat. No. 9,087,899, which is a continuation of application No. 13/277,108, filed on Oct. 19, 2011, now Pat. No. 8,742,502, which is a continuation of application No. 13/053,211, filed on Mar. 22, 2011, now Pat. No. 8,129,787, which is a division of application No. 11/484,370, filed on Jul. 10, 2006, now Pat. No. 7,910,993, and a continuation-in-part of application No. 13/028,144, filed on Feb. 15, 2011, now Pat. No. 8,954,902, which is a continuation-in-part of application No. 11/484,370, filed on Jul. 10, 2006, now Pat. No. 7,910,993, which is a division of application No. 11/520,912, filed on Sep. 14, 2006, now Pat. No. 7,890,891.

(60) Provisional application No. 61/405,165, filed on Oct. 20, 2010, provisional application No. 60/698,523, filed on Jul. 11, 2005, provisional application No. 60/718,260, filed on Sep. 15, 2005.

(51) Int. Cl.
```
H01L 29/06      (2006.01)
H01L 29/36      (2006.01)
H01L 29/49      (2006.01)
H01L 29/786     (2006.01)
H03K 17/16      (2006.01)
H01L 49/02      (2006.01)
H01L 29/08      (2006.01)
H01L 29/10      (2006.01)
```

(52) U.S. Cl.
CPC ...... *H01L 29/0649* (2013.01); *H01L 29/0688* (2013.01); *H01L 29/0847* (2013.01); *H01L 29/1087* (2013.01); *H01L 29/1095* (2013.01); *H01L 29/36* (2013.01); *H01L 29/4908* (2013.01); *H01L 29/78615* (2013.01); *H01L 29/78654* (2013.01); *H01L 29/78657* (2013.01); *H03K 17/162* (2013.01)

(58) Field of Classification Search
CPC ......... H01L 29/78609; H01L 29/78615; H01L 29/78681; H01L 29/78684; H01L 2924/13091; H01L 27/1203; H01L 29/78; H01L 2223/6672; H01L 29/0847; H01L 29/407; H01L 27/0605; H01L 29/7841; H01L 28/00; H01L 29/0688; H01L 29/1087; H01L 29/36; H01L 29/4908; H01L 29/78654; H01L 29/78657
USPC .................................. 257/347, 352, E29.242
See application file for complete search history.

(56) References Cited

U.S. PATENT DOCUMENTS

| | | |
|---|---|---|
| 3,975,671 A | 8/1976 | Stoll |
| 3,988,727 A | 10/1976 | Scott |
| 4,053,916 A | 10/1977 | Cricchi |
| 4,145,719 A | 3/1979 | Hand |
| 4,244,000 A | 1/1981 | Ueda |
| 4,256,977 A | 3/1981 | Hendrickson |
| 4,316,101 A | 2/1982 | Minner |
| 4,317,055 A | 2/1982 | Yoshida |
| 4,367,421 A | 1/1983 | Baker |
| 4,390,798 A | 6/1983 | Karafuji |
| RE31,749 E | 11/1984 | Yamashiro |
| 4,638,184 A | 1/1987 | Kimura |
| 4,736,169 A | 4/1988 | Weaver |
| 4,739,191 A | 4/1988 | Puar |
| 4,746,960 A | 5/1988 | Valeri |
| 4,748,485 A | 5/1988 | Vasudev |
| 4,809,056 A | 2/1989 | Shirato |
| 4,810,911 A | 3/1989 | Noguchi |
| 4,825,145 A | 4/1989 | Tanaka |
| 4,849,651 A | 7/1989 | Estes, Jr. |
| 4,883,976 A | 11/1989 | Deane |
| 4,890,077 A | 12/1989 | Sun |
| 4,891,609 A | 1/1990 | Eilley |
| 4,893,070 A | 1/1990 | Milberger |
| 4,897,774 A | 1/1990 | Bingham |
| 4,906,587 A | 3/1990 | Blake |
| 4,929,855 A | 5/1990 | Ezzeddine |
| 4,939,485 A | 7/1990 | Eisenberg |
| 4,984,040 A | 1/1991 | Yap |
| 4,985,647 A | 1/1991 | Kawada |
| 4,999,585 A | 3/1991 | Burt |
| 5,001,528 A | 3/1991 | Bahraman |
| 5,012,123 A | 4/1991 | Ayasli |
| 5,023,494 A | 6/1991 | Tsukii |
| 5,061,907 A | 10/1991 | Rasmussen |
| 5,061,911 A | 10/1991 | Weidman |
| 5,081,706 A | 1/1992 | Kim |
| 5,095,348 A | 3/1992 | Houston |
| 5,107,152 A | 4/1992 | Jain |
| 5,124,762 A | 6/1992 | Childs |
| 5,125,007 A | 6/1992 | Yamaguchi |
| 5,146,178 A | 9/1992 | Nojima |
| 5,148,393 A | 9/1992 | Furuyama |
| 5,157,279 A | 10/1992 | Lee |
| 5,182,529 A | 1/1993 | Chern |
| 5,208,557 A | 5/1993 | Kersh, III |
| 5,272,457 A | 12/1993 | Heckaman |
| 5,274,343 A | 12/1993 | Russell |
| 5,283,457 A | 2/1994 | Matloubian |
| 5,285,367 A | 2/1994 | Keller |
| 5,306,954 A | 4/1994 | Chan |
| 5,313,083 A | 5/1994 | Schindler |
| 5,317,181 A | 5/1994 | Tyson |
| 5,319,604 A | 6/1994 | Imondi |
| 5,345,422 A | 9/1994 | Redwine |
| 5,350,957 A | 9/1994 | Cooper |
| 5,375,257 A | 12/1994 | Lampen |
| 5,405,795 A | 4/1995 | Beyer |
| 5,416,043 A | 5/1995 | Burgener |
| 5,422,590 A | 6/1995 | Coffman |
| 5,442,327 A | 8/1995 | Longbrake |
| 5,446,418 A | 8/1995 | Hara |
| 5,448,207 A | 9/1995 | Kohama |
| 5,477,184 A | 12/1995 | Uda |
| 5,488,243 A | 1/1996 | Tsuruta |
| 5,492,857 A | 2/1996 | Reedy |
| 5,493,249 A | 2/1996 | Manning |
| 5,535,160 A | 7/1996 | Yamaguchi |
| 5,548,239 A | 8/1996 | Kohama |
| 5,553,295 A | 9/1996 | Pantelakis |
| 5,554,892 A | 9/1996 | Norimatsu |
| 5,559,368 A | 9/1996 | Hu |
| 5,572,040 A | 11/1996 | Reedy |
| 5,576,647 A | 11/1996 | Sutardja |
| 5,578,853 A | 11/1996 | Hayashi |
| 5,581,106 A | 12/1996 | Hayashi |
| 5,587,604 A | 12/1996 | Machesney et al. |
| 5,594,371 A | 1/1997 | Douseki |
| 5,596,205 A | 1/1997 | Reedy |
| 5,597,739 A | 1/1997 | Sumi |
| 5,600,169 A | 2/1997 | Burgener |
| 5,600,588 A | 2/1997 | Kawashima |
| 5,610,533 A | 3/1997 | Arimoto |
| 5,629,655 A | 5/1997 | Dent |

(56) References Cited

U.S. PATENT DOCUMENTS

| | | |
|---|---|---|
| 5,663,570 A | 9/1997 | Reedy |
| 5,670,907 A | 9/1997 | Gorecki |
| 5,681,761 A | 10/1997 | Kim |
| 5,689,144 A | 11/1997 | Williams |
| 5,694,308 A | 12/1997 | Cave |
| 5,699,018 A | 12/1997 | Yamamoto |
| 5,717,356 A | 2/1998 | Kohama |
| 5,729,039 A | 3/1998 | Beyer |
| 5,731,607 A | 3/1998 | Kohama |
| 5,734,291 A | 3/1998 | Tasdighi |
| 5,748,016 A | 5/1998 | Kurosawa |
| 5,748,053 A | 5/1998 | Kameyama |
| 5,753,955 A | 5/1998 | Fechner |
| 5,760,652 A | 6/1998 | Maemura |
| 5,767,549 A | 6/1998 | Chen |
| 5,767,721 A | 6/1998 | Crampton |
| 5,774,411 A | 6/1998 | Hsieh |
| 5,774,792 A | 6/1998 | Tanaka |
| 5,777,530 A | 7/1998 | Nakatuka |
| 5,784,311 A | 7/1998 | Assaderaghi |
| 5,784,687 A | 7/1998 | Itoh |
| 5,793,246 A | 8/1998 | Vest |
| 5,801,577 A | 9/1998 | Tailliet |
| 5,804,858 A | 9/1998 | Hsu |
| 5,807,772 A | 9/1998 | Takemura |
| 5,808,505 A | 9/1998 | Tsukada |
| 5,812,939 A | 9/1998 | Kohama |
| 5,814,899 A | 9/1998 | Okumura |
| 5,818,099 A | 10/1998 | Burghartz |
| 5,818,278 A | 10/1998 | Yamamoto |
| 5,818,283 A | 10/1998 | Tonami |
| 5,818,289 A | 10/1998 | Chevallier |
| 5,818,766 A | 10/1998 | Song |
| 5,821,769 A | 10/1998 | Douseki |
| 5,821,800 A | 10/1998 | Le |
| 5,825,227 A | 10/1998 | Kohama |
| 5,861,336 A | 1/1999 | Reedy |
| 5,863,823 A | 1/1999 | Burgener |
| 5,864,328 A | 1/1999 | Kajimoto |
| 5,874,836 A | 2/1999 | Nowak |
| 5,874,849 A | 2/1999 | Marotta |
| 5,877,978 A | 3/1999 | Morishita |
| 5,878,331 A | 3/1999 | Yamamoto |
| 5,880,620 A | 3/1999 | Gitlin |
| 5,883,396 A | 3/1999 | Reedy |
| 5,883,541 A | 3/1999 | Tahara |
| 5,892,260 A | 4/1999 | Okumura |
| 5,892,382 A | 4/1999 | Ueda |
| 5,892,400 A | 4/1999 | Van Sanders |
| 5,895,957 A | 4/1999 | Reedy |
| 5,903,178 A | 5/1999 | Miyatsuji |
| 5,912,560 A | 6/1999 | Pasternak |
| 5,917,362 A | 6/1999 | Kohama |
| 5,920,093 A | 7/1999 | Huang |
| 5,920,233 A | 7/1999 | Denny |
| 5,926,466 A | 7/1999 | Ishida |
| 5,930,605 A | 7/1999 | Mistry |
| 5,930,638 A | 7/1999 | Reedy |
| 5,945,867 A | 8/1999 | Uda |
| 5,959,335 A | 9/1999 | Bryant |
| 5,969,560 A | 10/1999 | Kohama |
| 5,973,363 A | 10/1999 | Staab |
| 5,973,382 A | 10/1999 | Burgener |
| 5,973,636 A | 10/1999 | Okubo |
| 5,986,518 A | 11/1999 | Dougherty |
| 6,020,778 A | 2/2000 | Shigehara |
| 6,020,781 A | 2/2000 | Fujioka |
| 6,049,110 A | 4/2000 | Koh |
| 6,057,555 A | 5/2000 | Reedy |
| 6,057,723 A | 5/2000 | Yamaji |
| 6,061,267 A | 5/2000 | Houston |
| 6,063,686 A | 5/2000 | Masuda |
| 6,064,253 A | 5/2000 | Faulkner |
| 6,064,275 A | 5/2000 | Yamauchi |
| 6,064,872 A | 5/2000 | Vice |
| 6,066,993 A | 5/2000 | Yamamoto |
| 6,081,165 A | 6/2000 | Goldman |
| 6,081,443 A | 6/2000 | Morishita |
| 6,081,694 A | 6/2000 | Matsuura |
| 6,084,255 A | 7/2000 | Ueda |
| 6,087,893 A | 7/2000 | Oowaki |
| 6,094,088 A | 7/2000 | Yano |
| 6,100,564 A | 8/2000 | Bryant |
| 6,104,061 A | 8/2000 | Forbes |
| 6,111,778 A | 8/2000 | MacDonald |
| 6,114,923 A | 9/2000 | Mizutani |
| 6,118,343 A | 9/2000 | Winslow |
| 6,122,185 A | 9/2000 | Utsunomiya |
| 6,130,570 A | 10/2000 | Pan |
| 6,133,752 A | 10/2000 | Kawagoe |
| 6,160,292 A | 12/2000 | Flaker |
| 6,169,444 B1 | 1/2001 | Thurber, Jr. |
| 6,172,378 B1 | 1/2001 | Hull |
| 6,173,235 B1 | 1/2001 | Maeda |
| 6,177,826 B1 | 1/2001 | Mashiko |
| 6,188,247 B1 | 2/2001 | Storino |
| 6,188,590 B1 | 2/2001 | Chang |
| 6,191,449 B1 | 2/2001 | Shimo |
| 6,195,307 B1 | 2/2001 | Umezawa |
| 6,201,761 B1 | 3/2001 | Wollesen |
| RE37,124 E | 4/2001 | Monk |
| 6,215,360 B1 | 4/2001 | Callaway, Jr. |
| 6,218,248 B1 | 4/2001 | Hwang |
| 6,218,890 B1 | 4/2001 | Yamaguchi |
| 6,218,892 B1 | 4/2001 | Soumyanath |
| 6,222,394 B1 | 4/2001 | Allen |
| 6,239,649 B1 | 5/2001 | Bertin |
| 6,249,027 B1 | 6/2001 | Burr |
| 6,249,029 B1 | 6/2001 | Bryant |
| 6,249,446 B1 | 6/2001 | Shearon |
| 6,281,737 B1 | 8/2001 | Kuang |
| 6,288,458 B1 | 9/2001 | Berndt |
| 6,297,687 B1 | 10/2001 | Sugimura |
| 6,300,796 B1 | 10/2001 | Troutman |
| 6,304,110 B1 | 10/2001 | Hirano |
| 6,308,047 B1 | 10/2001 | Yamamoto |
| 6,310,508 B1 | 10/2001 | Westerman |
| 6,316,983 B1 | 11/2001 | Kitamura |
| 6,320,225 B1 | 11/2001 | Hargrove |
| 6,337,594 B1 | 1/2002 | Hwang |
| 6,341,087 B1 | 1/2002 | Kunikiyo |
| 6,355,957 B1 | 3/2002 | Maeda |
| 6,356,536 B1 | 3/2002 | Repke |
| 6,365,488 B1 | 4/2002 | Liao |
| 6,380,793 B1 | 4/2002 | Bancal |
| 6,380,796 B2 | 4/2002 | Sakai |
| 6,387,739 B1 | 5/2002 | Smith, III |
| 6,392,440 B2 | 5/2002 | Nebel |
| 6,392,467 B1 | 5/2002 | Oowaki |
| 6,396,325 B2 | 5/2002 | Goodell |
| 6,396,352 B1 | 5/2002 | Muza |
| 6,400,211 B1 | 6/2002 | Yokomizo |
| 6,407,427 B1 | 6/2002 | Oh |
| 6,407,614 B1 | 6/2002 | Takahashi |
| 6,411,156 B1 | 6/2002 | Borkar |
| 6,414,353 B2 | 7/2002 | Maeda |
| 6,414,863 B1 | 7/2002 | Bayer |
| 6,429,487 B1 | 8/2002 | Kunikiyo |
| 6,429,632 B1 | 8/2002 | Forbes |
| 6,429,723 B1 | 8/2002 | Hastings |
| 6,433,587 B1 | 8/2002 | Assaderaghi |
| 6,433,589 B1 | 8/2002 | Lee |
| 6,452,232 B1 | 9/2002 | Adan |
| 6,461,902 B1 | 10/2002 | Xu |
| 6,466,082 B1 | 10/2002 | Krishnan |
| 6,469,568 B2 | 10/2002 | Toyoyama |
| 6,486,511 B1 | 11/2002 | Nathanson |
| 6,486,729 B2 | 11/2002 | Imamiya |
| 6,498,058 B1 | 12/2002 | Bryant |
| 6,498,370 B1 | 12/2002 | Kim |
| 6,504,212 B1 | 1/2003 | Allen |
| 6,504,213 B1 | 1/2003 | Ebina |
| 6,512,269 B1 | 1/2003 | Braynt |
| 6,518,645 B2 | 2/2003 | Bae |

(56) References Cited

U.S. PATENT DOCUMENTS

| | | | |
|---|---|---|---|
| 6,519,191 B1 | 2/2003 | Morishita |
| 6,521,959 B2 | 2/2003 | Kim |
| 6,537,861 B1 | 3/2003 | Kroell |
| 6,559,689 B1 | 5/2003 | Clark |
| 6,563,366 B1 | 5/2003 | Kohama |
| 6,573,533 B1 | 6/2003 | Yamazaki |
| 6,608,785 B2 | 8/2003 | Chuang |
| 6,608,789 B2 | 8/2003 | Sullivan |
| 6,617,933 B2 | 9/2003 | Ito |
| 6,631,505 B2 | 10/2003 | Arai |
| 6,632,724 B2 | 10/2003 | Henley |
| 6,642,578 B1 | 11/2003 | Arnold |
| 6,646,305 B2 | 11/2003 | Assaderaghi |
| 6,653,697 B2 | 11/2003 | Hidaka |
| 6,670,655 B2 | 12/2003 | Lukes |
| 6,677,641 B2 | 1/2004 | Kocon |
| 6,677,803 B1 | 1/2004 | Chiba |
| 6,684,065 B2 | 1/2004 | Bult |
| 6,693,326 B2 | 2/2004 | Adan |
| 6,693,498 B1 | 2/2004 | Sasabata |
| 6,698,082 B2 | 3/2004 | Crenshaw |
| 6,698,498 B1 | 3/2004 | Zeigelaar |
| 6,703,863 B2 | 3/2004 | Gion |
| 6,704,550 B1 | 3/2004 | Kohama |
| 6,711,397 B1 | 3/2004 | Petrov |
| 6,714,065 B2 | 3/2004 | Komiya |
| 6,717,458 B1 | 4/2004 | Potanin |
| 6,762,477 B2 | 7/2004 | Kunikiyo |
| 6,774,701 B1 | 8/2004 | Heston |
| 6,781,805 B1 | 8/2004 | Urakawa |
| 6,788,130 B2 | 9/2004 | Pauletti |
| 6,790,747 B2 | 9/2004 | Henley |
| 6,801,076 B1 | 10/2004 | Merritt |
| 6,803,680 B2 | 10/2004 | Brindle |
| 6,804,502 B2 | 10/2004 | Burgener |
| 6,816,016 B2 | 11/2004 | Sander |
| 6,819,938 B2 | 11/2004 | Sahota |
| 6,830,963 B1 | 12/2004 | Forbes |
| 6,835,982 B2 | 12/2004 | Hogyoku |
| 6,836,172 B2 | 12/2004 | Okashita |
| 6,870,241 B2 | 3/2005 | Nakatani |
| 6,871,059 B1 | 3/2005 | Piro |
| 6,879,502 B2 | 4/2005 | Yoshida |
| 6,882,210 B2 | 4/2005 | Asano |
| 6,891,234 B1 | 5/2005 | Connelly |
| 6,897,701 B2 | 5/2005 | Chen |
| 6,898,778 B2 | 5/2005 | Kawanaka |
| 6,901,023 B2 | 5/2005 | Kirsch |
| 6,903,596 B2 | 6/2005 | Geller |
| 6,908,832 B2 | 6/2005 | Farrens |
| 6,917,258 B2 | 7/2005 | Kushitani |
| 6,933,744 B2 | 8/2005 | Das |
| 6,947,720 B2 | 9/2005 | Razavi |
| 6,967,517 B2 | 11/2005 | Mizuno |
| 6,969,668 B1 | 11/2005 | Kang |
| 6,975,271 B2 | 12/2005 | Adachi |
| 6,978,122 B2 | 12/2005 | Kawakyu |
| 6,978,437 B1 | 12/2005 | Rittman |
| 7,023,260 B2 | 4/2006 | Thorp |
| 7,042,245 B2 | 5/2006 | Hidaka |
| 7,045,873 B2 | 5/2006 | Chen |
| 7,056,808 B2 | 6/2006 | Henley |
| 7,057,472 B2 | 6/2006 | Fukamachi |
| 7,058,922 B2 | 6/2006 | Kawanaka |
| 7,082,293 B1 | 7/2006 | Rofougaran |
| 7,088,971 B2 | 8/2006 | Burgener |
| 7,092,677 B1 | 8/2006 | Zhang |
| 7,109,532 B1 | 9/2006 | Lee |
| 7,123,898 B2 | 10/2006 | Burgener |
| 7,129,545 B2 | 10/2006 | Cain |
| 7,132,873 B2 | 11/2006 | Hollmer |
| 7,138,846 B2 | 11/2006 | Suwa |
| 7,161,197 B2 | 1/2007 | Nakatsuka |
| 7,173,471 B2 | 2/2007 | Nakatsuka |
| 7,199,635 B2 | 4/2007 | Nakatsuka |
| 7,212,788 B2 | 5/2007 | Weber |
| 7,266,014 B2 * | 9/2007 | Wu ............... G11C 16/0475 365/185.01 |
| 7,269,392 B2 | 9/2007 | Nakajima |
| 7,307,490 B2 | 12/2007 | Kizuki |
| 7,345,342 B2 | 3/2008 | Challa |
| 7,345,521 B2 | 3/2008 | Takahashi |
| 7,355,455 B2 | 4/2008 | Hidaka |
| 7,391,282 B2 | 6/2008 | Nakatsuka |
| 7,404,157 B2 | 7/2008 | Tanabe |
| 7,405,982 B1 | 7/2008 | Flaker |
| 7,432,552 B2 | 10/2008 | Park |
| 7,460,852 B2 | 12/2008 | Burgener |
| 7,515,882 B2 | 4/2009 | Kelcourse |
| 7,546,089 B2 | 6/2009 | Bellantoni |
| 7,561,853 B2 | 7/2009 | Miyazawa |
| 7,564,103 B2 | 7/2009 | Losehand |
| 7,616,482 B2 | 11/2009 | Prall |
| 7,619,462 B2 | 11/2009 | Kelly |
| 7,659,152 B2 | 2/2010 | Gonzalez |
| 7,710,189 B2 | 5/2010 | Toda |
| 7,733,156 B2 | 6/2010 | Brederlow |
| 7,733,157 B2 | 6/2010 | Brederlow |
| 7,741,869 B2 | 6/2010 | Hidaka |
| 7,796,969 B2 | 9/2010 | Kelly |
| 7,860,499 B2 | 12/2010 | Burgener |
| 7,890,891 B2 | 2/2011 | Stuber |
| 7,910,993 B2 * | 3/2011 | Brindle ............. H01L 29/78615 257/347 |
| 7,928,759 B2 | 4/2011 | Hidaka |
| 7,982,265 B2 | 7/2011 | Challa |
| 7,984,408 B2 | 7/2011 | Cheng |
| 8,081,928 B2 | 12/2011 | Kelly |
| 8,129,787 B2 | 3/2012 | Brindle |
| 8,405,147 B2 | 3/2013 | Brindle |
| 8,451,044 B2 | 5/2013 | Nisbet |
| 8,525,272 B2 | 9/2013 | Losehand |
| 8,527,949 B1 * | 9/2013 | Pleis ................... G06F 15/7867 717/121 |
| 8,559,907 B2 | 10/2013 | Burgener |
| 8,583,111 B2 | 11/2013 | Burgener |
| 8,669,804 B2 | 3/2014 | Ranta |
| 8,680,928 B2 | 3/2014 | Jeon |
| 8,729,948 B2 | 5/2014 | Sugiura |
| 8,729,949 B2 | 5/2014 | Nisbet |
| 8,742,502 B2 | 6/2014 | Brindle |
| 8,779,859 B2 | 7/2014 | Su |
| 8,954,902 B2 | 2/2015 | Stuber |
| 9,087,899 B2 | 7/2015 | Brindle |
| 9,129,836 B2 | 9/2015 | Losehand |
| 9,130,564 B2 | 9/2015 | Brindle |
| 9,160,292 B2 | 10/2015 | Olson |
| 9,177,737 B2 | 11/2015 | Englekirk |
| 9,178,493 B1 | 11/2015 | Nobbe |
| 9,184,709 B2 | 11/2015 | Adamski |
| 9,219,445 B2 | 12/2015 | Nobbe |
| 9,225,378 B2 | 12/2015 | Burgener |
| 9,276,526 B2 | 3/2016 | Nobbe |
| 9,331,738 B2 | 5/2016 | Sharma |
| 9,369,087 B2 | 6/2016 | Burgener |
| 9,397,656 B2 | 7/2016 | Dribinsky |
| 9,419,560 B2 | 8/2016 | Korol |
| 9,438,223 B2 | 9/2016 | De Jongh |
| 9,467,124 B2 | 10/2016 | Crandall |
| 9,608,619 B2 | 3/2017 | Stuber |
| 9,653,601 B2 | 5/2017 | Brindle |
| 9,673,155 B2 | 6/2017 | Smith |
| 9,755,615 B2 | 9/2017 | Ranta |
| 9,780,775 B2 | 10/2017 | Brindle |
| 9,780,778 B2 | 10/2017 | Burgener |
| 9,786,781 B2 | 10/2017 | Brindle |
| 9,887,695 B2 | 2/2018 | Dribinsky |
| 9,948,281 B2 | 4/2018 | Ranta |
| 9,966,988 B2 | 5/2018 | Burgener |
| 10,074,746 B2 | 9/2018 | Brindle |
| 10,122,356 B2 | 11/2018 | Kunishi |
| 10,153,763 B2 | 12/2018 | Brindle |
| 10,153,767 B2 | 12/2018 | Burgener |
| 10,784,855 B2 | 9/2020 | Brindle |

(56) References Cited

U.S. PATENT DOCUMENTS

| | | |
|---|---|---|
| 10,790,390 B2 | 9/2020 | Brindle |
| 10,790,814 B2 | 9/2020 | Brindle |
| 10,790,815 B2 | 9/2020 | Brindle |
| 10,790,820 B2 | 9/2020 | Brindle |
| 10,797,172 B2 | 10/2020 | Brindle |
| 10,797,690 B2 | 10/2020 | Brindle |
| 10,797,691 B1 | 10/2020 | Brindle |
| 10,797,694 B2 | 10/2020 | Brindle |
| 10,804,892 B2 | 10/2020 | Dribinsky |
| 10,812,068 B2 | 10/2020 | Burgener |
| 2001/0031518 A1 | 10/2001 | Kim |
| 2001/0040479 A1 | 11/2001 | Zhang |
| 2001/0045602 A1 | 11/2001 | Maeda |
| 2002/0029971 A1 | 3/2002 | Kovacs |
| 2002/0115244 A1 | 8/2002 | Park |
| 2002/0126767 A1 | 9/2002 | Ding |
| 2002/0195623 A1 | 12/2002 | Horiuchi |
| 2003/0002452 A1 | 1/2003 | Sahota |
| 2003/0025159 A1 | 2/2003 | Hogyoku |
| 2003/0090313 A1 | 5/2003 | Burgener |
| 2003/0141543 A1 | 7/2003 | Bryant |
| 2003/0160515 A1 | 8/2003 | Yu |
| 2003/0181167 A1 | 9/2003 | Iida |
| 2003/0201494 A1 | 10/2003 | Maeda |
| 2003/0205760 A1 | 11/2003 | Kawanaka |
| 2003/0222313 A1 | 12/2003 | Fechner |
| 2003/0227056 A1 | 12/2003 | Wang |
| 2004/0004251 A1 | 1/2004 | Madurawe |
| 2004/0021137 A1 | 2/2004 | Fazan |
| 2004/0061130 A1 | 4/2004 | Morizuka |
| 2004/0080364 A1 | 4/2004 | Sander |
| 2004/0129975 A1 | 7/2004 | Koh |
| 2004/0183583 A1 | 9/2004 | Mizuno |
| 2004/0204013 A1 | 10/2004 | Ma |
| 2004/0218442 A1 | 11/2004 | Kirsch |
| 2004/0227565 A1 | 11/2004 | Chen |
| 2004/0242182 A1 | 12/2004 | Hidaka |
| 2005/0017789 A1 | 1/2005 | Burgener |
| 2005/0077564 A1 | 4/2005 | Forbes |
| 2005/0079829 A1 | 4/2005 | Ogawa |
| 2005/0121699 A1 | 6/2005 | Chen |
| 2005/0127442 A1 | 6/2005 | Veeraraghavan |
| 2005/0167751 A1 | 8/2005 | Nakajima |
| 2005/0212595 A1 | 9/2005 | Kusunoki |
| 2005/0264341 A1 | 12/2005 | Hikita |
| 2006/0009164 A1 | 1/2006 | Kataoka |
| 2006/0022526 A1 | 2/2006 | Cartalade |
| 2006/0118884 A1 | 6/2006 | Losehand |
| 2006/0194558 A1 | 8/2006 | Kelly |
| 2006/0194567 A1 | 8/2006 | Kelly |
| 2006/0199563 A1 | 9/2006 | Kelly |
| 2006/0267093 A1* | 11/2006 | Tang .................. H01L 29/785 |
| | | 257/347 |
| 2007/0018247 A1 | 1/2007 | Brindle |
| 2007/0023833 A1 | 2/2007 | Okhonin |
| 2007/0045697 A1 | 3/2007 | Cheng |
| 2007/0069291 A1 | 3/2007 | Stuber |
| 2007/0120103 A1 | 5/2007 | Burgener |
| 2007/0279120 A1 | 12/2007 | Brederlow |
| 2007/0290744 A1 | 12/2007 | Adachi |
| 2008/0034335 A1 | 2/2008 | Cheng |
| 2008/0073719 A1* | 3/2008 | Fazan .................. H01L 27/108 |
| | | 257/347 |
| 2008/0076371 A1 | 3/2008 | Dribinsky |
| 2008/0191788 A1 | 8/2008 | Chen |
| 2008/0303080 A1 | 12/2008 | Bhattacharyya |
| 2009/0007036 A1 | 1/2009 | Cheng |
| 2009/0029511 A1* | 1/2009 | Wu .................. G11C 11/5628 |
| | | 438/261 |
| 2009/0117871 A1 | 5/2009 | Burgener |
| 2009/0181630 A1 | 7/2009 | Seshita |
| 2009/0278206 A1 | 11/2009 | Losehand |
| 2010/0327948 A1 | 12/2010 | Nisbet |
| 2011/0092179 A1 | 4/2011 | Burgener |
| 2011/0163779 A1 | 7/2011 | Hidaka |
| 2011/0169550 A1 | 7/2011 | Brindle |
| 2011/0227637 A1 | 9/2011 | Stuber |
| 2012/0169398 A1 | 7/2012 | Brindle |
| 2012/0267719 A1* | 10/2012 | Brindle ............... H01L 29/7841 |
| | | 257/348 |
| 2013/0009725 A1 | 1/2013 | Heaney |
| 2013/0260698 A1 | 10/2013 | Nisbet |
| 2013/0278317 A1 | 10/2013 | Iversen |
| 2013/0293280 A1 | 11/2013 | Brindle |
| 2014/0001550 A1 | 1/2014 | Losehand |
| 2014/0028521 A1 | 1/2014 | Bauder |
| 2014/0085006 A1 | 3/2014 | Mostov |
| 2014/0087673 A1 | 3/2014 | Mostov |
| 2014/0165385 A1 | 6/2014 | Englekirk |
| 2014/0167834 A1 | 6/2014 | Stuber |
| 2014/0179249 A1 | 6/2014 | Burgener |
| 2014/0179374 A1 | 6/2014 | Burgener |
| 2014/0306767 A1 | 10/2014 | Burgener |
| 2014/0312422 A1 | 10/2014 | Brindle |
| 2015/0015321 A1 | 1/2015 | Dribinsky |
| 2015/0022256 A1 | 1/2015 | Sprinkle |
| 2015/0236691 A1 | 8/2015 | Cam |
| 2016/0064561 A1* | 3/2016 | Brindle ............... H01L 29/7841 |
| | | 257/348 |
| 2016/0191040 A1 | 6/2016 | Brindle |
| 2016/0191050 A1 | 6/2016 | Englekirk |
| 2016/0191051 A1 | 6/2016 | Burgener |
| 2016/0226478 A1 | 8/2016 | Dribinsky |
| 2016/0329891 A1 | 11/2016 | Bakalski |
| 2017/0162692 A1 | 6/2017 | Brindle |
| 2017/0201250 A1 | 7/2017 | Heaney |
| 2017/0236946 A1 | 8/2017 | Stuber |
| 2017/0237462 A1 | 8/2017 | Burgener |
| 2018/0061985 A1 | 3/2018 | Brindle |
| 2018/0062645 A1 | 3/2018 | Burgener |
| 2018/0083614 A1 | 3/2018 | Brindle |
| 2018/0138272 A1 | 5/2018 | Ebihara |
| 2018/0212599 A1 | 7/2018 | Dribinsky |
| 2019/0058470 A1 | 2/2019 | Burgener |
| 2019/0081655 A1 | 3/2019 | Burgener |
| 2019/0088781 A1 | 3/2019 | Brindle |
| 2019/0089348 A1 | 3/2019 | Brindle |
| 2019/0097612 A1 | 3/2019 | Burgener |
| 2019/0237579 A1 | 8/2019 | Brindle |
| 2019/0238126 A1 | 8/2019 | Brindle et al. |
| 2020/0036377 A1 | 1/2020 | Brindle |
| 2020/0036378 A1 | 1/2020 | Brindle |
| 2020/0067504 A1 | 2/2020 | Brindle |
| 2020/0076427 A1 | 3/2020 | Burgener |
| 2020/0076428 A1 | 3/2020 | Burgener |
| 2020/0295751 A1 | 9/2020 | Brindle |
| 2020/0321467 A1 | 10/2020 | Brindle |
| 2020/0335633 A1 | 10/2020 | Stuber |

FOREIGN PATENT DOCUMENTS

| | | |
|---|---|---|
| JP | 5591356 | 9/2014 |
| JP | 55678106 | 2/2015 |
| JP | WO2015015720 | 3/2017 |
| JP | 2014239233 | 12/2017 |

OTHER PUBLICATIONS

US 10,700,200 B1, 06/2020, Brindle (withdrawn)
Analog Devices—"LC2MOS High Speed, Quad SPST Switch", Rev. B, 8 pages, Apr. 1988, Doc 1076.
Analog Devices—"LC2MOS Quad SPST Switch", Rev. B, 6 pages, Jul. 1992, Doc 1077.
Le TMOS en technologie SOI, 3.7.2.2 Pompage de charges, pp. 110-111, 2 pages, Doc 1081.
Linear Systems—"High-Speed DMOS FET Analog Switches and Switch Arrays", 11 pages, Doc 1082.
Orndorff—"CMOS/SOS/LSI Switching Regulator Control Device", IEEE International Solid-State Circuits Conference, ISSCC 78, Feb. 1978, pp. 234-235, 282, 3 pages, Doc 0151.
Kwok—"An X-Band SOS Resistive Gate Insulator Semiconductor (RIS) Switch", IEEE Transactions on Electron Device, Feb. 1980, pp. 442-448, 7 pages, Doc 0154.

(56) References Cited

OTHER PUBLICATIONS

Ayasli—"An X-Band 10 W Monolithic Transmit-Receive GaAs FET Switch", Raytheon Research Division, May 31-Jun. 1, 1983 IEEE, pp. 42-46, 5 pages, Doc 0155.

Ayasli—"Microwave Switching with GaAs FETs", Microwave Journal, Nov. 1982, pp. 719-723, 10 pages, Doc 0156.

Pucel—"A Multi-Chip GaAs Monolithic Transmit/Receive Module for X-Band", Research Division. Raytheon Company, Jun. 15-17, 1982 IEEE MTT-S Digest, pp. 489-492, 4 pages , Doc 0157.

Sedra—"Microelectronic Circuits", University of Toronto, Oxford University Press, Fourth Edition, 1982, 1987, 1991, 1998, pp. 374-375, 4 pages, Doc 0158.

Ayasli—"A Monolithic Single-Chip X-Band Four-Bit Phase Shifter", IEEE Transactions on Microwave Theory and Techniques, vol. MTT-30, No. 12, Dec. 1982, pp. 2201-2206, 6 pages, Doc 0159.

Heller—"Cascode Voltage Switch Logic: A Different CMOS Logic Family", IEEE International Solid-State Circuits Conference, Feb. 22-24, 1984, pp. 16-17, 2 pages, Doc 0160.

Gopinath—"GaAs FET RF Switches", IEEE Transactions on Electron Devices, Jul. 1985, pp. 1272-1278, 7 pages, Doc 0161.

Yamao—"GaAs Broadband Monolithic Switches", 1986, pp. 63-71, 10 pages, Doc 0162.

Barker—"Communications Electronics-Systems, Circuits and Devices", Jan. 1, 1987 Prentice-Hall, 347 pages, Doc 0163 (A-D).

Harjani—"A Prototype Framework for Knowledge Based Analog Circuit Synthesis", IEEE Design Automation Conference, Jun. 28-Jul. 1, 1987, pp. 42-49, 8 pages, Doc 0164.

Colinge—"An SOI Voltage-Controlled Bipolar-MOS Device", IEEE Transactions on Electron Devices, vol. ED-34, Apr. 1987, pp. 845-849, 5 pages, Doc 0165.

Schindler—"DC-40 GHz and 20-40GHz MMIC SPDT Switches", IEEE Transactions of Electron Devices, vol. ED-34, No. 12, Dec. 1987, pp. 2595-2602, 8 pages, Doc 0167.

Colinge—"Fully Depleted SOI CMOS for Analog Applications", IEEE Transactions on Electron Devices, 1998, pp. 1010-1016, 7 pages, Doc 0168.

Nakayama—"A 1.9 GHz Single-Chip RF Front End GaAs MMIC with Low-Distortion Cascode FET Mixer for Personal Handy-Phone System Terminals", Radio Frequency Integrated Circuits Symposium, 1988, pp. 205-208, 4 pages, Doc 0169.

Peregrine Semiconductor Corporation—"An Ultra-Thin Silicon Technology that Provides Integration Solutions on Standard CMOS", 1988, 4 pages, Doc 0170.

Shifrin—"High Power Control Components Using a New Monolithic FET Structure", IEEE Microwave and Millimeter-Wave Monolithic Circuits Symposium, 1988, pp. 51-56, 6 pages, Doc 0171.

Schindler—"DC-20 GHz N X M Passive Switches", IEEE Transactions on Microwave Theory and Techniques, vol. 36, No. 12, Dec. 1988, pp. 1604-1613, 10 pages, Doc 0172.

Eisenberg—"High Isolation 1-20 GHz MMIC Switches with On-Chip Drivers", IEEE Microwave and Millimeter Wave Monolithic Circuits Symposium, 1989, pp. 41-45, 5 pages, Doc 0173.

Houng—"60-70 dB Isolation 2-19 GHz Switches", Raytheon Electromagnetic Systems Division, 1989 IEEE, GaAs IC Symposium, pp. 173-176, 4 pages, Doc 0174.

Schindler—"A 2-18 GHz Non-Blocking Active 2 X 2 Switch", Raytheon Company, 1989 IEEE, GaAs IC Symposium, pp. 181-183, 3 page, Doc 0175.

Slobodnik—"Millimeter Wave GaAs Switch FET Modeling", Microwave Journal, 1989, 7 pages, Doc 0176.

Chen—"Dual-Gate GaAs FET: A Versatile Circuit Component for MMICs", Microwave Journal, Jun. 1989, pp. 125-135, 7 pages, Doc 0177.

Shifrin—"Monolithic FET Structure for High Power Control Component Applications", IEEE Transactions on Microwave Theory and Techniques, vol. 37, No. 12, Dec. 1989, pp. 2134-2142, 8 pages, Doc 0178.

Schindler—"A High Power 2-18 GHz T/R Switch", 1988 IEEE, IEEE 1990 Microwave and Millimeter-Wave Circuits Symposium, pp. 119-122, 4 pages, Doc 0180.

Valeri—"A Composite High Voltage Device Using Low Voltage SOI MOSFETs", IEEE, 1990, pp. 169-170, 2 pages, Doc 0183.

Yun—"High Power-GaAs MMIC Switches with Planar Semi-Insulated Gate FETs (SIGFETs)", International Symposium on Power Semiconductor Devices & Ics, 1990, pp. 55-58, 4 pages, Doc 0184.

Wang—"Threshold Voltage Instability at Low Temperatures in Partially Depleted Thin Film SOI MOSFETs", IEEE SOS/SOI Technology Conference, Jun. 1991, pp. 91-92, 2 pages, Doc 0185.

Bernkopf—"A High Power K/Ka-Band Monolithic T/R Switch", 1991 IEEE, IEEE 1991 Microwave and Millimeter-Wave Monolithic Circuits Symposium, pp. 15-18, 4 pages, Doc 0186.

McGrath—"Multi Gate FET Power Switches", Applied Microwave 1991, pp. 77-88, 7 pages, Doc 0188.

McGrath—"Novel High Performance SPDT Power Switches Using Multi-Gate FETs", 1991 IEEE, 1991 IEEE MTT-S Digest, pp. 839-842, 4 pages, Doc 0189.

Valeri—"A Silicon-on-Insulator Circuit for High Temperature, High-Voltage Applications", IEEE, 1991, pp. 60-61, 2 pages, Doc 0191.

Giffard: "Dynamic Effects in SOI MOSFETs", IEEE SOS/SOI Technology Conference, Oct. 1991, pp. 160-161, 2 pages, Doc 0192.

Baker—"Stacking Power MOSFETs for Use in High Speed Instrumentation", American Institute of Physics, 1992, pp. 5799-5801, 3 pages, Doc 0193.

Eron—"Small and Large Signal Analysis of MESETs as Switches", Microwave.Journal, 1995, 7 pages, Doc 0216.

Kusunoki—"SPDT Switch MMIC Using E/D Mode GaAs JFETs for Personal Communications", IEEE GaAs IC Symposium, 1992, pp. 135-138, 4 pages, Doc 0195.

Shifrin—"A New Power Amplifier Topology with Series Biasing and Power Combining of Transistors", IEEE 1992 Microwave and Millimeter-Wave Monolithic Circuits Symposium, 1992, pp. 39-41, 3 pages, Doc 0196.

Van Der Pujie—"Telecommunication Circuit Design", Wiley 1992, 187 pages, Doc 0197 (A-B).

Baker—"Series Operation of Power MOSFETs for High Speed Voltage Switching Applications", American Institute of Physics, 1993, pp. 1655-1656, 2 pages, Doc 0198.

Devlin—"A 2.4 GHz Single Chip Transceiver", Microwave and Millimeter-Wave Monolithic Circuits Symposium 1993, pp. 23-26, 4 pages, Doc 0199.

Uda—"High Performance GaAs Switch IC's Fabricated Using MESFETs with Two Kinds of Pinch Off Voltages", IEEE GaAs IC Symposium, 1993, pp. 247-250, 4 pages, Doc 0200.

Apel—"A GaAs MMIC Transceiver for 2.45 GHz Wireless Commercial Products", Microwave and Millimeter-Wave Monolithic Circuits Symposium, 1994, pp. 15-18, 4 pages, Doc 0201.

Assaderaghi—"A Dynamic Threshold Voltage MOSFET (DTMOS) for Ultra-low Voltage Operation", 1994, IEEE pp. 33.1.1-33.1.4, 4 pages, Doc 0203.

Baker—"Designing Nanosecond High Voltage Pulse Generators Using Power MOSFETs", Electronic Letters, 1994, pp. 1634-1635, 2 pages, Doc 0204.

Caverly—"Distortion in GaAs MESFET Switch Circuits", 1994, 5 pages, Doc 0205.

Miyatsuji—"A GaAs High Power RF Single Pole Double Throw Switch IC for Digital Mobile Communication System", IEEE International Solid-State Circuits Conference, 1994, pp. 34-35, 2 pages, Doc 0206.

Puechberty—"A GaAs Power Chip Set for 3V Cellular Communications", 1994, 4 pages, Doc 0207.

Szedon—"Advanced Silicon Technology for Microwave Circuits." Naval Research Laboratory, 1994, pp. 1-110, 122 pages, Doc 0208.

Uda—"High-Performance GaAs Switch IC's Fabricated Using MESFETs with Two Kinds of Pinch-off Voltages and a Symmetrical Pattern Configuration", IEEE Journal of Solid-State Circuits, vol. 29, No. 10, Oct. 1994, pp. 1262-1269, 8 pages, Doc 0209.

Assaderaghi—"Dynamic Threshold Voltage MOSFET (DTMOS) for Ultra Low Voltage Operation", International Electron Devices Meeting, Dec. 1994, pp. 809-812, 4 pages, Doc 0212.

Abidi—"Low Power Radio Frequency IC's for Portable Communications", IEEE 1995, pp. 544-569, 26 pages, Doc 0213.

(56) References Cited

OTHER PUBLICATIONS

Couch—"Modem Communication System", Prentice-Hall, 1995, 316 pages, Doc 0214 (A-D).
De La Houssaye—"Microwave Performance of Optically Fabricated T-Gate Thin Film Silicon on Sapphire Based MOSFETs", IEEE Electron Device Letters, 1995, pp. 289-292, 4 pages, Doc 0215.
Gautier—"Body Charge Related Transient Effects in Floating Body SOI NMOSFETs", IEDM Tech. Digest 1995, pp. 623-626, 4 pages, Doc 0217.
Hittite Microwave—"Miniature Dual Control SP4T Switches for Low Cost Multiplexing", Hittite Microwave, 1995, 5 pages, Doc 0218.
Ionescu—"A Physical Analysis of Drain Current Transients at Low Drain Voltage in Thin Film SOI MOSFETs", Microelectronic Engineering 28 (1995), pp. 431-434, 4 pages, Doc 1085.
Keys—"Low Distortion Mixers or RF Communications", Ph.D. Thesis, University of California-Berkeley, 1995, 135 pages, Doc 0219.
Kohama—"High Power DPDT Antenna Switch MMIC for Digital Cellular Systems", GaAs IC Symposium, 1995, pp. 75-78, 4 pages, Doc 0220.
Lovelace—"Silicon MOSFET Technology for RF Ics", IEEE 1995, pp. 1238-1241, 4 pages, Doc 0221.
Matsumoto—"Fully Depleted 30-V-Class Thin Film SOI Power MOSFET", IEDM 95-979, Dec. 10-13, 1995, pp. 38.6.1-38.6.4, 4 pages, Doc 0222.
McGrath—"A 1.9-GHz GaAs Chip Set for the Personal Handyphone System", IEEE Transaction on Microwave Theory and Techniques, 1995, pp. 1733-1744, 12 pages, Doc 0223.
Microwave Journal—"A Voltage Regulator for GaAs FETs", Microwave Journal 1995, 1 page, Doc 0224.
Miyatsuji—"A GaAs High Power RF Single Pole Dual Throw Switch IC for Digital Mobile Communication System", IEEE Journal of Solid-State Circuits, 1995, pp. 979-983, 5 pages, Doc 0226.
Sanders—"Statistical Modeling of SOI Devices for the Low Power Electronics Program", AET, Inc., 1995, pp. 1-109, 109 pages, Doc 0227.
Tokumitsu—"A Low-Voltage, High-Power T/R-Switch MMIC Using LC Resonators", IEEE Transactions on Microwave Theory and Techniques, vol. 43, No. 5, May 1995, pp. 997-1003, 7 pages, Doc 0228.
Morishita—"Leakage Mechanism Due to Floating Body and Countermeasure on Dynamic Retention Mode of SOI-DRAM", 1995 Symposium on VLSI Technology Digest of Technical Papers, Apr. 1995, pp. 141-142, 2 pages, Doc 0229.
Suh—"A Physical Change-Based Model for Non-Fully Depleted SOI MOSFETs and Its Use in Assessing Floating-Body Effects in SOI SMOS Circuits", IEEE Transactions on Electron Devices, vol. 42, No. 4, Apr. 1995, pp. 728-737, 10 pages, Doc 0230.
Cherne—U.S. Statutory Invention Registration No. H1435, published May 2, 1995, 12 pages, Doc 0232.
Ota—"High Isolation and Low Insertion Loss Switch IC Using GaAa MESFETS", IEEE Transactions on Microwave Theory and Techniques, vol. 43, No. 9, Sep. 1995, pp. 2175-2177, 3 pages, Doc 0233.
Chan—"Comparative Study of Fully Depleted and Body-Grounded Non Fully Depleted SOI MOSFETs for High Performance Analog and Mixed Signal Circuits", IEEE Transactions on Electron Devices, vol. 42, No. 11, Nov. 1995, pp. 1975-1981, 7 pages, Doc 0234.
Assaderaghi—"History Dependence of Non-Fully Depleted (NFD) Digital SOI Circuits", 1996 Symposium on VLSI Technology Digest of Technical Papers 13.1, 1996, pp. 122-123, 2 pages, Doc 0235.
Burghartz—"Integrated RF and Microwave Components in BiCMOS Technology", IEEE Transactions on Electron Devices, 1996, pp. 1559-1570, 12 pages, Doc 0236.

Colinge—"A Low Voltage Low Power Microwave SOI MOSFET", IEEE International SOI Conference, 1996, pp. 128-129, 2 pages, Doc 0237.
Douseki—"A 0.5v SIMOX-MTMCOS Circuit with 200ps Logic Gate", IEEE International Solid-State Circuits Conference 1996, pp. 84-85, 423, 3 pages, Doc 0238.
Eggert—"CMOS/SIMOX-RF-Frontend for 1.7 GHz", Solid State Circuits Conference, 1996, 4 pages, Doc 0239.
Gentinne—"Measurement and Two-Dimensional Simulation of Thin-Film SOI MOSFETs: Intrinsic Gate Capacitances at Elevated Temperatures", Solid-State Electronics, vol. 39, No. 11, pp. 1613-1619, 1996, 7 pages, Doc 0240.
Hagan (or Hagen)—Radio Frequency Electronics:, Cambridge University Press 1996, 194 pages, Doc 0241(A-B).
Imai—"Novel High Isolation FET Switches", IEEE Transactions on Microwave Theory and Techniques 1996, pp. 685-691, 7 pages, Doc 0242.
Intersil—"RF Amplifier Design Using HFA3046, HFA3096, HFA3127, HFA3128 Transistor Arrays", Intersil Corporation 1996, pp. 1-4, 4 pages, Doc 0243.
Kuroda—"A 0.9-V, 150-Mhz, 10-mW, 4 mm2, 2-D Discrete Cosine Transform Core Processor with Variable-Threshold-Voltage (VT) Scheme", Technical Paper, 1996 IEEE International Solid-State Circuits Conference, 1996 Digest of Technical Papers, pp. 166-167, 14 pages, Doc 0245.
Larson—"RF and Microwave Circuit Design for Wireless Communications", Artech House 1996, 218 pages, Doc 0246 (A-C).
Nakayama—"A 1.9 GHz Single-Chip RF Front-End GaAs MMIC for Persona; Communications", Microwave and Millimeter-Wave Monolithic Circuits Symposium, 1996, pp. 69-72, 4 pages, Doc 0247.
Soyuer—"RF and Microwave Building Blocks in a Standard BiCMOS Technology", IBM T.J. Watson Research Center, 1996 IEEE, pp. 89-92, 4 pages, Doc 0249.
Suematsu—"L-Band Internally Matched Si-MMIC Front End", IEEE, 1996, pp. 2375-2378, 4 pages, Doc 0250.
Titus—"A Silicon BICMOS Transceiver Front-End MMIC Covering 900 and 1900 MHZ Applications", Hittite Microwave Corporation, IEEE 1996 Microwave and Millimeter-Wave Monolithic Circuits Symposium, pp. 73-75, 4 pages, Doc 0251.
Uda—"A High Performance and Miniturized Dual Use (antenna/local) GaAs SPDT Switch IC Operating at +3V/0V", Microwave Symposium Digest, 1996, pp. 141-144, 4 pages, Doc 0252.
Uda—"Miniturization and High Isolation of GaAs SPDT Switch IC Mounted in Plastic Package", 1996, 8 pages, Doc 0253.
Yamamoto—"A GaAs RF Transceiver IS for 1.9GHz Digital Mobile Communication Systems", ISSCC96, 1996, pp. 340-341, 469, 3 pages, Doc 0254.
Fuse—"0.5V SOI CMOS Pass-Gate Logic", 1996 IEEE Intl. Solid-State Circuits Conference, pp. 88-89, 424, 3 pages, Doc 0257.
Iyama—"L-Band SPDT Switch Using Si-MOSFET", IEICE Trans. Electron, vol. E79-C, No. 5, May 1996, pp. 636-643, 8 pages, Doc 0260.
Pelella—"Low-Voltage Transient Bipolar Effect Induced by Dynamic Floating-Body Charging in Scaled PD/SOI MOSFETs", IEEE Electron Device Letters, vol. 17, No. 5, May 1996, 3 pages, Doc 0261.
Wei—"Measurements of Transient Effects in SOI DRAM/SRAM Access Transistors", IEEE Electron Device Letters, vol. 17, No. 5, May 1996, pp. 193-195, 3 pages, Doc 0262.
Wei—"Measurement and Modeling of Transient Effects in Partially Depleted SOI MOSFETs", M.S. Thesis, MIT, Jul. 1996, 76 pages, Doc 0265.
Lu—"Floating Body Effects in Partially Depleted SOI CMOS Circuits", ISPLED, Aug. 1996, pp. 1-6, 6 pages, Doc 0266.
Madihian—"A High Speed Resonance Type FET Transceiver Switch for Millimeter Wave Band Wireless Networks", 26th EuMC, 1996, pp. 941-944, 4 pages, Doc 1084.
Chung—"A New SOI Inverter for Low Power Applications", IEEE SOI Conference, Oct. 1996, pp. 20-21, 2 pages, Doc 0267.
Ueda—"Floating Body Effects on Propagation Delay in SOI/CMOS LSIs", IEEE SOI Conference, Oct. 1996, pp. 142-143, 2 pages, Doc 0269.

(56) References Cited

OTHER PUBLICATIONS

Kuroda—"A 0.9-V, 150-Mhz, 10-mW, 4 mm2, 2-D Discrete Cosine Transform Core Processor with Variable-Threshold-Voltage (VT) Scheme", IEEE Journal of Solid-State Circuits, vol. 31, No. 11, Nov. 1996, pp. 1770-1779, 10 pages, Doc 0270.
Botto—"Series Connected Soft Switched IGBTs for High Power, High Voltage Drives Applications: Experimental Results," IEEE 1997, pp. 3-7, 5 pages, Doc 0271.
Carr—"Secrets of RF Circuit Design", McGraw-Hill, 1997, 293 pages, Doc 0272 (A-D).
Caverly—"A Project Oriented Undergraduate CMOS Analog Microelectronic System Design Course", IEEE, 1997, pp. 87-88, 2 pages, Doc 0274.
Caverly—Distortion in Microwave Control Devices, 1997, 10 pages, Doc 0275.
Caverly—"Distortion Properties of Gallium Arsenide and Silicon RF and Microwave Switches", IEEE, 1997, pp. 153-156, 4 pages, Doc 0276.
Crols—"CMOS Wireless Transceiver Design", Kluwer Academic, 1997, 214 pages, Doc 0277 (A-C).
Eggert—"A SOI-RF-CMOS Technology on High Resistivity SIMOX Substrates for Microwave Applications to 5 GHz", IEEE Transactions on Electron Devices, 1997, pp. 1981-1989, 9 pages, Doc 0278.
Freeman—"Radio System Design for Telecommunications", Wiley, 1997, 461 pages, Doc 0279 (A-F).
Gibson—"The Communication Handbook", CRC Press, 1997, 812 pages, Doc 0280 (A-R).
Hickman—"Practical RF Handbook", Newnes 1997, 270 pages, Doc 0281 (A-D).
Huang—"TFSOI Can It Meet the Challenge of Single Ship Portable Wireless Systems", IEEE International SOI Conference, 1997, pp. 1-3, 3 pages, Doc 0282.
Ishida—"A Low Power GaAs Front End IC with Current Reuse Configuration Using 0.15um Gate GaAs MODFETs", IEEE 1997, pp. 669-672, 4 pages, Doc 0283.
Iwata—"Gate Over Driving CMOS Architecture for 0.5V Single Power Supply Operated Devices", IEEE 1997, pp. 290-291, 3, pages, Doc 0284.
Johnson—"A Model for Leakage Control by MOS Transistor Stacking", ECE Technical Papers, 1997, pp. 1-28, 34 pages, Doc 0285.
Johnson—"Advanced High-Frequency Radio Communication", Artech House 1997, 205 pages, Doc 0286 (A-C).
Johnson—"Silicon-On-Sapphire MOSFET Transmit/Receive Switch for L and S Band Transceiver Applications", Electronic Letters, 1997, pp. 1324-1326, 3 pages, Doc 0287.
Kanda—"High Performance 19 GHz Band GaAs FET Using LOXI (Layered Oxide Isolation)—MESFETs", IEEE, 1997, pp. 62-65, 4 pages.
Lossee—"RF Systems, Components, and Circuits Handbook", Artech House 1997, 314 pages, Doc 0290 (A-D).
Madihan—"A 2-V, 1-10GHz BiCMOS Transceiver Chip for Multimode Wireless Communications Networks", IEEE 1997, pp. 521-525, 5 pages, Doc 0291.
Nishijima—"A High Performance Transceiver Hybrid IC for PHS Hand Set Operating with Single Positive Voltage Supply", Microwave Symposium Digest 1997, pp. 1155-1158, 4 pages, Doc 0293.
Philips Semiconductors—"SA630 Single Pole Double Throw (SPDT) Switch", 1997, 14 pages, Doc 0294.
Razavi—"Next Generation RF Circuits and Systems", IEEE 1997, pp. 270-282, 13 pages, Doc 0295.
Schaper—"Communications, Computations, Control, and Signal-Processing", Kluwer Academic, 1997, 308 pages, Doc 0296 (A-D).
Suematsu—"On-Chip Matching SI-MMIC for Mobile Communication Terminal Application", IEEE 1997, pp. 9-12, 4 pages, Doc 0297.
Wada—"Active Body-Bias SOI-CMOS Driver Circuits", Symposium on VLSI Circuits Digest of Technical Papers, 1997, pp. 29-30, 2 pages, Doc 0298.
Fuse—"A 0.5V 200MHz 1-Stage 32b ALU Using a Body Bias Controlled SOI Pass-Gate Logic", IEEE Intl Solid-State Circuits Conference, Feb. 1997, 3 pages, Doc 0299.
Shimomura—"TP 4.3: A 1V 46ns 16Mb SOI-DRAM with Body Control Technique", 1997 IEEE Intl Solid-State Circuits Conference, Feb. 1997, 9 pages, Doc 0300.
Ueda—"A CAD Compatible SOI/CMOS Gate Array Having Body Fixed Partially Depleted Transistors", IEEE International Solid-State Circuits Conference, Feb. 8, 1997, pp. 288-289, 3 pages, Doc 0301.
Assaderaghi—"Dynamic Threshold Voltage MOSFET (DTMOS) for Ultra Low Voltage VLSI", IEEE Transactions on Electron Devices, vol. 44, No. 3, Mar. 1997, pp. 414-422.
Smuk—"Monolithic GaAs Multi-Throw Switches with Integrated Low Power Decoder/Driver Logic", May 1997, IEEE Radio Frequency Integrated Circuits, 4 pages, Doc 0308.
Suehle—"Low Electric Field Breakdown of Thin Si02 Films Under Static and Dynamic Stress", IEEE Transactions on Electron Devices, vol. 44, No. 5, May 1997, 8 pages, Doc 0309.
Suehle—"Low Electric Field Breakdown of Thin Si02 Films Under Static and Dynamic Stress", IEEE Transactions on Electron Devices, vol. 44, No. 5, May 1997. pp. 801-808, 8 pages, Doc 0310.
Assaderaghi—"Transient Pass-Transistor Leakage Current in SOI MOSFETs", IEEE Electron Device Letters, vol. 18, No. 6, Jun. 1997, pp. 241-243, 3 pages, Doc 0312.
Chung—"A New SOI Inverter Using Dynamic Threshold for Low-Power Applications", IEEE Electron Device Letters, vol. 18, No. 6, Jun. 1997, pp. 248-250, 3 pages, Doc 0313.
Kuang—"SRAM Bitline Circuits on PD SOI: Advantages and Concerns", IEEE Journal of Solid State Circuits, vol. 32, No. 6, Jun. 1997, pp. 837-844, 8 pages, Doc 0314.
Smuk—"Monolithic GaAs Multi-Throw Switches with Integrated Low-Power Decoder-Driver Logic", Hitite Microwave Corporation, Jun. 1997, 4 pages, Doc 0317.
Wang—"Efficiency Improvement in Charge Pump Circuits", IEEE Journal of Solid-State Circuits, vol. 32, No. 6, Jun. 1997, pp. 852-860, 9 pages, Doc 0318.
Caverly—"A Silicon CMOS Monolithic RF and Microwave Switching Element", 27th European Microwave Conference, 1987, pp. 1046-1051, 10 pages, Doc 0166.
Douseki—"A 0.5-V MTCMOS/SIMOX Logic Gate", IEEE Journal of Solid-State Circuits, vol. 32, No. 10, Oct. 1997, 6 pages, Doc 0320.
Krishnan—"Efficacy of Body Ties Under Dynamic Switching Conditions in Partially Depleted SOI CMOS Technology", Proceedings IEEE Intl SOI Conference, Oct. 1997, pp. 140-141, 2 pages, Doc 0321.
Workman—"Dynamic Effects in BTG/SOI MOSFETs and Circuits Due to Distributed Body Resistance", Proceedings 1997 IEEE International SOI Conference, Oct. 1997, pp. 28-29, 2 pages, Doc 0322.
Shimomura—"A 1-V 46-ns 16-mb SOI-DRAM with Body Control Technique", IEEE Journal of Solid-State Circuits, vol. 32, No. 11, Nov. 1997, pp. 1712-1720, 9 pages, Doc 0323.
Edwards—"The Effect of Body Contact Series Resistance on SOI CMOS Amplifier Stages", IEEE Transactions on Electron Devices, vol. 44, No. 12, Dec. 1997, pp. 2290-2294, 5 pages, Doc 0325.
Caverly—"CMOS RF Circuits for Integrated Wireless Systems", IEEE 1998, pp. 1-4, 4 pages, Doc 0328.
Caverly—"Development of a CMOS Cell Library for RF Wireless and Telecommunications Applications", VLSI Symposium, 1998, 6 pages, Doc 0329.
Caverly—"Nonlinear Properties of Gallium Arsenide and Silicon FET-Based RF and Microwave Switches", IEEE 1998, pp. 1-4, 4 pages, Doc 0330.
Choumei—A High Efficiency, 2V Single Supply Voltage Operation RF Front End MMIC for 1.9GHz Personal Handy Phone Systems:, IEEE, 1998, pp. 73-76, 4 pages, Doc 0331.
Henshaw—"Design of an RF Transceiver", IEEE Colloquium on Analog Signal Processing, 1998, 6 pages, Doc 0332.

(56) References Cited

OTHER PUBLICATIONS

Johnson—"Advanced Thin Film Silicon-on-Sapphire Technology: Microwave Circuit Applications", IEEE Transactions on Electron Devices, vol. 45, No. 5, May 1988, pp. 1047-1054, 8 pages, Doc 0334 (A-B).
Larson—"Integrated Circuit Technology Options for RFICs—Present Status and Future Directions", IEEE Journal of Solid-State Circuits, 1998, pp. 387-399, 13 pages, Doc 0335.
Maas—"The RF and Microwave Circuit Design Cookbook", Artech House 1998, 149 pages, Doc 0336 (A-B).
Masuda—"High Power Heterojunction GaAs Switch IC with P-1dB of More than 38dBm for GSM Application", IEEE, 1998,pp. 229-232, 4 pages, Doc 0337.
Matsumoto—"A Novel High Frequency Quasi-SOI Power MOSFET for Multi-Gigahertz Application", IEEE, 1998, pp. 945-948, 4 pages, Doc 0338.
Megahed—"Low Cost UTSi Technology for RF Wireless Applications", Peregrine Semiconductor Corporation, IEEE MTT-S Digest, 1998, pp. 981-984, 4 pages, Doc 0339.
Moye—"A Compact Broadband, Six-Bit MMIC Phasor with Integrated Digital Drivers+", IEEE 1990 Microwave and Millimeter-Wave Monolithic Circuits Symposium, 1998 IEEE, pp. 123-126, 4 pages, Doc 0341.
Nakayama—"A 1.9 GHz Single-Chip RF Front-End GaAs MMIC with Low-Distortion Cascade FET Mixer for Personal Handy-Phone System Terminals", IEEE, 1998, pp. 101-104, Doc 0342.
Park—"A Regulated, Charge Pump CMOS DC/DC Converter for Low Power Application", 1998, pp. 1-62, 62 pages, Doc 0343.
Razavi—"RF Microelectronics", Prentice-Hall, 1998, 179 pages, Doc 0344.
Schindler—"DC-20 GHZ N X M Passive Switches", Raytheon Co., 1998 IEEE MTT-S Digest, pp. 1001-1005, 5 pages, Doc 0345.
Smith—"Modern Communication Circuits", McGraw-Hill 1998, 307 pages, Doc 0347 (A-D).
Stuber—"SOI CMOS with High Performance Passive Components for Analog, RF and Mixed Signal Designs", IEEE International SOI Conference, 1998, pp. 99-100, 2 pages, Doc 0348.
Tsutsumi—"A Single Chip PHS Front End MMIC with a True Single +3 Voltage Supply", IEEE Radio Frequency Integrated Circuits Symposium, 1998, pp. 105-108, 4 pages, Doc 0349.
Yamamoto—"Design and Experimental Results of a 2V-Operation Single Chip GaAs T/R MMIC Front-End for 1.9 GHz Personal Communications", IEEE 1998, pp. 7-12, 6 pages, Doc 0350.
Wei—"Effect of Floating-Body Charge on SOI MOSFET Design", IEEE Transaction on Electron Devices, vol. 45, No. 2, Feb. 1998, 9 pages, Doc 0352.
Koh—"Body-Contracted SOI MOSFET Structure and its Application to DRAM", IEEE Transactions on Electron Devices, vol. 45, No. 5, May 1998, pp. 1063-1070, 8 pages, Doc 0354.
Kawakyu—"A 2-V Operation Resonant Type T/R Switch with Low Distortion Characteristics for 1.9GHz PHS", IEICE Trans Electron, vol. E81-C, No. 6, Jun. 1998, pp. 862-867, 60 pages, Doc 0356.
Tseng—"Comprehensive Study on AC Characteristics in SOI MOSFETs for Analog Applications", 1998 Symposium on VLSI Technology Digest of Technical Papers, Jun. 1998, 2 pages, Doc 0357.
Rossek—"Direct Optical Control of a Microwave Phase Shifter Using GaAs Field-Effect Transistors", Communications Research Group, School of Electronic Engineering, Faculty of Technology, Middlesex University, Sep. 1998, 224 pages, Doc 0361.
Lee—"Effect of Body Structure on Analog Performance of SOI NMOSFETs", 1988 IEEE International SOI Conference, Oct. 1998, pp. 61-62, 2 pages, Doc 0365.
Pelella—"Control of Off-State Current in Scaled PD/SOI CMOS Digital Circuits", Proceedings IEEE Intl SOI Conference, Oct. 1998, pp. 147-148, 2 pages, Doc 0367.
Workman—"A Comparative Analysis of the Dynamic Behavior of BTG/SOI MOSFET's and Circuits with Distributed Body Resistance", IEEE Transactions and Electron Devices, vol. 45, No. 10, Oct. 1998, pp. 2138-2145, 8 pages, Doc 0368.

Mizutani—"Compact DC-60-GHz HJFET MMIC Switches using Ohmic Electrode-Sharing Technology", IEEE Transactions on Microwave Theory and Techniques, vol. 46, No. 11, Nov. 1998, pp. 1597-1603, 7 pages, Doc 0371.
Sleight—"Transient Measurements of SOI Body Contact Effectiveness", IEEE Electron Device Letters, vol. 19, No. 12, Dec. 1998, pp. 499-501, 3 pages, Doc 0373.
Analog Devices—"CMOS, Low Voltage RF/Video, SPST Switch", Analog Devices, Inc. 1999, pp. 1-10, 10 pages, Doc 0376.
Caverly—"High Power Gallium Nitride Devices for Microwave and RF Control Applications", 1999, pp. 1-30, 30 pages, Doc 0377.
Caverly—"Linear and Nonlinear Characteristics of the Silicon CMOS Monolithic 50-Omega Microwave and RF Control Element", IEEE Journal of Solid-State Circuits, vol. 34, No. 1, Jan. 1999, pp. 124-126, 3 pages, Doc 0378.
Derossi—"A Routing Switch Based on a Silicon-on-Insulator Mode Mixer", IEEE Photonics Technology Letters, 1999, pp. 194-196, 3 pages, Doc 0380.
Doyama—"Class E Power Amplifier for Wireless Transceivers", University of Toronto, 1999, pp. 1-59, 59 pages, Doc 0382.
Flandre—"Fully Depleted SOI CMOS Technology for Low Voltage Low Power Mixed Digital/Analog/Microwave Circuits", Analog Integrated Circuits and Signal Processing, 1999, pp. 213-228, 16 pages, Doc 0383.
Gil—"A High Speed and Low Power SOI Inverter Using Active Body-Bias", Solid-State Electronics, vol. 43, 1999, pp. 791-799, 9 pages, Doc 0384.
Harris—"CMOS Analog Switches", 1999, pp. 1-9, 9 pages, Doc 0385.
Harris Corporation—HI-5042 thru HI-5051 Datasheet, 1999, 9 pages, Doc 0386.
Hess—"Transformerless Capacitive Coupling of Gate Signals Operation of Power MOS Devices", IEEE 1999, pp. 673-675, 3 pages, Doc 0387.
Hu—"A Unified Gate Oxide Reliability Model", IEEE 37th Annual International Reliability Physic Symposium, 1999, pp. 47-51, 5 pages, Doc 0388.
Intersil—"Radiation Hardened CMOS Dual DPST Analog Switch", Intersil 1999, pp. 1-2, 2 pages, Doc 0391.
Lee—"CMOS RF: (Still) No Longer an Oxymoron (Invited)", IEEE Radio Frequency Integrated Circuits Symposium, 1999, pp. 3-6, 4 pages, Doc 0392.
Lindert—"Dynamic Threshold Pass-Transistor Logic for Improved Delay at Lower Power Supply Voltages", IEEE Journal of Solid-State Circuits, vol. 34, No. 1, Jan. 1999, pp. 85-89, 5 pages, Doc 0394.
Madihan—"CMOS RF Ics for 900MHz—2.4GHz Band Wireless Communications Networks", IEEE Radio Frequency Integrated Circuits Symposium, 1999, pp. 13-16, 4 pages, Doc 0395.
Masuda—"RF Current Evaluation of Ics by MP-10L", NEC Research and Development, vol. 40-41, 1999, pp. 253-258, 7 pages, Doc 0400.
Miller—"Modern Electronic Communications", Prentice-Hall 1999, 414 pages, Doc 0401 (A-E).
Nagayama—"Low Insertion Los DP3T MMIC Switch for Dual Band Cellular Phones", IEEE Journal of Solid State Circuits 1999, pp. 1051-1055, 5 pages, Doc 0402.
Newman—"Radiation Hardened Power Electronics", Intersil Corporation, 1999, pp. 1-4, 4 pages, Doc 0403.
Pelella—"Analysis and Control of Hysteresis in PD/SOI CMOS", University of Florida, Gainesville, FL, 1999, IEEE, pp. 34.5.1-34.5.4, 4 pages, Doc 0404.
Reedy—"Single Chip Wireless Systems Using SOI", IEEE International SOI Conference, 1999, pp. 8-11, 4 pages, Doc 0405.
Shahidi—"Partially Depleted SOI Technology for Digital Logic", IEEE Intl Solid-State Circuits Conference, 1999, pp. 426-427, 2 pages, Doc 0408.
Smuk—"Multi-Throw Plastic MMIC Switches Up to 6GHz with Integrated Positive Control Logic", IEEE 1999, pp. 259-262, 4 pages, Doc 0409.
Tseng—"Characterization of Floating Body and Body-Grounded Thin Film Silicon-on-Insulator MOSFETs for Analog Circuit Applications", Ph.D Thesis, UCLA, 1999, 240 pages, Doc 0410.

(56) References Cited

OTHER PUBLICATIONS

Wambacq—"A Single Package Solution for Wireless Transceivers", IEEE 1999, pp. 1-5, 5 pages, Doc 0411.
Wei—"Large-Signal Model of Triple-Gate MESFET/PHEMT for Switch Applications", Alpha Industries, Inc., 1999 IEEE, pp. 745-748, 4 pages, Doc 0412.
McRory—"Transformer Coupled Stacked FET Power Amplifier", IEEE Journal of Solid State Circuits, vol. 34, No. 2, Feb. 1999, pp. 157-161, 5 pages, Doc 0413.
Pelloie—"WP 25.2: SOI Technology Performance and Modeling", 1999 IEEE Intl. Solid-State Circuits Conference, Feb. 1999, 9 pages, Doc 0414.
Shoucair—"Modeling, Decoupling and Suppression of MOSFET Distortion Components", IEEE Proceeding Circuit Devices Systems, vol. 146, No. 1, Feb. 1999, 7 pages, Doc 0415.
Takamiya—"High-Performance Accumulated Black-Interface Dynamic Threshold SOI MOSFET (AB-DTMOS) with Large Body Effect at Low Supply Voltage", Japanese Journal of Applied Physics, vol. 38 (1999), Part 1, No. 4B, Apr. 1999, pp. 2483-2486, 4 pages, Doc 0416.
Ernst—"Detailed Analysis of Short-Channel SOI DT-MOSFET", Laboratoire de Physique des Composants a Semiconducteurs, Enserg, France, Sep. 1999, pp. 380-383, 4 pages, Doc 0421.
Ferlet-Cavrois—"High Frequency Characterization of SOI Dynamic Threshold. Voltage MOS (DTMOS) Transistors", 1999 IEEE International SOI Conference, Oct. 1999, pp. 24-25, 2 pages, Doc 0423.
Kuang—"A Dynamic Body Discharge Technique for SOI Circuit Applications", IEEE International SOI Conference, Oct. 1999, pp. 77-78, 2 pages, Doc 0424.
Adan—"Linearity and Low Noise Performance of SOI MOSFETs for RF Applications", IEEE International SOI Conference, 2000, pp. 30-31, 2 pages, Doc 0426.
Bernstein—"SOI Circuit Design Concepts", Springer Science + Business Media 2000, 239 pages, Doc 0427 (A-B).
Bolam—"Reliability Issues for Silicon-on-Insulator", IBM Microelectronics Division, IEEE 2000, pp. 6.4.1-6.4.4, 4 pages, Doc 0428.
Bullock—"Transceiver and System Design for Digital Communication", Noble 2000, 142 pages, Doc 0431 (A-B).
Caverly—"High Power Gallium Nitride Devices for Microwave and RF Control Applications", 2000, pp. 1-33, 35 pages, Doc 0432.
Caverly—"On-State Distortion in High Electron Mobility Transistor Microwave and RF Switch Control Circuits", IEEE Transactions on Microwave Theory and Techniques, 2000, pp. 98-103, 6 pages, Doc 0433.
Caverly—"SPICE Modeling of Microwave and RF Control Diodes", IEEE 2000, pp. 28-31, 4 pages, Doc 0434.
Cristoloveanu—"State-of-the-art and Future of Silicon on Insulator (SOI) Technologies, Materials and Devices", Microelectronics Reliability 40 (2000), pp. 771-777, 7 pages, Doc 0435.
Giugni—"A Novel Multi-Port Microwave/Millimeter-Wave Switching Circuit", Microwave Conference, 2000, 4 pages, Doc 0436.
Hittite Microwave—"Positive Bias GaAs Multi-Throw Switches with Integrated TTL Decoders", Hittite Microwave, 2000, 5 pages, Doc 0438.
Hittite Microwave—"Wireless Symposium 2000 is Stage for New Product Introductions", Hittite Microwave 2000, pp. 1-8, 8 pages, Doc 0439.
Huang—"A 900-MHz T/R Switch with a 0.8-dB Insertion Loss Implemented in a 0.5-um CMOS Process", IEEE Custom Integrated Circuits Conference, 2000, pp. 341-344, 4 pages, Doc 0440.
Kumar—"A Simple High Performance Complementary TFSOI BiCMOS Technology with Excellent Cross-Talk Isolation" IEEE International SOI Conference 2000, pp. 142-143, 2 pages, Doc 0444.
Lee—"Harmonic Distortion Due to Narrow Width Effects in Deep Submicron SOI-CMOS Device for Analog RF Applications", 2002 IEEE International SOI Conference, Oct. 2002, pp. 83-85, 3 pages, Doc 0445.

Montoriol—"3.6V and 4.8V GSM/DCS1800 Dual Band PA Application with DECT Capability Using Standard Motorola RFICs", 2000, p. 1-20, 20 pages, Doc 0446.
Silicon Wave—"Silicon Wave SiW1502 Radio Modem IC", Silicon Wave, 2000, pp. 1-21, 21 pages, Doc 0447.
Street—"R.F. Switch Design", The Institution of Electrical Engineers, 2000, pp. 4/1-4/7, 7 pages, Doc 0448.
Weigand—"An ASIC Driver for GaAs FET Control Components", Technical Feature, Applied Microwave & Wireless, 2000, pp. 42-48, 4 pages, Doc 0449.
Weisman—"The Essential Guide to RF and Wireless", Prentice-Hall 2000, 133 pages, Doc 0450 (A-B).
Hiramoto—"Low Power and Low Voltage MOSFETs with Variable Threshold Voltage Controlled by Back-Bias", IEICE Trans. Electron, vol. E83-C, No. 2, Feb. 2000, pp. 161-169, 9 pages, Doc 0437.
Lauterbach—"Charge Sharing Concept and New Clocking Scheme for Power Efficiency and Electromagnetic Emission Improvement of Boosted Charge Pumps", IEEE Journal of Solid-State Circuits, vol. 35, No. 5, May 2000, pp. 719-723, 5 pages, Doc 0453.
Yang—"Sub-100nm Vertical MOSFETs with Si1-x-y GexCy Source/Drains", a dissertation presented to the faculty of Princeton University, Jun. 2000, 272 pages, Doc 0455.
Wang—"A Novel Low-Voltage Silicon-on-Insulator (SOI) CMOS Complementary Pass-Transistor Logic (CPL) Circuit Using Asymmetrical Dynamic Threshold Pass-Transistor (ADTPT) Technique", Proceedings of the 43rd IEEE Midwest Symposium on Circuits and Systems, Aug. 2000, pp. 694-697, 4 pages, Doc 0458.
Rauly—"Investigation of Single and Double Gate SOI MOSFETs in Accumulation Mode for Enhanced Performances and Reduced Technological Drawbacks", Proceedings 30th European Solid-State Device Research Conference, Sep. 2000, pp. 540-543, 4 pages, Doc 0460.
Casu—"Comparative Analysis of PD-SOI Active Body-Biasing Circuits", IEEE Intl SOI Conference, Oct. 2000, pp. 94-95, 2 pages, Doc 0462.
Kuang—"A High-Performance Body-Charge-Modulated SOI Sense Amplifier", IEEE International SOI Conference, Oct. 2000, pp. 100-101, 2 pages, Doc 0463.
Saccamango—"An SOI Floating Body Charge Monitor Technique", IEEE International SOI Conference, Oct. 2000, pp. 88-89, 2 pages, Doc 0464.
Terauchi—"A Novel 4T SRAM Cell Using "Self-Body-Biased" SOI MOSFET Structure Operating as 0/5 Volt", IEEE International SOI Conference, Oct. 2000, pp. 108-109, 2 pages, Doc 0465.
Yeh—"High Performance 0.1 um Partially Depleted SOI CMOSFET", 2000 IEEE International SOI Conference, Oct. 2000, pp. 68-69, 2 pages, Doc 0466.
Assaderaghi—"DTMOS: Its Derivatives and Variations, and Their Potential Applications", The 12th Intl Conference on Microelectronics, Nov. 2000, pp. 9-10, 2 pages, Doc 0467.
Mashiko—"Ultra-Low Power Operation of Partially-Depleted SOI/CMOS Integrated Circuits", IEICE Transactions on Electronic Voltage, No. 11, Nov. 2000, pp. 1697-1704, 8 pages, Doc 0468.
Rozeau—"SOI Technologies Overview for Low Power Low Voltage Radio Frequency Applications", Analog Integrated Circuits and Signal Processing, Nov. 2000, pp. 93-114, 22 pages, Doc 0470.
Ajjkuttira—"A Fully Integrated CMOS RFIC for Bluetooth Applications", IEEE International Solid-State Circuits Conference, 2001, pp. 1-3, 3 pages, Doc 0473.
Caverly—"Gallium Nitride-Based Microwave and RF Control Devices", 2001, 17 pages, Doc 0475.
Chang—"Investigations of Bulk Dynamic Threshold-Voltage MOSFET with 65 GHz "Normal-Mode" Ft and 220GHz "Over-Drive Mode" Ft for RF Applications", Institute of Electronics, National Chiao-Tung University, Taiwan, 2001 Symposium on VLSI Technology Digest of Technical Papers, pp. 89-90, 2 pages, Doc 0476.
Couch—"Digital and Analog Communication Systems", 2001, Prentice-Hall, 398 pages, Doc 0477 (A-E).
Darabi—"A 2.4GHz CMOS Transceiver for Bluetooth", IEEE, 2001, pp. 89-92, 3 pages, Doc 0479.
Drake—"Dynamic-Threshold Logic for Low Power VLSI Design", www.research.ibm.com/acas, 2001, 5 pages, Doc 0480.

(56) References Cited

OTHER PUBLICATIONS

Drozdovsky—"Large Signal Modeling of Microwave Gallium Nitride Based HFETs", Asia Pacific Microwave Conference, 2001, pp. 248-251, 4 pages, Doc 0481.
Dunga—"Analysis of Floating Body Effects in Thin Film SOI MOSFETs Using the GIDL Current Technique", Proceedings of the 8th International Symposium on Physical and Failure Analysis of Integrated Circuits, 2001, pp. 254-257, 4 pages, Doc 0482.
Fiorenza—"RF Power Performance of LDMOSFETs on SOI: AN Experimental Comparison with Bulk Si MOSFETs", IEEE Radio Frequency Integrated Circuits Symposium, 2001, pp. 43-46, 4 pages, Doc 0483.
Fukuda—"SOI CMOS Device Technology", OKI Technical Review, Special Edition on 21st Century Solutions, 2001, pp. 54-57, 4 pages, Doc 0484.
Gould—"NMOS SPDT Switch MMIC with >48dB Isolation and 30dBm IIP3 for Applications within GSM and UMTS Bands", Bell Labs, 2001, pp. 1-4, 4 pages, Doc 0486.
Gu—"A High Performance GaAs SP3T Switch for Digital Cellular Systems", IEEE MTT-S Digest, 2001, pp. 241-244, 4 pages, Doc 0487.
Hittite Microwave—Floating Ground SPNT MMIC Switch Driver Techniques, 2001, 4 pages, Doc 0488.
Honeywell—"CMOS SOI Technology", 2001, pp. 1-7, 7 pages, Doc 0489.
Honeywell—"Honeywell SPDT Reflective RF Switch", Honeywell Advance Information, 2001, pp. 1-3, 3 pages, Doc 0490.
Huang—"A 2.4-GHz Single-Pole Double Throw T/R Switch with 0.8-dB Insertion Loss Implemented in a CMOS Process (slides)", Silicon Microwave Integrated Circuits and Systems Research, 2001, pp. 1-16, 16 pages, Doc 0492.
Huang—"A 2.4-GHz Single-Pole Double Throw T/R Switch with 0.8-dB Insertion Loss Implemented in a CMOS Process", Silicon Microwave Integrated Circuits and Systems Research, 2001, pp. 1-4, 4 pages, Doc 0493.
Huang—"Schottky Clamped MOS Transistors for Wireless CMOS Radio Frequency Switch Application", University of Florida, 2001, pp. 1-167, 167 pages, Doc 0494.
Itoh—"RF Technologies for Low Power Wireless Communications", Wiley, 2001, 244 pages, Doc 0495 (A-C).
Karandikar—"Technology Mapping for SOI Domino Logic Incorporating Solutions for the Parasitic Bipolar Effect", ACM 2001, pp. 1-14, 14 pages, Doc 0496.
Koh—"Low-Voltage SOI CMOS VLSI Devices and Circuits", Wiley Interscience, XP001090589, New York, 2001, 215 pages, Doc 0497 (A-C).
Koo—"RF Switches", Univ. Toronto, Elec. and Computer Engineering Dept. 2001, 12 pages, Doc 0498.
Kuo—"Low Voltage SOI CMOS VLSI Devices and Circuits", Wiley, 2001, pp. 57-60, 349-354, 215 pages, Doc 0499 (A-C).
Leenaerts—"Circuits Design for RF Transceivers", Kluwer Academic, 2001, 179 pages, Doc 0501 (A-B).
Marenk—"Layout Optimization of Cascode RF SOI Transistors", IEEE International SOI Conference, 2001, pp. 105-106, 2 pages, Doc 0502.
Misra—"Radio Frequency and Microwave Communication Circuits", Wiley 2001, 297 pages, Doc 0503 (A-C).
Morreale—The CRC Handbook of Modern Telecommunication:, CRC Press 2001, 228 pages, Doc 0504 (A-F).
Nakatani—"A Wide Dynamic Range Switched—LNA in SiGe BICMOS", IEEE Radio Frequency Integrated Circuits Symposium, 2001, pp. 223-226, 4 pages, Doc 0505.
Narendra—"Scaling of Stack Effects and its Application for Leakage Reduction", ISLPED 2001, 2001, pp. 195-200, 6 pages, Doc 0506.
Pozar—"Microwave and RF Design of Wireless Systems", Wiley 2001, 192 pages, Doc 0507 (A-B).
Reedy—"UTSi CMOS: A Complete RF SOI Solution", Peregrine Semiconductor Corporation, 2001, 6 pages, Doc 0509.

Salva (or Savla)—"Design and Simulation of a Low Power Bluetooth Transceiver", The University of Wisconsin, 2001, pp. 1-90, 90 pages, Doc 0510.
Sayre—"Complete Wireless Design", McGraw-Hill 2001, 284 pages, Doc 0511 (A-D).
Shimura—"High Isolation V-Band SPDT Switch MMIC for High Power Use", IEEE MTT-S International Microwave Symposium Digest, 2001, pp. 245-248, 4 pages, Doc 0512.
Sudhama—"Compact Modeling and Circuit Impact of Novel Frequency Dependence of Capacitance in RF MOSFETs", Nano Science and Technology Institute, Technical Proceedings of the 2001 Intl Conference of Modeling and Simulation of Microsystems, 4 pages, Doc 0513.
Wetzel—"Silicon-on-Sapphire Technology for Microwave Power Application", University of California, San Diego, 2001, 229 pages, Doc 0514 (A-B).
Cheng—"Gate-Channel Capacitance Characteristics in the Fully-Depleted SOI MOSFET", IEEE Transactions on Electron Devices, vol. 48, No. 2, Feb. 2001, pp. 388-391, 4 pages, Doc 0515.
Gritsch—"Influence of Generation/Recombination Effects in Simulations of Partially Depleted SOI MOSFETs", Solid-State Electronics 45 (2001), Received Dec. 22, 2000, accepted Feb. 14, 2001, pp. 621-627, 7 pages, Doc 0516.
Huang—"A 0.5-um CMOS T/R Switch for 900-MHz Wireless Applications", IEEE Journal of Solid-State Circuits, vol. 36, No. 3, Mar. 2001, pp. 486-492, 8 pages, Doc 0517.
Adriaensen—"Analysis and Potential of the Bipolar- and Hybrid-Mode Thin-Film SOI MOSFETs for High-Temperature Applications", Laboratoire de Macroelectronique, Universite Catholique de Louvain, May 2001, 5 pages, Doc 0519.
Chung—"SOI MOSFET Structure with a Junction Type Body Contact for Suppression of Pass Gate Leakage", IEEE Transactions on Electron Devices, vol. 48, No. 7, Jul. 2001, pp. 1360-1365, 6 pages, Doc 0520.
Burgener—"CMOS SOS Switches Offer Useful Features, High Integration", CMOS SOS Switches, Microwaves & RF, Aug. 2001, pp. 107-118, 7 pages, Doc 0523.
Casu—"Synthesis of Low-Leakage PD-SOI Circuits with Body Biasing", Intl Symposium on Low Power Electronics and Design, pp. 287-290, Aug. 6-7, 2001, 4 pages, Doc 0524.
Makioka—"Super Self Aligned GaAs RF Switch IC with 0.25dB Extremely Low Insertion Loss for Mobile Communication Systems", IEEE Transactions on Electron Devices, vol. 48, No. 8, Aug. 2001, pp. 1510-1514, 2 pages, Doc 0525.
Dehan—"Alternative Architectures of SOI MOSFET for Improving DC and Microwave Characteristics", Microwave Laboratory, Universite Catholique de Louvain, Sep. 2001, 4 pages, Doc 0529.
Texas Instruments—"TPS60204, TPS60205, Regulated 3.3-V, 100-mA Low-Ripple Charge Pump Low Power DC/DC Converters", published Feb. 2001, rev. Sep. 2001, pp. 1-18, 18 pages, Doc 0530.
Casu—"High Performance Digital CMOS Circuits in PD-SOI Technology: Modeling and Design", Tesi di Dottorato di Recerca, Gennaio 2002, Politecnico di Torina, Corso di Dottorato di Ricerca in Ingegneria Elettronica e delle Communicazioni, 200 pages, Doc 0532.
De Boer—"Highly Integrated X-Band Multi-Function MMIC with Integrated LNA and Driver Amplifier", TNO Physics and Electronics Laboratory, 2002, pp. 1-4, 4 pages, Doc 0534.
Hanzo—"Adaptive Wireless Transceivers", Wiley, 2002, 379 pages, Doc 0535 (A-E).
Honeywell—"CMOS SOI RF Switch Family", 2002, pp. 1-4, 4 pages, Doc 0536.
Honeywell—"Honeywell SPDT Absorptive RF Switch", Honeywell, 2002, pp. 1-6, 6 pages, Doc 0537.
Koudymov—"Low Loss High Power RF Switching Using Multifinger AlGaN/GaN MOSHFETs", University of South Carolina Scholar Commons, 2002, pp. 449-451, 5 pages, Doc 0539.
Lee—"Analysis of Body Bias Effect with PD-SOI for Analog and RF Application", Solid State Electron, vol. 46, 2002, pp. 1169-1176, 8 pages, Doc 0540.
Marshall—"SOI Design: Analog, Memory, and Digital Techniques", Kluwer Academic Publishers, 2002, 414 pages, Doc 0543.

(56) References Cited

OTHER PUBLICATIONS

Numata—"A +2.4/0 V Controlled High Power GaAs SPDT Antenna Switch IC for GSM Application", IEEE Radio Frequency Integrated Circuits Symposium, 2002, pp. 141-144, 4 pages, Doc 0544.
O—"CMOS Components for 802.11b Wireless LAN Applications", IEEE Radio Frequency Integrated Circuits Symposium, 2002, pp. 103-106, 4 pages, Doc 0545.
Ohnakado—"A 1.4dB Insertion Loss, 5GHz Transmit/Receive Switch Utilizing Novel Depletion-Layer Extended Transistors (DETs) in 0.18um CMOS Process", Symposium on VLSI Circuits Digest of Technical Papers, 2002, pp. 162-163, 2 pages, Doc 0546.
Peczalski—"RF/Analog/Digital SOI Technology GPS Receivers and Other Systems on a Chip", IEEE Aerospace Conference Proceedings, 2002, pp. 2013-2017, 5 pages, Doc 0547.
Shafi—"Wireless Communications in the 21st Century", Wiley, 2002, 230 pages, Doc 0548 (A-C).
Tinella—"A 0.7DB Insertion Loss CMOS-SOI Antenna Switch with More than 50dB Isolation Over the 2.5 to 5GHz Band", Proceeding of the 28th European Solid-State Circuits Conference, 2002, pp. 483-486, 4 pages, Doc 0549.
Van Der Pujie—"Telecommunication Circuit Design", Wiley 2002, 225 pages, Doc 0550 (A-C).
Hameau—"Radio-Frequency Circuits in Integration Using CMOS SOI 0.25um Technology", 2002 RF IC Design Workshop Europe, Mar. 2002, Grenoble, France, 6 pages, Doc 0551.
Harneau—"Radio-Frequency Circuit Integration Using CMOS SOI 0.25um Technology", 2002 RF IC Design Workshop Europe, Mar. 19-22, 2002, Grenoble, France, 6 pages, Doc 0552.
Sivaram—"Silicon Film Thickness Considerations in SOI-DTMOS", IEEE Device Letters, vol. 23, No. 5, May 2002, pp. 276-278, 3 pages, Doc 0556.
Han—"A Simple and Accurate Method for Extracting Substrate Resistance of RF MOSFETs", IEEE Electron Device Letters, vol. 23, No. 7, Jul. 2002, pp. 434-436, 3 pages, Doc 0557.
Das—"A Novel Sub-1 V High Speed Circuit Design Technique in Partially Depleted SOI-CMOS Technology with Ultra Low Leakage Power", Proceedings of the 28th European Solid-State Circuits Conference, Sep. 2002, pp. 24-26, 22 pages, Doc 0559.
Das—"A Novel Sub-1 V High Speed Circuit Design Technique in Partially Depleted SOI-CMOS Technology with Ultra Low Leakage Power", Proceedings of the 28th European Solid-State Circuits Conference, Sep. 2002, pp. 267-270, 4 pages, Doc 0560.
Bahl—"Lumped Elements for RF and Microwave Circuits", Artech House, 2003. pp. 353-394, 58 pages, Doc 0563.
Das—"Ultra-Low-Leakage Power Strategies for Sub-1 V VLSI: Novel Circuit Styles and Design Methodologies for Partially Depleted Silicon-on-Insulator (PD-SOI) CMOS Technology", Proceedings of the 16th Intl. Conference on VLSI Design, 2003, 6 pages, Doc 0564.
Gu—"A 2.3V PHEMT Power SP3T Antenna Switch IC for GSM Handsets", IEEE GaAs Digest, 2003, pp. 48-51, 4 pages, Doc 0561.
Gu—"A High Power DPDT MMIC Switch for Broadband Wireless Applications", IEEE MTT-S Digest, 2003, pp. 173-176, 4 pages, Doc 0568.
Hirano—"Impact of Actively Body Bias Controlled (ABC) SOI SRAM by Using Direct Body Contact Technology for Low Voltage Application," IEEE, 2003, pp. 2.4.1-2.4.4, 4 pages, Doc 0569.
Huang—"Hot Carrier Degradation Behavior in SOI Dynamic-Threshold-Voltage nMOSFETs (n-DTMOSFET) Measured by Gated-Diode Configuration", Microelectronics Reliability 43 (2003) pp. 707-711, 5 pages, Doc 0572.
Lederer—"Frequency Degradation of SOI MOS Device Output Conductance", Microwave Laboratory of Universite Catholique de Louvain, Belgium, IEEE 2003, pp. 76-77, 2 pages, Doc 0573.
Minoli—"Telecommunications Technology Handbook", Artech House 2003, 408 pages, Doc 0576 (A-F).
NEC—"RF & Microwave Device Overview 2003—Silicon and GaAs Semiconductors", NEC 2003, 73 pages, Doc 0577.
Numata—"A High Power Handling GSM Switch IC with New Adaptive Control Voltage Generator Circuit Scheme", IEEE Radio Frequency Integrates Circuits Symposium, 2003, pp. 233-236, 4 pages, Doc 0578.
Pylarinos—"Charge Pumps: An Overview", Proceedings of the IEEE International Symposium on Circuits and Systems, 2003, pp. 1-7, 7 pages, Doc 0579.
Ytterdal—"MOSFET Device Physics and Operation", Device Modeling for Analog and RF CMOS Circuit Design, 2003, John Wiley & Sons, Ltd., 46 pages, Doc 0581.
Su—"On the Body-Source Built-In Potential Lowering of SOI MOSFETs", IEEE Electron Device Letters, vol. 24, No. 2, Feb. 2003, pp. 90-92, 3 pages, Doc 0582.
Cho—"Comparative Assessment of Adaptive Body-Bias SOI Pass-Transistor Logic", Fourth Intl Symposium on Quality Electronic Design, Mar. 2003, pp. 55-60, 6 pages, Doc 0583.
Terauchi—"A Self-Body-Bias" SOI MOSFET: A Novel Body-Voltage-Controlled SOI MOSFET for Low Voltage Applications, The Japan Society of Applied Physics, vol. 42 (2003), pp. 2014-2019, Part 1, No. 4B, Apr. 2003, 6 pages, Doc 0587.
Dehan—"Partially Depleted SOI Dynamic Threshold MOSFET for Low-Voltage and Microwave Applications" 203rd Meeting of the Electrochemical Society—11th Int. Symp. on SOI technology and devices, Paris, France , 2003 1 page, Doc 1080.
Tinella—"A High Performance CMOS-SOI Antenna Switch for the 2.5-5-GHz Band", IEEE Journal of Solid-State Circuits, vol. 38, No. 7, Jul. 2003, pp. 1270-1283, 5 pages, Doc 0588.
Drake—"Analysis of the Impact of Gate-Body Signal Phase on DTMOS Inverters in 0.13um PD-SOI", Department of EECS, University of Michigan, Ann Arbor, MI, Sep./Oct. 2003, 16 pages, Doc 0591.
Drake—"Analysis of the Impact of Gate-Body Signal Phase on DTMOS Inverters in 0.13um PD-SOI", Department of EECS, University of Michigan, Ann Arbor, MI, Sep./Oct. 2003, 4 pages, Doc 0592.
Lederer—"Frequency Degradation of SOI MOS Device Output Conductance", Microwave Laboratory of Universite Catholique de Louvain, Belgium, Sep./Oct. 2003, 1 page, Doc 0593.
Bernstein—"Design and CAD Challenges in sub-90nm CMOS Technologies", IBL Thomas J. Watson Research Center, NY, Nov. 11-13, 2003, pp. 129-136, 8 pages, Doc 0595.
Drake—"Evaluation of Dynamic-Threshold Logic for Low-Power VLSI Design in 0.13um PD-SOI", University of Michigan, Ann Arbor, MI, Dec. 2003, 29 pages, Doc 0596.
Drake—Evaluation of Dynamic-Threshold Logic for Low-Power VLSI Design in 0.13um PD-SOI:, IFIP VLSI-SoC 2003, IFIP WG 10.5 International Conference on Very Large Scale Integration of System-on-Chip, Darmstadt, Germany, Dec. 1-3, 2003, 6 pages, Doc 0597.
Bonkowski—"Integration of Triple Band GSM Antenna Switch Module Using SOI CMOS", IEEE Radio Frequency Integrated Circuits Symposium, 2004, pp. 511-514, 4 pages, Doc 0598.
Gu—"Low Insertion Loss and High Linearity PHEMT SPDT and SP3T Switch ICS for WLAN 802.11a/b/g Application", 2004 IEEE Radio Frequency Integrated Circuits Symposium, 2004, pp. 505-508, 4 pages, Doc 0600.
Kelly—"Integrated Ultra CMIS Designs in GSM Front End", Wireless Design Magazine, 2004, pp. 18-22, 4 pages, Doc 0601.
Wang—"A Robust Large Signal Non-Quasi-Static MOSFET Model for Circuit Simulation", IEEE 2004 Custom Integrated Circuits Conference, pp. 2-1-1-2-1-4, 4 pages, Doc 0603.
Chao—"High-Voltage and High-Temperature Applications of DTMOS with Reverse Schottky Barrier on Substrate Contacts", vol. 25, No. 2, Feb. 2004, pp. 86-88, 3 pages, Doc 0605.
Bawedin—"Unusual Floating Body Effect in Fully Depleted MOSFETs", IMEP, Enserg, France and Microelectronics Laboratory, Universite Catholique de Louvain, Belgium, Oct. 2004, 22 pages, Doc 0614.
Damiano—"Integrated Dynamic Body Contact for H Gate PD SOI MOSFETs for High Performance/Low Power", IEEE SOI Conference, Oct. 2004, pp. 115-116, 2 pages, Doc 0615.

(56) References Cited

OTHER PUBLICATIONS

Goo—"History-Effect-Conscious SPICE Model Extraction for PD-SOI Technology", 2004 IEEE International SOI Conference, Oct. 2004, pp. 156-158, 3 pages, Doc 0616.
Kuang—A Floating-Body Charge Monitoring Technique for Partially Depleted SOI Technology:, International Journal of Electronics, vol. 91, No. 11, 2004, pp. 625-637, 13 pages, Doc 0618.
Wiatr—"Impact of Floating Silicon Film on Small-Signal Parameters of Fully Depleted SOI-MOSFETs Biased into Accumulation", Solid-State Electronics 49 (2005), Received Sep. 11, 2003, revised Nov. 9, 2004, pp. 779-789, 11 pages, Doc 0619.
Dehan—"Dynamic Threshold Voltage MOS in Partially Depleted SOI Technology: A Wide Frequency Band Analysis", Solid-State Electronics 49 (2005), pp. 67-72, 6 pages, Doc 0622.
Lee—"Effects of Gate Structures on the RF Performance in PD SOI MESFETs", IEEE Microwave and Wireless Components Letters, vol. 15, No. 4, Apr. 2005, pp. 223-225, 3 pages, Doc 0625.
Sjoblom—"An Adaptive Impedance Tuning CMOS Circuit for ISM 2.4-GHz Band", IEEE Transactions on Circuits and Systems—I: Regular Papers, vol. 52, No. 6, Jun. 2005, pp. 1115-1124, 10 pages, Doc 0627.
Su—"On the Prediction of Geometry-Dependent Floating-Body Effect in SOI MOSFETs", IEEE Transactions on Electron Devices, vol. 52, No. 7, Jul. 2005, pp. 1662-1664, 3 pages, Doc 0630.
Iijima—"Boosted Voltage Scheme with Active Body-Biasing Control on PD-SOI for Ultra Low Voltage Operation", IEICE Transactions on Electronics, Institute of Electronics, Tokyo, JP, vol. E90C, No. 4, Apr. 1, 2007, pp. 666-674, 9 pages, Doc 0655.
Willert-Porada—"Advances in Microwave and Radio Frequency Processing", 8th International Conference on Microwave and High-Frequency Heating, Oct. 2009, 408 pages, Doc 0714 (A-F).
RFMD's Petition for Inter Partes Review of U.S. Pat. No. 8,405,147 Under 35 U.S.C. 311 filed Mar. 27, 2014 in IPR2014-00546, 7810 pages, Doc 8086A-8086U.
RFMD's Corrected Petition for Inter Partes Review of U.S. Pat. No. 8,405,147 under 35 U.S.C. 311 filed Apr. 14, 2014 in IPR2014-00546, 64 pages, Doc 8087.
RFMD's Corrected Petition for Inter Partes Review of U.S. Pat. No. 8,405,147 under 35 U.S.C. 311 (Redline Copy) filed Apr. 14, 2014 in IPR2014-00546, 68 pages, Doc 8088.
Peregrine's Patent Owner Preliminary Response Pursuant to 37 C.F.R. 42.107 filed Jul. 10, 2014 in IPR2014-00546, 101 pages, Doc 8089.
Brinkman—Respondents' Notice of Prior Art, Investigation No. 337-TA-848, dated Aug. 31, 2012, 59 pages, Doc 0825.
Burgener—U.S. Appl. No. 10/267,531, filed Oct. 8, 2002, 72 pages, Doc 4339.
USPTO—Notice to File Corrected Application Papers dated Nov. 12, 2002 for U.S. Appl. No. 10/267,531, 1 page, Doc 4340.
Burgener—Response to Notice to File Corrected Application Papers and Replacement Figures dated Jan. 13, 2003 for U.S. Appl. No. 10/267,531, 16 pages, Doc 4341.
Burgener—Power of Attorney for Peregrine Semiconductor dated Feb. 4, 2003 for U.S. Appl. No. 10/267,531, 3 pages, Doc 4342.
USPTO—Acceptance of Power of Attorney dated Jan. 2, 2004 for U.S. Appl. No. 10/267,531, 1 page, Doc 4343.
USPTO—Notice of Allowance dated May 12, 2004 for U.S. Appl. No. 10/267,531, 32 pages, Doc 4344.
Burgener—Issue Fee Payment and Comments on Reasons for Allowance dated Aug. 12, 2004 for U.S. Appl. No. 10/267,531, 3 pages, Doc 4345.
Burgener—Request for Certificate of Correction dated Feb. 10, 2005 for U.S. Appl. No. 10/267,531, 2 pages, Doc 4346.
USPTO—Certificate of Correction dated Apr. 26, 2005 for U.S. Appl. No. 10/267,531, 1 page, Doc 4347.
Burgener—Request for Certificate of Correction dated Dec. 13, 2006 for U.S. Appl. No. 10/267,531, 1 page, Doc 4348.
USPTO—Certificate of Correction dated May 1, 2007 for U.S. Appl. No. 10/267,531, pages, Doc 4349.
Burgener—U.S. Appl. No. 10/922,135, filed Aug. 18, 2004, 63 pages, Doc 4350.
USPTO—Office Action dated Jun. 3, 2005 for U.S. Appl. No. 10/922,135, 11 pages, Doc 4351.
Burgener—Amendment dated Dec. 7, 2005 for U.S. Appl. No. 10/922,135, 10 pages, Doc 4352.
USPTO—Final Office Action dated Jan. 17, 2006 for U.S. Appl. No. 10/922,135, 9 pages, Doc 4353.
Burgener—Amendment dated May 19, 2006 for U.S. Appl. No. 10/922,135, 6 pages, Doc 4354.
USPTO—Notice of Allowance dated Jun. 2, 2006 for U.S. Appl. No. 10/922,135, 11 pages, Doc 4355.
Burgener—Issue Fee Payment dated Sep. 8, 2006 for U.S. Appl. No. 10/922,135, 1 page, Doc 4356.
Burgener—Request for Certificate of Correction dated Jul. 1, 2008 for U.S. Appl. No. 10/922,135, 3 pages, Doc 4358.
USPTO—Certificate of Correction dated Aug. 12, 2008 for U.S. Appl. No. 10/922,135, 1 page, Doc 4359.
Burgener—Amendment after final dated Apr. 25, 2009 for U.S. Appl. No. 10/922,135, 7 pages, Doc 4357.
USPTO—Report on the Determination of an Action Regarding a Patent or Trademark 3:12-cv-1160-CAB-BGS dated Jun. 11, 2012 for U.S. Appl. No. 110/922,135, 1 page, Doc 4360.
USPTO—Report on the Determination of an Action Regarding a Patent or Trademark 1:12CV377 dated Jul. 11, 2012 for U.S. Appl. No. 10/922,135, 13 pages, Doc 4361.
USPTO—Report on the Determination of an Action Regarding a Patent or Trademark 3:12-CV-1160-CAB-BGS) dated Apr. 15, 2013 for U.S. Appl. No. 10/922,135, 1 page, Doc 4363.
USPTO—Report on the Determination of an Action Regarding a Patent or Trademark SACV12-248 JST(RNBx) dated Dec. 21, 2013 for U.S. Appl. No. 10/922,135, 1 page, Doc 4362.
Burgener—Change of Address and Notification of Loss of Small Entity Status dated Mar. 5, 2014 for U.S. Appl. No. 10/922,135, 5 pages, Doc 4364.
USPTO—Report on the Determination of an Action Regarding a Patent or Trademark 3:12-CV-0911-AJB-WMC) dated Oct. 14, 2014 for U.S. Appl. No. 10/922,135, 1 page, Doc 4365.
Burgener—Notification of Loss of Small Entity Status dated Jun. 5, 2017 for U.S. Appl. No. 10/922,135, 1 page, Doc 4366.
Burgener—U.S. Appl. No. 11/582,206, filed Oct. 16, 2006, 65 pages, Doc 4385.
USPTO—Filing Receipt dated Nov. 3, 2006 for U.S. Appl. No. 11/582,206, 3 pages, Doc 4386.
USPTO—Notice of Publication dated May 31, 2007 for U.S. Appl. No. 11/582,206, 1 page, Doc 4387.
USPTO—Office Action dated Nov. 15, 2007 for U.S. Appl. No. 11/582,206, 12 pages, Doc 4388.
Burgener—Amendment and Terminal Disclaimers dated May 19, 2008 for U.S. Appl. No. 11/582,206, 15 pages, Doc 4389.
Tieu—Notice of Allowance dated Jul. 15, 2008 for U.S. Appl. No. 11/582,206, 12 pages, Doc 0668.
USPTO—Notice of Allowance dated Jul. 15, 2008 for U.S. Appl. No. 11/582,206, 12 pages, Doc 4390.
Burgener—Issue Fee Payment dated Oct. 20, 2008 for U.S. Appl. No. 11/582,206, 2 pages, Doc 4391.
USPTO—Supplemental Non-Final Rejection dated Oct. 30, 2008 for U.S. Appl. No. 11/582,206, 4 pages, Doc 4392.
USPTO—Issue Notification dated Nov. 12, 2008 for U.S. Appl. No. 11/582,206, 1 page, Doc 4393.
USPTO—Report on the Filing or Determination of an Action Regarding a Patent 3:12-cv-001160-CAB-BGS dated Jun. 11, 2012 for U.S. Appl. No. 11/582,206, 1 page, Doc 4394.
USPTO—Report on the Filing or Determination of an Action Regarding a Patent 8:12-cv-00248-JST-RNB dated Feb. 21, 2013 for U.S. Appl. No. 11/582,206, 1 page, Doc 4396.
USPTO—Report on the Filing or Determination of an Action Regarding a Patent 8:12-cv-1160-CAB-BGS dated Apr. 15, 2013 for U.S. Appl. No. 11/582,206, 1 page, Doc 4397.
USPTO—Report on the Filing or Determination of an Action Regarding a Patent 8:12-cv-00911-AJB-WMC dated Oct. 14, 2014 for U.S. Appl. No. 11/582,206, 1 page, Doc 4398.

(56) References Cited

OTHER PUBLICATIONS

Burgener—Notification of Loss of Small Entity Status dated Sep. 9, 2015 for U.S. Appl. No. 11/582,206, 1 page, Doc 4399.
Burgener—U.S. Appl. No. 12/315,395, filed Dec. 1, 2008, 65 pages, Doc 4400.
USPTO—Notice of Publication dated May 7, 2009 for U.S. Appl. No. 12/315,395, 1 page, Doc 4402.
USPTO—Notice of Allowance dated Aug. 11, 2010 for U.S. Appl. No. 12/315,395, 33 pages, Doc 4403.
USPTO—Supplemental Notice of Allowability dated Oct. 29, 2010 for U.S. Appl. No. 12/315,395, 10 pages, Doc 4404.
Burgener—Issue Fee Payment dated Nov. 16, 2010 for U.S. Appl. No. 12/315,395, 1 page, Doc 4405.
USPTO—Issue Notification dated Dec. 8, 2010 for U.S. Appl. No. 12/315,395, 1 page, Doc 4406.
USPTO—Report on the Filing or Determination of an Action Regarding a Patent 3:12-cv-001160-CAB-BGS dated Jun. 11, 2012 for U.S. Appl. No. 12/315,395, 1 page, Doc 4407.
USPTO—Report on the Filing or Determination of an Action Regarding a Patent 1:12cv377 dated Jul. 11, 2012 for U.S. Appl. No. 12/315,395, 13 pages, Doc 4408.
USPTO—Report on the Filing or Determination of an Action Regarding a Patent 8:12-cv-1160-CAB-BGS dated Apr. 15, 2013 for U.S. Appl. No. 12/315,395, 1 page, Doc 4409.
Burgener—Change of Address and Notification of Loss of Small Entity Status dated Mar. 7, 2014 for U.S. Appl. No. 12/315,395, 5 pages, Doc 4410.
USPTO—Report on the Filing or Determination of an Action Regarding a Patent dated Oct. 14, 2014 for U.S. Appl. No. 12/315,395, 1 page, Doc 4411.
Burgener—Request for Certificate of Correction dated Mar. 7, 2016 for U.S. Appl. No. 12/315,395, 5 pages, Doc 4412.
USPTO—Certificate of Correction dated May 10, 2016 for U.S. Appl. No. 12/315,395, 1 page, Doc 4413.
Burgener—Notification of Loss of Small Entity Status dated Jun. 5, 2017 for U.S. Appl. No. 12/315,395, 1 page, Doc 4414.
USPTO—Filing Receipt dated Jan. 27, 2019 for U.S. Appl. No. 12/315,395, 3 pages, Doc 4401.
Burgener—U.S. Appl. No. 12/980,161, filed Dec. 28, 2010, 68 pages, Doc 4415.
USPTO—Filing Receipt dated Jan. 13, 2011 for U.S. Appl. No. 12/980,161, 4 pages, Doc 4416.
USPTO—Notice of Publication dated Apr. 21, 2011 for U.S. Appl. No. 12/980,161, 1 page, Doc 4417.
Burgener—Preliminary Amendment dated Apr. 27, 2012 for U.S. Appl. No. 12/980,161, 28 pages, Doc 4418.
USPTO—Notice of Non-Compliant Amendment dated May 1, 2012 for U.S. Appl. No. 12/980,161, 2 pages, Doc 4419.
Burgener—Response to Notice of Non-Compliant Amendment—Preliminary Amendment dated May 17, 2012 for U.S. Appl. No. 12/980,161, 6 pages, Doc 4420.
USPTO—Office Action dated Feb. 19, 2013 for U.S. Appl. No. 12/980,161, 106 pages, Doc 4421.
Burgener—Amendment and Terminal Disclaimers dated Aug. 19, 2013 for U.S. Appl. No. 12/980,161, 32 pages, Doc 4422.
USPTO—Terminal Disclaimer Decision dated Aug. 21, 2013 for U.S. Appl. No. 12/980,161, 1 page, Doc 4423.
USPTO—Notice of Allowance dated Sep. 30, 2013 for U.S. Appl. No. 12/980,161, 186 pages, Doc 4424.
Burgener—Issue Fee Payment dated Oct. 8, 2013 for U.S. Appl. No. 12/980,161, 6 pages, Doc 4425.
USPTO—Issue Notification dated Oct. 23, 2013 for U.S. Appl. No. 12/980,161, 1 page, Doc 4426.
Burgener—Change of Address dated Nov. 8, 2013 for U.S. Appl. No. 12/980,161, 4 pages, Doc 4427.
Burgener—Request for Certificate of Correction dated Aug. 29, 2014 for U.S. Appl. No. 12/980,161, 7 pages, Doc 4428.
USPTO—Certificate of Correction dated Oct. 21, 2014 for U.S. Appl. No. 12/980,161, 1 page, Doc 4429.
Burgener—Notice of Loss of Small Entity Status dated Aug. 18, 2016 for U.S. Appl. No. 12/980,161, 1 page, Doc 4430.
Burgener—U.S. Appl. No. 14/062,791, filed Oct. 24, 2013, 66 pages, Doc 4431.
USPTO—Filing Receipt and Notice to File Missing Parts dated Nov. 12, 2013 for U.S. Appl. No. 14/062,791, 6 pages, Doc 4432.
Burgener—Response to Pre-Exam Formalities Notice dated Jan. 13, 2014 for U.S. Appl. No. 14/062,791, 15 pages, Doc 4470.
USPTO—Updated Filing Receipt and Acceptance of Power of Attorney dated Mar. 20, 2014 for U.S. Appl. No. 14/062,791, 5 pages, Doc 4471.
USPTO—Office Action dated Jun. 24, 2014 for U.S. Appl. No. 14/062,791, 10 pages, Doc 4472.
USPTO—Notice of Publication dated Jun. 30, 2014 for U.S. Appl. No. 14/062,791, 1 page, Doc 4473.
Burgener—Amendment and Terminal Disclaimer filed Nov. 24, 2014 for U.S. Appl. No. 14/062,791, 18 pages, Doc 4474.
USPTO—Terminal Disclaimer Decision dated Dec. 9, 2014 for U.S. Appl. No. 14/062,791, 1 page, Doc 4475.
USPTO—Notice of Allowance dated Jan. 23, 2015 for U.S. Appl. No. 14/062,791, 15 pages, Doc 4476.
USPTO—Notice of Allowance dated May 14, 2015 for U.S. Appl. No. 14/062,791, 11 pages, Doc 4477.
Burgener—Request for Continued Examination filed Aug. 14, 2015 in U.S. Appl. No. 14/062,791, 3 pages, Doc 4478.
USPTO—Notice of Allowance dated Sep. 4, 2015 for U.S. Appl. No. 14/062,791, 17 pages, Doc 4479.
Burgener—Issue Fee Payment dated Oct. 7, 2015 for U.S. Appl. No. 14/062,791, 5 pages, Doc 4480.
USPTO—Notice of Allowance dated Oct. 16, 2015 for U.S. Appl. No. 14/062,791, 8 pages, Doc 4481.
USPTO—Issue Notification dated Dec. 9, 2015 for U.S. Appl. No. 14/062,791, 1 page, Doc 4482.
Burgener—Application dated Oct. 14, 2015, U.S. Appl. No. 14/883,499, 66 pages, Doc 6025.
USPTO—Filing Receipt dated Nov. 2, 2015, U.S. Appl. No. 14/883,499, 4 pages, Doc 6026.
USPTO—Notice of Missing Parts dated Nov. 2, 2015, U.S. Appl. No. 14/883,499, 2 pages, Doc 6027.
Bergener—Response to Missing Parts dated Jan. 4, 2016, U.S. Appl. No. 14/883,499, 15 pages, Doc 6028.
USPTO—Updated Filing Receipt dated Mar. 24, 2016, U.S. Appl. No. 14/883,499, 6 pages, Doc 6029.
USPTO—Notice of Publication dated Jun. 30, 2016, U.S. Appl. No. 14/883,499, 1 page, Doc 6030.
USPTO—Office Action dated Oct. 4, 2016, U.S. Appl. No. 14/883,499, 26 pages, Doc 6031.
Burgener—Response to Office Action dated Feb. 3, 2017, U.S. Appl. No. 14/883,499, 16 pages, Doc 6032.
USPTO—Final Office Action dated May 18, 2017, U.S. Appl. No. 14/883,499, 24 pages, Doc 6033.
Burgener—Response to Final Office Action & Terminal Disclaimers dated May 26, 2017, U.S. Appl. No. 14/883,499, 19 pages, Doc 6034.
USPTO—Terminal Disclaimer Decision dated May 30, 2017, U.S. Appl. No. 14/883,499, 1 page, Doc 6035.
USPTO—Notice of Allowance dated Jun. 8, 2017, U.S. Appl. No. 14/883,499, 21 pages, Doc 6036.
Burgener—Issue Fee Payment dated Jul. 10, 2017, U.S. Appl. No. 14/883,499, 8 pages, Doc 6037.
Burgener—RCE dated Jul. 13, 2017, U.S. Appl. No. 14/883,499, 3 pages, Doc 6038.
Burgener—Petition to Accept Delayed Priority Claim dated Jul. 17, 2017, U.S. Appl. No. 14/883,499, 13 pages, Doc 6041.
USPTO—Notice of Allowance dated Aug. 3, 2017, U.S. Appl. No. 14/883,499, 42 pages, Doc 6042.
USPTO—Corrected Filing Receipt dated Aug. 17, 2017, U.S. Appl. No. 14/883,499, 4 pages, Doc 6043.
USPTO—Decision on Petition to Accept Delayed Priority Claim dated Aug. 21, 2017, U.S. Appl. No. 14/883,499, 9 pages, Doc 6044.
Burgener—Issue Fee Payment dated Aug. 22, 2017, U.S. Appl. No. 14/883,499, 7 pages, Doc 6045.

(56) References Cited

OTHER PUBLICATIONS

USPTO—Acceptance of Publication Request dated Aug. 23, 2017, U.S. Appl. No. 14/883,499, 1 page, Doc 6046.
USPTO—Supplemental Notice of Allowability dated Aug. 30, 2017, U.S. Appl. No. 14/883,499, 6 pages, Doc 6047.
USPTO—Issue Notification dated Sep. 13, 2017, U.S. Appl. No. 14/883,499, 1 page, Doc 6048.
Burgener—U.S. Appl. No. 15/656,953 filed Jul. 21, 2017, 71 pages, Doc 6005.
USPTO—Filing Receipt dated Aug. 4, 2017, U.S. Appl. No. 15/656,953, 4 pages, Doc 6006.
USPTO—Missing Parts dated Aug. 4, 2017, U.S. Appl. No. 15/656,953, 2 pages, Doc 6007.
Burgener—Response to Notice to File Missing Parts for U.S. Appl. No. 15/656,953, dated Oct. 4, 2017, 13 pages, Doc 6008.
Burgener—Preliminary Amendment dated Nov. 17, 2017, U.S. Appl. No. 15/656,953, 11 pages, Doc 6009.
USPTO—Updated Filing Receipt dated Nov. 22, 2017, U.S. Appl. No. 15/656,953, 4 pages, Doc 6010.
USPTO—Notice of Publication dated Mar. 1, 2018, U.S. Appl. No. 15/656,953, 1 page, Doc 6011.
USPTO—Office Action dated Mar. 7, 2018, U.S. Appl. No. 15/656,953, 21 pages, Doc 6012.
Burgener—Request to Update Applicant Name dated Apr. 8, 2018, U.S. Appl. No. 15/656,953 8 pages, Doc 6013.
USPTO—Corrected Filing Receipt dated Apr. 10, 2018 for U.S. Appl. No. 15/656,953, 4 pages, Doc 6014.
Burgener—Response to Office Action dated Apr. 19, 2018, U.S. Appl. No. 15/656,953, 4 pages, Doc 6015.
USPTO—Terminal Disclaimer dated Apr. 19, 2018 for U.S. Appl. No. 15/656,953, 3 pages, Doc 6016.
USPTO—Final Office Action dated May 16, 2018, U.S. Appl. No. 15/656,953, 17 pages, Doc 6017.
Burgener—Response to Final Office Action dated Jul. 12, 2018, U.S. Appl. No. 15/656,953, 3pages, Doc 6018
USPTO—Notice of Allowance dated Aug. 1, 2018, U.S. Appl. No. 15/656,953, 20 pages, Doc 6019.
Burgener—Rule 312 Amendment dated Sep. 19, 2018, U.S. Appl. No. 15/656,953, Doc 6020.
USPTO—Response to Rule 312 Amendment dated Sep. 27, 2018, U.S. Appl. No. 15/656,953, 3 pages, Doc 6021.
USPTO—Supplemental Notice of Allowability dated Oct. 12, 2018, U.S. Appl. No. 15/656,953, 14 pages, Doc 6022.
Burgener—Issue Fee Payment dated Oct. 19, 2018, U.S. Appl. No. 15/656,953, 5 pages, Doc 6023.
USPTO—Issue Notification dated Nov. 20, 2018, U.S. Appl. No. 15/656,953, 1 page, Doc 6024.
Burgener—U.S. Appl. No. 16/167,389, filed Oct. 22, 2018, 76 pages, Doc 6000.
USPTO—Filing Receipt dated Nov. 16, 2018, U.S. Appl. No. 16/167,389, 4 pages, Doc 6001.
USPTO—Notice of Publication dated Feb. 21, 2019 for U.S. Appl. No. 16/167,389, 1 page, Doc 6002.
USPTO—Office Action dated Mar. 22, 2019 for U.S. Appl. No. 16/167,389, 20 pages, Doc 6003.
USPTO—Terminal Disclaimer dated Mar. 28, 2019 for U.S. Appl. No. 16/167,389, 7 pages, Doc 6004.
Burgener—Response to Office Action filed Aug. 22, 2019 for U.S. Appl. No. 16/167,389, 24 pages, Doc 9027.
USPTO—Notice of Allowance and Notice of Allowability for U.S. Appl. No. 16/167,389 dated Oct. 10, 2019, 89 pages—Doc 9003.
Burgener—Issue Fee Payment and 312 Amendment filed Jan. 10, 2020 for U.S. Appl. No. 16/167,389, 11 pages, Doc 9070.
USPTO—Response to 312 Amendment dated Jan. 30, 2020 for U.S. Appl. No. 16/167,389, 11 pages, Doc 9082.
USPTO—Issue Notification dated Feb. 12, 2020 for U.S. Appl. No. 16/167,389, 1 page, Doc 9093.
USPTO—Supplemental Notice of Allowability dated Mar. 9, 2020 for U.S. Appl. No. 16/167,389, 8 pages, Doc 9100.
USPTO—Issue Notification dated Mar. 25, 2020 for U.S. Appl. No. 16/167,389, 1 page, Doc 9118.
Burgener—U.S. Appl. No. 16/676,350, filed Nov. 6, 2019, 92 pages, Doc 9004.
USPTO—Filing Receipt dated Nov. 25, 2019 for U.S. Appl. No. 16/676,350, 4 pages, Doc 9120.
USPTO—Non-final Office Action dated Dec. 26, 2019 for U.S. Appl. No. 16/676,350, 17 pages, Doc 9029.
USPTO—Notice of Publication dated Mar. 5, 2020 for U.S. Appl. No. 16/676,350, 1 page, Doc 9121.
Burgener—e-Terminal Disclaimer filed Apr. 21, 2020 for U.S. Appl. No. 16/676,350, 6 pages, Doc 9117.
Burgener—Response to Office Action filed Apr. 22, 2020 for U.S. Appl. No. 16/676,350, 9 pages, Doc 9119.
USPTO—Notice of Allowance and Allowability dated Jul. 2, 2020 for U.S. Appl. No. 16/676,350, 143 pages, Doc 9204.
Burgener—312 Amendment After Allowance filed Jul. 9, 2020 for U.S. Appl. No. 16/676,350, 11 pages, Doc 9205.
Burgener—Issue Fee Payment filed Jul. 14, 2020 for U.S. Appl. No. 16/676,350, 3 pages, Doc 9222.
USPTO—Response to Rule 312 Communication dated Jul. 29, 2020 for U.S. Appl. No. 16/676,350, 3 pages, Doc 9252.
USPTO—Notice of Allowance and Allowability dated Aug. 6, 2020 for U.S. Appl. No. 16/676,350, 15 pages, Doc 9242.
Burgener—Response to Notice of Allowance filed Aug. 6, 2020 for U.S. Appl. No. 16/676,350, 6 pages, Doc 9239.
USPTO—Corrected Notice of Allowability dated Aug. 19, 2020 for U.S. Appl. No. 16/676,350, 11 pages, Doc 9263.
USPTO—Issue Notification dated Sep. 30, 2020 for U.S. Appl. No. 16/676,350, 1 page, Doc 9264.
Burgener—U.S. Appl. No. 16/679,760, filed Nov. 11, 2019, 92 pages, Doc 9005.
USPTO—Filing Receipt dated Nov. 27, 2019 for U.S. Appl. No. 16/679,760, 4 pages, Doc 9025.
USPTO—Non-final Office Action dated Dec. 26, 2019 for U.S. Appl. No. 16/679,760, 19 pages, Doc 9026.
USPTO—Notice of Publication dated Mar. 5, 2020 for U.S. Appl. No. 16/679,760, 1 page, Doc 9099.
Burgener—e-Terminal Disclaimer filed Apr. 21, 2020 for U.S. Appl. No. 16/679,760, 6 pages, Doc 9122.
Burgener—Response to Office Action filed Apr. 22, 2020 for U.S. Appl. No. 16/679,760, 9 pages, Doc 9123.
USPTO—Notice of Allowance and Allowability dated Jul. 1, 2020 for U.S. Appl. No. 16/679,760, 125 pages, Doc 9206.
Burgener—312 Amendment After Allowance filed Jul. 9, 2020 for U.S. Appl. No. 16/679,760, 10 pages, Doc 9207.
Burgener—Issue Fee Payment filed Jul. 14, 2020 for U.S. Appl. No. 16/679,760, 3 pages, Doc 9223.
USPTO—Corrected Notice of Allowability dated Jul. 31, 2020 for U.S. Appl. No. 16/679,760, 7 pages, Doc 9248.
Burgener—Response to Notice of Allowance filed Aug. 7, 2020 for U.S. Appl. No. 16/679,760, 6 pages, Doc 9257.
USPTO—Corrected Notice of Allowability dated Aug. 19, 2020 for U.S. Appl. No. 16/679,760, 11 pages, Doc 9265.
USPTO—Issue Notification dated Sep. 9, 2020 for U.S. Appl. No. 16/679,760, 1 page, Doc 9266.
Burgener—U.S. Appl. No. 16/738,343, filed Jan. 9, 2020, 92 pages, Doc 9068.
USPTO—Filing Receipt dated Jan. 31, 2020 for U.S. Appl. No. 16/679,760, 4 pages, Doc 9085.
USPTO—Acceptance of Track I Request dated Feb. 4, 2020 for U.S. Appl. No. 16/679,760, 2 pages, Doc 9095.
USPTO—Non-final Office Action dated Feb. 25, 2020 for U.S. Appl. No. 16/738,343, 24 pages, Doc 9096.
Burgener—e-Terminal disclaimer filed Apr. 22, 2020 for U.S. Appl. No. 16/738,343, 6 pages, Doc 9124.
Burgener—Response to Office Action filed Apr. 22, 2020 for U.S. Appl. No. 16/738,343, 9 pages, Doc 9125.
USPTO—Notice of Publication dated May 14, 2020 for U.S. Appl. No. 16/738,343, 1 page, Doc 9164.
USPTO—Notice of Allowance and Allowability dated Jun. 29, 2020 for U.S. Appl. No. 16/735,343, 79 pages, Doc 9208.

(56) References Cited

OTHER PUBLICATIONS

Burgener—312 Amendment After Allowance filed Jul. 9, 2020 for U.S. Appl. No. 16/735,343, 10 pages, Doc 9209.
Burgener—Issue Fee Payment filed Jul. 9, 2020 for U.S. Appl. No. 16/735,343, 3 pages, Doc 9224.
USPTO—Office Communication dated Jul. 23, 2020 for U.S. Appl. No. 16/735,343, 77 pages, Doc 9232.
Burgener—312 Response Under 37 CFR § 1.312 filed Jul. 23, 2020 for U.S. Appl. No. 16/735,343, 9 pages, Doc 9231.
USPTO—Response to 312 Communication dated Jul. 30, 2020 for U.S. Appl. No. 16/735,343, 3 pages, Doc 9251.
USPTO—Notice of Allowance and Allowability dated Aug. 10, 2020 for U.S. Appl. No. 16/735,343, 14 pages, Doc 9256.
Brindle—Response to Notice of Allowance filed Aug. 10, 2020 for U.S. Appl. No. 16/735,343, 6 pages, Doc 9253.
USPTO—Corrected Notice of Allowability dated Aug. 20, 2020 for U.S. Appl. No. 16/735,343, 11 pages, Doc 9267.
USPTO—Issue Notification dated Sep. 16, 2020 for U.S. Appl. No. 16/735,343, 1 page, Doc 9268.
Burgener—US Patent Application filed Jul. 15, 2020 for U.S. Appl. No. 16/930,215, 84 pages, Doc 9225.
USPTO—Filing Receipt dated Jul. 24, 2020 for U.S. Appl. No. 16/930,215, 5 pages, Doc 9236.
USPTO—Notice of Missing Parts dated Jul. 24, 2020 for U.S. Appl. No. 16/930,215, 2 pages, Doc 9237.
Kelly—U.S. Appl. No. 11/347,014, filed Feb. 3, 2006, 80 pages, Doc 4367.
USPTO—Notice of File Missing Parts dated Mar. 7, 2006 for U.S. Appl. No. 11/347,014, 2 pages, Doc 4368.
Kelly—Response to Pre-Exam Formalities Notice dated May 10, 2006 for U.S. Appl. No. 11/347,014, 11 pages, Doc 4369.
Tieu—Office Action dated Sep. 16, 2009 for U.S. Appl. No. 11/347,014, 26 pages, Doc 0713.
Kelly—Amendment and Terminal Disclaimers dated Mar. 22, 2010 for U.S. Appl. No. 11/347,014, 10 pages, Doc 4371.
USPTO—Terminal Disclaimer Review Decision dated Apr. 9, 2010 for U.S. Appl. No. 11/347,014, 1 page, Doc 4372.
USPTO—Notice of Allowance dated Apr. 29, 2010 for U.S. Appl. No. 11/347,014, 15 pages, Doc 4373.
USPTO—Supplemental Notice of Allowability dated Jul. 22, 2010 for U.S. Appl. No. 11/347,014, 4 pages, Doc 4374.
Kelly—Issue Fee Payment and Comments on Reasons for Allowance dated Aug. 2, 2010 for U.S. Appl. No. 11/347,014, 3 pages, Doc 4375.
USPTO—Issue Notification dated Aug. 25, 2010 for U.S. Appl. No. 11/347,014, 1 page, Doc 4376.
USPTO—Report on the Filing or Determination of an Action Regarding a Patent 3:12-cv-001160-CAB-BGS dated Jun. 11, 2012 for U.S. Appl. No. 11/347,014, 1 page, Doc 4377.
USPTO—Report on the Filing or Determination of an Action Regarding a Patent 1:12cv377 dated Jul. 11, 2012 for U.S. Appl. No. 11/347,014, 13 pages, Doc 4378.
USPTO—Report on the Filing or Determination of an Action Regarding a Patent 1:12cv377 dated Jul. 11, 2012 for U.S. Appl. No. 11/347,014, 13 pages, Doc 4395.
USPTO—Report on the Filing or Determination of an Action Regarding a Patent 3:12-cv-001160-CAB-BGS dated Apr. 15, 2013 for U.S. Appl. No. 11/347,014, 1 page, Doc 4379.
Kelly—Change of Address and Notice of Loss of Small Entity Status dated Mar. 5, 2014 for U.S. Appl. No. 11/347,014, 5 pages, Doc 4380.
USPTO—Report on the Filing or Determination of an Action Regarding a Patent 3:12-cv-00911-AJB-WMC dated Oct. 15, 2014 for U.S. Appl. No. 11/347,014, 1 page, Doc 4381.
Kelly—Request for Certificate of Correction dated Mar. 7, 2016 for U.S. Appl. No. 11/347,014, 5 pages, Doc 4382.
USPTO—Certificate of Correction dated May 10, 2016 for U.S. Appl. No. 11/247,014, 1 page, Doc 4383.
Kelly—Notification of Loss of Small Entity Status dated Jun. 5, 2017 for U.S. Appl. No. 11/347,014, 1 page, Doc 4384.
Wells—Office Action dated Feb. 22, 2018 for U.S. Appl. No. 14/883,525, 19 pages, Doc 1044.
Wells—Final Office Action dated Jul. 5, 2018 for U.S. Appl. No. 14/883,525, 22 pages, Doc 1058.
Wells—Notice of Allowance dated Aug. 30, 2018 for U.S. Appl. No. 14/883,525, 13 pages, Doc 1061.
Nguyen—Office Action dated Oct. 25, 2005 for U.S. Appl. No. 10/875,405, 9 pages, Doc 0632.
Burgener—Amendment dated Jan. 25, 2006 for U.S. Appl. No. 10/875,405, 13 pages, Doc 0637.
Nguyen—Office Action dated Apr. 20, 2006 for U.S. Appl. No. 10/875,405, 12 pages, Doc 0641.
Burgener—Amendment dated Aug. 21, 2006 for U.S. Appl. No. 10/875,405, 13 pages, Doc 0648.
Nguyen—Notice of Allowance dated Sep. 27, 2006 for U.S. Appl. No. 10/875,405, 10 pages, Doc 0649.
Burgener—Comments on Reasons for Allowance dated Dec. 26, 2006 for U.S. Appl. No. 10/875,405, 3 pages, Doc 0653.
Le—Notice of Allowance dated Sep. 26, 2005 for U.S. Appl. No. 11/158,597, 14 pages, Doc 0631.
Le—Notice of Allowance dated Feb. 27, 2006 for U.S. Appl. No. 11/158,597, 11 pages, Doc 0640.
Tran—Office Action dated Mar. 19, 2009 for U.S. Appl. No. 11/501,125, 19 pages, Doc 0688.
Burgener—Amendment dated Jun. 19, 2009 for U.S. Appl. No. 11/501,125, 7 pages, Doc 0696.
Tran—Office Action dated Oct. 29, 2009 for U.S. Appl. No. 11/501,125, 21 pages, Doc 0716.
Burgener—Amendment filed May 5, 2010 for U.S. Appl. No. 11/501,125, 16 pages, Doc 0734.
Tran—Notice of Allowance dated Jun. 10, 2010 for U.S. Appl. No. 11/501,125, 13 pages, Doc 0740.
Tran—Notice of Allowance dated May 19, 2011 for U.S. Appl. No. 11/501,125, 16 pages, Doc 0780.
Tran—Notice of Allowance dated Oct. 6, 2011 for U.S. Appl. No. 11/501,125, 32 pages, Doc 0788.
Tran—Office Action dated Dec. 18, 2012 for U.S. Appl. No. 13/412,463, 8 pages, Doc 0830.
Burgener—Amendment dated May 20, 2013 for U.S. Appl. No. 13/412,463, 15 pages, Doc 0851.
Tran—Notice of Allowance dated Jun. 6, 2013 for U.S. Appl. No. 13/412,463, 18 pages, Doc 0854.
Tran—Office Action dated May 8, 2014 for U.S. Appl. No. 14/052,680, 14 pages, Doc 0907.
Burgener—Amendment dated Nov. 10, 2014 for U.S. Appl. No. 14/052,680, 17 pages, Doc 0937.
Tran—Notice of Allowance dated Feb. 3, 2017 for U.S. Appl. No. 14/052,680, 13 pages, Doc 1016.
Tran—Office Action dated Aug. 18, 2017 for U.S. Appl. No. 15/586,007, 14 pages, Doc 1034.
Burgener—Response dated Sep. 5, 2017 for U.S. Appl. No. 15/586,007, 13 pages, Doc 1035.
Tran—Office Action dated Sep. 27, 2017 for U.S. Appl. No. 15/586,007, 15 pages, Doc 1036.
Burgener—Response dated Oct. 11, 2017 for U.S. Appl. No. 15/586,007, 3 pages, Doc 1037.
Tran—Notice of Allowance dated Mar. 5, 2019 for U.S. Appl. No. 15/917,218, 18 pages, Doc 1071.
Trans—Office Action dated Feb. 3, 2012 for U.S. Appl. No. 12/903,848, 11 pages, Doc 0799.
Tran—Notice of Allowance dated Oct. 26, 2012 for U.S. Appl. No. 12/903,848, 27 pages, Doc 0828.
Tran—Notice of Allowance dated Feb. 15, 2013 for U.S. Appl. No. 12/903,848, 30 pages, Doc 0844.
Tran—Notice of Allowance dated May 16, 2013 for U.S. Appl. No. 12/903,848, 12 pages, Doc 0850.
Tran—Office Action dated Aug. 7, 2014 for U.S. Appl. No. 14/177,062, 9 pages, Doc 0919.
Burgener—Response dated Nov. 6, 2014 for U.S. Appl. No. 14/177,062, 22 pages, Doc 0936.
Tran—Office Action dated Feb. 24, 2015 for U.S. Appl. No. 14/177,062, 7 pages, Doc 0950.

(56) References Cited

OTHER PUBLICATIONS

Burgener—Response dated Dec. 3, 2015 for U.S. Appl. No. 14/177,062, 13 pages, Doc 0977.
Tran—Notice of Allowance dated Mar. 25, 2016 for U.S. Appl. No. 14/177,062, 159 pages, Doc 0989.
Tieu—Notice of Allowance dated Dec. 19, 2008 for U.S. Appl. No. 11/127,520, 11 pages, Doc 0677.
Luu—Office Action dated Oct. 30, 2008 for U.S. Appl. No. 11/351,342, 15 pages, Doc 0676.
Kelly—Response to Office Action dated Jan. 30, 2009 for U.S. Appl. No. 11/351,342, 15 pages, Doc 0683.
Luu—Final Office Action dated Apr. 8, 2009 for U.S. Appl. No. 11/351,342, 15 pages, Doc 0689.
Kelly—Proposed Amendment After Final dated Jun. 8, 2009 for U.S. Appl. No. 11/351,342, 14 pages, Doc 0694.
Luu—Notice of Allowance dated Jul. 2, 2009 for U.S. Appl. No. 11/351,342, 10 pages, Doc 0697.
Chow—Office Action dated Aug. 19, 2008 for U.S. Appl. No. 11/347,671, 18 pages, Doc 0669.
Kelly—Amendment dated Dec. 19, 2008 for U.S. Appl. No. 11/348,671, 16 pages, Doc 0678.
Chow—Office Action dated Apr. 16, 2009 for U.S. Appl. No. 11/347,671, 18 pages, Doc 0690.
Kelly—Response dated Jun. 16, 2009 for U.S. Appl. No. 11/347,671, 14 pages, Doc 0695.
Chow—Office Action dated Jul. 20, 2009 for U.S. Appl. No. 11/347,671, 19 pages, Doc 0700.
Chow—Office Action dated Apr. 28, 2010 for U.S. Appl. No. 11/347,671, 22 pages, Doc 0737.
Kelly—Amendment dated Jul. 28, 2010 for U.S. Appl. No. 11/347,671, 9 pages, Doc 0748.
Chow—Office Action dated Aug. 20, 2010 for U.S. Appl. No. 11/347,671, 20 pages, Doc 0750.
Kelly—Amendment dated Dec. 20, 2010 for U.S. Appl. No. 11/347,671, 13 pages, Doc 0728.
Kelly—Amendment dated Dec. 20, 2010 for U.S. Appl. No. 11/347,671, 15 pages, Doc 0766.
Chow—Office Action dated Mar. 2, 2011 for U.S. Appl. No. 11/347,671, 17 pages, Doc 0768.
Kelly—Amendment dated May 2, 2011 for U.S. Appl. No. 11/347,671, 10 pages, Doc 0773.
Chow—Advisory Action dated May 2, 2011 for U.S. Appl. No. 11/347,671, 3 pages, Doc 0774.
Kelly—Notice of Appeal dated Jun. 2, 2011 for U.S. Appl. No. 11/347,671, 6 pages, Doc 0781.
Chow—Notice of Panel Decision from Pre-Appeal Brief Review dated Jul. 11, 2011 for U.S. Appl. No. 11/347,671, 2 pages, Doc 0783.
Kelly—Supplemental Amendment dated Aug. 9, 2011 for U.S. Appl. No. 11/347,671, 5 pages, Doc 0785.
Chow—Notice of Allowance dated Aug. 16, 2011 for U.S. Appl. No. 11/347,671, 17 pages, Doc 0786.
Kelly—Comments on Examiner's Statement of Reasons for Allowance dated Nov. 16, 2011 for U.S. Appl. No. 11/347,671, 10 pages, Doc 0794.
Stuber—U.S. Appl. No. 11/520,912, filed Sep. 14, 2006, 128 pages, Doc 4217.
USPTO—Notice to File Missing Parts dated Oct. 5, 2006 for U.S. Appl. No. 11/520,912, 2 pages, Doc 4218.
Stuber—Response to Pre-Exam Formalities Notice dated Dec. 8, 2006 for U.S. Appl. No. 11/520,912, 20 pages, Doc 4219.
USPTO—Notice of Publication dated Mar. 29, 2007 for U.S. Appl. No. 11/520,912, 1 page, Doc 4221.
USPTO—Office Action dated Sep. 15, 2008 for U.S. Appl. No. 11/520,912, 25 pages, Doc 4222.
Stuber—Amendment dated Mar. 16, 2009 for U.S. Appl. No. 11/520,912, 26 pages, Doc 4223.
USPTO—Restriction Requirement dated Jul. 8, 2009 for U.S. Appl. No. 11/520,912, 9 pages, Doc 4224.
Stuber—Response to Restriction Requirement and Amendment dated Sep. 8, 2009 for U.S. Appl. No. 11/520,912, 8 pages, Doc 4225.
USPTO—Final Office Action dated Dec. 10, 2009 for U.S. Appl. No. 11/520,912, 26 pages, Doc 4226.
Stuber—Response to Final Office Action and Amendment dated Jun. 14, 2010 for U.S. Appl. No. 11/520,912, 29 pages, Doc 4227.
USPTO—Notice of Allowance dated Sep. 16, 2010 for U.S. Appl. No. 11/520,912, 23 pages, Doc 4228.
Stuber—Issue Fee Payment and Comments dated Dec. 20, 2010 for U.S. Appl. No. 11/520,912, 7 pages, Doc 4229.
USPTO—Issue Notification and Miscellaneous Letter to Applicant dated Jan. 16, 2011 for U.S. Appl. No. 11/520,912, 3 pages, Doc 4230.
Peregrine—Notice of Loss of Small Entity Status dated Jun. 26, 2017 for U.S. Appl. No. 11/520,912, 1 page, Doc 4231.
PSemi—3.73 Statement dated Aug. 31, 2018 for U.S. Appl. No. 11/520,912, 5 pages, Doc 4232.
USPTO—Updated Filing Receipt dated Dec. 15, 2019 for U.S. Appl. No. 11/520,912, 3 pages, Doc 4220.
USPTO—Notice of Withdraw from Issue dated Dec. 17, 2013 for U.S. Appl. No. 13/028,144, 1 page, Doc 4249.
Stuber—U.S. Appl. No. 13/028,144, filed Feb. 15, 2011, 121 pages, Doc 4233.
USPTO—Filing Receipt and Notice to File Missing Parts dated Mar. 1, 2011 for U.S. Appl. No. 13/028,144, 5 pages, Doc 4234.
Stuber—Response to Pre-Exam Formalities Notice dated Jun. 1, 2011 for U.S. Appl. No. 13/028,144, 17 pages, Doc 4235.
USPTO—Updated Filing Receipt dated Jun. 10, 2011 for U.S. Appl. No. 13/028,144, 4 pages, Doc 4236.
USPTO—Restriction Requirement dated Jan. 18, 2012 for U.S. Appl. No. 13/028,144, 35 pages, Doc 4237.
Stuber—Response to Restriction Requirement dated Feb. 1, 2012 for U.S. Appl. No. 13/028,144, 6 pages, Doc 4238.
USPTO—Office Action dated Apr. 12, 2012 for U.S. Appl. No. 13/028,144, 25 pages, Doc 4239.
Stuber—Amendment and Terminal Disclaimer dated Aug. 13, 2012 for U.S. Appl. No. 3/028,144, 14 pages, Doc 4240.
USPTO—Terminal Disclaimer Decision dated Aug. 20, 2012 for U.S. Appl. No. 13/028,144, 1 page, Doc 4241.
Stuber—Supplemental Amendment dated Nov. 8, 2012 for U.S. Appl. No. 13/028,144, 24 pages, Doc 4242.
USPTO—Restriction Requirement dated Jan. 14, 2013 for U.S. Appl. No. 13/028,144, 22 pages, Doc 4243.
Stuber—Amendment dated Jul. 15, 2013 for U.S. Appl. No. 13/028,144, 30 pages, Doc 4244.
USPTO—Notice of Allowance dated Sep. 26, 2013 for U.S. Appl. No. 13/028,144, 42 pages, Doc 4245.
Stuber—Issue Fee Payment and Comments dated Sep. 27, 2013 for U.S. Appl. No. 13/028,144, 10 pages, Doc 4246.
USPTO—Issue Notification dated Dec. 11, 2013 for U.S. Appl. No. 13/028,144, 1 page, Doc 4247.
Stuber—Request for Continued Examination and Petition to Withdraw Application from Issue dated Dec. 16, 2013 for U.S. Appl. No. 13/028,144, 11 pages, Doc 4248.
Stuber—Amendment dated Dec. 20, 2013 for U.S. Appl. No. 13/028,144, 32 pages, Doc 4250.
USPTO—Notice of Allowance dated Jan. 23, 2014 for U.S. Appl. No. 13/028,144, 25 pages, Doc 4251.
Stuber—Petition for and Auto-Grant for Removal from Issue dated Mar. 7, 2014 for U.S. Appl. No. 13/028,144, 9 pages, Doc 4253.
Stuber—Request for Continued Examination dated Mar. 7, 2014 for U.S. Appl. No. 13/028,144, 3 pages, Doc 4254.
USPTO—Notice of Allowance dated Apr. 25, 2014 for U.S. Appl. No. 13/028,144, 43 pages, Doc 4255.
Stuber—Request for Continued Examination dated May 27, 2014 for U.S. Appl. No. 13/028,144, 3 pages, Doc 4256.
USPTO—Notice of Allowance dated Jul. 18, 2014 for U.S. Appl. No. 13/028,144, 53 pages, Doc 4257.
USPTO—Supplemental Notice of Allowability dated Aug. 27, 2014 for U.S. Appl. No. 13/028,144, 29 pages, Doc 4258.
Stuber—Request for Continued Examination dated Aug. 28, 2014 for U.S. Appl. No. 13/028,144, 3 pages, Doc 4259.

(56) References Cited

OTHER PUBLICATIONS

Stuber—Issue Fee Payment and Comments on Reasons for Allowance dated Oct. 1, 2014 for U.S. Appl. No. 13/028,144, 8 pages, Doc 4260.
USPTO—Notice of Allowance dated Oct. 1, 2014 for U.S. Appl. No. 13/028,144, 35 pages, Doc 4261.
USPTO—Issue Notification dated Oct. 23, 2014 for U.S. Appl. No. 13/028,144, 1 page, Doc 4262.
Stuber—Petition for and Auto-Grant of Removal from Issue dated Oct. 30, 2014 for U.S. Appl. No. 13/028,144, 7 pages, Doc 4263.
Stuber—Request for Continued Examination dated Oct. 30, 2014 for U.S. Appl. No. 13/028,144, 3 pages, Doc 4264.
USPTO—Notice of Allowance dated Dec. 5, 2014 for U.S. Appl. No. 13/028,144, 32 pages, Doc 4265.
Stuber—Issue Fee Payment and Comments on Reasons for Allowance dated Dec. 8, 2014 for U.S. Appl. No. 13/028,144, 8 pages, Doc 4266.
Stuber—Terminal Disclaimers dated Dec. 12, 2014 for U.S. Appl. No. 13/028,144, 10 pages, Doc 4252.
USPTO—Issue Notification dated Jan. 21, 2015 for U.S. Appl. No. 13/028,144, 1 page, Doc 4267.
Peregrine—Notice of Loss of Small Entity Status dated Jun. 26, 2017 for U.S. Appl. No. 13/028,144, 1 page, Doc 4268.
PSemi—3.73 Statement dated Aug. 31, 2018 for U.S. Appl. No. 13/028,144, 5 pages, Doc 4269.
Stuber—U.S. Appl. No. 13/948,094, filed Jul. 22, 2013, 144 pages, Doc 4270.
USPTO—Filing Receipt and Notice to Respond to Missing Parts dated Aug. 13, 2013 for U.S. Appl. No. 13/948,094, 10 pages, Doc 4271.
Stuber—Response to Pre-Exam Formalities Notice, Power of Attorney and 3.73 Statement dated Nov. 13, 2013 for U.S. Appl. No. 13/948,094, 21 pages, Doc 4272.
USPTO—Updated Filing Receipt and Acceptance of Power of Attorney dated Mar. 11, 2014 for U.S. Appl. No. 13/948,094, 7 pages, Doc 4273.
USPTO—Restriction Requirement dated May 23, 2014 for U.S. Appl. No. 13/948,094, 13 pages, Doc 4274.
USPTO—Notice of Publication dated Jun. 19, 2014 for U.S. Appl. No. 13/948,094, 1 page, Doc 4275.
Stuber—Amendment dated Oct. 23, 2014 for U.S. Appl. No. 13/948,094, 35 pages, Doc 4276.
USPTO—Restriction Requirement dated Jan. 2, 2015 for U.S. Appl. No. 13/948,094, 18 pages, Doc 4277.
Stuber—Substitute Statement on Lieu of Oath or Declaration dated Feb. 26, 2015 for U.S. Appl. No. 13/948,094, 6 pages, Doc 4278.
Stuber—Response to Restriction Requirement and Amendment dated Mar. 2, 2015 for U.S. Appl. No. 13/948,094, 15 pages, Doc 4279.
USPTO—Office Action dated Mar. 27, 2015 for U.S. Appl. No. 13/948,094, 39 pages, Doc 4280.
Stuber—Amendment and Terminal Disclaimers dated Jul. 27, 2015 for U.S. Appl. No. 13/948,094, 35 pages, Doc 4281.
USPTO—Office Action dated Nov. 19, 2015 for U.S. Appl. No. 13/948,094, 45 pages, Doc 4282.
USPTO—Terminal Disclaimer Decisions dated Dec. 21, 2015 for U.S. Appl. No. 13/948,094, 1 page, Doc 4283.
Stuber—Issue Fee Payment dated Jan. 17, 2017 for U.S. Appl. No. 13/948,094, 5 pages, Doc 4287.
Stuber—Notice of Appeal dated May 18, 2016 for U.S. Appl. No. 13/948,094, 7 pages, Doc 4284.
Stuber—Request for Continued Examination and Amendment dated Jul. 18, 2016 for U.S. Appl. No. 13/948,094, 22 pages, Doc 4285.
USPTO—Notice of Allowance dated Oct. 17, 2016 for U.S. Appl. No. 13/948,094, 45 pages, Doc 4286.
USPTO—Issue Notification dated Mar. 8, 2017 for U.S. Appl. No. 13/948,094, 1 page, Doc 4288.
PSemi—3.73 Statement dated Aug. 31, 2018 for U.S. Appl. No. 13/948,094, 5 pages, Doc 4289.
Stuber—U.S. Appl. No. 15/419,898, filed Jan. 30, 2017, 136 pages, Doc 4290.
USPTO—Filing Receipt and Notice to File Missing Parts dated Feb. 8, 2017 for U.S. Appl. No. 15/419,898, 8 pages, Doc 4291.
Stuber—Response to Notice to File Missing Parts dated Apr. 10, 2017 for U.S. Appl. No. 15/419,898, 13 pages, Doc 4292.
USPTO—Updated Filing Receipt, Informational Notice and Acceptance of Power of Attorney dated May 11, 2017 for U.S. Appl. No. 15/419,898, 8 pages, Doc 4293.
Stuber—Preliminary Amendment dated Jul. 21, 2017 for U.S. Appl. No. 15/419,898, 16 pages, Doc 4294.
USPTO—Notice of Publication dated Aug. 17, 2017 for U.S. Appl. No. 15/419,898, 1 page, Doc 4295.
Stuber—Request to Change Applicant Name dated Mar. 4, 2018 for U.S. Appl. No. 15/419,898, 6 pages, Doc 4296.
USPTO—Updated Filing Receipt dated Mar. 6, 2018 for U.S. Appl. No. 15/419,898, 10 pages, Doc 4297.
USPTO—Office Action dated Jun. 4, 2018 for U.S. Appl. No. 15/419,898, 47 pages, Doc 4298.
Stuber—Amendment, Terminal Disclaimers and Change of Applicant dated Aug. 31, 2018 for U.S. Appl. No. 15/419,898, 55 pages, Doc 4299.
USPTO—Terminal Disclaimer Decision dated Sep. 3, 2018 for U.S. Appl. No. 15/419,898, 1 page, Doc 4300.
USPTO—Final Office Action dated Dec. 3, 2018 for U.S. Appl. No. 15/419,898, 30 pages, Doc 4301.
Stuber—Authorization to Act on Representative Capacity dated Feb. 11, 2019 for U.S. Appl. No. 15/419,898, 4 pages, Doc 4302.
USPTO—Applicant-Initialed Interview Summary dated Apr. 18, 2019 for U.S. Appl. No. 15/419,898, 1 page, Doc 4303.
Stuber—Request for Continued Examination and Amendment dated May 2, 2019 for U.S. Appl. No. 15/419,898, 75 pages, Doc 4304.
USPTO—Acceptance of Power of Attorney dated May 20, 2019 for U.S. Appl. No. 15/419,898, 7 pages, Doc 4305.
USPTO—Notice of Allowance and Examiner-Initialed Interview Summary dated May 20, 2019 for U.S. Appl. No. 15/419,898, 35 pages, Doc 4326.
USPTO—Notice of Allowance and Notice of Allowability for U.S. Appl. No. 15/419,898 dated Sep. 30, 2019, 98 pages—Doc 9006.
USPTO—Corrected Notice of Allowability dated Dec. 16, 2019 for U.S. Appl. No. 15/419,898, 4 pages, Doc 9030.
Stuber—Issue Fee Payment and 312 Amendment filed Dec. 27, 2019 for U.S. Appl. No. 15/419,898, 14 pages, Doc 9031.
USPTO—Corrected Notice of Allowability dated Jan. 21, 2020 for U.S. Appl. No. 15/419,898, 9 pages, Doc 9074.
USPTO—Corrected Notice of Allowability dated Mar. 5, 2020 for U.S. Appl. No. 15/419,898, 8 pages, Doc 9098.
USPTO—Corrected Notice of Allowance dated Mar. 13, 2020 for U.S. Appl. No. 15/419,898, 5 pages, Doc 9128.
USPTO—Issue Fee Payment, Corrected Application Data Sheet and 312 Amendment filed Apr. 21, 2020 for U.S. Appl. No. 15/419,898, 32 pages, Doc 9129.
USPTO—Supplemental Notice of Allowability dated May 13, 2020 for U.S. Appl. No. 15/419,898, 9 pages, Doc 9165.
USPTO—Corrected Notice of Allowability dated Jul. 9, 2020 for U.S. Appl. No. 15/419,898, 8 pages, Doc 9210.
USPTO—Notice of Allowance and Allowability dated Aug. 27, 2020 for U.S. Appl. No. 15/419,898, 17 pages, Doc 9269.
Stuber—Response to Notice of Allowance filed Aug. 27, 2020 for U.S. Appl. No. 15/419,898, 6 pages, Doc 9270.
USPTO—Issue Notification dated Oct. 7, 2020 for U.S. Appl. No. 15/419,898, 1 page, Doc 9271.
Stuber—U.S. Appl. No. 16/739,081, filed Jan. 9, 2020, 142 pages, Doc 9065.
USPTO—Filing Receipt dated Jan. 31, 2020 for U.S. Appl. No. 16/739,081, 4 pages, Doc 9086.
USPTO—Notice of Missing Parts dated Jan. 31, 2020 for U.S. Appl. No. 16/739,081, 2 pages, Doc 9087.
Stuber—Response to Notice of Missing Parts and Preliminary Amendment filed Jul. 9, 2020 for U.S. Appl. No. 16/739,081, 21 pages, Doc 9211.
USPTO—Office Action dated Nov. 10, 2020 for U.S. Appl. No. 16/739,081, 16 pages, Doc 9272.

(56) References Cited

OTHER PUBLICATIONS

Stuber—Reissue U.S. Appl. No. 16/710,998, filed Dec. 11, 2019, 103 pages, Doc 9023.
USPTO—Filing Receipt dated Dec. 17, 2019 for U.S. Appl. No. 16/710,998, 4 pages, Doc 9032.
USPTO—Notice to File Missing Parts dated Dec. 19, 2019 for U.S. Appl. No. 16/710,998, 2 pages, Doc 9033.
USPTO—Updated Filing Receipt dated Dec. 19, 2019 for U.S. Appl. No. 16/710,998, 4 pages, Doc 9072.
USPTO—Response to Notice to File Missing Parts filed Jan. 7, 2020 for U.S. Appl. No. 16/710,998, 6 pages, Doc 9079.
USPTO—Updated Filing Receipt dated Jan. 14, 2020 for U.S. Appl. No. 16/710,998, 4 pages, Doc 9080.
Brindle—U.S. Appl. No. 11/484,370, filed Jul. 10, 2006, 140 pages, Doc 4000.
USPTO—Notice to File Missing Parts for U.S. Appl. No. 11/484,370 dated Aug. 2, 2006, 2 pages, Doc 4001.
USPTO—Filing Receipt for U.S. Appl. No. 11/484,370 dated Aug. 2, 2006, 3 pages, Doc 4002.
Brindle—Response to Notice to File Missing Parts for U.S. Appl. No. 11/484,370 dated Oct. 6, 2006, Doc 4003.
USPTO—Notice of Publication for U.S. Appl. No. 11/484,370 dated Jan. 25, 2007, 1 page, Doc 4004.
USPTO—Restriction Requirement dated Sep. 19, 2008 for U.S. Appl. No. 11/484,370, 11 pages, Doc 4005.
Brindle—Response to Restriction Requirement dated Jan. 26, 2009 for U.S. Appl. No. 11/484,370, 7 pages, Doc 4006.
USPTO—Restriction Requirement dated Apr. 23, 2009 for U.S. Appl. No. 11/484,370, 15 pages, Doc 4007.
Brindle—Response to Restriction Requirement dated Aug. 28, 2009 for U.S. Appl. No. 11/484,370, 7 pages, Doc 4008.
USPTO—Office Action dated Jan. 6, 2010 for U.S. Appl. No. 11/484,370, 56 pages, Doc 4009.
Brindle—Amendment filed Jul. 12, 2010 for U.S. Appl. No. 11/484,370, 24 pages, Doc 4010.
USPTO—Notice of Allowance dated Nov. 12, 2010 for U.S. Appl. No. 11/484,370, 32 pages, Doc 4011.
USPTO—Issue Notification dated Mar. 2, 2011 for U.S. Appl. No. 11/484,370, 1 page, Doc 4012.
USPTO—Report on the Filing or Determination of an Action Regarding a Patent or Trademark dated Jun. 11, 2012 for U.S. Appl. No. 11/484,370, 1 page, Doc 4013.
USPTO—Report on the Filing or Determination of an Action Regarding a Patent or Trademark dated Jul. 11, 2012 for U.S. Appl. No. 11/484,370, 13 pages, Doc 4014.
USPTO—Report on the Filing or Determination of an Action Regarding a Patent or Trademark dated Feb. 21, 2013 for U.S. Appl. No. 11/484,370, 1 page, Doc 4015.
USPTO—Report on the Filing or Determination of an Action Regarding a Patent or Trademark dated Apr. 15, 2013 for U.S. Appl. No. 11/484,370, 1 page, Doc 4016.
USPTO—Report on the Filing or Determination of an Action Regarding a Patent or Trademark advising of Dismissal dated Oct. 14, 2014 for U.S. Appl. No. 11/484,370, 1 page, Doc 4017.
Brindle—U.S. Appl. No. 13/053,211, filed Mar. 22, 2011, 135 pages, Doc 4018.
USPTO—Filing Receipt for U.S. Appl. No. 13/053,211 dated Apr. 8, 2011, 4 pages, Doc 4019.
USPTO—Notice of Publication for U.S. Appl. No. 13/053,211 dated Jul. 14, 2011, 1 page, Doc 4020.
USPTO—Corrected Filing Receipt dated Nov. 14, 2011 for U.S. Appl. No. 13/053,211, 3 pages, Doc 4021.
USPTO—Notice of Allowance dated Nov. 17, 2011 for U.S. Appl. No. 13/053,211, 54 pages, Doc 4022.
USPTO—Issue Notification dated Feb. 15, 2012 for U.S. Appl. No. 13/053,211, 5 pages, Doc 4023.
Brindle—U.S. Appl. No. 13/412,529, filed Mar. 5, 2012, 123 pages, Doc 4024.
USPTO—Filing Receipt for U.S. Appl. No. 13/412,529 dated Mar. 23, 2012, 4 pages, Doc 4025.
USPTO—Office Action dated Apr. 11, 2012 for U.S. Appl. No. 13/412,529, 15 pages, Doc 4026.
USPTO—Notice of Publication dated Jul. 5, 2012 for U.S. Appl. No. 13/412,529, 1 page, Doc 4027.
Brindle—Response to Office Action dated Oct. 11, 2012 for U.S. Appl. No. 13/412,529, 22 pages, Doc 4028.
Brindle—Response to Office Action and Terminal Disclaimers dated Dec. 19, 2012 for U.S. Appl. No. 13/412,529, 25 pages, Doc 4029.
USPTO—Terminal Disclaimer Review Decision dated Dec. 27, 2012 for U.S. Appl. No. 13/412,529, 1 page, Doc 4030.
USPTO—Notice of Allowance dated Jan. 17, 2013 for U.S. Appl. No. 13/412,529, 243 pages, Doc 4031.
Brindle—Issue Fee Payment dated Feb. 8, 2013 for U.S. Appl. No. 13/412,529, 9 pages, Doc 4032.
USPTO—Notice of Allowance dated Feb. 8, 2013 for U.S. Appl. No. 13/412,529, 21 pages, Doc 4033.
USPTO—Issue Notification for U.S. Appl. No. 13/412,529 dated Mar. 6, 2013, 1 page, Doc 4034.
US District Court—Report on the Filing of an Action Regarding U.S. Pat. No. 8,405,147 dated Mar. 26, 2013 for U.S. Appl. No. 13/412,529, 1 page, Doc 4035.
US District Court—Order Termination of Proceeding dated Jul. 29, 2014 for U.S. Appl. No. 13/412,529, 3 pages, Doc 4036.
US District Court—Report on Determination of an Action dated Sep. 5, 2014 for U.S. Appl. No. 13/412,529, 1 page, Doc 4037.
Brindle—U.S. Appl. No. 13/850,251, filed Mar. 25, 2013, 124 pages, Doc 4038.
USPTO—Filing Receipt, Fee Sheet and Notice of Missing Parts dated May 15, 2013 for U.S. Appl. No. 13/850,251, 6 pages, Doc 4039.
Brindle—Response to Pre-Exam Formalities Notice dated Jul. 11, 2013 for U.S. Appl. No. 13/850,251, 18 pages, Doc 4040.
Brindle—Preliminary Amendment dated Jul. 19, 2013 for U.S. Appl. No. 13/850,251, 28 pages, Doc 4041.
USPTO—Updated Filing Receipt dated Aug. 1, 2013 for U.S. Appl. No. 13/850,251, 6 pages, Doc 4042.
USPTO—Office Action dated Oct. 2, 2013 for U.S. Appl. No. 13/850,251, 38 pages, Doc 4043.
USPTO—Notice of Publication for U.S. Appl. No. 13/850,251 dated Nov. 7, 2013, 1 page, Doc 4044.
Brindle—Amendment and Terminal Disclaimers for U.S. Appl. No. 13/850,251 dated Dec. 26, 2013, 32 pages, Doc 4045.
USPTO—Terminal Disclaimer Decisions dated Jan. 24, 2014 for U.S. Appl. No. 13/850,251, 1 page, Doc 4046.
Brindle—Notification of Loss of Small Entity Status dated Mar. 11, 2014 for U.S. Appl. No. 13/850,251, 1 page, Doc 4047.
USPTO—Office Action dated Apr. 2, 2014 for U.S. Appl. No. 13/850,251, 24 pages, Doc 4048.
Brindle—Amendment dated Oct. 2, 2014 for U.S. Appl. No. 13/850,251, 20 pages, Doc 4049.
Brindle—Amendment dated Oct. 2, 2014 for U.S. Appl. No. 13/850,251, 19 pages—2nd filed Oct. 2, 2014, Doc 4050.
USPTO—Final Office Action dated Jan. 22, 2015 for U.S. Appl. No. 13/850,251, 305 pages, Doc 4051.
Brindle—Response to Final Office Action and Terminal Disclaimers dated Mar. 23, 2015 for U.S. Appl. No. 13/850,251, 24 pages, Doc 4052.
USPTO—Terminal Disclaimer Decision dated Mar. 30, 2015 for U.S. Appl. No. 13/850,251, 1 page, Doc 4053.
USPTO—Notice of Allowance dated Apr. 22, 2015 for U.S. Appl. No. 13/850,251, 37 pages, Doc 4054.
USPTO—Corrected Notice of Allowability dated Jun. 18, 2015 for U.S. Appl. No. 13/850,251, 9 pages, Doc 4055.
USPTO—Office Communication dated Jul. 9, 2015 for U.S. Appl. No. 13/850,251, 32 pages, Doc 4056.
USPTO—Office Communication dated Jul. 16, 2015 for U.S. Appl. No. 13/850,251, 6 pages, Doc 4057.
Brindle—Issue Fee Payment dated Jul. 22, 2015 for U.S. Appl. No. 13/850,251, 8 pages, Doc 4058.
USPTO—Issue Notification dated Aug. 19, 2015 for U.S. Appl. No. 13/850,251, 10 pages, Doc 4059.

(56) References Cited

OTHER PUBLICATIONS

Peregrine—Notice of Loss of Small Entity Status dated Jul. 31, 2017 for U.S. Appl. No. 13/850,251, 1 page, Doc 4060.
Brindle—U.S. Appl. No. 14/845,154 dated Sep. 3, 2015, 124 pages, Doc 4061.
USPTO—Filing Receipt and Notice to File Missing Parts dated Sep. 22, 2015 for U.S. Appl. No. 14/845,154, 6 pages, Doc 4062.
Brindle—Response to Pre-Exam Formalities Notice dated Nov. 23, 2015 for U.S. Appl. No. 14/845,154, 17 pages, Doc 4063.
USPTO—Updated Filing Receipt, Informational Notice, and Acceptance of Power of Attorney dated Mar. 23, 2016 for U.S. Appl. No. 14/845,154, 7 pages, Doc 4064.
USPTO—Office Action dated Jun. 1, 2016 for U.S. Appl. No. 14/845,154, 13 pages, Doc 4065.
USPTO—Notice of Publication dated Jun. 30, 2016 for U.S. Appl. No. 14/845,154, 1 page, Doc 4066.
Brindle—Amendment dated Oct. 28, 2016 for U.S. Appl. No. 14/845,154, 20 pages, Doc 4067.
USPTO—Final Office Action dated Mar. 8, 2017 for U.S. Appl. No. 14/845,154, 33 pages, Doc 4068.
Brindle—Amendment and Terminal Disclaimer dated Mar. 24, 2017 for U.S. Appl. No. 14/845,154, 11 pages, Doc 4069.
USPTO—Terminal Disclaimer Decision dated Mar. 30, 2017 for U.S. Appl. No. 14/845,154, 1 page, Doc 4070.
USPTO—Notice of Allowance dated Apr. 10, 2017 for U.S. Appl. No. 14/845,154, 21 pages, Doc 4071.
Brindle—Correction of Inventorship and Oath/Declarations filed Jun. 15, 2017 for U.S. Appl. No. 14/845,154, 21 pages, Doc 4072.
USPTO—Notice of Acceptance of Inventorship Correction and Updated Filing Receipt dated Jun. 22, 2017 for U.S. Appl. No. 14/845,154, 5 pages, Doc 4073.
USPTO—Notice of Allowance dated Jun. 28, 2017 for U.S. Appl. No. 14/845,154, 10 pages, Doc 4074.
Brindle—Request for Continued Examination dated Jul. 7, 2017 for U.S. Appl. No. 14/845,154, 3 pages, Doc 4075.
USPTO—Notice of Allowance dated Aug. 9, 2017 for U.S. Appl. No. 14/845,154, 20 pages, Doc 4076.
Brindle—Issue Fee Payment dated Aug. 24, 2017 for U.S. Appl. No. 14/845,154, 1 page, Doc 4077.
USPTO—Corrected Notice of Allowability dated Sep. 6, 2017 for U.S. Appl. No. 14/845,154, 10 pages, Doc 4078.
USPTO—Issue Notification dated Sep. 13, 2017 for U.S. Appl. No. 14/845,154, 1 page, Doc 4079.
Brindle—Patent U.S. Appl. No. 15/707,970, filed Sep. 18, 2017, 149 pages, Doc 4080.
USPTO—Filing Receipt and Notice to File Missing Parts dated Oct. 16, 2017 for U.S. Appl. No. 15/707,970, 7 pages, Doc 4081.
Brindle—Response to Request to File Missing Parts dated Dec. 4, 2017 for U.S. Appl. No. 15/707,970, 13 pages, Doc 4082.
Brindle—Preliminary Amendment dated Dec. 7, 2017 for U.S. Appl. No. 15/707,970, 14 pages, Doc 4083.
USPTO—Updated Filing Receipt and Informational Notice dated Dec. 17, 2017 for U.S. Appl. No. 15/707,970, 7 pages, Doc 4084.
USPTO—Office Action dated Jan. 12, 2018 for U.S. Appl. No. 15/707,970 , 29 pages, Doc 4085.
Peregrine—Request to Change Applicant and Power of Attorney dated Jan. 26, 2018 for U.S. Appl. No. 15/707,970, 19 pages, Doc 4086.
Peregrine—Amendment dated Feb. 1, 2018 for U.S. Appl. No. 15/707,970, 15 pages, Doc 4087.
Peregrine—Terminal Disclaimer dated Feb. 1, 2018 for U.S. Appl. No. 15/707,970, 2 pages, Doc 4088.
USPTO—Corrected Filing Receipt and Acceptance of Power Attorney dated Feb. 1, 2018 for U.S. Appl. No. 15/707,970, 5 pages, Doc 4089.
PSemi—Request for Change of Applicant dated Feb. 26, 2018 for U.S. Appl. No. 15/707,970, 8 pages, Doc 4090.
USPTO—Corrected Filing Receipt dated Feb. 28, 2018 for U.S. Appl. No. 15/707,970, 4 pages, Doc 4091.
PSemi—Request for Correction of Name of Applicant dated Mar. 1, 2018 for U.S. Appl. No. 15/707,970, 8 pages, Doc 4092.
PSemi—Terminal Disclaimer filed Mar. 6, 2018 for U.S. Appl. No. 15/707,970, 4 pages, Doc 4093.
USPTO—Corrected Filing Receipt dated Mar. 7, 2018 for U.S. Appl. No. 15/707,970, 4 pages, Doc 4094.
USPTO—Terminal Disclaimer Decision filed Mar. 8, 2018 for U.S. Appl. No. 15/707,970, 1 page, Doc 4095.
USPTO—Notice of Publication dated Mar. 22, 2018 for U.S. Appl. No. 15/707,970, 1 page, Doc 4096.
USPTO—Notice of Allowance dated Apr. 2, 2018 for U.S. Appl. No. 15/707,970, 48 pages, Doc 4097.
PSemi—Request for Continued Examination dated May 5, 2018 for U.S. Appl. No. 15/707,970, 3 pages, Doc 4098.
USPTO—Notice of Allowance dated Jul. 2, 2018 for U.S. Appl. No. 15/707,970, 34 pages, Doc 4099.
PSemi—Request to Correct Inventorship dated Jul. 25, 2018 for U.S. Appl. No. 15/707,970, 19 pages, Doc 4100.
PSemi—Issue Fee Payment dated Aug. 1, 2018 for U.S. Appl. No. 15/707,970, 6 pages, Doc 4101.
USPTO—Notice of Improper Submission of Request Under 37 CFR 1.48(a) dated Aug. 2, 2018 for U.S. Appl. No. 15/707,970, 11 pages, Doc 4102.
USPTO—Corrected Notice of Allowability dated Aug. 16, 2018 for U.S. Appl. No. 15/707,970, 3 pages, Doc 4103.
PSemi—Petition (and Automatic Grant) for Withdraw from Issue After Payment of Issue Fee dated Aug. 22, 2018 for U.S. Appl. No. 15/707,970, 13 pages, Doc 4104.
PSemi—Request for Continued Examination dated Aug. 22, 2018 for U.S. Appl. No. 15/707,970, 3 pages, Doc 4105.
USPTO—Acceptance of Request to Correct Inventorship and Updated Filing Receipt dated Aug. 24, 2018 for U.S. Appl. No. 15/707,970, 22 pages, Doc 4106.
USPTO—Notice of Allowance dated Sep. 28, 2018 for U.S. Appl. No. 15/707,970, 44 pages, Doc 4107.
PSemi—Issue Fee Payment dated Oct. 17, 2018 for U.S. Appl. No. 15/707,970, 4 pages, Doc 4108.
USPTO—Issue Notification dated Nov. 20, 2018 for U.S. Appl. No. 15/707,970, 1 page, Doc 4109.
Brindle—U.S. Appl. No. 16/738,787, filed Jan. 9, 2020, 82 pages, Doc 9067.
USPTO—Filing Receipt dated Jan. 21, 2020 for U.S. Appl. No. 16/738,787, 4 pages, Doc 9075.
Brindle—U.S. Appl. No. 16/054,959, filed Aug. 3, 2018, 151 pages, Doc 4197.
USPTO—Filing Receipt and Notice to File Missing Parts dated Aug. 23, 2018 for U.S. Appl. No. 16/054,959, 8 pages, Doc 4198.
Brindle—Response to Pre-Exam Formalities Notice dated Oct. 23, 2018 for U.S. Appl. No. 16/054,959, 13 pages, Doc 4199.
Brindle—Amendment dated Dec. 11, 2018 for U.S. Appl. No. 16/054,959, 13 pages, Doc 4200.
USPTO—Updated Filing Receipt and Acceptance of Power of Attorney dated Dec. 14, 2018 for U.S. Appl. No. 16/054,959, 7 pages, Doc 4201.
USPTO—Notice of Publication dated Mar. 21, 2019 for U.S. Appl. No. 16/054,959, 1 page, Doc 4205.
PSemi—Power of Attorney dated May 16, 2019 for U.S. Appl. No. 16/054,959, 4 pages, Doc 4202.
USPTO—Acceptance of Power of Attorney dated May 20, 2019 for U.S. Appl. No. 16/054,959, 2 pages, Doc 4203.
USPTO—Non-final Office Action dated Jun. 7, 2019 for U.S. Appl. No. 16/054,959, 31 pages, Doc 4204.
Brindle—Response to Non-final Office Action dated Aug. 30, 2019 for U.S. Appl. No. 16/054,959, 14 pages, Doc 9036.
Brindle—Terminal Disclaimer filed Aug. 30, 2019 for U.S. Appl. No. 16/054,959, 5 pages, Doc 9037.
USPTO—Notice of Allowance and Notice of Allowability for U.S. Appl. No. 16/054,959 dated Sep. 23, 2019, 131 pages—Doc 9007.
Brindle—312 Amendment filed Oct. 15, 2019 for U.S. Appl. No. 16/054,959, 13 pages, Doc 9038.
Brindle—Request to Correct Inventorship filed Dec. 20, 2019 for U.S. Appl. No. 16/054,959, 17 pages, Doc 9039.

(56) References Cited

OTHER PUBLICATIONS

Brindle—Issue Fee Payment filed Dec. 23, 2019 for U.S. Appl. No. 16/054,959, 3 pages, Doc 9040.
USPTO—Acceptance of Inventorship Change dated Dec. 26, 2019 for U.S. Appl. No. 16/054,959, 1 page, Doc 9041.
USPTO—Updated Filing Receipt dated Dec. 26, 2019 for U.S. Appl. No. 16/054,959, 4 page, Doc 9064.
USPTO—Corrected Notice of Allowability dated Dec. 30, 2019 for U.S. Appl. No. 16/054,959, 4 pages, Doc 9071.
USPTO—Corrected Notice of Allowability dated Jan. 24, 2020 for U.S. Appl. No. 16/054,959, 11 pages, Doc 9076.
USPTO—Office Communication dated Feb. 4, 2020 for U.S. Appl. No. 16/054,959, 4 pages, Doc 9090.
USPTO—Issue Notification dated Feb. 12, 2020 for U.S. Appl. No. 16/054,959, 1 page, Doc 9092.
USPTO—Corrected Notice of Allowability dated Mar. 13, 2020 for U.S. Appl. No. 16/054,959, 7 pages, Doc 9132.
USPTO—Issue Notification dated Mar. 25, 2020 for U.S. Appl. No. 16/054,959, 1 page, Doc 9133.
Brindle—e-Terminal Disclaimer filed Apr. 20, 2020 for U.S. Appl. No. 16/054,959, 5 pages, Doc 9134.
Brindle—U.S. Appl. No. 16/377,114, filed Apr. 5, 2019, 161 pages, Doc 4211.
Brindle—Authorization to Act in Representative Capacity dated Apr. 16, 2019 for U.S. Appl. No. 16/377,114, 4 pages, Doc 4212.
USPTO—Filing Receipt and Decision Granting Request for Track One dated Apr. 23, 2019 for U.S. Appl. No. 16/377,114, 8 pages, Doc 4213.
USPTO—Office Action dated May 24, 2019 for U.S. Appl. No. 16/377,114, 13 pages, Doc 4214.
PSemi—Power of Attorney dated May 29, 2019 for U.S. Appl. No. 16/377,114, 4 pages, Doc 4215.
USPTO—Acceptance of Power of Attorney dated May 30, 2019 for U.S. Appl. No. 16/377,114, 1 page, Doc 4216.
Brindle—Response to Office Action filed Aug. 26, 2019 for U.S. Appl. No. 16/377,114, 14 pages, Doc 9042.
Brindle—Terminal Disclaimer filed Aug. 26, 2019 for U.S. Appl. No. 16/377,114, 5 pages, Doc 9043.
USPTO—Notice of Allowance and Notice of Allowability for U.S. Appl. No. 16/377,114 dated Oct. 7, 2019, 111 pages—Doc 9008.
Brindle—Request to Correct Inventorship filed Dec. 20, 2019 for U.S. Appl. No. 16/377,114, 17 pages, Doc 9044.
USPTO—Corrected Notice of Allowability dated Dec. 31, 2019 for U.S. Appl. No. 16/377,114, 4 pages, Doc 9045.
USPTO—Acceptance of Correction of Inventorship dated Dec. 27, 2019 for U.S. Appl. No. 16/377,114, 1 page, Doc 9046.
USPTO—Updated Filing Receipt dated Dec. 27, 2019 for U.S. Appl. No. 16/377,114, 4 pages, Doc 9063.
Brindle—Issue Fee Payment and 312 Amendment filed Jan. 6, 2020 for U.S. Appl. No. 16/377,114, 14 pages, Doc 9058.
USPTO—Corrected Notice of Allowability dated Jan. 24, 2020 for U.S. Appl. No. 16/377,114, 16 pages, Doc 9077.
USPTO—Issue Notification dated Feb. 19, 2020 for U.S. Appl. No. 16/377,114, 1 page, Doc 9094.
USPTO—Corrected Notice of Allowability dated Mar. 13, 2020 for U.S. Appl. No. 16/377,114, 7 pages, Doc 9172.
USPTO—Issue Notification dated Apr. 1, 2020 for U.S. Appl. No. 16/377,114, 1 page, Doc 9173.
USPTO—Notice of Allowability dated May 1, 2020 for U.S. Appl. No. 16/377,114, 8 pages, Doc 9174.
Brindle—e-Terminal Disclaimer filed May 11, 2020 for U.S. Appl. No. 16/377,114, 5 pages, Doc 9175.
USPTO—Issue Notification dated May 20, 2020 for U.S. Appl. No. 16/377,114, 1 page, Doc 9176.
PSemi—U.S. Appl. No. 16/590,262, filed Oct. 1, 2019, 92 pages—Doc 9009.
USPTO—Filing Receipt dated Oct. 18, 2019 for U.S. Appl. No. 16/590,262, 4 pages, Doc 9019.
USPTO—Office Action dated Nov. 20, 2019 for U.S. Appl. No. 16/590,262, 7 pages, Doc 9010.

USPTO—Notice of Publication dated Jan. 30, 2020 for U.S. Appl. No. 16/590,262, 1 page, Doc 9088.
Brindle—e-Terminal Disclaimer filed Apr. 20, 2020 for U.S. Appl. No. 16/590,262, 5 pages, Doc 9135.
Brindle—Response to Office Action filed Apr. 20, 2020 for U.S. Appl. No. 16/590,262, 13 pages, Doc 9136.
USPTO—Notice of Allowance and Allowability dated May 20, 2020 for U.S. Appl. No. 16/590,262, 105 pages, Doc 9177.
Brindle—Amendment Under 37 CFR 1.312 filed May 21, 2020 for U.S. Appl. No. 16/590,262, 13 pages, Doc 9178.
Brindle—Issue Fee filed Jun. 9, 2020 for U.S. Appl. No. 16/590,262, 6 pages, Doc 9179.
USPTO—Corrected notice of Allowability dated Jul. 1, 2020 for U.S. Appl. No. 16/590,262, 8 pages, Doc 9212.
USPTO—Corrected Notice of Allowability dated Jul. 23, 2020 for U.S. Appl. No. 16/590,262, 6 pages, Doc 9234.
USPTO—Corrected Notice of Allowability dated Aug. 5, 2020 for U.S. Appl. No. 16/590,262, 4 pages, Doc 9245.
USPTO—Corrected Notice of Allowability dated Aug. 21, 2020 for U.S. Appl. No. 16/590,262, 5 pages, Doc 9273.
USPTO—Issue Notification dated Sep. 16, 2020 for U.S. Appl. No. 16/590,262, 1 page, Doc 9274.
PSemi—U.S. Appl. No. 16/590,292, filed Oct. 21, 2019, 143 pages—Doc 9011.
USPTO—Filing Receipt dated Oct. 22, 2019 for U.S. Appl. No. 16/590,292, 4 pages, Doc 9020.
USPTO—Office Action dated Nov. 20, 2019 for U.S. Appl. No. 16/590,292, 7 pages, Doc 9012.
USPTO—Notice of Publication dated Jan. 30, 2020 for U.S. Appl. No. 16/590,292, 1 page, Doc 9089.
Brindle—e-Terminal Disclosure filed Apr. 20, 2020 for U.S. Appl. No. 16/590,292, 1 page, Doc 9110.
Brindle—Response to Office Action filed Apr. 20, 2020 for U.S. Appl. No. 16/590,292, 11 pages, Doc 9115.
Brindle—eTerminal Disclaimer filed May 15, 2020 for U.S. Appl. No. 16/590,292, 5 pages, Doc 9180.
USPTO—Notice of Allowance and Allowability dated May 28, 2020 for U.S. Appl. No. 16/590,292, 104 pages, Doc 9181.
Brindle—Issue Fee Payment and 312 Amendment filed Jun. 10, 2020 for U.S. Appl. No. 16/590,292, 12 pages, Doc 9182.
USPTO—Corrected Notice of Allowability dated Jul. 2, 2020 for U.S. Appl. No. 16/590,292, 7 pages, Doc 9213.
USPTO—Notice of Allowance and Allowability dated Aug. 5, 2020 for U.S. Appl. No. 16/590,292, 46 pages, Doc 9244.
Brindle—Response to Notice of Allowance filed Aug. 6, 2020 for U.S. Appl. No. 16/590,292, 6 pages, Doc 9240.
USPTO —Corrected Notice of Allowability dated Aug. 21, 2020 for U.S. Appl. No. 16/590,292, 5 pages, Doc 9275.
USPTO—Issue Notification dated Aug. 21, 2020 for U.S. Appl. No. 16/590,292, 1 page, Doc 9276.
PSemi—U.S. Appl. No. 16/671,967, filed Nov. 1, 2019, 143 pages—Doc 9013.
USPTO—Filing Receipt dated Nov. 20, 2019 for U.S. Appl. No. 16/671,967, 4 pages, Doc 9021.
USPTO—Office Action dated Dec. 31, 2019 for U.S. Appl. No. 16/671,967, 7 pages, Doc 9062.
USPTO—Notice of Publication dated Feb. 27, 2020 for U.S. Appl. No. 16/671,967, 1 page, Doc 9097.
Brindle—Terminal Disclaimer filed Apr. 20, 2020 for U.S. Appl. No. 16/671,967, 5 pages, Doc 9112.
Brindle—Response to Office Action filed Apr. 20, 2020 for U.S. Appl. No. 16/671,967, 10 pages, Doc 9116.
USPTO—Notice of Allowance and Allowability dated May 20, 2020 for U.S. Appl. No. 16/671,967, 106 pages, Doc 9183.
Brindle—Issue Fee Payment and Response Under 37 CFR 3.312 filed Jun. 10, 2020 for U.S. Appl. No. 16/671,967, 6 pages, Doc 9184.
USPTO—Corrected Notice of Allowability dated Jul. 1, 2020 for U.S. Appl. No. 16/671,967, 6 pages, Doc 9214.
USPTO—Corrected Notice of Allowability dated Jul. 23, 2020 for U.S. Appl. No. 16/671,967, 6 pages, Doc 9233.
USPTO—Corrected Notice of Allowability dated Jul. 31, 2020 for U.S. Appl. No. 16/377,026, 4 pages, Doc 9249.

(56) References Cited

OTHER PUBLICATIONS

USPTO—Corrected Notice of Allowability dated Aug. 10, 2020 for U.S. Appl. No. 16/377,411, 4 pages, Doc 9255.
USPTO—Notice of Allowability dated Aug. 20, 2020 for U.S. Appl. No. 16/377,411, 5 pages, Doc 9277.
USPTO—Issue Notification dated Sep. 9, 2020 for U.S. Appl. No. 16/377,411, 1 page, Doc 9278.
PSemi—U.S. Appl. No. 16/673,411, filed Nov. 4, 2019, 142 pages—Doc 9014.
USPTO—Filing Receipt and Notice to File Corrected Application Papers dated Nov. 21, 2019 for U.S. Appl. No. 16/673,411, 7 pages—Doc 9022.
Brindle—Response to Notice to File Corrected Application Papers dated Nov. 27, 2019 for U.S. Appl. No. 16/673,411, 37 pages, Doc 9035.
USPTO—Updated Filing Receipt dated Dec. 30, 2019 for U.S. Appl. No. 16/673,411, 37 pages, Doc 9061.
USPTO—Office Action dated Jan. 30, 2020 for U.S. Appl. No. 16/673,411, 8 pages, Doc 9081.
USPTO—Notice of Publication dated Apr. 9, 2020 for U.S. Appl. No. 16/673,411, 1 page, Doc 9037.
Brindle—e-Terminal Disclaimer filed Apr. 20, 2020 for U.S. Appl. No. 16/673,411, 5 pages, Doc 9111.
Brindle—Response to Office Action filed Apr. 20, 2020 for U.S. Appl. No. 16/673,411, 9 pages, Doc 9138.
USPTO—Notice of Allowance and Allowability dated May 14, 2020 for U.S. Appl. No. 16/673,411, 191 pages, Doc 9166.
Brindle—Amendment Under 37 CFR 1.312 filed May 14, 2020 for U.S. Appl. No. 16/673,411, 9 pages, Doc 9167.
Brindle—eTerminal Disclaimer filed May 15, 2020 for U.S. Appl. No. 16/673,411, 5 pages, Doc 9168.
Brindle—Issue Fee Payment and Amendment Under 37 CFR 1.312 filed Jun. 10, 2020 for U.S. Appl. No. 16/673,411, 11 pages, Doc 9169.
USPTO—Corrected Notice of Allowability dated Jul. 1, 2020 for U.S. Appl. No. 16/673,411, 6 pages, Doc 9215.
USPTO—Notice of Allowance and Allowability dated Aug. 4, 2020 for U.S. Appl. No. 16/673,411, 52 pages, Doc 9247.
Brindle—Issue Fee Payment filed Aug. 6, 2020 for U.S. Appl. No. 16/673,411, 6 pages, Doc 9241.
USPTO—Response to Notice of Allowance dated Aug. 6, 2020 for U.S. Appl. No. 16/673,411, 105 pages, Doc 9243.
USPTO—Notice of Allowability dated Aug. 20, 2020 for U.S. Appl. No. 16/673,411, 4 pages, Doc 9279.
USPTO—Issue Notification dated Sep. 9, 2020 for U.S. Appl. No. 16/673,411, 1 page, Doc 9280.
Brindle—U.S. Appl. No. 16/853,688, filed Apr. 20, 2020, 143 pages, Doc 9160.
USPTO—Notice to File Corrected Application Papers dated Apr. 27, 2020 for U.S. Appl. No. 16/853,688, 2 pages, Doc 9170.
Brindle—Response to Notice to File Corrected Application Papers dated Jun. 9, 2020 for U.S. Appl. No. 16/853,688, 9 pages, Doc 9171.
Brindle—e-Terminal Disclaimer filed Jul. 1, 2020 for U.S. Appl. No. 16/853,688, 7 pages, Doc 9216.
USPTO—Non-final Office Action dated Jul. 14, 2020 for U.S. Appl. No. 16/853,688, 90 pages, Doc 9226.
Brindle—Response to Non-final Office Action filed Jul. 14, 2020 for U.S. Appl. No. 16/853,688, 7 pages, Doc 9227.
USPTO—Notice of Allowance and Allowability dated Aug. 6, 2020 for U.S. Appl. No. 16/673,411, 105 pages, Doc 9243.
Brindle—Issue Fee Payment filed Aug. 10, 2020 for U.S. Appl. No. 16/853,688, 6 pages, Doc 9258.
USPTO—Notice to File Corrected Application Papers dated Aug. 17, 2020 for U.S. Appl. No. 16/673,411, 3 pages, Doc 9281.
Brindle—Response to Notice to File Corrected Application Papers filed Aug. 28, 2020 for U.S. Appl. No. 16/673,411, 28 pages, Doc 9282.
USPTO—Corrected Notice of Allowability dated Sep. 2, 2020 for U.S. Appl. No. 16/673,411, 6 pages, Doc 9283.
USPTO—Issue Notification dated Sep. 16, 2020 for U.S. Appl. No. 16/673,411, 1 page, Doc 9284.
USPTO—Notice of Publication dated Sep. 17, 2020 for U.S. Appl. No. 16/673,411, 1 page, Doc 9285.
Brindle—U.S. Appl. No. 16/987,265, filed Aug. 6, 2020, 135 pages, Doc 9238.
USPTO—Notice to File Missing Parts dated Aug. 14, 2020 for U.S. Appl. No. 16/987,265, 2 pages, Doc 9286.
USPTO—Filing Receipt dated Aug. 14, 2020 for U.S. Appl. No. 16/987,265, 5 pages, Doc 9287.
Brindle—U.S. Appl. No. 13/277,108, filed Oct. 19, 2011, 119 pages, Doc 4110.
USPTO—Filing Receipt and Notice to File Missing Parts dated Nov. 2, 2011 for U.S. Appl. No. 13/277,108, 6 pages, Doc 4111.
Brindle—Applicant Response to Pre-Exam Formalities Notice dated Feb. 1, 2012 for U.S. Appl. No. 13/277,108, 22 pages, Doc 4112.
USPTO—Updated Filing Receipt and Acceptance of Power of Attorney dated Jul. 16, 2012 for U.S. Appl. No. 13/277,108, 5 pages, Doc 4113.
USPTO—Office Action dated Sep. 26, 2012 for U.S. Appl. No. 13/277,108, 59 pages, Doc 4114.
USPTO—Notice of Publication dated Oct. 25, 2012 for U.S. Appl. No. 13/277,108, 1 page, Doc 4115.
Brindle—Amendment and Terminal Disclaimer dated Dec. 26, 2012 for U.S. Appl. No. 13/277,108, 23 pages, Doc 4117.
USPTO—Terminal Disclaimer Decision dated Jan. 4, 2013 for U.S. Appl. No. 13/277,108, 1 page, Doc 4118.
USPTO—Office Action dated Apr. 10, 2013 for U.S. Appl. No. 13/277,108, 246 pages, Doc 4119.
Brindle—Amendment dated Jul. 18, 2013 for U.S. Appl. No. 13/277/108, 41 pages, Doc 4120.
USPTO—Final Office Action dated Sep. 27, 2013 for U.S. Appl. No. 13/277,108, 32 pages, Doc 4121.
Brindle—Response to Final Office Action dated Dec. 27, 2013 for U.S. Appl. No. 13/277,108, 15 pages, Doc 4122.
USPTO—Notice of Allowance dated Jan. 10, 2014 for U.S. Appl. No. 13/277,108, 47 pages, Doc 4123.
Brindle—Issue Fee Payment dated Apr. 10, 2014 for U.S. Appl. No. 13/277,108, 5 pages, Doc 4124.
USPTO—Issue Notification dated May 14, 2014 for U.S. Appl. No. 13/277,108, 1 page, Doc 4125.
Peregrine—Notice of Loss of Small Entity Status dated Jun. 5, 2017 for U.S. Appl. No. 13/277,108, 1 page, Doc 4126.
Brindle—U.S. Appl. No. 14/198,315, filed Mar. 5, 2014, 124 pages, Doc 4127.
USPTO—Filing Receipt and Notice to File Missing Parts dated Mar. 24, 2014 for U.S. Appl. No. 14/198,315, 7 pages, Doc 4128.
Brindle—Response to Pre-Exam Formalities Notice dated May 27, 2014 for U.S. Appl. No. 14/198,315, 16 pages, Doc 4129.
USPTO—Updated Filing Receipt, Informational Notice and Acceptance of Power of Attorney dated Jul. 15, 2014 for U.S. Appl. No. 14/198,315, 7 pages, Doc 4130.
USPTO—Notice of Allowance dated Aug. 20, 2014 for U.S. Appl. No. 14/198,315, 54 pages, Doc 4131.
USPTO—Notice of Publication dated Oct. 23, 2014 for U.S. Appl. No. 14/198,315, 1 page, Doc 4132.
Brindle—Request for Continued Examination and Notification of Loss of Small Entity Status dated Nov. 20, 2014 for U.S. Appl. No. 14/198,315, 7 pages, Doc 4133.
USPTO—Notice of Allowance dated Feb. 3, 2015 for U.S. Appl. No. 14/198,315, 238 pages, Doc 4134.
Brindle—Substitute Statement in Lieu of Oath or Declaration dated Feb. 26, 2015 for U.S. Appl. No. 14/198,315, 6 pages, Doc 4135.
Brindle—Issue Fee Payment and Letter Regarding Substitute Statement dated May 4, 2015 for U.S. Appl. No. 14/198,315, 3 pages, Doc 4136.
USPTO—Corrected Filing Receipt dated Jun. 9, 2015 for U.S. Appl. No. 14/198,315, 4 pages, Doc 4137.
USPTO—Issue Notification dated Jun. 30, 2015 for U.S. Appl. No. 14/198,315, 1 page, Doc 4138.
Peregrine—Notification of Loss of Small Entity Status dated Jul. 31, 2017 for U.S. Appl. No. 14/198,315, 1 page, Doc 4139.

(56) References Cited

OTHER PUBLICATIONS

Brindle—U.S. Appl. No. 14/804,198, filed Jul. 20, 2015, 116 pages, Doc 4140.
USPTO—Filing Receipt and Notice to File Missing Parts dated Aug. 5, 2015 for U.S. Appl. No. 14/804,198, 6 pages, Doc 4141.
Brindle—Response to Pre-Exam Formalities Notice and Power of Attorney dated Oct. 5, 2015 for U.S. Appl. No. 14/804,198, 15 pages, Doc 4142.
Brindle—Preliminary Amendment dated Nov. 20, 2015 for U.S. Appl. No. 14/804,198, 15 pages, Doc 4143.
USPTO—Updated Filing Receipt, Acceptance of Power of Attorney and Informational Notice dated Nov. 27, 2015 for U.S. Appl. No. 14/804,198, 7 pages, Doc 4144.
USPTO—Office Action dated Mar. 2, 2016 for U.S. Appl. No. 14,804,198, 9 pages, Doc 4145.
USPTO—Notice of Publication dated Mar. 3, 2016 for U.S. Appl. No. 14/804,198, 1 page, Doc 4146.
Brindle—Amendment dated Jun. 2, 2016 for U.S. Appl. No. 14/804,198, 17 pages, Doc 4147.
USPTO—Notice of Allowance dated Sep. 23, 2016 for U.S. Appl. No. 14/804,198, 33 pages, Doc 4148.
USPTO—Corrected Filing Receipt dated Oct. 11, 2016 for U.S. Appl. No. 14/804,198, 1 page, Doc 4149.
Brindle—Substitute Statement in Lieu of Oath or Declaration dated Oct. 28, 2016 for U.S. Appl. No. 14/804,198, 6 pages, Doc 4150.
Brindle—Request for Continued Examination dated Nov. 10, 2016 for U.S. Appl. No. 14/804,198, 3 pages, Doc 4151.
USPTO—Notice of Allowance dated Dec. 7, 2016 for U.S. Appl. No. 14/804,198, 34 pages, Doc 4152.
Brindle—Issue Fee Payment and 312 Amendment dated Mar. 7, 2017 for U.S. Appl. No. 14/804,198, 13 pages, Doc 4153.
USPTO—Notice of Allowance dated Mar. 27, 2017 for U.S. Appl. No. 14/804,198, 10 pages, Doc 4154.
USPTO—312 Amendment Initialed by Examiner dated Apr. 14, 2017 for U.S. Appl. No. 14/804,198, 1 page, Doc 4155.
USPTO—Issue Notification dated Apr. 26, 2017 for U.S. Appl. No. 14/804,198, 1 page, Doc 4156.
Brindle—U.S. Appl. No. 15/354,723, filed Nov. 17, 2016, 123 pages, Doc 4157.
USPTO—Filing Receipt and Notice to File Missing Parts dated Nov. 30, 2016 for U.S. Appl. No. 15/354,723, 7 pages, Doc 4158.
Brindle—Response to Pre-Exam Formalities Notice dated Jan. 30, 2017 for U.S. Appl. No. 15/354,723, 13 pages, Doc 4159.
Brindle—Preliminary Amendment dated Feb. 23, 2017 for U.S. Appl. No. 15/354,723, 13 pages, Doc 4160.
USPTO—Updated Filing Receipt, Informational Notice and Acceptance of Power of Attorney dated Feb. 28, 2017 for U.S. Appl. No. 15/354,723, 7 pages, Doc 4161.
USPTO—Office Action dated Mar. 24, 2017 for U.S. Appl. No. 15/534,723, 22 pages, Doc 4162.
Brindle—Amendment and Terminal Disclaimer dated Apr. 17, 2017 for U.S. Appl. No. 15/354,723, 13 pages, Doc 4163.
USPTO—Terminal Disclaimer Decision dated May 4, 2017 for U.S. Appl. No. 15/354,723, 1 page, Doc 4164.
USPTO—Notice of Publication dated Jun. 8, 2017 for U.S. Appl. No. 15/354,723, 1 page, Doc 4165.
USPTO—Notice of Allowance dated Jun. 21, 2017 for U.S. Appl. No. 15/354,723, 36 pages, Doc 4166.
Brindle—Request for Continued Examination dated Jul. 18, 2017 for U.S. Appl. No. 15/354,723, 3 pages, Doc 4167.
Brindle—Substitute Statement in Lieu of Oath or Declaration dated Aug. 9, 2017 for U.S. Appl. No. 15/354,723, 6 pages, Doc 4168.
USPTO—Notice of Allowance dated Aug. 11, 2017 for U.S. Appl. No. 15/354,723, 31 pages, Doc 4169.
USPTO—Issue Fee Payment dated Aug. 25, 2017 for U.S. Appl. No. 15/354,723, 1 page, Doc 4170.
USPTO—Corrected Notice of Allowability dated Sep. 11, 2017 for U.S. Appl. No. 15/354,723, 2 pages, Doc 4171.
USPTO—Issue Notification dated Sep. 20, 2017 for U.S. Appl. No. 15/354,723, 1 page, Doc 4172.
Brindle—U.S. Appl. No. 15/693,182, filed Aug. 31, 2017, 123 pages, Doc 4173.
USPTO—Filing Receipt and Notice to File Missing Parts dated Sep. 13, 2017 for U.S. Appl. No. 15/693,182, 7 pages, Doc 4174.
Brindle—Preliminary Amendment and Response to Pre-Exam Formalities Notice dated Nov. 13, 2017 for U.S. Appl. No. 15/693,182, 21 pages, Doc 4175.
USPTO—Updated Filing Receipt, Informational Notice and Acceptance of Power of Attorney dated Nov. 20, 2017 for U.S. Appl. No. 15/693,182, 7 pages, Doc 4176.
USPTO—Notice of Publication dated Mar. 1, 2018 for U.S. Appl. No. 15/693,182, 1 page, Doc 4177.
USPTO—Office Action dated Mar. 9, 2018 for U.S. Appl. No. 15/693,182, 15 pages, Doc 4178.
PSemi—Request to Correct Applicant Name dated Apr. 8, 2018 for U.S. Appl. No. 15/693,182, 8 pages, Doc 4179.
USPTO—Corrected Filing Receipt dated Apr. 10, 2018 for U.S. Appl. No. 15/693,182, 4 pages, Doc 4180.
PSemi—Amendment and Terminal Disclaimer dated Apr. 27, 2018 for U.S. Appl. No. 15/693,182, 19 pages, Doc 4181.
PSemi—Terminal Disclaimer filed Jun. 6, 2018 for U.S. Appl. No. 15/693,182, 4 pages, Doc 4182.
USPTO—Terminal Disclaimer decision dated Jun. 8, 2018 for U.S. Appl. No. 15/693,182, 1 page, Doc 4183.
USPTO—Notice of Allowance dated Jun. 21, 2018 for U.S. Appl. No. 15/693,182, 37 pages, Doc 4184.
PSemi—Issue Fee Payment dated Jul. 23, 2018 for U.S. Appl. No. 15/693,182, 4 pages, Doc 4186.
USPTO—Notice of Allowance dated Aug. 6, 2018 for U.S. Appl. No. 15/693,182, 6 pages, Doc 4187.
USPTO—Issue Notification dated Aug. 23, 2018 for U.S. Appl. No. 15/693,182, 1 page, Doc 4188.
PSemi—Substitute Statement in Lieu of Oath or Declaration dated Jul. 20, 2019 for U.S. Appl. No. 15/693,182, 6 pages, Doc 4185.
Brindle—U.S. Appl. No. 16/046,974, filed Jun. 26, 2018, 125 pages, Doc 4189.
USPTO—Filing Receipt and Notice to File Missing Parts dated Aug. 14, 2018 for U.S. Appl. No. 16/046,974, 7 pages, Doc 4190.
Brindle—Response to Pre-Exam Formalities Notice dated Oct. 9, 2018 for U.S. Appl. No. 16/046,974, 13 pages, Doc 4191.
Brindle—Preliminary Amendment dated Dec. 5, 2018 for U.S. Appl. No. 16/046,974, 14 pages, Doc 4192.
USPTO—Updated Filing Receipt and Acceptance of Power of Attorney dated Dec. 10, 2018 for U.S. Appl. No. 16/046,974, 7 pages, Doc 4193.
USPTO—Notice of Allowance dated May 8, 2019 for U.S. Appl. No. 16/046,974, 46 pages, Doc 4194.
PSemi—Power of Attorney dated May 16, 2019 for U.S. Appl. No. 16/046,974, 4 pages Doc 4195.
USPTO—Acceptance of Power of Attorney dated May 20, 2019 for U.S. Appl. No. 16/046,974, 2 pages, Doc 4196.
USPTO—Notice of Allowance and Notice of Allowability dated Sep. 19, 2019 for U.S. Appl. No. 16/046,974, 120 pages, Doc 9015.
Brindle—312 Amendment filed Nov. 1, 2019 for U.S. Appl. No. 16/046,974, 19 pages, Doc 9016.
Brindle—Issue Fee Payment filed Dec. 19, 2019 for U.S. Appl. No. 16/046,974, 3 pages, Doc 9052.
USPTO—Corrected Notice of Allowability dated Dec. 23, 2019 for U.S. Appl. No. 16/046,974, 4 pages, Doc 9053.
USPTO—Corrected Notice of Allowability dated Jan. 24, 2020 for U.S. Appl. No. 16/046,974, 11 pages, Doc 9078.
USPTO—Corrected Notice of Allowability dated Mar. 16, 2020 for U.S. Appl. No. 16/046,974, 7 pages, Doc 9142.
Brindle—Petition to Correct Inventorship filed Apr. 20, 2020 for U.S. Appl. No. 16/046,974, 23 pages, Doc 9143.
USPTO—Notice of Acceptance of Request Under 37 CFR 1.48(a) dated Apr. 27, 2020 for U.S. Appl. No. 16/046,974, 1 page, Doc 9185.
USPTO—Corrected Notice of Allowability dated May 1, 2020 for U.S. Appl. No. 16/046,974, 8 pages, Doc 9186.
Brindle—Request for Corrected Filing Receipt filed May 12, 2020 for U.S. Appl. No. 16/046,974, 20 pages, Doc 9187.

(56) References Cited

OTHER PUBLICATIONS

USPTO—Corrected Filing Receipt dated May 14, 2020 for U.S. Appl. No. 16/046,974, 4 pages, Doc 9188.
USPTO—Issue Notification dated Jun. 10, 2020 for U.S. Appl. No. 16/046,974, 1 page, Doc 9189.
USPTO—Corrected Notice of Allowability dated Aug. 4, 2020 for U.S. Appl. No. 16/046,974, 11 pages, Doc 9246.
USPTO—Corrected Notice of Allowability dated Aug. 24, 2020 for U.S. Appl. No. 16/046,974, 5 pages, Doc 9288.
USPTO—Issue Notification dated Sep. 16, 2020 for U.S. Appl. No. 16/046,974, 1 page, Doc 9289.
Brindle—U.S. Appl. No. 16/377,026, filed Apr. 5, 2019, 135 pages, Doc 4206.
Brindle—Authorization to Act in Representative Capacity dated Apr. 16, 2019 for U.S. Appl. No. 16/377,026, 4 pages, Doc 4207.
USPTO—Filing Receipt and Decision Granting Request for Track 1 dated Apr. 24, 2019 for U.S. Appl. No. 16/377,026, 8 pages, Doc 4208.
USPTO—Notice of Allowance dated May 29, 2019 for U.S. Appl. No. 16/377,026, 24 pages, Doc 4209.
USPTO—Acceptance of Power of Attorney dated May 30, 2019 for U.S. Appl. No. 16/377,026, 1 page, Doc 4210.
USPTO—Notice of Allowance and Notice of Allowability dated Oct. 2, 2019 for U.S. Appl. No. 16/377,026, 122 pages, Doc 9017.
USPTO—Corrected Notice of Allowability dated Dec. 18, 2019 for U.S. Appl. No. 16/377,026, 4 pages, Doc 9054.
Brindle—Issue Fee Payment and 312 Amendment filed Jan. 2, 2020 for U.S. Appl. No. 16/377,026, 26 pages, Doc 9059.
USPTO—Corrected Notice of Allowability dated Feb. 14, 2020 for U.S. Appl. No. 16/377,026, 17 pages, Doc 9091.
USPTO—Corrected Notice of Allowability dated Mar. 13, 2020 for U.S. Appl. No. 16/377,026, 8 pages, Doc 9190.
USPTO—Office Communication dated Mar. 26, 2020 for U.S. Appl. No. 16/377,026, 10 pages, Doc 9191.
USPTO—Corrected Notice of Allowability dated May 1, 2020 for U.S. Appl. No. 16/377,026, 7 pages, Doc 9192.
USPTO—Issue Notification dated Jun. 10, 2020 for U.S. Appl. No. 16/377,026, 1 page, Doc 9193.
USPTO—Corrected Notice of Allowability dated Jun. 24, 2020 for U.S. Appl. No. 16/377,026, 6 pages, Doc 9217.
USPTO—Corrected Notice of Allowability dated Jul. 8, 2020 for U.S. Appl. No. 16/377,026, 4 pages, Doc 9218.
USPTO—Corrected Notice of Allowability dated Jul. 23, 2020 for U.S. Appl. No. 16/377,026, 6 pages, Doc 9235.
USPTO—Notice of Allowance and Allowability dated Aug. 18, 2020 for U.S. Appl. No. 16/377,026, 11 pages, Doc 9290.
Brindle—Response to Notice of Allowance filed Aug. 18, 2020 for U.S. Appl. No. 16/377,026, 6 pages, Doc 9291.
USPTO—Issue Notification dated Sep. 9, 2020 for U.S. Appl. No. 16/377,026, 1 page, Doc 9292.
Brindle—U.S. Appl. No. 16/739,093, filed Jan. 9, 2020, 132 pages, Doc 9066.
USPTO—Notice of Missing Parts dated Jan. 31, 2020 for U.S. Appl. No. 16/739,093, 2 pages, Doc 9083.
USPTO—Filing Receipt dated Jan. 31, 2020 for U.S. Appl. No. 16/739,093, 4 pages, Doc 9084.
Brindle—Response to Notice of Missing Parts and Preliminary Amendment filed Jun. 30, 2020 for U.S. Appl. No. 16/739,093, 19 pages, Doc 9219.
Brindle—Terminal Disclaimers filed Jul. 1, 2020 for U.S. Appl. No. 16/739,093, 7 pages, Doc 9220.
USPTO—Updated Filing Receipt dated Jul. 2, 2020 for U.S. Appl. No. 16/739,093, 6 page, Doc 9221.
USPTO—Notice of Publication dated Oct. 8, 2020 for U.S. Appl. No. 16/739,093, 1 pages, Doc 9293.
Brindle—U.S. Appl. No. 11/881,816, filed Jul. 26, 2007, 45 pages, Doc 4433.
USPTO—Filing Receipt and Pre-Exam Formalities Notice dated Aug. 13, 2007 for U.S. Appl. No. 11/881,816, 5 pages, Doc 4434.
Brindle—Response to Pre-Exam Formalities Notice and Request for Corrected Filing Receipt dated Oct. 18, 2007 for U.S. Appl. No. 11/881,816, 16 pages, Doc 4435.
USPTO—Updated Filing Receipt dated Nov. 5, 2007 for U.S. Appl. No. 11/881,816, 3 pages, Doc 4436.
Brindle—Request for Corrected Filing Receipt dated Nov. 23, 2007 for U.S. Appl. No. 11/881,816, 4 pages, Doc 4437.
USPTO—Corrected Filing Receipt dated Dec. 19, 2007 for U.S. Appl. No. 11/881,816, 3 pages, Doc 4438.
USPTO—Notice of Publication dated Mar. 27, 2008 for U.S. Appl. No. 11/881,816, 1 page, Doc 4439.
USPTO—Restriction Requirement dated Oct. 7, 2008 for U.S. Appl. No. 11/881,816, 5 pages, Doc 4440.
Brindle—Amendment filed Jan. 12, 2009 for U.S. Appl. No. 11/881,816, 7 pages, Doc 4441.
USPTO—Notice of Non-Responsive Amendment dated Apr. 28, 2009 for U.S. Appl. No. 11/881,816, 3 pages, Doc 4442.
Brindle—Amendment filed Aug. 31, 2009 for U.S. Appl. No. 11/881,816, 7 pages, Doc 4443.
Brindle—Amendment filed Jul. 21, 2010 for U.S. Appl. No. 11/881,816, 23 pages, Doc 4445.
USPTO—Final Office Action dated Oct. 14, 2010 for U.S. Appl. No. 11/881,816, 17 pages, Doc 4446.
Brindle—Amendment dated Jan. 14, 2011 for U.S. Appl. No. 11/881,816, 19 pages, Doc 4447.
USPTO—Advisory Action dated Mar. 18, 2011 for U.S. Appl. No. 11/881,816, 3 pages, Doc 4448.
USPTO—Examiner Interview Summary dated Apr. 18, 2011 for U.S. Appl. No. 11/881,816, 3 pages, Doc 4449.
Brindle—Letter Confirming No Formal Response to Examiner Interview Summary Required dated Jun. 29, 2011 for U.S. Appl. No. 11/881,816, 1 page, Doc 4450.
USPTO—Notice of Allowance dated Oct. 12, 2011 for U.S. Appl. No. 11/881,816, 10 pages, Doc 4451.
Brindle—Issue Fee Payment dated Jan. 17, 2012 for U.S. Appl. No. 11/881,816, 1 page, Doc 4452.
USPTO—Issue Notification dated Mar. 7, 2012 for U.S. Appl. No. 11/881,816, 1 page, Doc 4453.
Brindle—Auto-Granted Petition to Remove from Issue dated Mar. 26, 2012 for U.S. Appl. No. 11/881,816, 6 pages, Doc 4454.
Brindle—Request for Continued Examination filed Mar. 26, 2012 for U.S. Appl. No. 11/881,816, 3 pages, Doc 4455.
USPTO—Notice of Withdrawal from Issue dated Apr. 11, 2012 for U.S. Appl. No. 11/881,816, 1 page, Doc 4456.
USPTO—Notice of Allowance dated Jun. 4, 2012 for U.S. Appl. No. 11/881,816, 17 pages, Doc 4457.
Brindle—Issue Fee Payment dated Sep. 4, 2012 for U.S. Appl. No. 11/881,816, 1 page, Doc 4458.
USPTO—Issue Notification dated Oct. 10, 2012 for U.S. Appl. No. 11/881,816, 1 page. Doc 4459.
Brindle—Auto-Granted Petition to Remove from Issue dated Oct. 17, 2012 for U.S. Appl. No. 11/881,816, 7 pages, Doc 4460.
Brindle—Request for Continued Examination filed Oct. 17, 2012 for U.S. Appl. No. 11/881,816, 3 pages, Doc 4461.
USPTO—Office Action dated Mar. 1, 2013 for U.S. Appl. No. 11/881,816, 12 pages, Doc 4462.
Brindle—Amendment filed Jun. 3, 2013 for U.S. Appl. No. 11/881,816, 30 pages, Doc 4463.
USPTO—Final Rejection dated Oct. 23, 2013 for U.S. Appl. No. 11/881,816, 12 pages, Doc 4464.
Brindle—Amendment filed Feb. 4, 2014 in U.S. Appl. No. 11/881,816, 21 pages, Doc 4465.
USPTO—Advisory Action dated Feb. 19, 2014 for U.S. Appl. No. 11/881,816, 3 pages, Doc 4466.
Brindle—Notice of Appeal with Pre-Brief Conference Request filed Feb. 20, 2014 in U.S. Appl. No. 11/881,816, 13 pages, Doc 4467.
USPTO—Pre-Appeal Brief Conference Decision dated Apr. 21, 2014 for U.S. Appl. No. 11/881,816, 2 pages, Doc 4468.
USPTO—Notice of Abandonment dated Dec. 23, 2014 for U.S. Appl. No. 11/881,816, 2 pages, Doc 4469.
USPTO—Office Action dated Jan. 19, 2010 for U.S. Appl. No. 11/881,816, 8 pages, Doc 4444.

(56) References Cited

OTHER PUBLICATIONS

Dribinsky—U.S. Appl. No. 14/257,808, filed Apr. 21, 2014, 47 pages, Doc 4327.
USPTO—Filing Receipt and Notice to File Missing Parts dated May 8, 2014 for U.S. Appl. No. 14/257,808, 6 pages, Doc 4306.
Dribinsky—Power of Attorney and Response to Notice to File Missing Parts dated Jul. 7, 2014 for U.S. Appl. No. 14/257,808, 15 pages, Doc 4307.
USPTO—Updated Filing Receipt, Informational Notice, and Acceptance of Power of Attorney dated Oct. 9, 2014 for U.S. Appl. No. 14/257,808, 6 pages, Doc 4308.
USPTO—Notice of Publication dated Jan. 15, 2015 for U.S. Appl. No. 14/257,808, 1 page, Doc 4309.
Dribinsky—Substitute Statement in Lieu of Oath or Declaration dated Mar. 11, 2015 for U.S. Appl. No. 14/257,808, 6 pages, Doc 4310.
Shingleton—Office Action dated Apr. 10, 2015 for U.S. Appl. No. 14/257,808, 8 pages, Doc 0958.
USPTO—Office Action dated Apr. 10, 2015 for U.S. Appl. No. 14/257,808, 10 pages, Doc 4311.
Dribinsky—Amendment dated Oct. 13, 2015 for U.S. Appl. No. 14/257,808, 27 pages, Doc 4312.
USPTO—Notice of Allowance dated Dec. 10, 2015 for U.S. Appl. No. 14/257,808, 181 pages, Doc 4313.
Dribinsky—Issue Fee Payment dated Jan. 12, 2016 for U.S. Appl. No. 14/257,808, 1 page, Doc 4314.
USPTO—Issue Notification dated Jun. 26, 2016 for U.S. Appl. No. 14/257,808, 15 pages, Doc 4315.
Dribinsky—U.S. Appl. No. 14/987,360, filed Jan. 4, 2016, 58 pages, Doc 4316.
USPTO—Filing Receipt and Notice to File Missing Parts dated Jan. 20, 2016 for U.S. Appl. No. 14/987,360, 7 pages, Doc 4317.
Dribinsky—Power of Attorney and Response to Notice to File Missing Parts dated Mar. 21, 2016 for U.S. Appl. No. 14/987,360, 16 pages, Doc 4318.
USPTO—Updated Filing Receipt, Informational Notice and Acceptance of Power of Attorney dated Apr. 25, 2016 for U.S. Appl. No. 14/987,360, 7 pages, Doc 4319.
USPTO—Notice of Publication dated Aug. 4, 2016 for U.S. Appl. No. 14/987,360, 1 page, Doc 4320.
USPTO—Office Action dated Sep. 14, 2016 for U.S. Appl. No. 14/987,360, 18 pages, Doc 4321.
Dribinsky—Amendment dated Dec. 14, 2016 for U.S. Appl. No. 14/987,360, 35 pages, Doc 4322.
Dribinsky—Terminal Disclaimer dated Dec. 14, 2016 for U.S. Appl. No. 14/987,360, 2 pages, Doc 4323.
USPTO—Terminal Disclaimer Decision dated Jan. 7, 2017 for U.S. Appl. No. 14/987,360, 1 page, Doc 4324.
USPTO—Notice of Allowance dated Aug. 10, 2017 for U.S. Appl. No. 14/987,360, 54 pages, Doc 4325.
Dribinsky—Issue Fee Payment dated Oct. 31, 2017 for U.S. Appl. No. 14/987,360, 4 pages, Doc 4328.
USPTO—Issue Notification dated Jan. 17, 2018 for U.S. Appl. No. 14/987,360, 1 page, Doc 4329.
Dribinsky—U.S. Appl. No. 15/826,453, filed Nov. 29, 2017, 58 pages, Doc 4330.
USPTO—Filing Receipt and Notice to File Missing Parts dated Dec. 20, 2017 for U.S. Appl. No. 15/826,453, 7 pages, Doc 4331.
Dribinsky—Response to Pre-Exam Formalities Notice, Power of Attorney and 3.73 Statement dated Feb. 20, 2018 for U.S. Appl. No. 15/826,453, 14 pages, Doc 4332.
Dribinsky—Request for Change of Applicant dated Apr. 15, 2018 for U.S. Appl. No. 15/826,453, 8 pages, Doc 4333.
USPTO—Notice of Acceptance of Power of Attorney, Updated Filing Receipt and Informational Notice dated Apr. 17, 2018 for U.S. Appl. No. 15/826,453, 7 pages, Doc 4334.
USPTO—Notice of Publication dated Jul. 26, 2018 for U.S. Appl. No. 15/826,453, 1 page, Doc 4335.
USPTO—Office Action dated Feb. 14, 2019 for U.S. Appl. No. 15/826,453, 36 pages, Doc 4336.
Dribinsky—Response to Office Action dated May 9, 2019 for U.S. Appl. No. 15/826,453, 25 pages, Doc 4337.
USPTO—Final Office Action dated Jun. 6, 2019 for U.S. Appl. No. 15/826,453, 18 pages, Doc 4338.
PSemi—Request for Continued Examination and Amendment filed Nov. 6, 2019 for U.S. Appl. No. 15/826,453, 28 pages—Doc 9018.
USPTO—Notice of Allowance dated Jan. 13, 2020 for U.S. Appl. No. 15/826,453, 5 pages—Doc 9073.
USPTO—Notice Requiring Inventor's Oath or Declaration dated Mar. 10, 2020 for U.S. Appl. No. 15/826,453, 1 page—Doc 9101.
USPTO—Notice to File Corrected Application Papers dated Mar. 16, 2020 for U.S. Appl. No. 15/826,453, 3 pages—Doc 9157.
Dribinsky—Request for Continued Examination filed Apr. 12, 2020 for U.S. Appl. No. 15/826,453, 23 pages—Doc 9158.
Dribinsky—Preliminary Amendment filed Apr. 15, 2020 for U.S. Appl. No. 15/826,453, 11 pages—Doc 9159.
Dribinsky—Response to Notice Requiring Inventor's Oath filed Apr. 21, 2020 for U.S. Appl. No. 15/826,453, 1 page, Doc 9194.
USPTO—Non-final Office Action dated May 7, 2020 for U.S. Appl. No. 15/826,453, 144 pages, Doc 9195.
Dribinsky—eTerminal Disclaimer filed May 8, 2020 for U.S. Appl. No. 15/826,453, 5 pages Doc 9196.
Dribinsky—Response to Non-final Office Action dated May 8, 2020 for U.S. Appl. No. 15/826,453, 11 pages, Doc 9197.
Dribinsky—Response to Notice to File Corrected Application Papers filed May 12, 2020 for U.S. Appl. No. 15/826,453, 9 pages, Doc 9198.
USPTO—Final Office Action dated May 27, 2020 for U.S. Appl. No. 15/826,453, 5 pages, Doc 9199.
Dribinsky—Response to Final Office Action filed Jun. 9, 2020 for U.S. Appl. No. 15/826,453, 12 pages, Doc 9200.
Dribinsky—e-Terminal Disclaimer filed Jun. 9, 2020 for U.S. Appl. No. 15/826,453, 12 pages, Doc 9201.
USPTO—Notice of Allowance dated Jun. 17, 2020 for U.S. Appl. No. 15/826,453, 5 pages, Doc 9202.
Dribinsky—Issue Fee Payment filed Jun. 20, 2020 for U.S. Appl. No. 15/826,453, 5 pages, Doc 9203.
USPTO—Corrected Notice of Allowability dated Jul. 22, 2020 for U.S. Appl. No. 15/826,453, 8 pages, Doc 7238.
USPTO—Corrected Notice of Allowability dated Jul. 31, 2020 for U.S. Appl. No. 15/826,453, 4 pages, Doc 9250.
USPTO—Notice of Allowability dated Aug. 10, 2020 for U.S. Appl. No. 15/826,453, 3 pages, Doc 9254.
USPTO—Corrected Notice of Allowability dated Aug. 19, 2020 for U.S. Appl. No. 15/826,453, 4 pages, Doc 9294.
USPTO—Issue Notification dated Sep. 3, 2020 for U.S. Appl. No. 15/826,453, 1 page, Doc 9295.
Dribinsky—US Patent Application filed Jul. 7, 2020 for U.S. Appl. No. 16/921,790, 59 pages, Doc 9228.
USPTO—Filing Receipt dated Jul. 16, 2020 for U.S. Appl. No. 16/921,790, 5 pages, Doc 9229.
USPTO—Notice of Missing Parts dated Jul. 16, 2020 for U.S. Appl. No. 16/921,790, 2 pages, Doc 9230.
Patel—Office Action dated Dec. 5, 2011 for U.S. Appl. No. 13/046,560, 18 pages, Doc 0797.
Englekirk—Amendment dated Mar. 5, 2012 for U.S. Appl. No. 13/046,560, 7 pages, Doc 0803.
Patel—Notice of Allowance dated May 24, 2012 for U.S. Appl. No. 13/046,560, 15 pages, Doc 0817.
Patel—Notice of Allowance dated Dec. 3, 2012 for U.S. Appl. No. 13/046,560, 198 pages, Doc 0829.
Patel—Notice of Allowance dated Mar. 15, 2013 for U.S. Appl. No. 13/046,560, 16 pages, Doc 0847.
Englekirk—Fee Transmittal and Comments on Allowance dated Jun. 17, 2013 for U.S. Appl. No. 13/046,560, 4 pages, Doc 0855.
Patel—Office Action dated Aug. 15, 2014 for U.S. Appl. No. 14/028,357, 12 pages, Doc 0923.
Patel—Final Office Action dated Apr. 7, 2015 for U.S. Appl. No. 14/028,357, 160 pages, Doc 0957.
Englekirk—Response to Final Office Action dated Jun. 8, 2015 for U.S. Appl. No. 14/028,357, 10 pages, Doc 0964.
Patel—Notice of Allowance dated Jun. 25, 2015 for U.S. Appl. No. 14/028,357, 18 pages, Doc 0966.

(56) References Cited

OTHER PUBLICATIONS

Patel—Office Action dated Jun. 22, 2016 for U.S. Appl. No. 14/883,122, 12 pages, Doc 0999.
Patel—Notice of Allowance dated Nov. 2, 2016 for U.S. Appl. No. 14/883,122, 21 pages, Doc 1010.
Dang—Notice of Allowance dated Jan. 25, 2013 for U.S. Appl. No. 12/735,954, 57 pages, Doc 0839.
Dang—Office Action dated Feb. 26, 2014 for U.S. Appl. No. 12/735,954, 34 pages, Doc 0892.
EPO—Communications pursuant to Article 94(3) EPC from EPO dated Mar. 22, 2010 for Application No. EP05763216.8, 7 pages, Doc 0733.
EPO—Communication under Rule 71(3) EPC for Application No. EP05763216.8, dated Apr. 25, 2014, 47 pages, Doc 0902.
JPO—Notice of Reasons for Refusal for Application No. 2007-518298, dated Jul. 13, 2010, 9 pages, Doc 0747.
Peregrine—Amendment for Application No. JP2007518298, dated Oct. 15, 2010, 10 pages, Doc 0761.
JPO—Notice of Reasons for Refusal for Application No. JP2010232563, dated Mar. 23, 2011, 7 pages, Doc 0770.
WIPO—Corrected Publication for Application No. PCT/US02/32266 dated Apr. 17, 2003, 66 pages, Doc 2000.
WIPO—Correction of entry in Section I of the PCT Gazette for Application No. PCT/US02/32266 dated Apr. 17, 2003, 2 pages, Doc 2001.
WIPO—International Publication without Search Report for Application No. PCT/US02/32266 dated Apr. 17, 2003, 65 pages, Doc 2003.
WIPO—International Publication for Application No. PCT/US02/32266 dated Apr. 17, 2003, 3 pages, Doc 2002.
PCT—International Preliminary Examination Report for Application No. PCT/US02/32266 dated Sep. 27, 2004, 13 pages, Doc 2004.
PCT—International Search Report for Application No. PCT/US2005/022407, dated Nov. 15, 2005 2 pages, Doc 0633.
Peregrine—Communication Pursuant to Article 94(3) EPC from EPO dated Jun. 19, 2008 for Application No. EP02800982.7, 3 pages, Doc 0664.
Peregrine—EP Response dated Dec. 23, 2008 for Application No. EP02800982.7, 22 pages, Doc 0680.
EPO—Communication pursuant to Rule 94(3) EPC for Application No. EP02800982.7, dated Aug. 6, 2009, 2 pages, Doc 0703.
Peregrine—EP Response filed Oct. 7, 2009 for Application No. EP02800982.7, 23 pages, Doc 0715.
EPO—Communication under Rule 71(3) EPC and Annex Form 2004 for Application No. EP02800982.7, dated Nov. 27, 2009, 68 pages, Doc 0717.
EPO—Communication of a Notice of Opposition for Application No. EP02800982.7, dated Nov. 8, 2011, 33 pages, Doc 0793.
Huber—Response to Notice of Opposition for Application No. EP1451890, dated Apr. 17, 2012, 46 pages, Doc 0809.
Huber—Response for Application No. EP10011669.8, dated May 15, 2012, 19 pages, Doc 0816.
EPO—Summons to Attend Oral Proceedings pursuant to Rule 115(1) EPC, dated Oct. 17, 2013 for Application No. EP02800982.7, 20 pages, Doc 0873.
Huber—Response to Summons to attend Oral Proceedings dated Oct. 17, 2013 for Application No. EP02800982.7, dated Jan. 9, 2014,21 pages, Doc 0882.
Nguyen—Notice of Allowance for U.S. Appl. No. 13/277,108, dated Jan. 10, 2014, 47 pages, Doc 0883.
EPO—Brief Communication regarding Oral Proceedings for Application No. EP02800982.7, dated Jan. 16, 2014, 1 page, Doc 0884.
Huber—Report on Decision in EPO Opposition Division for Application No. EP02800982.7, dated Feb. 25, 2014, 13 pages, Doc 0891.
EPO—Communication Pursuant to Article 101(1) and 81(2) to (3) EPC for Application No. EP02800982.7, dated Mar. 3, 2014, 7 pages, Doc 0893.

EPO—Provision of the minutes in accordance with Rule 124(4) EPC for Application No. EP02800982.7, dated Apr. 10, 2014, 11 pages, Doc 0900.
EPO—Brief Communication for Application No. EP02800982.7, dated May 8, 2014, 2 pages, Doc 0905.
Huber—Reply to Official Communication for Application No. EP02800982.7, dated May 8, 2014, 84 pages, Doc 0906.
EPO—Brief Communication dated Aug. 14, 2014 for Application No. EP02800982.7, dated Aug. 14, 2014, 2 pages, Doc 0920.
EPO—Brief Communication from EPO for Application No. EP02800982.7, dated Oct. 24, 2014, 2 pages, Doc 0934.
EPO—Interlocutory Decision in Opposition Proceedings for Application No. EP02800982.7, dated Nov. 14, 2014, 79 pages, Doc 0935.
EPO—Request for Grant of a Divisional Patent, Application No. EP10011669.8, dated Sep. 29, 2010, 73 pages, Doc 2081.
EPO—Noting of Loss of Rights Rule 112(1) EPC for Application No. EP10011669.8, dated Dec. 15, 2010, 4 pages, Doc 2082.
Huber—Response to Noting of Loss of Rights Rule 112(1) EPC for Application No. EP10011669.8, dated Dec. 21, 2010, 5 pages, Doc 2083.
EPO—Communication Under Rule 112(2) EPC for Application No. EP10011669.8, dated Feb. 15, 2011, 1 page, Doc 2084.
EPO—Communication Pursuant to Rule 58 EPC Invitation to Remedy Deficiencies in the Application Documents for Application No. EP10011996.8, dated Mar. 1, 2011, 3 pages, Doc 2085.
Huber—Response to Invitation to Remedy Deficiencies Pursuant to Rule 58 EPC dated Mar. 1, 2011 for Application No. EP10011669.8, dated Mar. 25, 2011, 14 pages, Doc 2086.
Huber—Response to the Communication Pursuant to Rule 19(1)EPC dated Mar. 23, 2011 for Application No. EP10011669.8, dated Apr. 15, 2011, 1 page, Doc 2087.
EPO—Extended European Search Report for Application No. EP10011669.8, dated Sep. 30, 2011, 8 pages, Doc 2088.
EPO—Notification of European Publication Number and Information on the Application of Article 67(3) EPC for Application No. EP10011669.8, dated Oct. 19, 2011, 2 pages, Doc 2089.
EPO—Communication Pursuant to Rule 69 EPC Reminder Concerning Payment of the Designation Fee and the Examination Fee for Application No. EP10011669.8, dated Nov. 21, 2011, 2 pages, Doc 2090.
Huber—Response to Communication dated Nov. 21, 2011 for Application No. EP10011669.8, dated May 15, 2012, 19 pages, Doc 2091.
EPO—Payment of Fees and Costs for Application No. EP10011669.8, dated Oct. 31, 2012, 1 page, Doc 2092.
EPO—Communication Pursuant to Article 94(3) EPC for Application No. EP10011669.8, dated Apr. 9, 2014, 5 pages, Doc 2093.
Huber—Response to Communication Pursuant to Article 94(3) EPC dated Apr. 9, 2014 for Application No. EP10011669.8, dated Aug. 6, 2014, 1 page, Doc 2094.
EPO—Extension of Time Limit Pursuant to Rule 132(2) EPC for Application No. EP10011669.8, dated Aug. 12, 2014, 1 page, Doc 2095.
Huber—Response to Office Action dated Apr. 9, 2014 for Application No. EP10011669.8, dated Oct. 14, 2014, 30 pages, Doc 0971.
Huber—Response to Office Action dated Apr. 9, 2014 for Application No. EP10011669.8, dated Oct. 14, 2014, 30 pages, Doc 2096.
Huber—Acknowledgement of Receipt of Response to Office Action dated Apr. 9, 2014 for Application No. EP10011669.8, dated Oct. 14, 2014, 30 pages, Doc 2097.
EPO—CDS Clean Up—Amended Data Concerning the Representative for the Applicant for Application No. EP10011669.8, dated Dec. 23, 2014, 1 page, Doc 2098.
Huber—Enquiry as to when a Communication from the Examining Division can be Expected for Application No. EP10011669.8, dated Oct. 12, 2015, 1 page, Doc 2099.
EPO—Response to Enquiry for Communication from the Examining Division for Application No. EP10011669.8, dated Oct. 16, 2015, 1 page, Doc 2100.
EPO—Communication Under Rule 71(3) EPC for Application No. EP10011669.8, dated Dec. 1, 2015, 78 pages, Doc 2101.

(56) References Cited

OTHER PUBLICATIONS

Huber—Response to Communication Dated Dec. 1, 2015 for Application No. EP10011669.8, dated Mar. 16, 2016, 11 pages, Doc 2102.
EPO—Decision to Grant a European Patent Pursuant to Article 97(1) EPC for Application No. EP10011669.8 dated Apr. 7, 2016, 2 pages, Doc 2103.
EPO—Transmission of the Certificate for a European Patent Pursuant to Rule 74 EPC for Application No. EP10011669.8, dated May 4, 2016, 1 page, Doc 2104.
EPO—Communication Regarding the Expiry of the Time Limit Within Which Notice of Opposition May be Filed for Application No. EP10011669.8, dated Mar. 10, 2017, 1 page, Doc 2105.
EPO—Request for Grant of European Divisional Patent for Application No. EP16020116.6, dated Apr. 6, 2016, 62 pages, Doc 2106.
EPO—Payment of Fees and Costs for Application No. EP16020116.6, dated May 3, 2016, 2 page, Doc 2107.
EPO—Communication Pursuant to Rule 58 EPC Invitation to Remedy Deficiencies in the Application Documents for Application No. EP16020116.6 dated May 19, 2016, 4 pages, Doc 2108.
Huber—Response to Official Communication dated May 19, 2016 for Application No. EP16020116.6, dated May 31, 2016, 14 pages, Doc 2109.
Huber—Response to Invitation to Remedy Deficiencies to (R. 58 EPC) dated May 19, 2014 for Application No. EP16020116.6, dated Jul. 28, 2016, 6 pages, Doc 2110.
EPO—Payment of Fees and Costs for Application No. EP16020116.6, dated Aug. 3, 2016, 2 page, Doc 2111.
EPO—Notice of Debiting of Fees for Application No. EP16020116.6, dated Aug. 17, 2016, 1 page, Doc 2112.
Huber—Addition to Letter dated Jul. 28, 2016 for Application No. EP16020116.6, dated Sep. 6, 2016, 2 pages, Doc 2113.
EPO—Payment of Fees and Costs for Application No. EP16020116.6, dated Oct. 24, 2016, 2 pages, Doc 2114.
EPO—Notice of Debiting of Fees for Application No. EP16020116.6, dated Nov. 4, 2016, 1 page, Doc 2115.
EPO—Extended European Search Report for Application No. EP16020116.6, dated Dec. 6, 2016, 9 pages, Doc 2116.
EPO—Notification of European Publication Numbers and Information on the Application of Article 67(3) EPC for Application No. EP16020116.6, dated Dec. 7, 2016, 2 pages, Doc 2117.
EPO—Refund of fees for Application No. EP16020116.6, dated Dec. 14, 2016, 1 page, Doc 2118.
EPO—Communication Pursuant to Rule 69 EPC Reminder Concerning Payment of the Designation Fee and the Examination Fee for Application No. EP16020116.6, dated Jan. 10, 2017, 2 pages, Doc 2119.
EPO—Noting of Loss of Rights Pursuant to Rule 112(1) EPC for Application No. EP16020116.6, dated Aug. 11, 2017, 2 pages, Doc 2120.
EPO—Final Instructions (application deemed to be withdrawn/application refused) for Application No. EP16020116.6, dated Nov. 21, 2017, 1 page, Doc 2121.
Huber—Additions to Response dated Jul. 28, 2016 for Application No. EP16020116.6, dated Sep. 6, 2016, 2 pages, Doc 1001.
EPO—Extended Search Report for Application No. EP16020116.6, dated Dec. 6, 2016, 9 pages, Doc 1012.
TMI Associates—Letter Regarding Office Action Response for Application No. JP2003-535287, dated Nov. 30, 2005, 1 page, Doc 2342.
JPO—Notice of Reasons for Refusal for Application No. JP2003535287, dated Feb. 9, 2006, 5 pages, Doc 0638.
TMI Associates—Letter Regarding Office Action for Application No. JP2003-535287, dated Mar. 1, 2006, 5 pages, Doc 2343.
Kuhn—Expert Testimony of Kuhn for Application No. JP2003-535287, dated Aug. 3, 2006, 12 pages, Doc 2337.
Kuhn—Response to JP Final Rejection for Application No. JP2003-535287, dated Aug. 3, 2006, 32 pages, Doc 2339.
J&A—Letter Regarding Replying to Final Rejection issued by JP Examiner on Feb. 13, 2006 for Application No. JP2003-535287, dated Aug. 7, 2006, 4 pages, Doc 2338.
Peregrine—JP Response to Notice of Refusal for Application No. JP2003535287, dated Aug. 14, 2006, 10 pages, Doc 0647.
JPO—Notice of Reasons for Refusal for Application No. JP2003535287, dated Oct. 5, 2006, 7 pages, Doc 0650.
TMI Associates—Confirmation of Letter Regarding Response to Office Action for Application No. JP2003-535287, dated Oct. 5, 2006, 3 pages, Doc 2341.
J&A—Letter Regarding Invoice for Application No. JP2003-535287, dated Jan. 25, 2006, 2 pages, Doc 2334.
Burgener—Email Regarding no. Longer Pursuing Application for Application No. JP2003-535287, dated Jan. 5, 2007, 1 page, Doc 2335.
TMI Associates—Letter Regarding Extension of Time for Response to Office Action for Application No. JP2003-535287, dated Feb. 23, 2007, 1 page, Doc 2344.
Burgener—Email Regarding Abandoning Application for Application No. JP2003-535287, dated Jan. 5, 2007, 1 page, Doc 2336.
TMI Associates—Letter Regarding Closing Matter for Application No. JP2003-535287, dated Apr. 4, 2007, 2 pages, Doc 2340.
J&A—Letter Responding to Office Action with Replacement Claims for Application JP2003-535287, dated Nov. 10, 2015, 16 pages, Doc 2332.
PCT—International Search Report from USRO dated Mar. 28, 2003 for Application No. PCT/US02/32266, 2 pages, Doc 0586.
Peregrine—Communication and supplementary European Search Report dated Nov. 27, 2009 for Application No. EP05763216.8, 7 pages, Doc 0718.
L&P—Response to Communication Pursuant to Article 94(3) dated Jan. 21, 2013 for Application No. EP05763216.8, 17 pages, Doc 0863.
EPO—Decision to Grant EP Patent pursuant to Article 97(1) EPC for Application No. EP05763216.8, dated Sep. 4, 2014, 2 pages, Doc 0927.
L&P—Response to Invitation Pursuant to Rule 58 EPC issued on Oct. 9, 2014 for Application No. EP14182150.4, dated Dec. 4, 2014, 6 pages, Doc 0939.
EPO—Invitation Pursuant to Rule 63(1) EPC for Application No. EP14182150.4, dated Mar. 3, 2015, 3 pages, Doc 0953.
L&P—Response to Invitation Pursuant to Rule 63(1) for Application No. EP14182150.4, dated Apr. 29, 2015, 12 pages, Doc 0962.
EPO—Extended Search Report for Application No. EP14182150.4, dated Jun. 11, 2015, 9 pages, Doc 0965.
EPO—Communication pursuant to Article 94(3) EPC for Application No. EP14182150.4, dated Jul. 2, 2018, 4 pages, Doc 1056.
EPO—Communication under Rule 71(3) EPC for Application No. EP14182150.4, dated Nov. 2, 2018, 82 pages, Doc 1068.
PCT—Chapter II Demand filed Aug. 17, 2012 for Application No. PCT/US2011/056942, 41 pages, Doc 0824.
EPO—Information on Entry into European Phase for Application No. EP06814836.0, dated Feb. 1, 2008, 3 pages, Doc 2138.
EPO—Request for Entry into the European Phase for Application for EP06814836.0, dated Mar. 13, 2008, 5 pages, Doc 2139.
EPO—Amendments Received Before Examination for Application No. EP06814836.0, dated Mar. 31, 2008, 15 pages, Doc 2140.
EPO—Communication Pursuant to Rules 161 and 162 EPC for Application No. EP06814836.0, dated Apr. 22, 2008, 2 pages, Doc 2141.
EPO—Communication of European Publication Number and Information on Application of Article 67(3) EPC for Application No. EP06814836.0, dated May 2, 2008, 1 page, Doc 2142.
PCT—Notification of Transmittal of the International Search Report and the Written Opinion of the International Searching Authority, or the Declaration for Application No. PCT/US06/036240, dated Jul. 3, 2008, 10 pages, Doc 2145.
EPO—Enquiry with the International Bureau for Application No. EP06814836.0, dated Aug. 18, 2008, 1 page, Doc 2143.
EPO—Reply by International Bureau for Application No. EP06814836.0, dated Sep. 3, 2008, 1 page, Doc 2144.
EPO—Letter Accompanying Subsequently Filed Items for Application No. EP06814836.0, dated Sep. 4, 2008, 1 page, Doc 2146.
PCT—International Preliminary Report on Patentabliity for Application No. PCT/US06/036240, filed Sep. 15, 2006, 6 pages, Doc 2147.

(56) References Cited

OTHER PUBLICATIONS

WIPO—Partial Publication with International Search Report for Application No. PCT/US06/036240, dated Mar. 29, 2007, 3 pages, Doc 2148.
EPO—Extended European Search Report for Application No. EP06814836.0, dated Feb. 17, 2010, 7 pages, Doc 2149.
EPO—Proceeding Further with European Patent Application Pursuant to Rule 70(2) EPC for Application No. EP06814836.0, dated Mar. 8, 2010, 1 page, Doc 2150.
EPO—Letter Accompanying Subsequently Filed Items for Application No. EP06814836.0, dated Mar. 26, 2010, 3 pages, Doc 2151.
EPO—Communication Pursuant to Article 94(3) EPC for Application No. EP06814836.0, dated Apr. 14, 2010, 1 page, Doc 2152.
SIB—Request for Extension of Time Limit Under Rule 132(2) EPC for Application No. EP06814836.0, dated Aug. 4, 2010, 1 page, Doc 2153.
EPO—Extension of Time Under Rule 132(2) EPC for Application No. EP06814836.0, dated Aug. 9, 2010, 1 page, Doc 2154.
Peregrine—EP Response filed for Application No. EP06814836.0 dated Oct. 12, 2010, 25 pages, Doc 0756.
SIB—Response to Communication dated Feb. 17, 2010 for Application No. EP06814836.0, dated Oct. 12, 2010, 25 pages, Doc 2155.
SIB—Enquiry as to When a Communication from the Examining Division Can be Expected for Application No. EP06814836.0, dated Apr. 11, 2013, 1 page, Doc 2156.
EPO—Notice Regarding Examination Started for Application No. EP06814836.0, dated Dec. 12, 2013, 1 page, Doc 2157.
EPO—Communication Pursuant to Article 94(3) EPC for Application No. EP06814836.0, dated Dec. 18, 2013, 5 pages, Doc 2158.
EPO—Noting of Loss of Rights Pursuant to Rule 112(1) EPC for Application No. EP06814836.0, dated May 27, 2014, 1 page, Doc 2159.
EPO—Closure of the Procedure in Respect of Application for Application No. EP06814836.0, dated Aug. 26, 2014, 1 page, Doc 2160.
Peregrine—Request Form for Application No. PCT/US06/036240, dated Sep. 15, 2006, 5 pages, Doc 2133.
WIPO—Initial Publication without International Search Report for Application No. PCT/US06/036240, dated Mar. 29, 2007, 107 pages, Doc 2134.
TAT—International Search Report and Written Opinion from USRO dated Jul. 3, 2008 for Application No. PCT/US06/36240, 10 pages, Doc 0666.
PCT—Written Opinion of the International Searching Authority for Application No. PCT/US06/036240, dated Jul. 3, 2008, 5 pages, Doc 2136.
PCT—International Preliminary Report on Patentability for Application No. PCT/US06/036240, filed Sep. 15, 2006, 6 pages, Doc 2137.
WIPO—Partial Publication with International Search Report for Application No. PCT/US06/036240, dated Mar. 29, 2007, 3 pages, Doc 2135.
GPO—Office Action for Application No. DE112011103554.3, dated May 18, 2017, 15 pages, Doc 2348.
Huber—Response to Office Action for Application No. DE112011103554.3, dated Nov. 28, 2017, 26 pages, Doc 2349.
Huber—Pending Claims for Application No. PCT/US2011/056942, dated Jan. 22, 2013, 10 pages, Doc 2350.
Steinfl & Bruno—Letter Regarding Filing Receipt for Application No. JP2013-535054, dated Aug. 19, 2013, 1 page, Doc 2351.
Steinfl & Bruno—Letter Regarding Examination Requested for Application No. JP2013-535054, dated Oct. 14, 2014, 1 page, Doc 2357.
Translation of JP Office Action for Application No. JP2013-535054, dated Dec. 1, 2015, 3 pages, Doc 2358.
Comment Regarding Response to Office Action for Application No. JP2013-535054, dated Jan. 19, 2016, 3 pages, Doc 2362.
Steinfl & Bruno—Letter Regarding Office Action for Application No. JP2013-535054, dated Jan. 21, 2016, 1 page, Doc 2363.
Peregrine—Request for Extension of Time for Application No. JP2013-535054, dated Feb. 29, 2016, Doc 2355.
Peregrine—Amendment for Application No. JP2013-535054, dated Mar. 31, 2016, 31 pages, Doc 0994.
Peregrine—Amendment for Application No. JP2013-535054, dated Mar. 31, 2016, 13 pages, Doc 2353.
Peregrine—Opinion for Application No. JP2013-535054, dated Mar. 31, 2016, 10 pages, Doc 2354.
Steinfl & Bruno Letter Reporting Response to Office Action for Application No. JP2013-535054, dated Apr. 15, 2016, 1 page, Doc 2364.
Peregrine—Decision to Grant a Patent for Application No. JP2013-535054, dated Aug. 2, 2016, 6 pages, Doc 2359.
Steinfl & Bruno—Letter Reporting Notice of Allowance for Application No. JP2013-535054, dated Aug. 15, 2016, 2 pages, Doc 2360.
Allowed Claims for Application No. JP2013-535054, dated Aug. 15, 2016, 10 pages, Doc 2361.
Peregrine—Letter of Payment of Patent Fee for Application No. JP2013-535054, dated Sep. 8, 2016, 2 pages, Doc 2366.
Steinfl & Bruno—Letter Regarding Issue Fee and Maintenance Fees Paid for Application No. JP2013-535054, dated Sep. 13, 2016, 1 page, Doc 2365.
Steinfl & Bruno—Letter Reporting Letters Patent for Application No. JP2013-535054, dated Oct. 24, 2016, 4 pages, Doc 2367.
JPO—Notice of Reasons for Refusal for Application JP2016-175339, dated Jun. 19, 2017, 7 pages, Doc 1029.
Request for Divisional Application for Application No. JP2016175339, dated Sep. 8, 2016, 163 pages, Doc 2369.
File History for Application No. JP20160175339, dated Sep. 8, 2016, 264 pages, Doc 2376.
Steinfl & Bruno—Letter Reporting Divisional Application as Filed for Application No. JP2016-175339, dated Sep. 13, 2016, 2 pages, Doc 2378.
Request for Examination for Application No. JP2016175339, dated Oct. 6, 2016, 11 pages, Doc 2370.
Request for Examination for Application No. JP2016175339, dated Oct. 6, 2016, 2 pages, Doc 2391.
Steinfl & Bruno—Letter Reporting Exam Requested for Application No. JP2016-175339, dated Oct. 10, 2016, 1 page, Doc 2379.
Correction of Defective Abstract for Application No. JP2016175339, dated Nov. 28, 2016, 2 pages, Doc 2392.
Notice of Reasons for Rejection for Application No. JP2016175339, dated Jun. 27, 2017, 14 pages, Doc 2377.
Steinfl & Bruno—Debit Report JP Office Action for Application No. JP2016-175339, dated Jul. 26, 2017, 1 page, Doc 2375.
Notice of Reason for Rejection for Application No. JP2016175339, dated Feb. 27, 2018, 8 pages, Doc 2384.
Translation of JP Office Action for Application No. JP2016-175339, dated Feb. 27, 2018, 4 pages, Doc 2385.
Comment Regarding Response to Office Action for Application No. JP2016-175339, dated Mar. 26, 2018, 10 pages, Doc 2386.
Decision to Refuse for Application No. JP2016175339, dated Oct. 30, 2018, 20 pages, Doc 2390.
WIPO—Publication with International Search Report for Application No. PCT/US06/026965, dated Jan. 18, 2007, 112 pages, Doc 2127.
PCT—International Search Report for Application No. PCT/US2011/056942, dated Feb. 27, 2012, 12 pages, Doc 0801.
Brindle—Application as Filed for Application No. PCT/US11/0569942, filed Oct. 19, 2011, 112 pages, Doc 2128.
WIPO—Publication with International Search Report for Application No. PCT/US11/056942, dated Apr. 26, 2012, 116 pages, Doc 2130.
PCT—First Notice Informing the Applicant of the Communication of the International Application for Application No. PCT/US11/056942, dated May 24, 2012, 1 page, Doc 2129.
Huber—Technical Comments to Written Opinion of the IPEA dated Dec. 21, 2012 for Application No. PCT/US2011/056942, dated Jan. 21, 2013, 27 pages, Doc 0833.
PCT—International Preliminary Report on Patentability from EPO dated Feb. 6, 2013 for Application No. PCT/US2011/056942, 27 pages, Doc 0841.

(56) References Cited

OTHER PUBLICATIONS

PCT—Written Opinion of the International Searching Authority for Application No. PCT/US11/056942, filed Oct. 19, 2011, 8 pages, Doc 2131.
PCT—International Preliminary Report on Patentability for Application No. PCT/US11/056942, filed Oct. 19, 2011, 27 pages, Doc 2132.
CN Office Action dated Jul. 31, 2009 for Application No. CN200680025128.7, 10 pages, Doc 0701.
Translation of CN Response dated Nov. 30, 2009 for Application No. CN200680025128.7, 13 pages, Doc 0722.
Translation of Office Action dated Nov. 2, 2011 for Application No. CN200680025128.7, 16 pages, Doc 0792.
Translation of CN Response dated Mar. 1, 2012 for Application No. CN200680025128.7, 14 page, Doc 0802.
L&P—Letter to Client Regarding Proposed Amendments for Application No. CN200680025128.7, dated Jun. 12, 2012, 2 pages, Doc 2394.
L&P—Proposed Claims for Application No. CN200680025128.7, dated Jun. 12, 2012, 10 pages, Doc 2395.
L&P—Letter Regarding Claim Amendments for Application No. CN200680025128.7, dated Jun. 20, 2012, 12 pages, Doc 2397.
L&P—Letter to Client Regarding Response to Office Action filed for Application No. CN200680025128.7, dated Jun. 29, 2012, 1 page, Doc 2396.
Brindle—Particulars of Letters Patent for Application No. CN200680025128.7 dated Dec. 16, 2013.pages, Doc 2393.
JPO—Notice for Reasons for Refusal for Application No. JP2013-003388, dated Feb. 27, 2014, 9 pages, Doc 0896.
Peregrine—Amendment for Application No. JP2013-003388, dated Jul. 9, 2014, 17 pages, Doc 0912.
EPO—Request for entry into the European Phase and Claims for Application No. EP02800982.7 dated Apr. 28, 2004, 15 pages, Doc 2009.
EPO—Communication to designated inventor for Application No. EP02800982.7 dated May 19, 2004, 2 pages, Doc 2010.
EPO—Communication Pursuant to Rules 109 and 110 EPC for Application No. EP02800982.7 dated May 27, 2004, 2 pages, Doc 2011.
EPO—Communication regarding International Preliminary Examination Report for Application No. EP02800982.7 dated Jul. 15, 2004, 1 page, Doc 2012.
EPO—Reply to Communication regarding International Preliminary Examination Report for Application No. EP02800982.7 dated Jul. 15, 2004, 1 page, Doc 2013.
EPO—Supplementary European Search Report for Application No. EP02800982.7 dated Oct. 1, 2004, 3 pages, Doc 2014.
EPO—Proceeding Further with the European Patent Application Pursuant to Article 96(1) and Rule 51(1) EPC for Application No. EP02800982.7 dated Oct. 5, 2004, 1 page, Doc 2015.
PCT—International Preliminary Search Report and Claims for Application No. PCT/US02/32266 dated Sep. 27, 2004, 16 pages, Doc 2016.
Huber—Amendments received before examination for Application No. EP02800982.7 dated Dec. 6, 2004, 19 pages, Doc 2018.
EPO—Notice Regarding Fees for Application No. EP02800982.7 dated Dec. 9, 2005, 1 page, Doc 2019.
Brindle—Application as Filed for Application No. EP06786943.8, filed Sep. 11, 2006, 107 pages, Doc 2161.
PCT—Notification Relating to Priority Claim for Application No. PCT/US06/026965, dated Oct. 19, 2006, 2 pages, Doc 2162.
PCT—Notification Relating to Priority Claim for Application No. PCT/US06/026965, dated Nov. 1, 2006, 1 pages, Doc 2163.
PCT—International Search Report and Written Opinion from EPO dated Nov. 7, 2006 for Application No. PCT/US2006/026965, 19 pages, Doc 0652.
EPO—Notice Regarding Fees for Application No. EP02800982.7 dated Nov. 27, 2006, 1 page, Doc 2020.
WIPO—Publication with International Search Report for Application No. PCT/US06/026965, dated Jan. 18, 2007, 112 pages, Doc 2164.
PCT—Invitation to Correct Defects in Demand for Application No. PCT/US06/026965, dated Feb. 20, 2007, 11 pages, Doc 2166.
PCT—Notification Concerning Documents Transmitted for Application No. PCT/US06/026965, dated Mar. 8, 2007, 1 page, Doc 2167.
PCT—Invitation to Submit Amendments for Application No. PCT/US06/026965, dated May 25, 2007, 1 page, Doc 2168.
EPO—Noting of Loss of Rights (R.69(1) EPC) for Application No. EP02800982.7 dated Jun. 4, 2007, 1 pages, Doc 2021.
PCT—International Preliminary Report on Patentability for Application No. PCT/US06/026965, dated Jun. 21, 2007, 24 pages, Doc 2169.
EPO—Communication Pursuant to Rule 69(2) EPC for Application No. EP02800982.7 dated Aug. 9, 2007, 1 page, Doc 2023.
EPO—Refund of fees for Application No. EP02800982.7 dated Aug. 16, 2007, 1 page, Doc 2024.
EPO—Information on Entry into European Phase for Application No. EP06786943.8, dated Nov. 23, 2007, 3 pages, Doc 2170.
EPO—Notice Drawing Attention to Article 86(2) EPC, Art 2 No. 5 of the Rules Relating to Fees—Payment of the Renewal Fee Plus Additional Fee for Application EP02800982.7 dated Dec. 5, 2007, 1 page, Doc 2025.
EPO—Request for Entry into the European Phase for Application for EP06786943.8, dated Jan. 8, 2008, 7 pages, Doc 2171.
EPO—Communication Pursuant to Rule 161 and 162 EPC for Application No. EP06786943.8, dated Feb. 21, 2008, 2 pages, Doc 2172.
EPO—Notice Concerning Payment of Fees for Application No. EP06786943.8, dated Mar. 31, 2008, 1 page, Doc 2173.
L&P—Reply to Communication Pursuant to Rules 161 and 162 EPC dated Feb. 21, 2008 for Application No. EP06786943.8, dated Apr. 1, 2008, 32 pages, Doc 2174.
EPO—Confirmation of Receipt of Reply to Communication Pursuant to Rules 161 and 162 EPC dated Feb. 21, 2008 for Application No. EP06786943.8, dated Apr. 7, 2008, 32 pages, Doc 2175.
EPO—Communication Pursuant to Article 94(3) EPC for Application No. EP02800982.7 dated Jun. 19, 2008, 3 pages, Doc 2026.
Huber—Response to Communication Pursuant to Article 94(3) EPC for Application No. EP02800982.7 dated Oct. 16, 2008, 1 page, Doc 2027.
EPO—Extension of Time Limit Pursuant to Rule 132(2) EPC for Application No. EP02800982.7 dated Oct. 27, 2008, 1 page, Doc 2028.
Huber—Reply to communication from the Examining Division for Application No. EP02800982.7 dated Dec. 23, 2008, 22 pages, Doc 2029.
EPO—Communication Pursuant to Article 94(3) EPC for Application No. EP06786943.8, dated Feb. 4, 2009, 7 pages, Doc 2176.
L&P—Request for Extension of Time Limit to Respond to Office Action for Application No. EP06786943.8, dated Jun. 2, 2009, 1 page, Doc 2177.
EPO—Extension of Time Under Rule 132(2) EPC for Application No. EP06786943.8, dated Jun. 16, 2009, 1 page, Doc 2178.
Huber—Enquiry as to when a communication from the Examining Division can be expected for Application No. EP02800982.7 dated Jul. 7, 2009, 1 page, Doc 2030.
EPO—Response to enquiry for communication from the Examining Division for Application No. EP02800982.7 dated Jul. 14, 2009, 1 page, Doc 2031.
EPO—Communication Pursuant to Article 94(3) EPC for Application No. EP02800982.7, dated Aug. 6, 2009, 2 pages, Doc 2032.
L&P—Reply to Communication Pursuant to Article 94(3) EPC for Application No. EP06786943.8, dated Feb. 4, 2009, dated Aug. 13, 2009, 31 pages, Doc 2179.
EPO—Confirmation of Receipt for Reply to Communication Pursuant to Rule 94(3) EPC for Application No. EP06786943.8, dated Aug. 18, 2009, 31 pages, Doc 2180.
Huber—Reply to Communication Pursuant to Article 94(3) EPC for Application EP02800982.7 dated Oct. 7, 2009,23 pages, Doc 2033.

(56) References Cited

OTHER PUBLICATIONS

Huber—Confirmation of Reply to Communication Pursuant to Article 94(3) EPC for Application No. EP02800982.7 dated Oct. 9, 2009,23 pages, Doc 2034.
EPO—Communication Pursuant to Rule 71(3)EPC for Application No. EP02800982.7 dated Nov. 27, 2009, 67 pages, Doc 2035.
Huber—Response to Communication Pursuant to Article 71(3) EPC for Application No. EP02800982.7 dated Mar. 31, 2010, 29 pages, Doc 2036.
EPO—After Communication Under Rule 71(3) EPC but Before Decision to Grant for Application No. EP02800982.7 dated Apr. 20, 2010, 3 pages, Doc 2037.
L&P—Enquiry as to When a Communicaton from the Examining Division can be Expected for Application No. EP06786943.8, dated Nov. 2, 2010, 1 page, Doc 2181.
EPO—Response to Enquiry for Communication from the Examining Division for Application No. EP06786943.8, dated Nov. 17, 2010, 1 page, Doc 2182.
EPO—Documents for grant of a patent for Application No. EP02800982.7 dated Nov. 29, 2010, 3 pages, Doc 2038.
EPO—Amendment or Correction to Text Intended for Grant for Application No. EP02800982.7 dated Dec. 3, 2010, 1 pages, Doc 2039.
EPO—Decision to Grant a European Patent Pursuant to Article 97(1) EPC for Application No. EP02800982.7 dated Jan. 7, 2011, 2 pages, Doc 2040.
L&P—Letter Concerning Fees and Payments for Application No. EP06786943.8, dated Jun. 27, 2011, 9 pages, Doc 2183.
L&P—Enquiry as to When a Communication from the Examining Division can be Expected for Application No. EP06786943.8, dated Jul. 11, 2011, 2 pages, Doc 2184.
Peregrine—Summons to Attend Oral Proceedings Pursuant to Rule 115(1) from EPO dated Jul. 22, 2011 for Application No. EP06786943.8, 9 pages, Doc 0784.
EPO—Summons to Attend Oral Proceedings Pursuant to Rule 115(1) EPC for Application No. EP06786943.8, dated Jul. 22, 2011, 9 pages, Doc 2185.
Deutsche Post—Advice of delivery for Application No. EP06786943.8, dated Jul. 27, 2011, 2 pages, Doc 2186.
Peregrine—EP Response filed Oct. 24, 2011 for Application No. EP06786943.8, 1 page, Doc 0791.
L&P—Reply to Summons to Attend Oral Proceedings Issued on Jul. 22, 2011 for Application No. EP06786943.8, dated Oct. 24, 2011, 1 page, Doc 2187.
EPO—Notice Regarding Maintenance/Change/Cancelation of Oral Proceedings for Application No. EP06786943.8, dated Oct. 25, 2011, 2 pages, Doc 2188.
Shweiger—Notice of Opposition for Patent No. EP1451890, dated Oct. 31, 2011, 164 pages, Doc 2041.
EPO—Notice Regarding Oral Proceedings for Application No. EP06786943.8, dated Nov. 4, 2011, 1 page, Doc 2189.
EPO—Communication of a Notice of Opposition for Application No. EP02800982.7 dated Nov. 8, 2011, 1 page, Doc 2042.
EPO—Brief Communication for Application No. EP02800982.7 dated Nov. 10, 2011, 1 page, Doc 2043.
EPO—Decision to Refuse European Patent Application (Art. 97(2) EPC) dated Nov. 18, 2011 for Application No. EP06786943.8, dated Nov. 18, 2011, 5 pages, Doc 2190.
Deutsche Post—Advice of delivery for Application No. EP06786943.8, dated Nov. 18, 2011, 2 pages, Doc 2191.
EPO—Communication of Opposition (R.79(1) EPC) for Application EP02800982.7, dated Dec. 7, 2011, 2 pages, Doc 2044.
L&P—Notice of Appeal for Application No. EP 06786943.8, dated Jan. 17, 2012, 2 pages, Doc 1086.
L&P—Notice of Appeal for Application No. EP06786943.8, dated Jan. 17, 2012, 2 pages, Doc 2192.
L&P—Appeal to the Decision of Refusal Issued Nov. 18, 2011 for Application No. EP06786943.8, dated Mar. 20, 2012, 27 pages, Doc 2193.
Huber—Substantive Response to Opposition for Application EP02800982.7, dated Apr. 17, 2012, 46 pages, Doc 2045.
EPO—Communication Regarding Opposition Proceedings for Application No. EP02800982.7, dated Apr. 23, 2012, 1 page, Doc 2046.
EPO—Communication of Amended Entries Concerning the Representative (R.143(1)(h) EPC) for Application No. EP06786943.8, dated May 10, 2012, 1 page, Doc 2194.
EPO—Notice Drawing Attention to Rule 51(2) EPC, Article 2 No. 5 of the Rules Relating to Fees-Payment of Renewal Fee Plus Additional Fee for Application No. EP06786943.8, dated Sep. 4, 2012, 2 pages, Doc 2195.
EPO—Communication Indicating Deficiencies in the Notice of Opposition Which May be Remedied for Application No. EP02800982.7, dated Apr. 10, 2013, 3 pages, Doc 2047.
Schweiger—Reply to the Communication Indicating Deficiencies in the Notice of Opposition Which May be Remedied for Application No. EP02800982.7, dated Jun. 11, 2013, 1 page, Doc 2049.
EPO—Brief Communication for Application No. EP02800982.7, dated Jun. 17, 2013, 1 page, Doc 2050.
EPO—Summons to Attend Oral Proceedings Pursuant to Rule 115(1) EPC for Application No. EP02800982.7, dated Oct. 17, 2013, 20 pages, Doc 2051.
EPO—Form 2310 Requesting Acknowledgement of Receipt from Moore for Application No. EP02800982.7, dated Oct. 17, 2013, 3 pages, Doc 2052.
EPO—Form 2310 Requesting Acknowledgement of Receipt from Schussler for Application No. EP02800982.7, dated Oct. 17, 2013, 1 pages, Doc 2053.
Schweiger—Request for Interpreters During Oral Proceedings for Application No. EP02800982.7, dated Dec. 10, 2013, 1 page, Doc 2055.
EPO—Brief Communication, Summons to Attend Oral Proceedings for Application No. EP02800982.7, dated Dec. 16, 2013, 1 page, Doc 2056.
Schweiger—Response to Summons to Attend Oral Proceedings for Application No. EP02800982.7, dated Jan. 10, 2014, 35 pages, Doc 2057.
EPO—Brief Communication Regarding Language for Oral Proceedings for Application No. EP02800982.7, dated Jan. 15, 2014, 1 page, Doc 2058.
EPO—Brief Communication for Application No. EP02800982.7, dated Jan. 16, 2014, 1 page, Doc 2059.
EPO—Brief Communication Regarding Summons to Attend Oral Proceedings for Application No. EP02800982.7, dated Jan. 17, 2014, 2 pages, Doc 2060.
EPO—Brief Communication Regarding Summons to Attend Oral Proceedings for Application No. EP02800982.7, dated Jan. 28, 2014, 1 pages, Doc 2061.
EPO—Information Regarding the Oral Proceedings for Application No. EP02800982.7, dated Feb. 12, 2014, 1 page, Doc 2062.
EPO—Communication Pursuant to Article 101(1) and Rule 81(2) to (3) EPC for Application No. EP02800982.7, dated Mar. 3, 2014, 4 pages, Doc 2063.
L&P—Letter Relating to Appeal Procedure for Application No. EP06786943.8, dated Mar. 25, 2014, 12 pages, Doc 2196.
EPO—Provision of a Copy the Minutes in Accordance with Rule 124(4) EPC for Application No. EP02800982.7, dated Apr. 10, 2014, 11 pages, Doc 2064.
Schweiger—Response to Communication Pursuant to Article 101(1) and Rule 81(2) to (3) EPC for Application No. EP02800982.7, dated May 2, 2014, 1 page, Doc 2065.
Schweiger—Response to Communication Pursuant to Article 101(1) and Rule 81(2) to (3) EPC for Application No. EP02800982.7, dated May 2, 2014, 1 page, Doc 2066.
Huber—esponse to Official Communication of Mar. 3, 2014 for Application EP02800982.7, dated May 8, 2014, 83 pages, Doc 2067.
EPO—Brief Communication Regarding Letter from Proprietor for Application No. EP02800982.7, dated May 14, 2014, 1 page, Doc 2068.
EPO—Brief Communication Regarding Letter from Proprietor for Application No. EP02800982.7, dated Aug. 14, 2017, 2 pages, Doc 2069.

(56) References Cited

OTHER PUBLICATIONS

L&P—Document Concerning Representation for Application No. EP06786943.8, dated Oct. 8, 2014, 2 pages, Doc 2197.
L&P—Confirmation of Document Concerning Representation for Application No. EP06786943.8, dated Oct. 14, 2014, 2 pages, Doc 2198.
Schweiger—Response to Brief Communication dated Aug. 14, 2014 for Application No. EP02800982.7, dated Oct. 20, 2014, 1 page, Doc 2070.
EPO—Interlocutory Decision in Opposition Proceedings for Application No. EP02800982.7, dated Nov. 14, 2014, 79 pages, Doc 2071.
EPO—Acknowledgement from Schwieger for Application No. EP02800982.7, dated Nov. 14, 2014, 3 page, Doc 2072.
EPO—Acknowledgement from Schussler for Application No. EP02800982.7, dated Nov. 14, 2014, 1 page, Doc 2073.
EPO—Maintenance of the Patent with the Documents Specified in the Final Decision for Application No. EP02800982.7, dated Apr. 23, 2015, 1 page, Doc 2074.
EPO—Communication Pursuant to Rule 82(2) EPC for Application No. EP02800982.7, dated May 7, 2015, 7 pages, Doc 2075.
L&P—Enquiry as to When a Communication Regarding the Appeal Proceedings can be Expected for Application No. EP06786943.8, dated Jun. 3, 2015, 1 pages, Doc 2199.
Huber—Response to Official Communication Pursuant to Rule 82(2) of May 7, 2015 for Application No. EP02800982.7, dated Aug. 7, 2015, 22 pages, Doc 2076.
Huber—Confirmation of Response to Official Communication Pursuant to Rule 82(2) of May 7, 2015 for Application No. EP02800982.7, dated Aug. 8, 2015, 21 pages, Doc 2077.
EPO—Termination of the Opposition Proceedings with Maintenance of Patent for Application No. EP02800982.7, dated Aug. 21, 2015, 1 page, Doc 2078.
EPO—Decision to Maintain European Patent in Amended Form (Art. 101(3)(a) EPC ) for Application No. EP02800982.7, dated Aug. 27, 2015, 2 pages, Doc 2079.
EPO—Board of Appeals; Oral Proceedings to be Held for Application No. EP06786943.8, dated Nov. 13, 2015, 1 page, Doc 2200.
EPO—Change of Composition of the Board for Application No. EP06786943.8, dated Apr. 1, 2016, 1 page, Doc 2202.
EPO—Change of Composition of the Board for Application No. EP06786943.8, dated Apr. 6, 2016, 1 page, Doc 2203.
L&P—Reply to Summons to Attend Oral Proceedings Issued on Nov. 18, 2015 for Application No. EP06786943.8, dated Apr. 15, 2016, 26 pages, Doc 2204.
EPO—Confirmation of Reply to Summons to Attend Oral Proceedings Issued on Nov. 18, 2015 for Application No. EP06786943.8, dated Apr. 18, 2016, 26 pages, Doc 2205.
EPO—The Minutes of the Oral Proceedings for Application No. EP06786943.8, dated Oct. 10, 2016, 35 pages, Doc 1004.
EPO—The Minutes of the Oral Proceedings for Application No. EP06786943.8, dated Oct. 10, 2016, 35 pages, Doc 2206.
EPO—Decision of the Board of Appeal for Application No. EP06786943.8, dated Nov. 3, 2016, 32 pages, Doc 2207.
Deutsche Post—Advice of delivery for Application No. EP06786943.8, dated Nov. 3, 2016, 3 pages, Doc 2208.
EPO—Grant of a Patent with the Documents Specified in the Final Decision of the Board of Appeal for Application No. EP06786943.8, dated Nov. 22, 2016, 2 pages, Doc 2209.
EPO—Communication Under Rule 71(3) EPC for Application No. EP06786943.8, dated Dec. 1, 2016, 99 pages, Doc 2210.
L&P—Filing of the Translations of the Claims for Application No. EP06786943.8, dated Mar. 1, 2017, 10 pages, Doc 2211.
EPO—Confirmation of the Filing of the Translations of the Claims for Application No. EP06786943.8, dated Mar. 3, 2017, 10 pages, Doc 2212.
EPO—Decision to Grant a European Patent Pursuant to Article 97(1) EPC for Application No. EP06786943.8, dated Mar. 16, 2017, 2 pages, Doc 2213.
EPO—Transmission of the Certificate for a European Patent Pursuant to Rule 74 EPC for Application No. EP06786943.8, dated Apr. 12, 2017, 1 page, Doc 2214.
EPO—Communication Regarding the Expiry of Opposition Period for Application No. EP06786943.8, dated Feb. 16, 2018, 1 page, Doc 2215.
EPO—Acknowledgement Receipt for Board of Appeals for Application No. EP06786943.8, dated Nov. 18, 2018, 1 page, Doc 2201.
PCT—Chapter II Demand for Application No. PCT/US06/026965, dated Feb. 12, 2007, 11 pages, Doc 2165.
L&P—Response to Communication Pursuant to Article 94(3) dated Dec. 3, 2015 for Application No. EP11153241.2, dated Mar. 30, 2016, 15 pages, Doc 0991.
EPO—Request for Grant of a European Patent for Application No. EP11153227.1, dated Feb. 3, 2011, 125 pages, Doc 2216.
EPO—Designation as Inventor—Communication Under Rule 19(3) EPC for Application No. EP11153227.1, dated Apr. 26, 2011, 2 pages, Doc 2217.
Peregrine—EP Response dated May 16, 2011 for Application No. EP11153227.1, 5 pages, Doc 0775.
Peregrine—EP Response dated May 16, 2011 for Application No. 11153247.9, 6 pages, Doc 0777.
L&P—Reply to Communication Pursuant to Rule 58 EPC dated on Mar. 17, 2011 for Application No. EP11153227.1, dated May 16, 2011, 5 pages, Doc 2218.
EPO—Communication Pursuant to Rule 19(1) EPC for Application No. EP11153227.1, dated May 23, 2011, 2 pages, Doc 2219.
EPO—Notification of European Publication Number and Information on the Application of Article 67(3) for Application No. EP11153227.1, dated Jun. 29, 2011, 10 pages, Doc 2220.
EPO—Reply to Communication Pursuant to Rule 19(1) EPC for Application No. EP11153227.1, dated Jul. 5, 2011, 2 pages Doc 2221.
EPO—Extended European Search Report for Application No. EP11153227.1, dated May 4, 2012, 4 pages, Doc 2222.
L&P—Reply to Communication Pursuant to Rules 69 and 70a(1) EPC dated Jun. 4, 2012 and the European Search Opinion dated May 4, 2012 for Application No. EP11153227.1, dated Nov. 27, 2012, 10 pages, Doc 2224.
L&P—Letter regarding References Cited in US Prosecution for Application No. EP11153227.1, dated Jun. 18, 2013, 129 pages, Doc 2225.
L&P—Document Concerning Representation for Application No. EP11153227.1, dated Oct. 8, 2014, 2 pages, Doc 2227.
EPO—Confirmation of Document Concerning Representation for Application No. EP11153227.1, dated Oct. 14, 2014, 2 pages, Doc 2228.
L&P—Enquiry as to when a Communication from the Examining Division can be Expected for Application No. EP11153227.1, dated Jun. 1, 2015, 1 page, Doc 2229.
EPO—Response to Enquiry for Communication from the Examining Division for Application No. EP11153227.1, dated Jun. 9, 2015, 1 page, Doc 2230.
EPO—Notice Regarding Substantive Examination Started for Application No. EP11153227.1, dated Nov. 27, 2015, 1 page, Doc 2231.
EPO—Communication Pursuant to Article 94(3) EPC for Application No. EP11153227.1, dated Dec. 3, 2015, 4 pages, Doc 2232.
L&P—Reply to Communication Pursuant to Article 94(3) EPC for Application No. EP11153227.1 dated Dec. 3, 2015, dated Mar. 30, 2016, 13 pages, Doc 2233.
EPO—Confirmation of Reply to Communication Pursuant to Article 94(3) EPC for Application No. EP11153227.1, dated Apr. 5, 2016, 13 pages, Doc 2234.
EPO—Communication pursuant to Article 94(3) for Application No. EP11153227.1, dated Oct. 17, 2018 , 4 pages, Doc 1065.
EPO—Communication Pursuant to Article 94(3) EPC for Application No. EP11153227.1, dated Oct. 17, 2018, 4 pages, Doc 2235.
L&P—Reply to Communication Pursuant to Article 94(3) EPC for Application No. EP11153227.1 dated Oct. 17, 2018, dated Feb. 11, 2019, 36 pages, Doc 2236.
EPO—Confirmation of Reply to Communication Pursuant to Article 94(3) EPC for Application No. EP11153227.1, dated Feb. 13, 2019, 36 pages, Doc 2237.

(56) References Cited

OTHER PUBLICATIONS

EPO—Communication Pursuant to Rule 69 EPC—Reminder Concerning Payment of the Designation Fee (Art. 79(2) EPC) and of the examination fee (Art. 94(1) EPC)—and invitation pursuant to Rule 70a(1) EPC for Application No. EP11153227.1, dated Jun. 4, 2012, 2 pages, Doc 2223.
L&P—Reply to Communication Pursuant to Article 94(3) filed Dec. 20, 2019 for Application No. EP11153227.1, 11 pages, Doc 9069.
EPO—Communication Pursuant to Article 94(3) dated Apr. 16, 2020 for EP Application No. EP11153227.1, 4 pages, Doc 9107.
EPO—Request for Grant of a European Patent for Application No. EP11153241.2, dated Feb. 3, 2011, 125 pages, Doc 2238.
EPO—Designation as Inventor—Communication Under Rule 19(3) EPC for Application No. EP11153241.2, dated Apr. 26, 2011, 2 pages, Doc 2239.
L&P—Reply to Communication Pursuant to Rule 58 EPC dated Mar. 17, 2011 for Application No. EP11153241.2, dated May 16, 2011, 5 pages, Doc 2240.
EPO—Communication Pursuant to Rule 19(1) EPC for Application No. EP11153241.2, dated May 23, 2011, 2 pages, Doc 2241.
EPO—Notification of European Publication Number and Information on the Application of Article 67(3) for Application No. EP11153241.2, dated Jun. 29, 2011, 10 pages, Doc 2242.
L&P—Response to Communications Pursuant to Rule 19(1) EPC dated May 20, 2011 and May 23, 2011 for Application No. EP11153241.2, dated Jul. 5, 2011, 4 pages, Doc 2243.
EPO—Extended Search Report for Application No. EP11153241.2, dated May 7, 2012, 4 pages, Doc 2244.
EPO—Communication Pursuant to Rule 69 EPC—Reminder Concerning Payment of the Designation Fee (Art. 79(2) EPC) and of the examination fee (Art. 94(1) EPC)—and invitation pursuant to Rule 70a(1) EPC for Application No. EP11153241.2, dated Jun. 12, 2012, 2 pages, Doc 2245.
EPO—Notice Drawing Attention to Rule 51(2) EPC, Article 2 No. 5 of the Rules Relating to Fees-Payment of Renewal Fee Plus Additional Fee for Application No. EP11153241.2, dated Sep. 4, 2012, 2 pages, Doc 2246.
L&P—Response to Communication Pursuant to Rule 69 and 70a(1) EPC dated Jun. 12, 2012 for Application No. EP11153241.2, dated Dec. 5, 2012, 30 pages, Doc 2247.
L&P—Letter regarding References Cited in US Prosecution for Application No EP11153241.2, dated Jun. 18, 2013, 129 pages, Doc 2248.
L&P—Document Concerning Representation for Application No. EP1153241.2, dated Oct. 8, 2014, 2 pages, Doc 2252.
EPO—Confirmation of Document Concerning Representation for Application No. EP11153241.2, dated Oct. 14, 2014, 2 pages, Doc 2253.
L&P—Enquiry as to when a Communication from the Examining Division can be Expected for Application No. EP11153241.2, dated Jun. 1, 2015, 1 page, Doc 2254.
EPO—Communication in Response to Enquiry Received on Jun. 6, 2015 for Application No. EP 11153241.2, dated Jun. 9, 2015, 1 page, Doc 2255.
EPO—Communication Pursuant to Article 94(3) for Application No. EP11153247.9, dated Dec. 3, 2015, 4 pages, Doc 0980.
EPO—Communication Pursuant to Article 94(3) EPC for Application No. EP11153241.2, dated Dec. 3, 2015, 5 pages, Doc 2256.
L&P—Reply to Communication Pursuant to Article 94(3) EPC for Application No. EP11153241.2, dated Dec. 3, 2015, dated Mar. 30, 2016, 15 pages, Doc 2257.
EPO—Confirmation of Reply to Communication Pursuant to Article 94(3) dated Dec. 3, 2015 for Application No. EP11153241.2, dated Apr. 5, 2016, 15 pages, Doc 2258.
EPO—Notice Drawing Attention to Rule 51(2) EPC, Article 2 No. 5 of the Rules Relating to Fees—Payment Fee Plus Additional Fee for Application No. EP1153241.2, dated Sep. 4, 2017, 2 pages, Doc 2259.
EPO—Noting of Loss of Rights Pursuant to Rule 112(1) EPC for Application No. EP11153241.2, dated Feb. 28, 2018, 1 page, Doc 2260.
EPO—Closure of the Procedure in Respect of Application for Application No. EP11153241.2, dated May 30, 2018, 2 pages, Doc 2261.
EPO—Communication pursuant to Article 94(3) for Application No. EP11153247.9, dated Oct. 17, 2018, 4 pages, Doc 1066.
EPO—Communication Pursuant to Article 94(3) for Application No. EP11153247.9 dated Aug. 27, 2019, 4 pages Doc 9002.
EPO—Request for Grant of European Patent for Application No. EP 11153247.9, dated Feb. 3, 2011, 125 pages, Doc 2262.
EPO—Designation as Inventor—Communication Under Rule 19(3) EPC for Application. No. EP11153247.9, dated Apr. 26, 2011, 2 pages, Doc 2263.
L&P—Reply to Communication Pursuant to Rule 58 EPC dated Mar. 17, 2011 for Application No. EP11153247.9, dated May 16, 2011, 6 pages, Doc 2264.
EPO—Communication Pursuant to Rule 19(1) EPC for Application No. EP11153247.9, dated May 23, 2011, 2 pages, Doc 2265.
EPO—Notification of European Publication Number and Information on the Application of Article 67(3) EPC for Application No. EP11153247.9, dated Jun. 29, 2011, 10 pages, Doc 2266.
L&P—Reply to Communication Pursuant to Rule 19(1) EPC dated May 20 & 23, 2011 for Application No. EP11153247.9, dated Jul. 5, 2011, 2 pages, Doc 2267.
EPO—Extended European Search Report for Application No. EP11153247.9, dated May 7, 2012, 4 pages, Doc 2268.
EPO—Communication Pursuant to Rule 69 EPC—Reminder Concerning Payment of the Designation Fee (Art. 79(2) EPC) and the Examination Fee (Art. 79(2) EPC)—and Invitation Pursuant to Rule 70a(1) EPC for Application No. EP 11153247.9, dated Jun. 12, 2012, 2 pages, Doc 2269.
EPO—Notice Drawing Attention to Rule 51(2) EPC, Article 2 No. 5 of the Rules Relating to the Fees—Payment of the Renewal Fee and Additional Fee for Application No. EP11153247.9, dated Sep. 4, 2012, 2 pages, Doc 2270.
L&P—Reply to Communication Pursuant to Rule 69 and 71a(1) EPC dated Jun. 12, 2012 and the European Search Opinion dated May 7, 2012 for Application No. EP11153247.9, dated Dec. 5, 2012, 24 pages, Doc 2271.
L&P—Letter Regarding References Cited in US Prosecution for Application No. EP11153247.9, dated Jun. 18, 2013, 129 pages, Doc 2272.
L&P—Letter Regarding References Cited in JP Prosecution for Application No. EP11153247.9, dated Mar. 25, 2014, 12 pages, Doc 2273.
L&P—Document Concerning Representation for Application No. EP11153247.9, dated Oct. 8, 2014, 2 pages, Doc 2274.
EPO—Confirmation of Document Concerning Representation for Application No. EP11153247.9, dated Oct. 14, 2014, 2 pages, Doc 2275.
L&P—Enquiry as to When a Communication from the Examining Division can be Expected for Application No. EP11153247.9, dated Jun. 1, 2015, 1 page, Doc 2276.
EPO—Response to Enquiry for Communication from the Examining Division for Application No. EP11153247.9, dated Jun. 9, 2015, 1 page, Doc 2277.
EPO—Substantive Examination Started for Application No. EP11153247.9, dated Nov. 30, 2015, 3 pages, Doc 2278.
EPO—Communication Pursuant to Article 94(3) for Application No. EP11153241.2, dated Dec. 3, 2015, 5 pages, Doc 0979.
EPO—Communication Pursuant to Article 94(3) EPC for Application No. EP11153247.9, dated Dec. 3, 2015, 4 pages, Doc 2279.
L&P—Reply to Communication Pursuant to 94(3) EPC dated Dec. 2, 2015 for Application No. EP11153247.9, dated Mar. 30, 2016, 13 pages, Doc 2280.
EPO—Confirmation of Reply to Communication Pursuant to 94(3) EPC dated Dec. 2, 2015 for Application No. EP11153247.9, dated Apr. 5, 2016, 13 pages, Doc 2281.
EPO—Communication Pursuant to Article 94(3) EPC for Application No. EP11153247.9, dated Oct. 17, 2018, 4 pages, Doc 2282.

(56) References Cited

OTHER PUBLICATIONS

L&P—Reply to Communication Pursuant to Article 94(3) EPC for Application No. EP11153247.9 dateded Oct. 17, 2018, dated Feb. 11, 2019, 39 pages, Doc 2283.
EPO—Confirmation of Reply to Communication Pursuant to Article 94(3) EPC dated on Oct. 17, 2018 for Application No. EP11153247.9, dated Feb. 13, 2019, 39 pages, Doc 2284.
EPO—Request for Grant of a European Patent for Application No. EP11153281.8, dated Feb. 4, 2011, 125 pages, Doc 2285.
EPO—Designation as Inventor—Communication Under Rule 19(3) EPC for Application No. EP11153281.8, dated Apr. 26, 2011, 2 pages, Doc 2286.
L&P—Reply to Communication Pursuant to Rule 58 EPC dated Mar. 17, 2011 for Application No. EP11153281.8, dated May 16, 2011, 7 pages, Doc 2287.
EPO—Confirmation of Reply to Communication Pursuant to Rule 58 EPC dated Mar. 17, 2011 for Application No. EP11153281.8, dated May 18, 2011, 7 pages, Doc 2288.
EPO—Communication Pursuant to Rule 19(1) EPC for Application No. EP11153281.8, dated May 20, 2011, 2 pages, Doc 2289.
EPO—Notification of European Publication Number and Information on the Application of Article 67(3) EPC for Application No. EP11153281.8, dated Jun. 29, 2011, 11 pages, Doc 2290.
L&P—Response to Communication Pursuant to Rule 91(1) EPC dated May 20, 2011 and May 23, 2011 for Application No. EP11153281.8, dated Jul. 5, 2011, 2 pages, Doc 2291.
EPO—Extended European Search Report for Application No. EP11153281.8, dated May 8, 2012, 4 pages, Doc 2292.
EPO—Communication Pursuant to Rule 69 EPC—Reminder Concerning Payment of Designation Fee (Art. 79(2) EPC) and of the Examination Fee (Art. 94(1) EPC)—and Invitation Pursuant to Rule 70a(1) EPC for Application No. EP11153281.8, dated Jun. 12, 2012, 2 pages, Doc 2293.
EPO—Notice Drawing Attention to Rule 51(2) EPC, Article 2 No. 5 of the Rules Relating to Fees, Payment of the Renewal Fee Plus Additional Fee for Application No. EP11153281.8, dated Sep. 4, 2012, 2 pages, Doc 2294.
L&P—Response to Communication Pursuant to Rule 69 EPC and 70a(1) dated Jun. 12, 2012 for Application No. EP11153281.8, dated Dec. 5, 2012, 30 pages, Doc 2295.
L&P—Listing of References Cited During Prosecution of Corresponding US Application for Application No. EP11153281.8, dated Jun. 18, 2013, 129 pages, Doc 2296.
L&P—Listing of References Cited During Prosecution of Corresponding JP Application for Application No. EP11153281.8, dated Mar. 25, 2014, 12 pages, Doc 2297.
L&P—Document Concerning Representation for Application No. EP11153281.8, dated Oct. 8, 2014, 2 pages, Doc 2298.
EPO—Confirmation of Document Concerning Representation for Application No. EP11153281.8, dated Oct. 14, 2014, 2 pages, Doc 2299.
L&P—Enquiry as to When a Communication from the Examining Division can be Expected for Application No. EP11153281.8, dated Jun. 1, 2015, 1 page, Doc 2300.
EPO—Response to Enquiry for Communication from the Examining Division for Application No. EP11153281.8, dated Jun. 9, 2015, 1 page, Doc 2301.
EPO—Substantive Examination Started for Application No. EP11153281.8, dated Nov. 30, 2015, 1 page, Doc 2302.
EPO—Communication Pursuant to Article 94(3) EPC for Application No. EP11153281.8, dated Dec. 4, 2015, 5 pages, Doc 2303.
L&P—Reply to Communication Pursuant to Article 94(3) EPC dated Dec. 4, 2015 for Application No. EP11153281.8, dated Mar. 30, 2016, 13 pages, Doc 2304.
EPO—Confirmation of Reply to Communication Pursuant to Article 94(3) EPC dated on Dec. 4, 2015 for Application No. EP11153281.8, dated Apr. 5, 2016, 18 pages, Doc 2305.
EPO—Communication Pursuant to Article 94(3) EPC for Application No. EP11153281.8, dated Oct. 16, 2018, 9 pages, Doc 2306.
EPO—Communication Pursuant to Article 94(3) for Application No. EP11153281.8 dated Aug. 27, 2019, 4 pages Doc 9001.
EPO Request for Grant of a European Patent for Application No. EP11153313.9, dated Feb. 4, 2011, 125 pages, Doc 2307.
EPO—Designation as Inventor—Communication Under Rule 19(3) EPC for Application No. EP11153313.9, dated Apr. 26, 2011, 2 pages, Doc 2308.
L&P—Reply to Communication Pursuant to Rule 58 EPC dated Mar. 17, 2011 for Application No. EP11153313.9, dated May 16, 2011, 8 pages, Doc 2309.
EPO—Communication Pursuant to Rule 19(1) EPC for Application No. EP11153313.9, dated May 20, 2011, 3 pages, Doc 2310.
EPO—Notification of European Publication Number and Information on the Application of Article 67(3) for Application No. EP11153313.9, dated Jun. 29, 2011, 10 pages, Doc 2311.
L&P—Response to Communication Pursuant to Rule 19(1) EPC dated May 20, 2011 and May 23, 2011 for Application No. EP11153313.9, dated Jul. 5, 2011, 4 pages, Doc 2312.
EPO—Extended European Search Report for Application No. EP11153313.9, dated May 8, 2012, 4 pages, Doc 2313.
EPO—Communication Pursuant to Rule 69 EPC—Reminder Concerning Payment of the Designation Fee (Art. 79(2) EPC) and of the Examination Fee (Art. 94(1) EPC)—and Invitation Pursuant to Rule 70a(1) EPC for Application No. EP11153313.9, dated Jun. 12, 2012, 2 pages, Doc 2314.
L&P—Response to Communication Pursuant to Rule 69 EPC and 70a(1) dated Jun. 12, 2012 and the European Search Report dated May 8, 2012 for Application No. EP11153313.9, dated Dec. 5, 2012, 30 pages, Doc 2315.
L&P—List of References Cited in Corresponding US Application for Application No. EP11153313.9, dated Jun. 18, 2013, 129 pages, Doc 2316.
L&P—List of References Cited in Corresponding JP Application for Application No. EP11153313.9, dated Mar. 25, 2014, 12 pages, Doc 2317.
L&P—Document Concerning Representation for Application No. EP11153313.9, dated Oct. 8, 2014, 2 pages, Doc 2318.
EPO—Confirmation of Document Concerning Representation for Application No. EP11153313.9, dated Oct. 14, 2014, 2 pages, Doc 2319.
L&P—Enquiry as to when a Communication from the Examining Division can be Expected for Application No. EP11153313.9, dated Nov. 18, 2015, 1 page, Doc 2320.
EPO—Confirmation of Enquiry as to when a Communication from the Examining Division can be Expected for Application No. EP11153313.9, dated Nov. 21, 2015, 1 page, Doc 2321.
EPO—Communication in Response to Enquiry Received on Nov. 18, 2015 for Application No. EP11153313.9, dated Nov. 24, 2015, 1 page, Doc 2322.
EPO—Substantive Examination Started for Application No. EP11153313.9, dated May 9, 2016, 1 page, Doc 2323.
EPO—Communication Pursuant to Article 94(3) EPC for Application No. EP11153313.9, dated May 13, 2016, 4 pages, Doc 2324.
EPO—Noting Loss of Rights Pursuant to Rule 112(1) EPC for Application No. EP11153313.9, dated Oct. 21, 2016, 1 page, Doc 2325.
EPO—Closure of the Procedure in Respect of Application EP11153313.9, dated Jan. 20, 2017, 1 page, Doc 2326.
JPO—Notice of Reasons for Refusal for Application No. JP2008-521544, dated Jul. 10, 2012, 4 pages, Doc 0820.
Notification of Reason for Refusal for Application No. JP2008-521544, dated Jul. 17, 2012, 4 pages, Doc 2401.
Amended Claims for Application No. JP2008-521544, dated Jan. 8, 2013, 8 pages, Doc 2403.
L&P—Particulars of Letters Patent for Patent No. JP5215850, dated Apr. 11, 2013, 5 pages, Doc 2402.
Pending Claims for Application No. JP2009500868, 7 pages, Doc 2400.
L&P—Letter Regarding Filing Divisional Application for Application No. JP2013-003388, dated Jul. 3, 2014, 14 pages, Doc 2406.
Jaquez Land Richman—Letter Regarding Notice of Allowance for Application No. JP2013-003388, dated Dec. 18, 2014, 1 page, Doc 2407.

(56) References Cited

OTHER PUBLICATIONS

JPO—Grant of Patent for Application No. JP2013-003388, dated Jan. 9, 2015, 5 pages, Doc 2408.
Jaquez Land Richman—Letter Regarding Patent Grant for Application No. JP2013-003388, dated Apr. 9, 2015, 1 page, Doc 2409.
PCT—International Search Report for PCT/US2006/026965, dated Nov. 7, 2006, 19 pages, Doc 0651.
PCT—Notification Concerning Submission or Transmittal of Priority Document for Application No. PCT/US06/026965, dated Sep. 26, 2006, 131 page, Doc 2122.
WIPO—Publication with International Search Report for Application No. PCT/US06/026965, dated Jan. 18, 2007, 112 pages, Doc 2124.
Peregrine—Request Form for Application No. PCT/US06/026965, dated Mar. 14, 2007, 1 page, Doc 2123.
Geier—International Preliminary Report on Patentability from EPO dated Jun. 21, 2007 for Application No. PCT/US2006/026965, 12 pages, Doc 0658.
PCT—Written Opinion of the International Searching Authority for Application No. PCT/US06/026965, filed Jul. 11, 2006, 11 pages, Doc 2125.
PCT—International Preliminary Report on Patentability for Application No. PCT/US06/026965, filed Jul. 11, 2006, 12 pages, Doc 2126.
L&P—Response to Communication Pursuant to Rule 69 EPC dated Jul. 20, 2015 for Application No. EP14182150.4, dated Jan. 14, 2016, 24 pages, Doc 0987.
EPO—Noting Loss of Rights Pursuant to Rule 112(1) EPC for Application No. EP07794407.2, dated May 8, 2014, 1 page, Doc 0904.
Societa—Response for Application No. EP07794407.2, dated Jul. 11, 2014, 32 pages, Doc 0915.
Peregrine—Response to communication dated Nov. 16, 2012 for Application No. EP09174085.2, dated May 23, 2013, 18 pages, Doc 0852.
JPO—Decision to Grant a Patent for Application No. JP2013-006353, dated Jul. 1, 2014, 6 pages, Doc 0914.
JPO—Notice of Reasons for Refusal for Application No. JP2010506156, dated Apr. 9, 2012, 4 pages, Doc 0808.
JPO—Notice of Reasons for Refusal for Application No. JP2013-006353, dated Oct. 21, 2013, 10 pages, Doc 0876.
Peregrine—Amendment for Application No. JP2013-006353, Apr. 28, 2014, 18 pages, Doc 0961.
EPO—Extended Search Report for Application No. EP12194187.6, dated Feb. 7, 2013, 11 pages, Doc 0840.
EPO—Extended Search Report for Application No. EP14165804.7, dated May 27, 2014, 8 pages, Doc 0909.
EPO—Communication Pursuant to Article 94(3) for Application No. EP11153227.1, dated Jul. 4, 2019, 7 pages Doc 2412.
RF Micro Devices Inc., Invalidity Contentions for U.S. Pat. No. 8,405,147, Dec. 10, 2013 (Civil Case #: 3:12-cv-00911-H-JLB), 324 pages, Doc 8000.
RF Micro Devices Inc., Invalidity Contentions for U.S. Pat. No. 7,910,993, Dec. 10, 2013 (Civil Case #: 3:12-cv-00911-H-JLB), 1697 pages, Doc 8001.
RF Micro Devices Inc., Exhibit listing prior art identified in connection with Invalidity Contentions for U.S. Pat. No. 7,910,993 and U.S. Pat. No. 8,405,147, Dec. 10, 2013, (Civil Case #: 3:12-cv-00911-H-JLB), 21 pages, Doc 8004.
RF Micro Devices Inc., Amended Invalidity Contentions for U.S. Pat. No. 8,405,147, Dec. 10, 2013 (Civil Case #: 3:12-cv-00911-H-JLB), 362 pages, Doc 8006.
RF Micro Devices Inc., Amended Invalidity Contentions for U.S. Pat. No. 7,910,993, Dec. 10, 2013 (Civil Case #: 3:12-cv-00911-H-JLB), 110 pages, Doc 8007.
RF Micro Devices Inc., Amended Exhibit listing prior art identified in connection with Invalidity Contentions for U.S. Pat. No. 7,910,993 and U.S. Pat. No. 8,405,147, Dec. 10, 2013, (Civil Case #: 3:12-cv-00911-H-JLB), 33 pages, Doc 8005.

RF Micro Devices Inc., Invalidity Contentions for U.S. Pat. No. 7,860,499, Dec. 10, 2013 (Civil Case #: 3:12-cv-00911-H-JLB), 403 pages, Doc 8002.
RF Micro Devices Inc., Invalidity Contentions for U.S. Pat. No. 7,123,898, Dec. 10, 2013 (Civil Case #: 3:12-cv-00911-H-JLB), 383 pages, Doc 8003.
RF Micro Devices Inc., Amended Invalidity Contentions for U.S. Pat. No. 7,860,499, Dec. 10, 2013 (Civil Case #: 3:12-cv-00911-H-JLB), 445 pages, Doc 8008.
RF Micro Devices Inc., Amended Invalidity Contentions for U.S. Pat. No. 7,123,898, Dec. 10, 2013 (Civil Case #: 3:12-cv-00911-H-JLB), 430 pages, Doc 8009.
RF Micro Devices Inc., Invalidity Contentions for U.S. Pat. No. 7,860,499, Dec. 10, 2013 (Civil Case #: 3:12-cv-00911-H-JLB), 403 pages, Doc 8010.
RF Micro Devices Inc., Invalidity Contentions for U.S. Pat. No. 7,123,898, Dec. 10, 2013 (Civil Case #: 3:12-cv-00911-H-JLB), 383 pages, Doc 8011.
RF Micro Devices Inc., Amended Invalidity Contentions for U.S. Pat. No. 7,860,499, Dec. 10, 2013 (Civil Case #: 3:12-cv-00911-H-JLB), 445 pages, Doc 8012.
RF Micro Devices Inc., Amended Invalidity Contentions for U.S. Pat. No. 7,123,898, Dec. 10, 2013 (Civil Case #: 3:12-cv-00911-H-JLB), 504 pages, Doc 8013.
Docket for Case No. CACD-8-12-cv-00248 filed Feb. 14, 2012 in the United States District Court, Central District of California, Southern Division, 4 pages, Doc 8022.
Docket for Case 377-TA-848 filed Feb. 14, 2012 in the International Trade Commission, 14 pages, Doc 8023.
Docket for Case No. CASD-3-12-cv-00911 filed Feb. 13, 2012 in the United States District Court, Central District of California, Southern Division, 42 pages, Doc 8024.
Docket for Case No. CASD-3-12-cv-01160 filed May 11, 2012 in the United States District Court, Central District of California, Southern Division, 10 pages, Doc 8025.
Docket for Case No. CASD-3-13-cv-00725 filed Mar. 26, 2013 in the United States District Court, Central District of California, Southern Division, 4 pages, Doc 8026.
Docket for Case No. NCMD-1-12-cv-00377 filed Apr. 16, 2012 in the United States District Court, North Carolina Middle District, 5 pages, Doc 8027.
Peregrine's Verified Complaint filed with ITC Feb. 14, 2012 in 337-TA-848, 39 pages, Doc 8067.
Peregrine's Letter to Supplement Feb. 14, 2012 Complaint filed Feb. 16, 2012 in 337-TA-848, 1 page, Doc 8080.
Peregrine's Letter to Clarify and Supplement Feb. 14, 2012 Complaint filed Feb. 28, 2012 in 337-TA-848, 1 page, Doc 8081.
Peregrine's First Amended Complaint filed May 11, 2012 in 337-TA-848, 38 pages, Doc 8068.
Peregrine's Errata to Correct Typographical Error in Peregrine's First Amended Complaint filed May 15, 2012 in 337-TA-848, 2 pages, Doc 8071.
HTC's Response to First Amended Complaint filed Jul. 2, 2012 in 337-TA-848, 22 pages, Doc 8070.
Motorola's Exhibit a to the Response to Amended Complaint filed Jul. 2, 2012 in 337-TA-848, 3 pages, Doc 8073.
Motorola's Response to Amended Complaint filed Jul. 2, 2012 in 337-TA-848, 24 pages, Doc 8074.
RFMD's Response to First Amended Complaint filed Jul. 2, 2012 in 337-TA-848, 26 pages, Doc 8078.
HTC's Response to Amended Complaint filed Jul. 3, 2012 in 337-TA-848, 3 pages, Doc 8069.
Peregrine's Appendices A and I to Accompany First Amended Complaint filed Jul. 3, 2012 in 337-TA-848, 2 pages, Doc 8076.
Peregrine's Motion for Leave to Amend Complaint filed Jul. 20, 2012 in 337-TA-848, 87 pages, Doc 8077.
Peregrine's Letter to Supplement First Amended Complaint filed Jul. 25, 2012 in 337-TA-848, 3 pages, Doc 8072.
Peregrine's Notice of Patent Priority Dates filed Aug. 22, 2012 in 337-TA-848, 4 pages, Doc 8075.
Commission Investigative Staffs Notice of Prior Art filed Aug. 31, 2012 in 337-TA-848, 3 pages, Doc 8079.

(56) References Cited

OTHER PUBLICATIONS

Peregrine's Complaint for Damages and Injunctive Relief filed Feb. 14, 2012 in CACD-8-12-cv-00248, 101 pages, Doc 8082.
Peregrine's Complaint for Injunctive Relief filed Apr. 13, 2012 in CASD-3-12-cv-00911, 199 pages, Doc 8030.
RFMD and Motorola's Answer to Complaint and RFMD's Counterclaim filed Jun. 8, 2012 in CASD-3-12-cv-00911, 18 pages, Doc 8031.
RFMD's Answer, Defenses and Counterclaims to Plaintiffs Complaint filed May 1, 2013 in CASD-3-12-cv-00911, 11 pages, Doc 8032.
Peregrine's Answer to RFMD's Counterclaims filed May 28, 2013 in CASD-3-12-cv-00911, 10 pages, Doc 8033.
Peregrine's First Amended Complaint filed Nov. 21, 22013 in CASD-3-12-cv-00911, 348 pages, Doc 8035.
Peregrine's Motion for Preliminary Injunction filed Nov. 25, 2013 in CASD-3-12-cv-00911, 327 pages, Doc 8036.
RFMD's Amended Answer, Defenses and Counterclaims to Plaintiff's Complaint (Redacted Public Version) filed Dec. 12, 2013 in CASD-3-12-cv-00911, 65 pages, Doc 8034.
Defendant RFMD's Opposition to Peregrine's Motion for Preliminary Injunction filed Dec. 13, 2013 in CASD-3-12-cv-00911, 504 pages, Docs 8028A-8028D.
Peregrine's Reply in Support of Its Motion for Preliminary Injunction (Public Redacted Version) filed Dec. 20, 2013 in CASD-3-12-cv-00911, 130 pages, Doc 8037.
RFMD'S Unopposed Motion for Leave to File Short Surreply in Opposition to Peregrine's Motion for Preliminary Injunction filed Jan. 3, 2014 in CASD-3-12-cv-00911, 60 pages, Doc 8038.
Peregrine's Unopposed Motion for Leave to File Response to RFMD's Surreply filed Jan. 3, 2014 in CASD-3-12-cv-00911, 15 pages, Doc 8039.
Peregrine's Answer and Counterclaims to RFMD's Counterclaims filed Jan. 6, 2014 in CASD-3-12-cv-00911, 23 pages, Doc 8040.
Order Denying Peregrine's Motion for Preliminary Injunction filed Jan. 8, 2014 in CASD-3-12-cv-00911, 7 pages, Doc 8041.
RFMD's Answer to Peregrine's Counterclaims filed Jan. 27, 2014 in CASD-3-12-cv-00911, 5 pages, Doc 8042.
RFMD's Motion to Dismiss Peregrine's 3rd, 4th, 6th, 7th and 8th Counts for Lack of Subject Matter Jurisdiction filed Jan. 30, 2014 in CASD-3-12-cv-00911, 323 pages, Doc 8043.
Defendant Benton's Answer and Defenses to Plaintiff's First Amended Complaint filed Jan. 31, 2014 in CASD-3-12-cv-00911, 36 pages, Doc 8044.
Joint Claim Construction and Prehearing Statement Pursuant to Patent L.R. 4.2 filed Feb. 4, 2014 in CASD-3-12-cv-00911, 176 pages, Doc 8045.
Defendant Benton's Notice of Joinder to RFMD's Motion to Dismiss and Motion and Memorandum in Support of Motion to Dismiss Peregrine's 1st, 2nd, and 3rd Causes of Action for Lack of Subject Matter Jurisdiction filed Feb. 26, 2014 in CASD-3-12-cv-00911, 13 pages, Doc 8046.
Peregrine's Memorandum in Opposition to RFMD's Motion to Dismiss filed Mar. 3, 2014 in CASD-3-12-cv-00911, 184 pages, Doc 8047.
Peregrine's Opening Claim Construction Brief filed Mar. 4, 2014 in CASD-3-12-cv-00911, 377 pages, Docs 8029A and 8029B.
RFMD's Opening Brief on Claim Construction (Public Redacted Version) filed Mar. 4, 2014 in CASD-3-12-cv-00911, 27 pages, Doc 8048.
RFMD's Declaration of Mark Tung in Support of RFMD's Opening Claim Construction Brief filed Mar. 4, 2014 in CASD-3-12-cv-00911, 162 pages, Doc 8049.
RFMD's Reply Memorandum in Support of Its Motion to Dismiss Peregrine's 4th, 6th, 7th and 8th Counts for Lack of Subject Matter Jurisdiction filed Mar. 10, 2014 in CASD-3-12-cv-00911, 37 pages, Doc 8051.
Peregrine's Memorandum in Opposition to Benton's Motion to Dismiss (Public Redacted Version) filed Mar. 14, 2014 in CASD-3-12-cv-00911, 86 pages, Doc 8052.

Order (1) Granting in Part and Denying in Part RFMD's Motion to Dismiss; (2) Granting Benton's Motion to Dismiss; and (3) Denying Peregrine's Motion to Stay filed Mar. 18, 2014 in CASD-3-12-cv-00911, 10 pages, Doc 8053.
Stricken Document: Response to Claim Construction Brief Pursuant to Order 214 filed Mar. 18, 2014 in CASD-3-12-cv-00911, 1 page, Doc 8054.
RFMD's Responsive Brief on Claim Construction filed Mar. 18, 2014 in CASD-3-12-cv-00911, 36 pages, Doc 8055.
Order Striking Peregrine's Mar. 18, 2014 Filings and Granting Peregrine's Motion to File Responsive Claim Construction Brief filed Mar. 20, 2014 in CASD-3-12-cv-00911, 2 pages, Doc 8056.
Peregrine's Substitute Responsive Claim Construction Brief (Public Redacted Version) filed Mar. 24, 2014 in CASD-3-12-cv-00911, 20 pages, Doc 8057.
Peregrine's Opening Claim Construction Brief for U.S. Pat. No. 6,903,426 filed Apr. 4, 2014 in CASD-3-12-cv-00911, 149 pages, Doc 8058.
RFMD's Opening Brief on Claim Construction for U.S. Pat. No. 6,903,426 filed Apr. 4, 2014 in CASD-3-12-cv-00911, 148 pages, Doc 8059.
Peregrine's Responsive Claim Construction Brief for U.S. Pat. No. 6,903,426 filed Apr. 11, 2014 in CASD-3-12-cv-00911, 31 pages, Doc 8060.
RFMD's Responsive Brief on Claim Construction filed Apr. 11, 2014 in CASD-3-12-cv-00911, 79 pages, Doc 8061.
Tentative Claim Construction Order for U.S. Pat. Nos. 7,910,993, 8,405,147 and 6,903,426 filed Apr. 16, 2014 in CASD-3-12-cv-00911, 87 pages, Doc 8062.
Peregrine's Markman Hearing Slide Deck filed Apr. 18, 2014 in CASD-3-12-cv-00911, 62 pages, Doc 8063.
RFMD's Markman Hearing Slide Deck filed Apr. 18, 2014 in CASD-3-12-cv-00911, 36 pages, Doc 8064.
Claim Construction Order for U.S. Pat. Nos. 7,910,993, 8,405,147 and 6,903,426 filed Apr. 23, 2014 in CASD-3-12-cv-00911, 16 pages, Doc 8065.
Claim Construction Charts for U.S. Pat. Nos. 7,910,993, 8,405,147 and 6,903,426 filed Apr. 23, 2014 in CASD-3-12-cv-00911, 72 pages, Doc 8066.
Declaration of Brian Floyd, Ph.D. filed Mar. 4, 2016 in CASD-3-12-cv-00911, 23 pages, Doc 8050.
Peregrine's Complaint for Damages and Injunctive Relief filed May 11, 2012 in CASD-3-12-cv-01160, 9 pages, Doc 8083.
Peregrine's Complaint and Demand for Jury Trial filed Mar. 26, 2013 in CASD-3-13-cv-00725, 68 pages, 68 pages, Doc 8084.
RFMD's Complaint for Declaratory Judgment of Patent Non-Infringement and Invalidity filed Apr. 16, 2012 in NCMD-1-12-cv-00377, 246 pages, Doc 8085.
Examiner Initialed 1449s/SB08s for U.S. Appl. No. 11/484,370, filed Jul. 10, 2006.
Examiner Initialed 1449s/SB08s for U.S. Appl. No. 13/053,211, filed Mar. 22, 2011.
Examiner Initialed 1449s/SB08s for U.S. Appl. No. 13/277,108, filed Oct. 19, 2011.
Examiner Initialed 1449s/SB08s for U.S. Appl. No. 14/198,315, filed Mar. 5, 2014.
Examiner Initialed 1449s/SB08s for U.S. Appl. No. 14/804,198, filed Jul. 20, 2015.
Examiner Initialed 1449s/SB08s for U.S. Appl. No. 15/354,723, filed Nov. 17, 2016.
Examiner Initialed 1449s/SB08s for U.S. Appl. No. 15/693,182, filed Aug. 31, 2017.
Examiner Initialed 1449s/SB08s for U.S. Appl. No. 16/046,974, filed Jul. 26, 2018.
Examiner Initialed 1449s/SB08s for U.S. Appl. No. 16/377,026, filed Apr. 5, 2019.
Voldman—"Dynamic Threshold Body- and Gate-coupled SOI ESD Protection Networks", Journal of Electrostatics 44, Mar. 20, 1998, pp. 239-255, Doc 8015.
Matloubian—"Smart Body Contact for SOI MOSFETs" 1989 IEEE SOS/SOI Technology Conference pp. 128-129, Oct. 3-5, 1989, 2 pages, Doc 0425.

(56) References Cited

OTHER PUBLICATIONS

Hieda—Floating-Body Effect Free Concave SOI-MOSFETs (COSMOS), ULSI Research Center, Toshiba Corporation, IEEE 1991, pp. 26.2.1-26.2.4, Dec. 8-11, 1991, 4 pages, Doc 0187.
Patel—"A Novel Body Contact for SIMOX Based SOI MOSFETs", Solid-State Electronics vol. 34, No. 10, pp. 1071-1075, Apr. 22, 1991, 6 pages, Doc 3000.
Katzin—"High Speed 100+ W RF Switched Using GaAs MMICs", IEEE Transactions on Microwave Theory and Techniques, Nov. 1992, pp. 1989-1996, 8 pages, Doc 0194.
Armijos—"High Speed DMOS FET Analog Switches and Switch Arrays", Temic Semiconductors Jun. 22, 1994, pp. 1-10, 10 pages, Doc 0202.
Li—"Suppression of Geometric Component of Charge Pumping Current SOI/MOSFETs", Proc. Int. Symp. VLSI Technology, Systems & Applications (IEEE May 31-Jun. 2, 1995), pp. 144-148, 5 pages, Doc 8016.
Chan—"A Novel SOI CBiCMOS Compatible Device Structure for Analog and Mixed-Mode Circuits", Dept. of EECS, University of California at Berkeley, IEEE Nov. 1995, pp. 40-43, 4 pages, Doc 1078.
Kohama—"High Power DPDT Antenna Switch MMIC for Digital Cellular Services", IEEE Journal of Solid-State Circuits, Oct. 1996, pp. 1406-1411, 6 pages, Doc 0244.
Tenbroek—"Electrical Measure of Silicon Film and Oxide Thickness in Partially Depleted SOI Technologies", Solid-State Electronics, vol. 39, No. 7, pp. 1011-1014, Nov. 14, 1995, 4 pages, Doc 8019.
NEC Corporation—"uPG13xG Series L-Band SPDT Switch GaAs MMIC", Document No. P1096EJ1VOANDO (1st Edition), Feb. 1996, 30 pages, Doc 0248.
Kuge—"SOI-DRAM Circuit Technologies for Low Power High Speed Multigiga Scale Memories", Jun. 8-10, 1995, IEEE Journal of Solid-State Circuits, vol. 31, No. 4, Apr. 1996, pp. 586-591, 6 pages, Doc 0259.
Fung—"Frequency Dispersion in Partially Depleted SOI MOSFET Output Resistance", Proceedings 1996 IEEE International SOI Conference, Oct. 1996, pp. 146-147, 2 pages, Doc 0268.
Yamamoto—"A Single-Chip GaAs RF Transceiver for 1.9GHz Digital Mobile Communication Systems", IEEE Dec. 1996, pp. 1964-1973, 10 pages, Doc 0255.
Johnson—"Silicon-On-Sapphire Technology for Microwave Circuit Applications", Dissertation UCSD Jan. 1997, IEEE May 1998, pp. 1-184, 214 pages, Doc 0288.
Koh—"1Giga Bit SOI DRAM with Fully Bulk Compatible Process and Body-Contacted SOI MOSFET Structure", IEEE Dec. 10, 1997, pages, Doc 8021.
Maeda—"A Highly Reliable .35um Field Body-Tied SOI Gate Array for Substrate-Bias-Effect Free Operation", 1997 Symposium on VLSI Technology Digest of Technical Papers, Jun. 10-12, 1997, 2 pages, Doc 8020.
Koh—"Body-Contacted SOI MOSFET Structure with Fully Bulk CMOS Compatible Layout and Process", IEEE Electron Device Letters, vol. 18, No. 3, Mar. 1997, pp. 102-104, 3 pages, Doc 0305.
Huang—"Device Physics, Performance Simulations and Measured Results of SOI MOS and DTMOS Transistors and Integrated Circuits", Beijing Microelectronics Technology Institute, Oct. 23, 1998 IEEE, pp. 712-715, 4 pages, Doc 0333.
Hirota—0.5V 320MHz 8b Multiplexer/Demultiplier Chips Based on a Gate Array with 1998 IEEE International Solid-State Circuits Conference. Digest of Technical Papers, ISSCC. First Edition, pp. 12.2-1-12.2-11, 11 pages, Doc 0351.
Chuang—"SOI for Digital CMOS VLSI Design: Design Considerations and Advances", Proceedings of the IEEE vol. 86, No. 4, Apr. 1, 1998 pp. 689-720, 32 pages, Doc 1079.
Duyet—"Suppression of Geometric Component of Charge Pumping Current in Thin Film Silicon on insulator Metal-Oxide-Semiconductor Field-Effect Transistors", Japanese Journal of Applied Physics, Jul. 15, 1998, vol. 37, pp. L855-858, 4 pages, Doc 0729.

Gil—"A High Speed and Low Power SOI Inverter using Active Body-Bias", Proceedings International Symposium on Low Power Electronics and Design, Sep. 1998, pp. 59-63, 5 pages, Doc 0359.
Tseng—"AC Floating-Body Effects an Submicron Fully Depleted (FD) SOI nMOSFETs and the Impact on Analog Applications", IEEE Electron Devices, vol. 19, No. 9, Sep. 1998, pp. 351-353, 3 pages, Doc 0362.
Duyet—"Effects of Body Reverse Pulse Bias on Geometric Component of Charge Pumping Current in FD SOI MOSFETs", Proceedings IEEE Intl SOI Conference, Oct. 5-8, 1998, pp. 79-80, 2 pages, Doc 0364.
Chung—"A New SOI MOSFET Structure with Junction Type Body Contact", International Electron Device Meeting (IEDM) Technical Digest, Dec. 5-8, 1999, pp. 59-62, 4 pages, Doc 0379.
Devlin—"The Design of Integrated Switches and Phase Shifters", Nov. 24, 1999, 15 pages, Doc 0381.
Lim—"Partial SOI LDMOSFETs for High-Side Switching", Dept. of Engineering, University of Cambridge, Oct. 5-9, 1999 IEEE, pp. 149-152, 4 pages, Doc 0393.
Maeda—"Substrate Bias Effect and Source Drain Breakdown Characteristics in Body Tied Short Channel SOI MOSFETs", IEEE Transactions on Electron Devices, vol. 46, No. 1, Jan. 1999, pp. 151-158, 8 pages, Doc 0397.
Rodgers—"Silicon UTSi CMOS RFIC for CDMA Wireless Communications System", IEEE MTT-S Digest, Jun. 14-15, 1999, pp. 485-488, 4 pages, Doc 0406.
Yamamoto—"A 2.2-V Operation, 2.4-GHz Single-Chip GaAs MMIC Transceiver for Wireless Applications", IEEE Journal of Solid-State Circuits, vol. 34, No. 4, Apr. 1999, pp. 502-512, 11 pages, Doc 0417.
Chen—"Low Power, Multi-Gigabit DRAM Cell Design Issues Using SOI Technologies", http://bwrc.eecs.berkeley.edu/people/grad_students/chenff/reports, May 14, 1999, 6 pages, Doc 0418.
Allen—"Characterization and Modeling of Silicon-on-Insulator Field Effect Transistors", Department of Electrical Engineering and Computer Science, MIT May 20, 1999, 80 pages, Doc 0419.
Tseng—"AC Floating-Body Effects and the Resultant Analog Circuit Issues in Submicron Floating Body and Body-Grounded SOI MOSFETs", IEEE Transactions on Electron Devices, vol. 46, No. 8, Aug. 1999, 8 pages, Doc 0420.
Fung—"Controlling Floating-Body Effects for 0.13um and .10um SOI CMOS", IDEM 00-231-234, Dec. 10-13, 2000, IEEE, 4 pages, Doc 8017.
Imam—"A Simple Method to Determine the Floating-Body Voltage of SOI CMOS Devices", IEEE Electron Device Letters, vol. 21, No. 1, Jan. 2000, pp. 21-23, 3 pages, Doc 0441.
Kanda—"A Si RF Switch MMIC for the Cellular Frequency Band Using SOI-CMOS Technology", The Institute of Electronics, Information and Communication Engineers, vol. 100, No. 152, Jun. 2000, pp. 79-83, 5 pages, Doc 0443.
Shahidi—"Issues in SOI CMOS Technology and Design", IEEE 2000 Custom Integrated Circuits Conference, Publication/Presentation dated May 21, 2000, 78 pages, Doc 8014.
Horiuchi—"A Dynamic-Threshold SOI Device with a J-FET Embedded Source Structure and a Merged Body-Bias-Control Transistor—Part II: Circuit Simulation", IEEE Transactions on Electron Devices, vol. 47, No. 8, Aug. 2000, pp. 1593-1598, 6 pages, Doc 0457.
Horiuchi—"A Dynamic-Threshold SOI Device with a J-FET Embedded Source Structure and a Merged Body-Bias-Control Transistor—Part I: A J-FET Embedded Source Structure Properties", IEEE Transactions on Electron Devices, vol. 47, No. 8, Aug. 2000, pp. 1587-1592, 6 pages, Doc 0456.
Scheinberg—"A Computer Simulation Model for Simulating Distortion in FET Resistors", IEEE Transactions on Computer-Aided Design of Integrated Circuits and Systems, vol. 19, No. 9, Sep. 2000, pp. 981-989, 9 pages, Doc 0461.
Cristoloveanu—"The Four-Gate Transistor", Institute of Microelectronics, Electromagnetism and Photonics, ESSDERC Sep. 24-26, 2002, pp. 323-326, 4 pages, Doc 0478.
Reedy—"Utsi CMOS: A Complete RF SOI Solution", Peregrine Semiconductor Nov. 2000, pp. 1-6, 6 pages, Doc 0508.

(56) References Cited

OTHER PUBLICATIONS

Yamamoto—"A 2.4GHz Band 1.8V Operation Single Chip SI-CMOS T/R MMIC Front End with a Low Insertion Loss Switch", IEEE Journal of Solid-State Circuits, vol. 36, No. 8, Aug. 2001, pp. 1186-1197, 12 pages, Doc 0527.
Adan—"Off-State Leakage Current Mechanisms in BulkSi and SOI MOSFETs and Their Impact on CMOS ULSIs Standby Current", IEEE Transactions on Electron Devices, vol. 48, No. 9, Sep. 2001, pp. 2050-2057, 8 pages, Doc 0528.
Goldman—"0.15um SOI DRAM Technology Incorporating Sub-Volt Dynamic Threshold Devices for Embedded Mixed-Signal & RF Circuits", Oct. 1-4, 2001 IEEE SOI Conference, pp. 97-98, 2 pages, Doc 0531.
Fung—"Present Status and Future Direction of BSIM SOIL Model for High-Performance/Low-Power/RF Application", IBM Microelectronics, Semiconductor Research and Development Center, Apr. 2002, 4 pages, Doc 0554.
Adan—"Linearity and Low-Noise Performance of SOI MOSFETs for RF Applications", IEEE Transactions on Electron Devices, May 2002 vol. 49, No. 5, pp. 881-888, 8 pages, Doc 0555.
Akarvardar—"Multi-Bias Dependence of Threshold Voltage, Subthreshold Swing, and Mobility in G4-FETs", Institute of Microelectronics, Electromagnetism, and Photonics, IEEE Oct. 2003, pp. 127-130, 4 pages, Doc 1075.
Dufrene—"The G4-FET: Low Voltage to High Voltage Operation and Performance", Dept. of Electrical and Computer Engineering, The University of Tennessee, IEEE Jan. 2003, pp. 55-56, 2 pages, Doc 0565.
Marks—"SOI for Frequency Synthesis in RF Integrated Circuits", Thesis submitted to North Carolina State University, May 2003, 155 pages, Doc 0574.
Zhu Ming—"A New Structure of Silicon-on-Insulator Metal-Oxide Semiconductor Field Effect Transistor to Suppress the Floating Body Effect", Nov. 4, 2002, Chin. Phys. Lett., vol. 20, No. 5 (2003) pp. 767-769, 3 pages, Doc 0575.
Fung—"On the Body-Source Built-In Potential Lowering of SOI MOSFETS", IEEE Electron Device Letters, vol. 24, No. 2, Feb. 2003, pages, Doc 8018.
Tinella—"Study of the Potential of CMOS-SOI Technologies Partially Abandoned for Radiofrequency Applications", Thesis for obtaining the standard of Doctor of INPG, National Polytechnic of Grenoble, Sep. 25, 2003, 187 pages, Doc 0594.
De Houck—"Design of EEPROM Memory Cells in Fully Depleted 'CMOS SOI Technology'", Universite Catholique de Louvain Faculty of Applied Science, Laboratory of Electronics and Microelectronics, Academic Year 2003-2004, Jan. 2003, 94 pages, Doc 0599.
Streetman—"Solid State Electronic Devices", Microelectronics Research Center, Dept. of Electrical and Computer Engineering, The University of Texas at Austin, Chapter 6, Jan. 2004 by Pearson Education Inc., 4 pages, Doc 0602.
Zhu—"Simulation of Suppression of Floating-Body Effect in Partially Depleted SOI MOSFET Using a Sil-xGex Dual Source Structure", Materials Science and Engineering B 114-115 Dec. 15, 2004, pp. 264-268, 5 pages, Doc 0604.
Chen—"G4-FET Based Voltage Reference", Masters Theses, University of Tennessee, Knoxville, Trace: Tennessee Research and Creative Exchange, May 2004, 57 pages, Doc 0607.
Ippoushi—"SOI Structure Avoids Increases in Chip Area and Parasitic Capacitance Enables Operational Control of Transistor Threshold Voltage", Renesas Edge, vol. 2004.5, Jul. 2004, p. 15, 1 page, Doc 0610.
Akarvardar—"Threshold Voltage Model of the SOI 4-Gate Transistor", 2004 IEEE International SOI Conference, Oct. 4-7, 2004, pp. 89-90, 2 pages, Doc 0613.
Dufrene—"Investigation of the Four-Gate Action in G4-FETs", IEEE Transactions on Electron Devices, vol. 51, No. 11, Dec. 2004, pp. 1931-1935, 5 pages, Doc 0617.
Cathelin—"Antenna Switch Devices in RF Modules for Mobile Applications", ST Microelectronics, Front-End Technology Manufacturing, Crolles, France, Mar. 2005, 42 pages, Doc 0623.
Burgener — Response to Missing Parts and Preliminary Amendment filed Feb. 23, 2021 for U.S. Appl. No. 16/930,215, 15 pages, (PER-001-CON-12), Doc 9297.
USPTO — Updated Filing Receipt dated Feb. 26, 2021 for U.S. Appl. No. 16/930,215, 5 pages, (PER-001-CON-12), Doc 9302.
Stuber — Response to Office Action dated Feb. 3, 2021 for U.S. Appl. No. 16/739,081, 15 pages, (PER-015-CIP-DIV-CON-3), Doc 9298.
Brindle — Response to Missing Parts and Preliminary Amendment dated Mar. 15, 2021 for U.S. Appl. No. 16/987,265, 19 pages (PER-016-DIV-CON-12), Doc 9299.
Dribinsky — Response to Missing Parts and Preliminary Amendment dated Feb. 10, 2021 for U.S. Appl. No. 16/921,790, 14 pages (PER-018-CIP-CON-4), Doc 9300.
USPTO — Updated Filing Receipt dated Feb. 12, 2021 for U.S. Appl. No. 16/921,790, 5 pages (PER-018-CIP-CON-4), Doc 9301.

\* cited by examiner

METHOD AND APPARATUS FOR USE IN IMPROVING LINEARITY OF MOSFETS USING AN ACCUMULATED CHARGE SINK-HARMONIC WRINKLE REDUCTION

CROSS-REFERENCE TO RELATED APPLICATIONS—CLAIM OF PRIORITY

This patent application claims the benefit of priority to U.S. provisional application No. 61/405,165, filed Oct. 20, 2010; this patent application is also a Continuation-in-Part (CIP) of U.S. patent application Ser. No. 13/053,211 filed Mar. 22, 2011, which is a divisional application of U.S. patent application Ser. No. 11/484,370 filed Jul. 10, 2006 (now U.S. Pat. No. 7,910,993, dated Mar. 22, 2011) which claims the benefit of priority to U.S. provisional application No. 60/698,523, filed Jul. 11, 2005. This patent application is also related to U.S. application Ser. No. 11/520,912 filed Sep. 14, 2006 (now U.S. Pat. No. 7,890,891, dated Feb. 15, 2011) which claims the benefit of priority to U.S. Provisional Application Nos. 60/718,260, filed Sep. 15, 2005. The contents of all of the applications and issued patents cited above, including appendices of those applications, are incorporated by reference herein in their entirety as if set forth in full.

BACKGROUND

1. Field

The present invention relates to metal-oxide-semiconductor (MOS) field effect transistors (FETs), and particularly to MOSFETs fabricated on Semiconductor-On-Insulator ("SOI") and Semiconductor-On-Sapphire ("SOS") substrates. In one embodiment, an SOI (or SOS) MOSFET is adapted to control accumulated charge and thereby improve linearity of circuit elements.

2. Description of Related Art

Although the disclosed method and apparatus for use in improving the linearity of MOSFETs are described herein as applicable for use in SOI MOSFETs, it will be appreciated by those skilled in the electronic device design arts that the present teachings are equally applicable for use in SOS MOSFETs. In general, the present teachings can be used in the implementation of MOSFETs using any convenient semiconductor-on-insulator technology, including silicon-on-insulator technology. For example, the inventive MOSFETs described herein can be implemented using compound semiconductors on insulating substrates. Such compound semiconductors include, but are not limited to, the following: Silicon Germanium (SiGe), Gallium Arsenide (GaAs), Indium Phosphide (InP), Gallium Nitride (GaN), Silicon Carbide (SiC), and II-VI compound semiconductors, including Zinc Selenide (ZnSe) and Zinc Sulfide (ZnS). The present teachings also may be used in implementing MOSFETs fabricated from thin-film polymers. Organic thin-film transistors (OTFTs) utilize a polymer, conjugated polymers, oligomers, or other molecules to form the insulting gate dielectric layer. The present inventive methods and apparatus may be used in implementing such OTFTs.

It will be appreciated by those skilled in the electronic design arts that the present disclosed method and apparatus apply to virtually any insulating gate technology, and to integrated circuits having a floating body. As those skilled in the art will appreciate, technologies are constantly being developed for achieving "floating body" implementations. For example, the inventors are aware of circuits implemented in bulk silicon wherein circuit implementations are used to "float" the body of the device. In addition, the disclosed method and apparatus can also be implemented using silicon-on-bonded wafer implementations. One such silicon-on-bonded wafer technique uses "direct silicon bonded" (DSB) substrates. Direct silicon bond (DSB) substrates are fabricated by bonding and electrically attaching a film of single-crystal silicon of differing crystal orientation onto a base substrate. The present disclosure therefore contemplates embodiments of the disclosed method and apparatus implemented in any of the developing floating body implementations. Therefore, references to and exemplary descriptions of SOI MOSFETs herein are not to be construed as limiting the applicability of the present teachings to SOI MOSFETs only. Rather, as described below in more detail, the disclosed method and apparatus find utility in MOSFETs implemented in a plurality of device technologies, including SOS and silicon-on-bonded wafer technologies.

As is well known, a MOSFET employs a gate-modulated conductive channel of n-type or p-type conductivity, and is accordingly referred to as an "NMOSFET" or "PMOSFET", respectively. FIG. 1 shows a cross-sectional view of an exemplary prior art SOI NMOSFET 100. As shown in FIG. 1, the prior art SOI NMOSFET 100 includes an insulating substrate 118 that may comprise a buried oxide layer, sapphire, or other insulating material. A source 112 and drain 116 of the NMOSFET 100 comprise N+ regions (i.e., regions that are heavily doped with an "n-type" dopant material) produced by ion implantation into a silicon layer positioned above the insulating substrate 118. (The source and drain of PMOSFETs comprise P+ regions (i.e., regions heavily doped with "p-type" dopant material)). The body 114 comprises a P-region (i.e., a region that is lightly doped with a "p-type" dopant), produced by ion implantation, or by dopants already present in the silicon layer when it is formed on the insulating substrate 118. As shown in FIG. 1, the NMOSFET 100 also includes a gate oxide 110 positioned over the body 114. The gate oxide 110 typically comprises a thin layer of an insulating dielectric material such as $SiO_2$. The gate oxide 110 electrically insulates the body 114 from a gate 108 positioned over the gate oxide 110. The gate 108 comprises a layer of metal or, more typically, polysilicon A source terminal 102 is operatively coupled to the source 112 so that a source bias voltage "Vs" may be applied to the source 112. A drain terminal 106 is operatively coupled to the drain 116 so that a drain bias voltage "Vd" may be applied to the drain 116. A gate terminal 104 is operatively coupled to the gate 108 so that a gate bias voltage "Vg" may be applied to the gate 108.

As is well known, when a voltage is applied between the gate and source terminals of a MOSFET, a generated electric field penetrates through the gate oxide to the transistor body. For an enhancement mode device, a positive gate bias creates a channel in the channel region of the MOSFET body through which current passes between the source and drain. For a depletion mode device, a channel is present for a zero gate bias. Varying the voltage applied to the gate modulates the conductivity of the channel and thereby controls the current flow between the source and drain.

For an enhancement mode MOSFET, for example, the gate bias creates a so-called "inversion channel" in a channel region of the body 114 under the gate oxide 110. The inversion channel comprises carriers having the same polarity (e.g., "P" polarity (i.e., hole carriers), or "N" polarity (i.e., electron carriers) carriers) as the polarity of the source and drain carriers, and it thereby provides a conduit (i.e., channel) through which current passes between the source and the drain. For example, as shown in the SOI NMOSFET 100 of FIG. 1, when a sufficiently positive voltage is applied between the gate 108 and the source 112 (i.e. a positive gate bias exceeding a threshold voltage $V_{th}$), an inversion channel is formed in the channel region of the body 114. As noted above, the polarity of carriers in the inversion channel is identical to the polarity of carriers in the source and drain. In this example, because the source and drain comprise "n-type" dopant material and therefore have N polarity carriers, the carriers in the channel comprise N polarity carriers. Similarly, because the source and drain comprise "p-type" dopant material in PMOSFETs, the carriers in the channel of turned on (i.e., conducting) PMOSFETs comprise P polarity carriers.

Depletion mode MOSFETs operate similarly to enhancement mode MOSFETs, however, depletion mode MOSFETs are doped so that a conducting channel exists even without a voltage being applied to the gate. When a voltage of appropriate polarity is applied to the gate the channel is depleted. This, in turn, reduces the current flow through the depletion mode device. In essence, the depletion mode device is analogous to a "normally closed" switch, while the enhancement mode device is analogous to a "normally open" switch. Both enhancement and depletion mode MOSFETs have a gate voltage threshold, $V_{th}$, at which the MOSFET changes from an off-state (non-conducting) to an on-state (conducting).

No matter what mode of operation an SOI MOSFET employs (i.e., whether enhancement or depletion mode), when the MOSFET is operated in an off-state (i.e., the gate voltage does not exceed $V_{th}$), and when a sufficient nonzero gate bias voltage is applied with respect to the source and drain, an "accumulated charge" may occur under the gate. The "accumulated charge", as defined in more detail below and used throughout the present application, is similar to the "accumulation charge" described in the prior art literature in reference to MOS capacitors. However, the prior art references describe "accumulation charge" as referring only to bias-induced charge existing under a MOS capacitor oxide, wherein the accumulation charge is of the same polarity as the majority carriers of the semiconductor material under the capacitor oxide. In contrast, and as described below in more detail, "accumulated charge" is used herein to refer to gate-bias induced carriers that may accumulate in the body of an off-state MOSFET, even if the majority carriers in the body do not have the same polarity as the accumulated charge. This situation may occur, for example, in an off-state depletion mode NMOSFET, wherein the accumulated charge may comprise holes (i.e., having P polarity) even though the body doping is N– rather than P–.

For example, as shown in FIG. 1, when the SOI NMOSFET 100 is biased to operate in an off-state, and when a sufficient nonzero voltage is applied to the gate 108, an accumulated charge 120 may accumulate in the body 114 underneath and proximate the gate oxide 110. The operating state of the SOI NMOSFET 100 shown in FIG. 1 is referred to herein as an "accumulated charge regime" of the MOSFET. The accumulated charge regime is defined in more detail below. The causes and effects of the accumulated charge in SOI MOSFETs are now described in more detail.

As is well known, electron-hole pair carriers may be generated in MOSFET bodies as a result of several mechanisms (e.g., thermal, optical, and band-to-band tunneling electron-hole pair generation processes). When electron-hole pair carriers are generated within an NMOSFET body, for example, and when the NMOSFET is biased in an off-state condition, electrons may be separated from their hole counterparts and pulled into both the source and drain. Over a period of time, assuming the NMOSFET continues to be biased in the off-state, the holes (resulting from the separated electron-hole pairs) may accumulate under the gate oxide (i.e., forming an "accumulated charge") underneath and proximate the gate oxide. A similar process (with the behavior of electrons and holes reversed) occurs in similarly biased PMOSFET devices. This phenomenon is now described with reference to the SOI NMOSFET 100 of FIG. 1.

When the SOI NMOSFET 100 is operated with gate, source and drain bias voltages that deplete the channel carriers in the body 114 (i.e., the NMOSFET 100 is in the off-state), holes may accumulate underneath and proximate the gate oxide 110. For example, if the source bias voltage Vs and the drain bias voltage Vd are both zero (e.g., connected to a ground contact, not shown), and the gate bias voltage Vg comprises a sufficiently negative voltage with respect to ground and with respect to $V_{th}$, holes present in the body 114 become attracted to the channel region proximate the gate oxide 110. Over a period of time, unless removed or otherwise controlled, the holes accumulate underneath the gate oxide 110 and result in the accumulated charge 120 shown in FIG. 1. The accumulated charge 120 is therefore shown as positive "+" hole carriers in FIG. 1. In the example given, Vg is negative with respect to Vs and Vd, so electric field regions 122 and 124 may also be present.

MOSFETs using body contacts are known in the art. For example, Burr in U.S. Pat. No. 6,249,027 describes a partially depleted SOI device having a single dedicated single body bias means. Burr shows depletion regions and respective body regions disposed beneath the depletion regions. In each of the body regions, a respective body contact is present and is in electrical communication with the corresponding body region. The body contacts are also connected to bias voltage generators. The body contact is connected to the body of the partially depleted SOI device so that the threshold voltage $V_{TH}$ can be adjusted for variations in process, temperature and circuit activity. Therefore, Burr discloses the use of body contacts to fine tune the threshold voltage, but does not disclose or address operation of a MOSFET in an accumulated charge regime where accumulated charge is present in the body regions of the MOSFET as described below.

Accumulated Charge Regime Defined

The accumulated charge is opposite in polarity to the polarity of carriers in the channel. Because, as described above, the polarity of carriers in the channel is identical to the polarity of carriers in the source and drain, the polarity of the accumulated charge 120 is also opposite to the polarity of carriers in the source and drain. For example, under the operating conditions described above, holes (having "P" polarity) accumulate in off-state NMOSFETs, and electrons (having "N" polarity) accumulate in off-state PMOSFETs. Therefore, a MOSFET device is defined herein as operating within the "accumulated charge regime" when the MOSFET is biased to operate in an off-state, and when carriers having opposite polarity to the channel carriers are present in the channel region. Stated in other terms, a MOSFET is defined as operating within the accumulated charge regime when the MOSFET is biased to operate in an off-state, and when carriers are present in the channel region having a polarity that is opposite the polarity of the source and drain carriers.

For example, and referring again to FIG. 1, the accumulated charge 120 comprises hole carriers having P or "+" polarity. In contrast, the carriers in the source, drain, and channel (i.e., when the FET is in the on-state) comprise electron carriers having N or "−" polarity. The SOI NMOSFET 100 is therefore shown in FIG. 1 as operating in the accumulated charge regime. It is biased to operate in an off-state, and an accumulated charge 120 is present in the channel region. The accumulated charge 120 is opposite in polarity (P) to the polarity of the channel, source and drain carriers (N).

In another example, wherein the SOI NMOSFET 100 comprises a depletion mode device, $V_{th}$ is negative by definition. According to this example, the body 114 comprises an N− region (as contrasted with the P− region shown in FIG. 1). The source and drain comprise N+ regions similar to those shown in the enhancement mode MOSFET 100 of FIG. 1. For Vs and Vd both at zero volts, when a gate bias Vg is applied that is sufficiently negative relative to $V_{th}$ (for example, a Vg that is more negative than approximately −1 V relative to $V_{th}$), the depletion mode NMOSFET is biased into an off-state. If biased in the off-state for a sufficiently long period of time, holes may accumulate under the gate oxide and thereby comprise the accumulated charge 120 shown in FIG. 1.

In other examples, Vs and Vd may comprise nonzero bias voltages. In some embodiments, Vg must be sufficiently negative to both Vs and Vd (in order for Vg to be sufficiently negative to $V_{th}$, for example) in order to bias the NMOSFET in the off-state. Those skilled in the MOSFET device design arts shall recognize that a wide variety of bias voltages may be used to practice the present teachings. As described below in more detail, the present disclosed method and apparatus contemplates use in any SOI MOSFET device biased to operate in the accumulated charge regime.

SOI and SOS MOSFETs are often used in applications in which operation within the accumulated charge regime adversely affects MOSFET performance. As described below in more detail, unless the accumulated charge is removed or otherwise controlled, it detrimentally affects performance of SOI MOSFETs under certain operating conditions. One exemplary application, described below in more detail with reference to the circuits shown in FIGS. 2B and 5A, is the use of SOI MOSFETs in the implementation of radio frequency (RF) switching circuits. As described below with reference to FIGS. 2B and 5A in more detail, the inventors have discovered that unless the accumulated charge is removed or otherwise controlled, under some operating conditions, the accumulated charge adversely affects the linearity of the SOI MOSFET and thereby increases harmonic distortion and intermodulation distortion (IMD) caused by the MOSFET when used in the implementation of certain circuits. In addition, as described below in more detail, the inventors have discovered that removal or control of the accumulated charge improves the drain-to-source breakdown voltage (i.e., the "BVDSS") characteristics of the SOI MOSFETs.

Therefore, it is desirable to provide techniques for adapting and improving SOI (and SOS) MOSFETs, and circuits implemented with the improved SOI MOSFETs, in order to remove or otherwise control the accumulated charge, and thereby significantly improve SOI MOSFET performance. It is desirable to provide methods and apparatus for use in improving the linearity characteristics in SOI MOSFETs. The improved MOSFETs should have improved linearity, harmonic distortion, intermodulation distortion, and BVDSS characteristics as compared with prior art MOSFETs, and thereby improve the performance of circuits implemented with the improved MOSFETs. The present teachings provide such novel methods and apparatus.

SUMMARY

Apparatuses and methods are provided to control accumulated charge in SOI MOSFETs, thereby improving nonlinear responses and harmonic and intermodulaton distortion effects in the operation of the SOI MOSFETs.

In one embodiment, a circuit having at least one SOI MOSFET is configured to operate in an accumulated charge regime. An accumulated charge sink (ACS), operatively coupled to the body of the SOI MOSFET, receives accumulated charge generated in the body, thereby reducing the nonlinearity of the net source-drain capacitance of the SOI MOSFET.

In one embodiment, the ACS comprises a high impedance connection to the MOSFET body, with exemplary impedance greater than $10^6$ ohm.

In one embodiment, an accumulated charge control (ACC) floating body metal-oxide-semiconductor field effect transistor (MOSFET) comprises: a gate; a drain; a source; a body, where the body has a gate modulated conductive channel between the source and the drain; a gate oxide layer positioned between the gate and the body; and an accumulated charge sink (ACS) operatively coupled to the body, wherein the ACS comprises material selected to shift a capacitance versus voltage inflection inside the ACS away from a desired region of operation; where accumulated charge is present in the body of the floating body MOSFET when the MOSFET is biased to operate in an accumulated charge regime, and where the gate modulated conductive channel, source, and drain have carriers of identical polarity when the MOSFET is biased to operate in an on-state and wherein the MOSFET operates in the accumulated charge regime when the MOSFET is biased to operate in a off-state and when the accumulated charge has a polarity that is opposite to the polarity of the source, drain, and gate modulated conductive channel.

In one embodiment, an ACC MOSFET adapted to control charge accumulated in the body of the MOSFET when the MOSFET is biased to operate in an accumulated charge regime, comprises: a) a gate, drain, source, floating body, and a gate oxide layer positioned between the gate and the floating body, where the ACC MOSFET is biased to operate in the accumulated charge regime when the MOSFET is operated in a non-conducting or near non-conducting state and charge accumulates within the body in a region proximate and underneath the gate oxide layer; b) a first accumulated charge sink positioned proximate a first distal end of the floating body, where the first ACS is in electrical communication with the floating body, and wherein, when the MOSFET is operated in the accumulated charge regime, a first ACS bias voltage is applied to the first ACS to control the accumulated charge in the MOSFET body or to remove the accumulated charge from the MOSFET body via the first ACS; c) a second accumulated charge sink positioned proximate a second distal end of the floating body, wherein the second ACS is in electrical communication with the floating body and wherein, when the MOSFET is operated in the accumulated charge regime, a second ACS bias voltage is applied to the second ACS to control the accumulated charge in the MOSFET body or to remove the accumulated charge from the MOSFET body via the second ACS; d) a first electrical contact region positioned proximate to and in electrical communication with the first ACS, wherein the electrical contact region facilitates electrical coupling to the first ACS; and e) a second electrical contact region positioned proximate to and in electrical communication with the second ACS, wherein the electrical contact region facilitates electrical coupling to the second ACS.

In one embodiment, an ACC MOSFET adapted to control charge accumulated in the body of the MOSFET when the MOSFET is biased to operate in an accumulated charge regime, comprises: a) a gate, drain, source, floating body, and a gate oxide layer positioned between the gate and the floating body, where the ACC MOSFET is biased to operate in the accumulated charge regime when the MOSFET is operated in a non-conducting or near non-conducting state and charge accumulates within the body in a region proximate and underneath the gate oxide layer; b) a plurality of accumulated charge sinks positioned proximate portions of the floating body, wherein each accumulated charge sink of the plurality of accumulated charge sinks is electrically coupled to the floating body, and where, when the MOSFET is operated in the accumulated charge regime, ACS bias voltages are applied to each accumulated charge sink to control the accumulated charge in the MOSFET body or to remove the accumulated charge from the MOSFET body via the plurality of accumulated charge sinks; and c) a plurality of electrical contact regions positioned proximate to corresponding accumulated charge sinks, wherein each electrical contact region facilitates electrical coupling to the corresponding accumulated charge sink.

BRIEF DESCRIPTION OF THE DRAWINGS

Like reference numbers and designations in the various drawings indicate like elements.

DETAILED DESCRIPTION

As noted above, those skilled in the electronic device design arts shall appreciate that the teachings herein apply equally to NMOSFETs and PMOSFETs. For simplicity, the embodiments and examples presented herein for illustrative purposes include only NMOSFETs, unless otherwise noted. By making well known changes to dopants, charge carriers, polarity of bias voltages, etc., persons skilled in the arts of electronic devices will easily understand how these embodiments and examples may be adapted for use with PMOSFETs.

Non-Linearity and Harmonic Distortion Effects of Accumulated Charge in an SOI NMOSFET As described above in the background, no matter what mode of operation the MOSFET employs (i.e., enhancement mode or depletion mode), under some circumstances, when a MOSFET is operated in an off-state with a nonzero gate bias voltage applied with respect to the source and drain, an accumulated charge may occur under the gate. According to the present teachings, as described above when the MOSFET is in an off-state, and when carriers are present in the channel region having a polarity that is opposite the polarity of the source and drain carriers, the MOSFET is defined herein as operating in the accumulated charge regime.

According to the present teachings, the inventors have observed that, when used in certain circuit implementations, MOSFETs operating in the accumulated charge regime exhibit undesirable non-linear characteristics that adversely impact circuit performance. For example, as described below in more detail with reference to FIG. 2A, the accumulated charge 120 (FIG. 1) adversely affects the linearity of off-state SOI MOSFETs, and more specifically, it adversely affects the linearity of contributing capacitances to the drain-to-source capacitance (Cds). For an SOI MOSFET operating in an off-state, Cds is referred to as $C_{off}$. The contributing capacitances to $C_{off}$ are described below in reference to FIG. 2A for bias conditions wherein the gate bias Vg is provided by a circuit having an impedance that is large compared to the impedances of the contributing capacitances. As described below with reference to FIGS. 2B and 5A, this, in turn, adversely affects harmonic distortion, intermodulation distortion, and other performance characteristics of circuits implemented with the SOI MOSFETs. These novel observations, not taught or suggested by the prior art, may be understood with reference to the electrical model shown in FIG. 2A.

Figure 1:
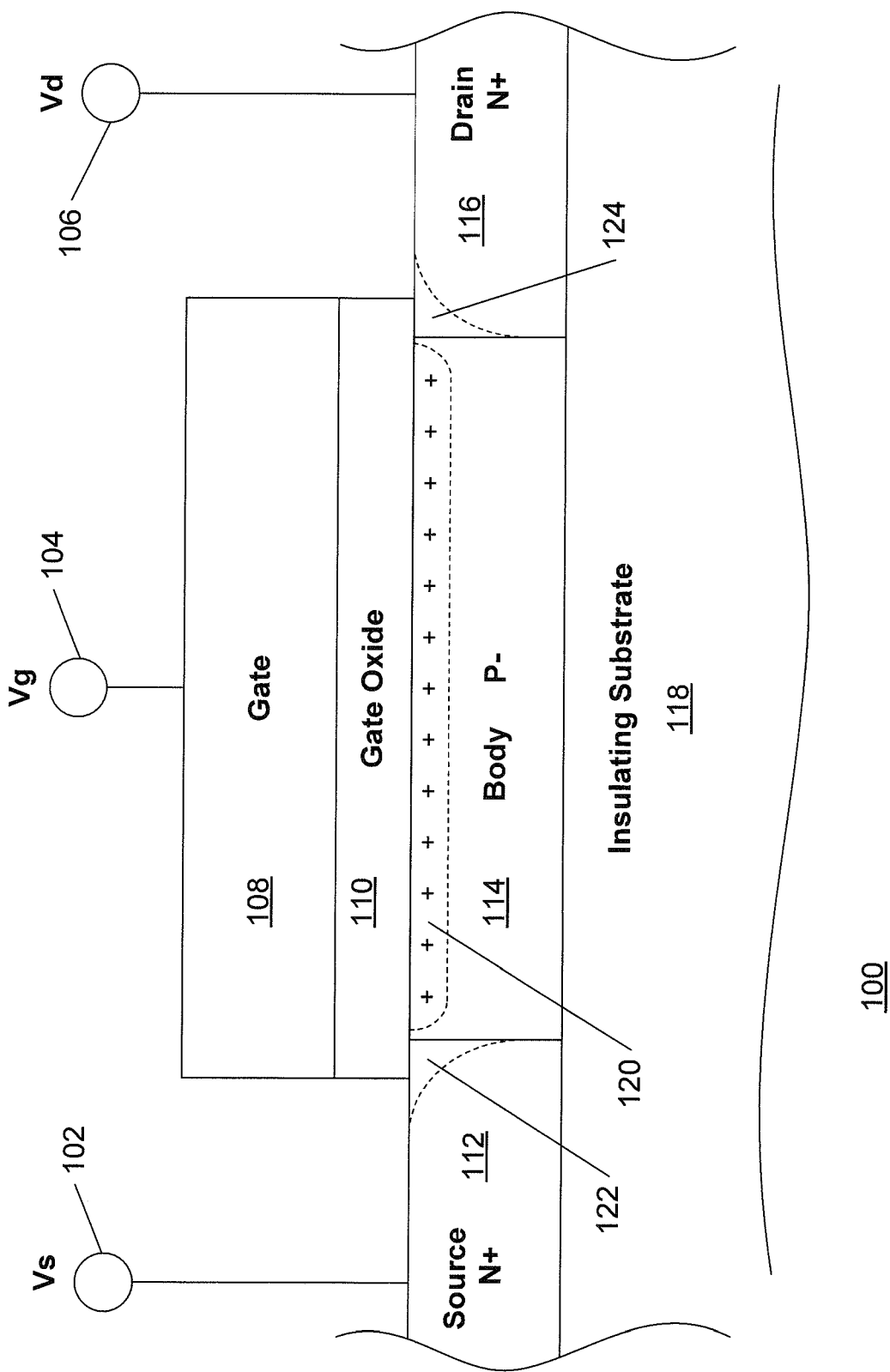
FIG. 1 is a cross-sectional view of an exemplary prior art SOI NMOSFET.
Figure 2A:
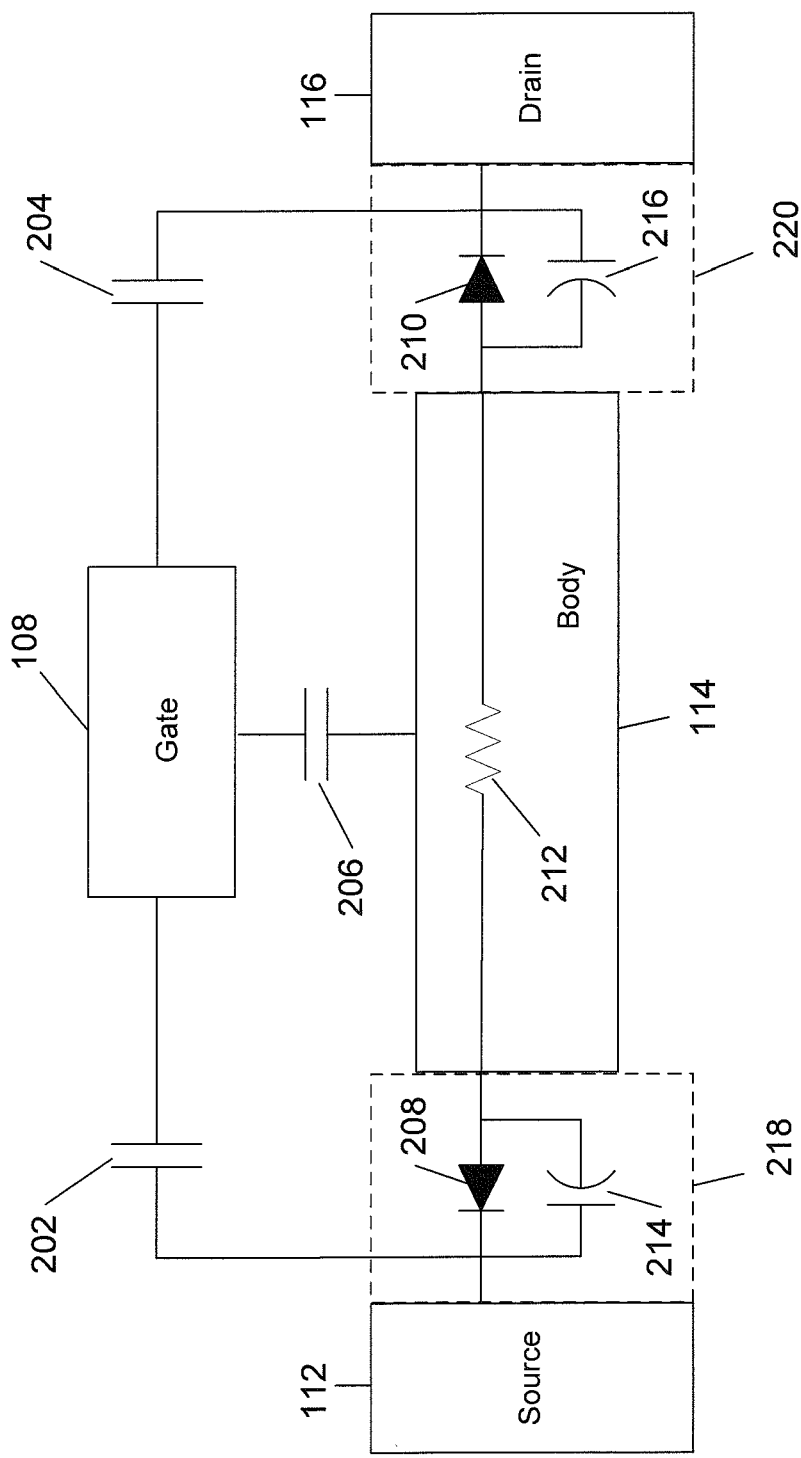
FIG. 2A is a simplified schematic of an electrical model showing the off-state impedance characteristics of the exemplary prior art SOI NMOSFET of FIG. 1.

FIG. 2A is a simplified schematic of an electrical model 200 showing the off-state impedance (or conversely, conductance) characteristics of the exemplary prior art SOI NMOSFET 100 of FIG. 1. More specifically, the model 200 shows the impedance characteristics from the source 112 to the drain 116 when the NMOSFET 100 is operated in the off-state. Because the drain-to-source off-state impedance characteristic of the NMOSFET 100 is primarily capacitive in nature, it is referred to herein as the drain-to-source off-state capacitance ($C_{off}$). For the exemplary description herein, the gate 108 is understood to be biased at a voltage Vg by a circuit (not shown) that has an impedance that is large compared to the impedances of the contributing capacitances described in reference to FIG. 2A. Persons skilled in the electronic arts will understand how this exemplary description may be modified for the case wherein the impedance of the circuit providing the Vg bias is not large compared to the impedances of the contributing capacitances.

As shown in FIG. 2A, the junction between the source 112 and the body 114 (i.e., a source-body junction 218) of the off-state NMOSFET 100 can be represented by a junction diode 208 and a junction capacitor 214, configured as shown. Similarly, the junction between the drain 116 and the body 114 (i.e., the drain-body junction 220) of the off-state NMOSFET 100 can be represented by a junction diode 210 and a junction capacitor 216, configured as shown. The body 114 is represented simply as an impedance 212 that is present between the source-body junction 218 and the drain-body junction 220.

A capacitor 206 represents the capacitance between the gate 108 and the body 114. A capacitor 202 represents the capacitance between the source 112 and the gate 108, and another capacitor 204 represents the capacitance between the drain 116 and the gate 108. A substrate capacitance due to the electrical coupling between the source 112 and the drain 116 (through the insulating substrate 118 shown in FIG. 1) is taken to be negligibly small in the exemplary description set forth below, and therefore is not shown in the electrical model 200 of FIG. 2A.

As described above, when the NMOSFET 100 is in the off-state, and when the accumulated charge 120 (FIG. 1) is not present in the body 114 (i.e., the NMOSFET 100 is not operating within the accumulated charge regime), the body 114 is depleted of charge carriers. In this case the body impedance 212 is analogous to the impedance of an insulator, and the electrical conductance through the body 114 is very small (i.e., the NMOSFET 100 is in the off-state). Consequently, the principal contributions to the drain-to-source off-state capacitance $C_{off}$ are provided by the capacitors 202 and 204. The capacitors 202 and 204 are only slightly voltage dependent, and therefore do not significantly contribute to a nonlinear response that adversely affects harmonic generation and intermodulation distortion characteristics.

However, when the NMOSFET 100 operates within the accumulated charge regime, and the accumulated charge 120 is therefore present in the body 114, mobile holes comprising the accumulated charge produce p-type conductivity between the source-body junction 218 and the drain-body junction 220. In effect, the accumulated charge 120 produces an impedance between the source-body junction 218 and the drain-body junction 220 that is significantly less than the impedance between the junctions in the absence of the accumulated charge. If a Vds voltage is applied between the drain 116 and the source 112, the mobile holes redistribute according to the electrical potentials that result within the body 114. DC and low-frequency current flow through the SOI NMOSFET 100 is prevented by the diode properties of the source-body junction 218 and the drain-body junction 220, as represented by the junction diodes 208 and 210, respectively. That is, because the junction diodes 208 and 210 are anti-series (i.e., "back-to-back") in this case, no DC or low-frequency currents flow through the SOI NMOSFET 100. However, high-frequency currents may flow through the SOI NMOSFET 100 via the capacitances of the source-body junction 218 and the drain-body junction 220, as represented by the junction capacitors 214 and 216, respectively.

The junction capacitors 214 and 216 are voltage dependent because they are associated with junctions between n-type and p-type regions. This voltage dependence results from the voltage dependence of the width of the depletion region of the junction between the n-type and p-type regions. As a bias voltage is applied to the NMOSFET, the width of the depletion region of the junction between the n-type and p-type regions is varied. Because the capacitance of the junction depends on the width of the junction depletion region, the capacitance also varies as a function of the bias applied across the junction (i.e., the capacitance is also voltage dependent).

Further, the capacitors 202 and 204 may also have a voltage dependence caused by the presence of the accumulated charge 120. Although the complex reasons for this voltage dependence are not described in detail herein, persons skilled in the arts of electronic devices shall understand that electric field regions (e.g., electric field regions 122 and 124 described above with reference to FIG. 1) may be affected by the response of the accumulated charge and its response to an applied Vds, thereby causing a voltage dependence of capacitors 202 and 204. An additional non-linear effect may occur due to a direct capacitance (not shown) between the source 112 and the drain 116. Although this direct capacitance would usually be expected to be negligible for most SOI MOSFETs, it may contribute for SOI MOSFETs having very short spacing between the source and drain. The contribution of this direct capacitance to $C_{off}$ is also voltage-dependent in the presence of an accumulated charge, for reasons that are analogous to the voltage dependencies of the capacitors 202 and 204 as described above.

The voltage dependencies of the junction capacitors 214 and 216, the gate-to-source and gate-to-drain capacitors 202, 204, respectively, and the direct capacitance (not shown), cause nonlinear behavior in off-state capacitance $C_{off}$ of the MOSFET when AC voltages are applied to the NMOSFET 100, thereby producing undesirable generation of harmonic distortions and intermodulation distortion (IMD). The relative contributions of these effects are complex, and depend on fabrication processes, biases, signal amplitudes, and other variables. However, those skilled in the electronic device design arts shall understand from the teachings herein that reducing, removing, or otherwise controlling the accumulated charge provides an overall improvement in the nonlinear behavior of $C_{off}$. In addition, because the body impedance 212 is significantly decreased in the presence of the accumulated charge 120, the magnitude of $C_{off}$ may be increased when the FET operates in the accumulated charge regime. Reducing, removing, or otherwise controlling the accumulated charge also mitigates this effect.

In addition, the accumulated charge does not accumulate in the body in an instant as soon as the FET transitions from an on-state (conducting state) to an off-state (non-conducting state). Rather, when the FET transitions from the on-state to the off-state, it begins to accumulate charge in the body of the MOSFET, and the amount of accumulated charge increases over time. The accumulation of the accumulated charge therefore has an associated time constant (i.e., it does not instantly reach a steady-state level of accumulated charge). The accumulated charge accumulates slowly in the FET body. The depleted FET has a $C_{off}$ associated with it which is increased with an increasing amount of accumulated charge. In terms of FET performance, as the $C_{off}$ increases with an increasing amount of accumulated charge in the FET body, drift occurs in the FET insertion loss (i.e., the FET becomes more "lossy"), isolation (the FET becomes less isolating) and insertion phase (delay in the FET is increased). Reducing, removing, or otherwise controlling the accumulated charge also mitigates these undesirable drift effects.

The inventors have observed that the nonlinear behavior of the MOSFET off-state capacitance $C_{off}$ adversely affects the performance of certain circuits implemented with the prior art SOI MOSFETs. For example, when an RF switch is implemented using the prior art SOI MOSFETs, such as the prior art SOI NMOSFET 100 of FIG. 1, the above-described non-linear off-state characteristics of the prior art MOSFETs adversely affect the linearity of the switch. As described below in more detail, RF switch linearity is an important design parameter in many applications. Improved switch linearity leads to improved suppression of harmonic and intermodulation (IM) distortion of signals processed by the switch. These improved switch characteristics can be critically important in some applications such as use in cellular communication devices.

For example, the well known GSM cellular communication system standard imposes stringent linearity, harmonic and intermodulation suppression, and power consumption requirements on front-end components used to implement GSM cell phones. One exemplary GSM standard requires that all harmonics of a fundamental signal be suppressed to below −30 dBm at frequencies up to 12.75 GHz. If harmonics are not suppressed below these levels, reliable cell phone operation can be significantly adversely impacted (e.g., increased dropped calls or other communication problems may result due to harmonic and intermodulation distortion of the transmit and receive signals). Because the RF switching function is generally implemented in the cell phone front-end components, improvements in the RF switch linearity, harmonic and intermodulation suppression, and power consumption performance characteristics is highly desirable. A description of how the non-linear behavior of the off-state capacitance $C_{off}$ of the prior art MOSFETs adversely affects these RF switch characteristics is now described with reference to FIG. 2B.

Figure 2B:
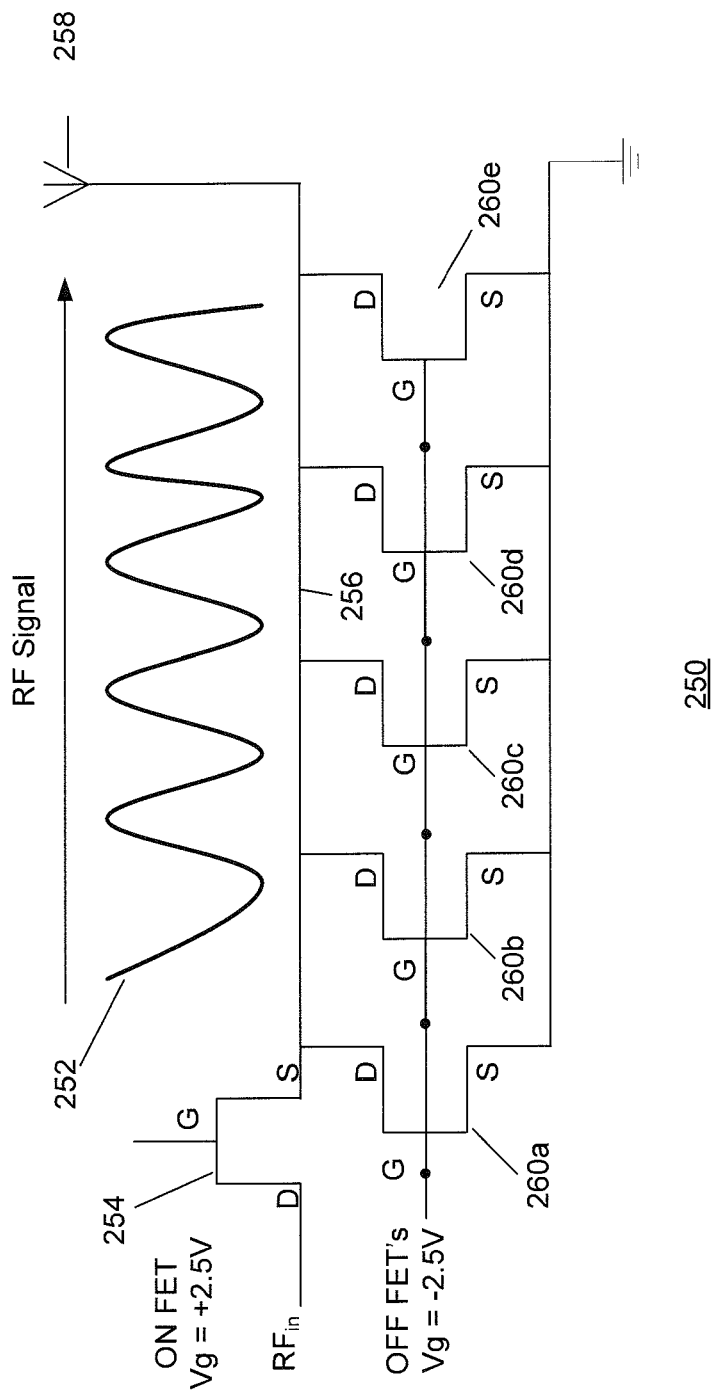
FIG. 2B is a schematic of an exemplary simplified RF switching circuit implemented using prior art SOI MOSFETs such as the prior art SOI NMOSFET of FIG. 1.

Harmonic Distortion Effects on RF Switch Circuits Implemented Using Prior Art SOI MOSFETs FIG. 2B illustrates an exemplary simplified RF switch circuit 250 implemented using prior art MOSFETs such as the prior art SOI NMOSFET 100 described above with reference to FIG. 1. A detailed description of the operation and implementation of RF switch circuits is provided in commonly assigned U.S. Pat. No. 6,804,502 which is hereby incorporated herein by reference in its entirety for its teachings on RF switch circuits. As shown in FIG. 2B, the prior art RF switch 250 includes a single "pass" or "switching" MOSFET 254 operatively coupled to five shunting MOSFETs 260a-260e.

The MOSFET 254 acts as a pass or switching transistor and is configured, when enabled, to selectively couple an RF input signal (applied to its drain, for example) to an RF antenna 258 via a transmission path 256. The shunting MOSFETs, 260a-260e, when enabled, act to alternatively shunt the RF input signal to ground. As is well known, the switching MOSFET 254 is selectively controlled by a first switch control signal (not shown) coupled to its gate, and the shunting MOSFETs, 260a-260e are similarly controlled by a second switch control signal (not shown) coupled to their gates. The switching MOSFET 254 is thereby enabled when the shunting MOSFETs 260a-260e are disabled, and vice versa. As shown in the exemplary embodiment of the RF switch 250 of FIG. 2B, the switching MOSFET 254 is enabled by applying a gate bias voltage of +2.5V (via the first switch control signal). The shunting MOSFETs 260a-260e are disabled by applying a gate bias voltage of −2.5V (via the second switch control signal).

When the switch 250 is configured in this state, the RF signal 252 propagates through the switching MOSFET 254, through the transmission path 256, and to the antenna 258. As described above with reference to FIG. 2A, when the shunting MOSFETS 260a-260e comprise prior art SOI (or SOS) MOSFETs, such as the SOI NMOSFET 100 (FIG. 1), an accumulated charge can occur in the SOI MOSFET bodies (i.e., when the SOI MOSFETs operate in the accumulated charge regime as described above). The accumulated charge can produce nonlinear behavior in the off-state capacitance $C_{off}$ of the SOI MOSFETs when AC voltages are applied to the MOSFETs.

More specifically, when the accumulated charge is present in the channel regions of the off-state SOI MOSFETs 260a-260e it responds to variations in the RF signals applied to their respective drains. As the time varying RF signal propagates along the transmission path 256, the RF signal applies time varying source-to-drain bias voltages to the SOI MOSFETs 260a-260e. The time varying source-to-drain bias voltages creates movement of the accumulated charge within the channel regions of the SOI MOSFETs 260-260e. The movement of the accumulated charge within the channel regions of the SOI MOSFETs causes variations in the drain-to-source off-state capacitance of the SOI MOSFETs 260a-260e. More specifically, the movement of the accumulated charge within the channel regions causes a voltage dependence of the drain-to-source off-state capacitance as described above with reference to FIG. 2A. The voltage dependent variations in the off-state capacitance of the SOI MOSFETs 260a-260e is the dominant cause of harmonic distortion and IMD of the RF signal as it propagates through the RF switch 250.

As noted above, harmonic distortion and IMD of the RF signal is a major disadvantage of the prior art RF switch circuits implemented using the prior art SOI MOSFET devices. For many applications, harmonics and IMD of the RF signal must be suppressed to levels that heretofore have been difficult or impossible to achieve using prior art SOI MOSFET devices. In GSM devices, for example, at a maximum operating power of +35 dBm, prior art switches typically have only a 6 dB margin to the GSM third order harmonics suppression requirement of less than −30 dBm. Very low even order harmonic distortion is also desirable in GSM systems as the second order harmonic of the GSM transmit band also resides in the DCS receive band. Suppression of odd order (e.g., third order) harmonics of the RF signal, however, is desirable and improvements in that regard are needed.

In addition, as is well known, presence of an accumulated charge in the bodies of floating body (e.g., SOI) MOSFETs can also adversely affect the drain-to-source breakdown voltage (BVDSS) performance characteristics of the floating body MOSFETs. As is well known, floating-body FETs demonstrate drain-to-source breakdown voltage problems, also known as BVDSS, wherein the drain-to-source "punch-through" voltage is reduced by a parasitic bipolar action. The parasitic bipolar action is caused when holes are generated in the channel and the holes have nowhere to dissipate (i.e., because the body is floating, the holes have no means for escaping the body). As a consequence, the potential of the MOSFET body is increased, which effectively reduces the threshold voltage. In turn, this condition causes the MOSFET device to experience increased leakage, thereby generating more holes in the body, and thereby exacerbating the BVDSS problem (as a result of this positive feedback condition).

The present disclosed method and apparatus for improving linearity of SOI (and SOS) MOSFET devices overcomes the above-described disadvantages of the prior art. Once the accumulated charge is recognized as a major source of harmonic distortion, IMD and compression/saturation in off-state SOI MOSFET devices, and in circuits (such as RF circuits) implemented with these devices, it becomes clear that reduction, removal, and/or control of the accumulated charge improves the harmonic suppression characteristics of these devices. In addition, reduction, removal, and/or control of the accumulated charge also improve the BVDSS performance characteristics by preventing the parasitic bipolar action from occurring. Improvements in BVDSS lead to consequent improvements in device linearity. Several exemplary structures and techniques for controlling the accumulated charge in SOI MOSFETs are described in detail in the next section.

Method and Apparatus for Improving the Linearity of MOSFETs Using Accumulated Charge Sinks (ACS)—Overview As described below in more detail, the present disclosure describes methods and apparatuses for improving semiconductor device linearity (e.g., reducing adverse harmonic distortion and IMD effects) in SOI MOSFETs. In one exemplary embodiment, the method and apparatus improves the linearity and controls the harmonic distortion and IMD effects of the MOSFET devices by reducing the accumulated charge in the bodies of the MOSFET devices. In one embodiment, the present method and apparatus reduces or otherwise controls the accumulated charge in the MOSFET bodies using an accumulated charge sink (ACS) that is operatively coupled to the MOSFET body. In one embodiment, the present method and apparatus entirely removes all of the accumulated charge from the bodies of the MOSFET devices. In one described embodiment, the MOSFET is biased to operate in an accumulated charge regime, and the ACS is used to entirely remove, reduce, or otherwise control, the accumulated charge and thereby reduce harmonic distortions and IMD that would otherwise result. Linearity is also improved in some embodiments by removing or otherwise controlling the accumulated charge thereby improving the floating body MOSFET BVDSS characteristics.

As noted in the background section above, persons skilled in the electronic device design and manufacture arts shall appreciate that the teachings herein apply equally to MOSFETs fabricated on Semiconductor-On-Insulator ("SOI") and Semiconductor-On-Sapphire ("SOS") substrates. The present teachings can be used in the implementation of MOSFETs using any convenient semiconductor-on-insulator technology. For example, the inventive MOSFETs described herein can be implemented using compound semiconductors fabricated on insulating substrates, such as GaAs MOSFETs. As noted above, the present method and apparatus may also be applied to silicon-germanium (SiGe) SOI MOSFETs. For simplicity, the embodiments and examples presented herein for illustrative purposes include only NMOSFETs, unless otherwise noted. By making well known changes to dopants, charge carriers, polarity of bias voltages, etc., persons skilled in the electronic device design arts will easily understand how these embodiments and examples may be adapted for use with PMOSFETs.

As noted above, the present disclosure is particularly applicable to FETs and associated applications benefiting from a fully depleted channel when the FET is operated in the off-state, wherein an accumulated charge may result. The disclosed method and apparatus for use in improving the linearity of MOSFETs also finds applicability for use with partially depleted channels. As known to those skilled in the art, the doping and dimensions of the body vary widely. In an exemplary embodiment, the body comprises silicon having a thickness of approximately 100 angstroms to approximately 2,000 angstroms. In a further exemplary embodiment, dopant concentration within the FET bodies ranges from no more than that associated with intrinsic silicon to approximately $1 \times 10^{18}$ active dopant atoms per $cm^3$, resulting in fully-depleted transistor operation. In a further exemplary embodiment, dopant concentration within the FET bodies ranges from $1 \times 10^{18}$ to $1 \times 10^{19}$ active dopant atoms per $cm^3$ and/or the silicon comprising the body ranges from a thickness of 2000 angstroms to many micrometers, resulting in partially-depleted transistor operation. As will be appreciated by those skilled in the electronic design and manufacturing arts, the present disclosed method and apparatus for use in improving linearity of MOSFETs can be used in MOSFETs implemented in a wide variety of dopant concentrations and body dimensions. The present disclosed method and apparatus therefore is not limited for use in MOSFETs implemented using the exemplary dopant concentrations and body dimensions as set forth above.

According to one aspect of the present disclosure, accumulated charge within a FET body is reduced using control methodologies and associated circuitry. In one embodiment all of the accumulated charge is removed from the FET body. In other embodiments, the accumulated charge is reduced or otherwise controlled. In one embodiment, holes are removed from the FET body, whereas in another embodiment, electrons are removed from the FET body, as described below in more detail. By removing holes (or electrons) from the FET body using the novel and nonobvious teachings of the present disclosure, voltage induced variations in the parasitic capacitances of the off-state FETs are reduced or eliminated, thereby reducing or eliminating nonlinear behavior of the off-state FETs. In addition, as described above with reference to FIG. 2A, because the body impedance is greatly increased when the accumulated charge is reduced or controlled, there is a beneficial overall reduction in the magnitude of the FET off-state capacitances. Also, as described above, removing or otherwise controlling the accumulated charge in floating body MOSFETs improves the BVDSS characteristics of the FET and thereby improves the linearity of the floating body MOSFET.

Accumulated charge control not only facilitates a beneficial overall reduction in the FET off-state capacitance $C_{off}$ (as described above with reference to FIG. 2A and below with reference to FIG. 4H), it also facilitates a reduction in $C_{off}$ variations that can occur over time in the presence of a time varying $V_{ds}$ bias voltage. Thus, a reduction of undesirable harmonics generation and intermodulation distortion in RF switch circuits is obtained using SOI MOSFETs made in accordance with the present disclosure. Improved SOI MOSFET power handling, linearity, and performance are achieved by devices made in accordance with the present teachings. While the methods and apparatuses of the present disclosure are capable of fully removing accumulated charge from the FET bodies, those skilled in the electronic device design arts shall appreciate that any reduction of accumulated charge is beneficial.

Reductions in harmonics and intermodulation distortion are generally beneficial in any semiconductor system, either bulk semiconductor or semiconductor-on-insulator (SOI) systems. SOI systems include any semiconductor architecture employing semiconductor-containing regions positioned above an underlying insulating substrate. While any suitable insulating substrate can be used in a SOI system, exemplary insulating substrates include silicon dioxide (e.g., a buried oxide layer supported by a silicon substrate, such as that known as Separation by Implantation of Oxygen (SIMOX)), bonded wafer (thick oxide), glass, and sapphire. As noted above, in addition to the commonly used silicon-based systems, some embodiments of the present disclosure may be implemented using silicon-germanium (SiGe), wherein the SiGe is used equivalently in place of Si.

A wide variety of ACS implementations and structures can be used to practice the present disclosed method and apparatus. In accordance with one embodiment of the present method and apparatus, an ACS is used to remove or otherwise control accumulated charge (referenced as 120 in FIG. 1 described above) from the MOSFETs when the MOSFETs are configured to operate in the accumulated charge regime. By adapting the SOI (or SOS) MOSFETs in accordance with the present teachings, improved Accumulated Charge Control (ACC) MOSFETs are realized. The ACC MOSFETs are useful in improving performance of many circuits, including RF switching circuits. Various characteristics and possible configurations of the exemplary ACC MOSFETs are described in detail below with reference to FIGS. 3A-3K. This section also describes how the exemplary ACS implementations of the present disclosure differ from the body contacts of the prior art.

Figure 4A:
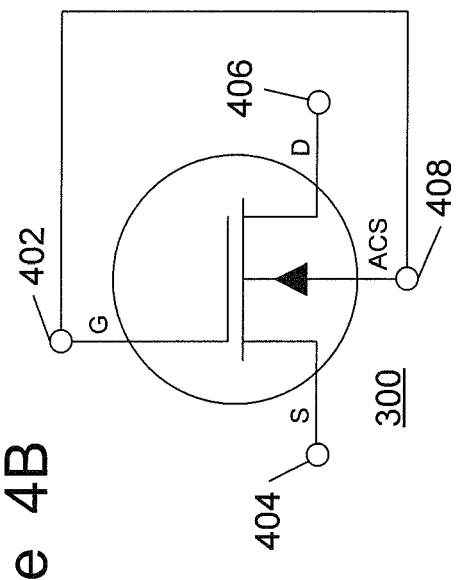
FIG. 4A is a simplified schematic of an improved SOI NMOSFET adapted to control accumulated charge embodied as a four terminal device.

The ACC MOSFET is shown schematically embodied as a four-terminal device in FIG. 4A. FIGS. 4B-4G show various exemplary simple circuit configurations that can be used in removing the accumulated charge from the ACC MOSFET when it operates in an accumulated charge regime. The operation of the simplified circuit configurations is described in more detail below with reference to FIGS. 4A-4G. The improvement in off-state capacitance $C_{off}$ of the ACC MOSFETs, as compared with the off-state capacitance of the prior art SOI MOSFETs, is described below with reference to FIG. 4H.

The operation of various exemplary RF switch circuits implemented using the ACC MOSFETs of the present disclosure is described below with reference to the circuit schematics of FIGS. 5B-5D. Further, an exemplary RF switch circuit using stacked ACC MOSFETs (for increased power handling) of the present disclosure is described below with reference to FIG. 6. An exemplary method of improving the linearity of an SOI MOSFET using an accumulated charge sink (ACS) is described with reference to FIG. 7. Finally, exemplary fabrication methods that may be used to manufacture the ACC MOSFET are described. The various exemplary ACS implementations and structures that can be used to practice the disclosed method and apparatus are now described with reference to FIGS. 3A-3K.

Controlling Accumulated Charge Using an
Accumulated Charge Sink (ACS)

Figure 3B:
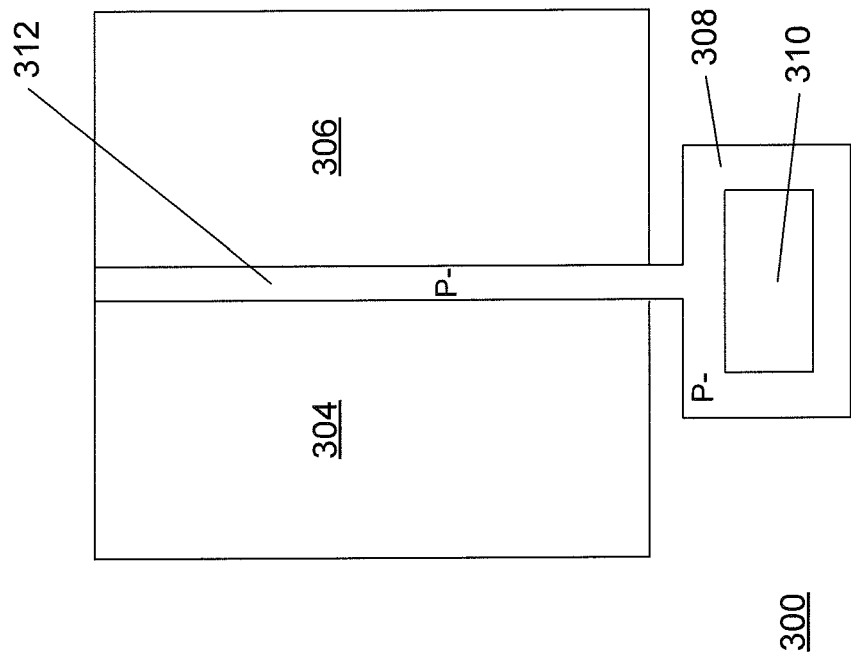
FIGS. 3A and 3B are simplified schematic diagrams of a top view of an improved SOI NMOSFET adapted to control accumulated charge in accordance with the present teachings.
Figure 3A:
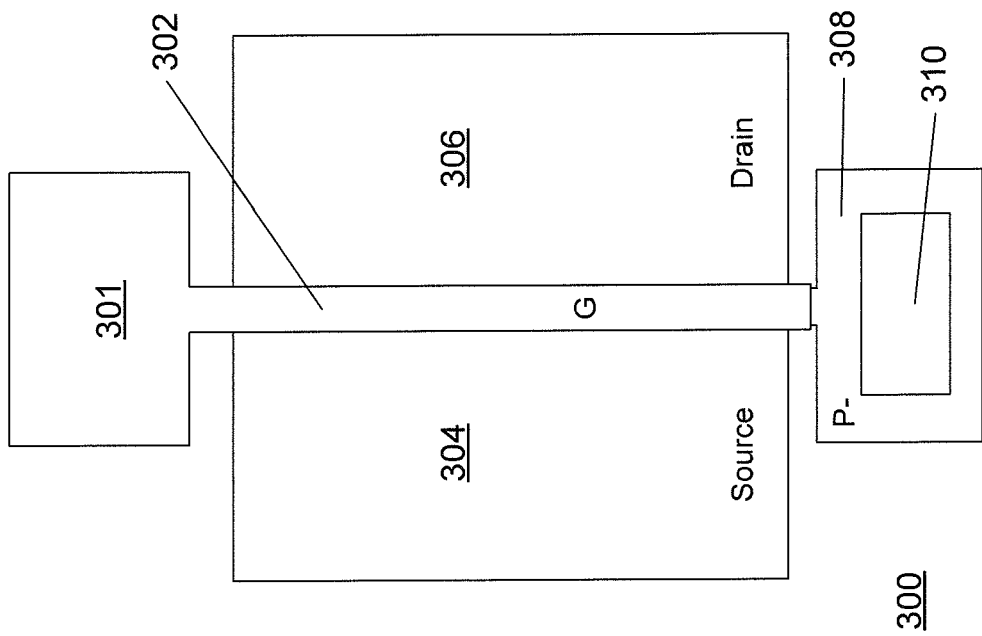

FIGS. 3A and 3B are simplified schematic diagrams of a top view of an Accumulated Charge Control (ACC) SOI NMOSFET 300 adapted to control accumulated charge 120 (FIG. 1) in accordance with the present disclosure. In the exemplary embodiment, a gate contact 301 is coupled to a first end of a gate 302. A gate oxide (not shown in FIG. 3A but shown in FIG. 1) and a body 312 (shown in FIG. 3B) are positioned under the gate 302. In the exemplary NMOSFET 300 shown, a source 304 and a drain 306 comprise N+ regions. In the exemplary embodiment, the ACC NMOSFET 300 includes an accumulated charge sink (ACS) 308 comprising a P– region. The ACS 308 is coupled to and is in electrical communication with the body 312 which also comprises a P– region. An electrical contact region 310 provides electrical connection to the ACS 308. In some embodiments, the electrical contact region 310 comprises a P+ region. As shown in FIG. 3A, the electrical contact region 310 is coupled to and is in electrical communication with the ACS 308.

Those skilled in the arts of electronic devices shall understand that the electrical contact region 310 may be used to facilitate electrical coupling to the ACS 308 because in some embodiments it may be difficult to make a direct contact to a lightly doped region. In addition, in some embodiments the ACS 308 and the electrical contact region 310 may be coextensive. In another embodiment, the electrical contact region 310 comprises an N+ region. In this embodiment, the electrical contact region 310 functions as a diode connection to the ACS 308, which prevents positive current flow into the ACS 308 (and also prevents positive current flow into the body 312) under particular bias conditions, as described below in more detail.

FIG. 3B is an alternative top view of the ACC SOI NMOSFET 300 of FIG. 3A, illustrating the ACC NMOSFET 300 without its gate contact 301, gate 302, and gate oxide being visible. This view allows the body 312 to be visible. FIG. 3B shows the coupling of the ACS 308 to one end of the body 312. In one embodiment, the body 312 and the ACS 308 comprise a combined P– region that may be produced by a single ion-implantation step. In another embodiment, the body 312 and ACS 308 comprise separate P– regions that are coupled together.

As is well known to those skilled in the electronic device design arts, in other embodiments, the ACC NMOSFET 300 of FIGS. 3A and 3B can be implemented as an ACC PMOSFET simply by reversing the dopant materials used to implement the various FET component regions (i.e., replace p-type dopant material with n-type dopant material, and vice versa). More specifically, in an ACC PMOSFET, the source and drain comprise P+ regions, and the body comprises an N– region. In this embodiment, the ACS 308 also comprises an N– region. In some embodiments of the ACC PMOSFET, the electrical contact region 310 may comprise an N+ region. In other embodiments of the ACC PMOSFETs, the region 310 comprises a P+ region, which functions as a diode connection to the ACS 308 and thereby prevents current flow into the ACS 308 under particular bias conditions.

Prior Art Body Contacts Distinguished from the
Disclosed ACS

According to the present disclosure, the ACS 308 used to implement ACC SOI MOSFETs includes novel features in structure, function, operation and design that distinguish it from the so-called "body contacts" (also sometimes referred to as "body ties", usually when the "body contact" is directly connected to the source) that are well known in the prior art.

Exemplary references relating to body contacts used in prior art SOI MOSFETs include the following: (1) F. Hameau and O. Rozeau, Radio-Frequency Circuits Integration Using CMOS SOI 0.25 μm Technology," 2002 RF IC Design Workshop Europe, 19-22 Mar. 2002, Grenoble, France; (2) J. R. Cricci et al., "Silicon on Sapphire MOS Transistor," U.S. Pat. No. 4,053,916, Oct. 11, 1977; (3) O. Rozeau et al., "SOI Technologies Overview for Low-Power Low-Voltage Radio-Frequency Applications," Analog Integrated Circuits and Signal Processing, 25, pp. 93-114, Boston, Mass., Kluwer Academic Publishers, November 2000; (4) C. Tinella et al., "A High-Performance CMOS-SOI Antenna Switch for the 2.5-5-GHz Band, "IEEE Journal of Solid-State Circuits, Vol. 38, No. 7, July, 2003; (5) H. Lee et al., "Analysis of body bias effect with PD-SOI for analog and RF applications," Solid State Electron., Vol. 46, pp. 1169-1176, 2002; (6) J.-H. Lee, et al., "Effect of Body Structure on Analog Performance of SOI NMOSFETs," Proceedings, 1998 IEEE International SOI Conference, 5-8 Oct. 1998, pp. 61-62; (7) C. F. Edwards, et al., The Effect of Body Contact Series Resistance on SOI CMOS Amplifier Stages," IEEE Transactions on Electron Devices, Vol. 44, No. 12, December 1997 pp. 2290-2294; (8) S. Maeda, et al., Substrate-bias Effect and Source-drain Breakdown Characteristics in Body-tied Short-channel SOI MOSFET's," IEEE Transactions on Electron Devices, Vol. 46, No. 1, January 1999 pp. 151-158; (9) F. Assaderaghi, et al., "Dynamic Threshold-voltage MOSFET (DTMOS) for Ultra-low Voltage VLSI," IEEE Transactions on Electron Devices, Vol. 44, No. 3, March 1997, pp. 414-422; (10) G. O. Workman and J. G. Fossum, "A Comparative Analysis of the Dynamic Behavior of BTG/SOI MOSFETs and Circuits with Distributed Body Resistance," IEEE Transactions on Electron Devices, Vol. 45, No. 10, October 1998 pp. 2138-2145; and

(11) T.-S. Chao, et al., "High-voltage and High-temperature Applications of DTMOS with Reverse Schottky Barrier on Substrate Contacts," IEEE Electron Device Letters, Vol. 25, No. 2, February 2004, pp. 86-88.

As described herein, applications such as RF switch circuits, may use SOI MOSFETs operated with off-state bias voltages, for which accumulated charge may result. The SOI MOSFETs are defined herein as operating within the accumulated charge regime when the MOSFETs are biased in the off-state, and when carriers having opposite polarity to the channel carriers are present in the channel regions of the MOSFETs. In some embodiments, the SOI MOSFETs may operate within the accumulated charge regime when the MOSFETs are partially depleted yet still biased to operate in the off-state. Significant benefits in improving nonlinear effects on source-drain capacitance can be realized by removing or otherwise controlling the accumulated charge according to the present teachings. In contrast to the disclosed techniques, none of the cited prior art teach or suggest ACS methods and apparatuses that are uniquely useful for removing or controlling accumulated charge. Nor are they informed regarding problems caused by the accumulated charge such as nonlinear effects on the off-state source-drain capacitance $C_{off}$. Consequently, the prior art body contacts described in the references cited above differ greatly (in structure, function, operation and design) from the ACSs described with reference to FIGS. 3A-4D.

In one example, the ACS 308 operates effectively to remove or otherwise control the accumulated charge from the SOI NMOSFET 300 using a high impedance connection to and throughout the body 312. High impedance ACSs may be used because the accumulated charge 120 is primarily generated by phenomena (e.g., thermal generation) that take a relatively long period of time to produce significant accumulated charge. For example, a typical time period for producing non-negligible accumulated charge when the NMOSFET operates in the accumulated charge regime is approximately a few milliseconds or greater. Such relatively slow generation of accumulated charge corresponds to very low currents, typically less than 100 nA/mm of transistor width. Such low currents can be effectively conveyed even using very high impedance connections to the body. According to one example, the ACS 308 is implemented with a connection having a resistance of greater than $10^6$ ohms. Consequently, the ACS 308 is capable of effectively removing or otherwise controlling the accumulated charge 120 even when implemented with a relatively high impedance connection, relative to the low impedance prior art body contacts.

In stark contrast, the prior art teachings of body contacts described in the references cited above require low impedance (high efficiency) access to the body regions of SOI MOSFETs for proper operation (see, e.g., references (3), (6), and (7) above). A principal reason for this requirement is that the prior art body contacts are primarily directed to reducing the adverse effects on SOI MOSFET functions caused by much faster and more effective electron-hole pair generation processes than occur when the FET is operated in the accumulated charge regime. For example, in some prior art MOSFETs not operated in the accumulated charge regime, electron-hole pair carriers are generated as a result of impact ionization. Impact ionization produces electron-hole pairs at a much faster rate than occurs when the FET is operated in the accumulated charge regime.

The relative rates for electron-hole pair generation by impact ionization versus the pair generation processes causing accumulated charge can be estimated from the roll-off frequencies for the two phenomena. For example, reference (3) cited above indicates roll-off frequencies for impact ionization effects in the range of $10^5$ Hz. In contrast, a roll-off frequency for the accumulated charge effects has been observed to be in the range of $10^3$ Hz or less, as indicated by recovery times for odd harmonics. These observations indicate that the ACS 308 can effectively control accumulated charge using an impedance that is at least 100 times larger than required of prior art body contacts used in controlling impact ionization charge, for example. Further, because impact ionization primarily occurs when the SOI MOSFET operates in an on-state, the effects of impact ionization can be amplified by on-state transistor operation. Low impedance body contacts to and throughout a body region is even more critical in these environments in order to control the effects of impact ionization under the on-state conditions.

In stark contrast, the ACS 308 of the present teachings removes or otherwise controls the accumulated charge only when the ACC SOI MOSFET operates in the accumulated charge regime. By definition, the FET is in the off-state in this regime, so there is no requirement to remove impact ionization as amplified by an on-state FET. Therefore, a high impedance ACS 308 is perfectly adequate for removing the accumulated charge under these operating conditions. The prior art requirements for low impedance body connections results in numerous problems of implementation that are overcome by the present teachings, as described below in more detail.

In addition, the ACS 308 may be implemented with much lower source-to-drain parasitic capacitance as compared to the body contacts of the prior art. The above-described low impedance connection to the SOI MOSFET body required of the prior art body contacts necessitates proximity of the contacts to the entire body. This may require a plurality body contact "fingers" that contact the body at different locations along the body. The low impedance connection to the body also necessitates proximity of the prior art body contacts to the source and drain. Because of parasitic capacitances produced by such body contacts, the cited prior art references teach away from the use of such structures for many high frequency applications such as RF. In stark contrast, the ACS 308 of the present disclosure may be positioned a selected distance away from the source 304 and the drain 306, and the ACS 308 may also be coupled to the body 312 at a first distal end of the body 312 (shown in FIGS. 3A and 3B). Arranged in this manner, the ACS 308 makes minimal contact (as compared to the prior art body contacts that may contact the body at many locations along the body) with the body 312. This configuration of the ACS 308 with the MOSFET eliminates or greatly reduces the parasitic capacitances caused by a more proximate positioning of the ACS 308 relative to the source, drain, and body. Further, the ACS 308 may be implemented in SOI MOSFETs operated with a depleted channel. In general, the cited prior art references teach away from the use of body contacts for this environment (see, e.g., reference (3), cited above).

Further, because impact ionization hole currents are much larger (in the range of 5,000 nA per mm body width) than for accumulated charge generation (less than approximately 100 nA per mm body width), the prior art does not teach how to effectively implement very large body widths (i.e., much greater than approximately 10 µm). In contrast, the ACS 308 of the present disclosed device may be implemented in SOI MOSFETs having relatively large body widths. This provides improvements in on-state conductance and transconductance, insertion loss and fabrication costs, particularly for RF switch devices. According to the prior art teachings cited above, larger body widths adversely affect the efficient operation of body contacts because their impedances are necessarily thereby increased. Although the cited prior art suggests that a plurality of fingers may be used to contact the body at different locations, the plurality of fingers adversely affects parasitic source-to-drain capacitances, as described above.

For these reasons, and for the reasons described below in more detail, the present disclosure provides novel MOSFET devices, circuits and methods that overcome the limitations according to the prior art teachings as cited above.

Figure 3D:
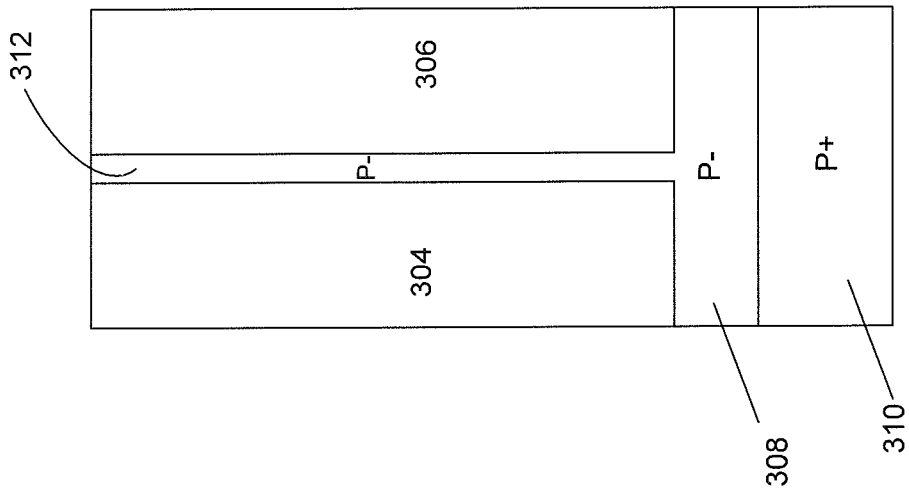
FIG. 3D is a simplified top view schematic of an improved SOI NMOSFET adapted to control accumulated charge having an accumulated charge sink (ACS) electrically coupled to a P+ region.
Figure 3C:
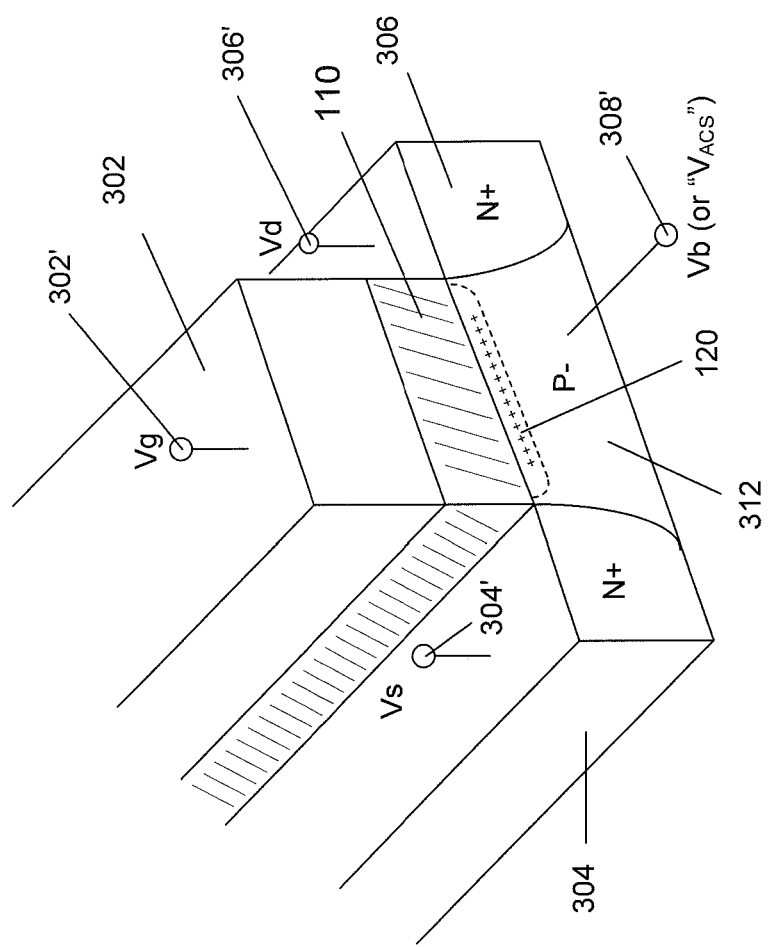
FIG. 3C is a cross-sectional perspective schematic of an improved SOI NMOSFET adapted to control accumulated charge showing gate, source, drain and accumulated charge sink (ACS) terminals.

FIG. 3C is a cross-sectional perspective schematic of an ACC SOI NMOSFET 300' adapted to control accumulated charge in accordance with the disclosed method and apparatus. In the example shown in FIG. 3C, the ACC NMOSFET 300' includes four terminals that provide electrical connection to the various FET component regions. In one embodiment, the terminals provide means for connecting external integrated circuit (IC) elements (such as metal leads, not shown) to the various FET component regions. Three of the terminals shown in FIG. 3C are typically available in prior art FET devices. For example, as shown in FIG. 3C, the ACC NMOSFET 300' includes a gate terminal 302' that provides electrical connection to the gate 302. Similarly, the ACC NMOSFET 300' includes source and drain terminals 304', 306' that provide electrical connection to the source 304 and drain 306, respectively. As is well known in the electronic design arts, the terminals are coupled to their respective FET component regions (i.e., gate, drain and source) via so-called "ohmic" (i.e., low resistance) contact regions. The manufacturing and structural details associated with the coupling of the various FET terminals to the FET component regions are well known in the art, and therefore are not described in more detail here.

As described above with reference to FIGS. 3A and 3B, the ACC NMOSFET 300' is adapted to control accumulated charge when the NMOSFET operates in the accumulated charge regime. To this end, in the exemplary embodiment shown in FIG. 3C, the ACC NMOSFET 300' includes a fourth terminal that provides electrical connection to the body 312, and thereby facilitates reduction (or other control) of the accumulated charge when the FET 300' operates in the accumulated charge regime. More specifically, and referring again to FIG. 3C, the ACC NMOSFET includes a "body" terminal, or Accumulated Charge Sink (ACS) terminal 308'. The ACS terminal 308' provides an electrical connection to the ACS 308 (not shown in FIG. 3C, but shown in FIGS. 3A and 3B) and to the body 312. Although the ACS terminal 308' is shown in FIG. 3C as being physically coupled to the body 312, those skilled in the electronic design arts shall understand that this depiction is for illustrative purposes only. The direct coupling of the ACS terminal 308' to the body 312 shown in FIG. 3C illustrates the electrical connectivity (i.e., not the physical coupling) of the terminal 308' with the body 312. Similarly, the other terminals (i.e., terminals 302', 304' and 306') are also shown in FIG. 3C as being physically coupled to their respective FET component regions. These depictions are also for illustrative purposes only.

In most embodiments, as described above with reference to FIGS. 3A-3B, and described further below with reference to FIGS. 3D-3K, the ACS terminal 308' provides the electrical connection to the body 312 via coupling to the ACS 308 via the electrical contact region 310. However, the present disclosure also contemplates embodiments where the coupling of the ACS terminal 308' is made directly to the body 312 (i.e., no intermediate regions exist between the ACS terminal 308' and the body 312).

In accordance with the disclosed method and apparatus, when the ACC NMOSFET 300' is biased to operate in the accumulated charge regime (i.e., when the ACC NMOSFET 300' is in the off-state, and there is an accumulated charge 120 of P polarity (i.e., holes) present in the channel region of the body 312), the accumulated charge is removed or otherwise controlled via the ACS terminal 308'. When accumulated charge 120 is present in the body 312, the charge 312 can be removed or otherwise controlled by applying a bias voltage ($V_b$ (for "body") or $V_{ACS}$ (ACS bias voltage)) to the ACS terminal 308'. In general, the ACS bias voltage $V_{ACS}$ applied to the ACS terminal 308' may be selected to be equal to or more negative than the lesser of the source bias voltage Vs and drain bias voltage Vd. More specifically, in some embodiments, the ACS terminal 308' can be coupled to various accumulated charge sinking mechanisms that remove (or "sink") the accumulated charge when the FET operates in the accumulated charge regime. Several exemplary accumulated charge sinking mechanisms and circuit configurations are described below with reference to FIGS. 4A-5D.

Similar to the prior art NMOSFET 100 described above with reference to FIG. 1, the ACC SOI NMOSFET 300' of FIG. 3C can be biased to operate in the accumulated charge regime by applying specific bias voltages to the various terminals 302', 304', and 306'. In one exemplary embodiment, the source and drain bias voltages (Vs and Vd, respectively) are zero (i.e., the terminals 304' and 306' are connected to ground). In this example, if the gate bias voltage (Vg) applied to the gate terminal 302' is sufficiently negative with respect to the source and drain bias voltages, and with respect to $V_{th}$ (for example, if $V_{th}$ is approximately zero, and if Vg is more negative than approximately −1 V), the ACC NMOSFET 300' operates in the off-state. If the ACC NMOSFET 300' continues to be biased in the off-state, the accumulated charge (holes) will accumulate in the body 312. Advantageously, the accumulated charge can be removed from the body 312 via the ACS terminal 308'. In some embodiments, as described below in more detail with reference to FIG. 4B, the ACS terminal 308' is coupled to the gate terminal 302' (thereby ensuring that the same bias voltages are applied to both the gate (Vg) and the body (shown in FIG. 3C as "Vb" or "$V_{ACS}$").

However, those skilled in the electronics design arts shall appreciate that a myriad of bias voltages can be applied to the four device terminals while still employing the techniques of the present disclosed method and apparatus. As long as the ACC SOI NMOSFET 300' is biased to operate in the accumulated charge regime, the accumulated charge can be removed or otherwise controlled by applying a bias voltage $V_{ACS}$ to the ACS terminal 308', and thereby remove the accumulated charge from the body 312.

For example, in one embodiment wherein the ACC NMOSFET 300' comprises a depletion mode device, $V_{th}$ is negative by definition. In this embodiment if both the Vs and Vd bias voltages comprise zero volts (i.e., both terminals tied to circuit ground node), and a gate bias Vg applied to the gate terminal 302' is sufficiently negative to $V_{th}$ (for example, Vg is more negative than approximately −1 V relative to $V_{th}$), holes may accumulate under the gate oxide 110 thereby becoming the accumulated charge 120. In this example, in order to remove the accumulated holes (i.e., the accumulated charge 120) from the FET body 312, the voltage $V_{ACS}$ applied to the ACS 308 may be selected to be equal to or more negative than the lesser of Vs and Vd.

In other examples, the source and drain bias voltages, Vs and Vd, respectively, may comprise voltage other than zero volts. According to these embodiments, the gate bias voltage Vg must be sufficiently negative to both Vs and Vd (in order for Vg to be sufficiently negative to $V_{th}$, for example) in order to bias the NMOSFET in the off-state. As described above, if the NMOSFET is biased in the off-state for a sufficiently long time period (approximately 1-2 ms, for example) an accumulated charge will accumulate under the gate oxide. In these embodiments, as noted above, in order to remove the accumulated charge 120 from the body 312, the ACS bias voltage $V_{ACS}$ applied to the ACS terminal 308' may be selected to be equal to or more negative than the lesser of Vs and Vd.

It should be noted that, in contrast to the examples described above, the prior art body contacts are implemented largely for purposes of mitigating the adverse effects caused by impact ionization. Consequently, the prior art body contacts are typically tied to the source of the MOSFET. In order to effectively control, reduce, or entirely remove the accumulated charge in an NMOSFET, $V_{ACS}$ should, in the exemplary embodiments, be equal to or more negative than the lesser of Vs and Vd. Those skilled in the electronic device design arts shall appreciate that different Vs, Vd, Vg and $V_{ACS}$ bias voltages may be used when the ACC MOSFET comprises a PMOSFET device. Because the prior art body contacts are typically tied to the source, this implementation cannot be effected using the prior art body contact approach.

FIG. 3D is a simplified schematic diagram of a top view of an ACC SOI NMOSFET 300" adapted to control accumulated charge 120 (FIG. 1) in accordance with the present disclosure. FIG. 3D shows the ACC NMOSFET 300" without its gate contact 301, gate 302, and gate oxide being visible. The ACC NMOSFET 300" of FIG. 3D is very similar in design to the ACC NMOSFET 300 described above with reference to FIGS. 3A and 3B. For example, similar to the ACC NMOSFET 300, the ACC NMOSFET 300" includes a source 304 and drain 306 comprising N+ regions. The ACC NMOSFET 300" also includes an accumulated charge sink (ACS) 308 comprising a P− region. As shown in FIG. 3D, the P− region that comprises the ACS 308 abuts (i.e., is directly adjacent) the body 312, which also comprises a P− region. Similar to the ACC NMOSFET 300, the ACC NMOSFET 300" includes an electrical contact region 310 that provides electrical connection to the ACS 308. As noted above, in some embodiments, the electrical contact region 310 comprises a P+ region. In another embodiment, the electrical contact region 310 may comprise an N+ region (which thereby prevents positive current flow into the body 312 as noted above). As shown in FIG. 3D, the electrical contact region 310 is formed in the ACC NMOSFET 300" directly adjacent the ACS 308. The ACC SOI NMOSFET 300" functions to control accumulated charge similarly to the operation of the ACC NMOSFETs described above with reference to FIGS. 3A-3C.

Figure 3E:
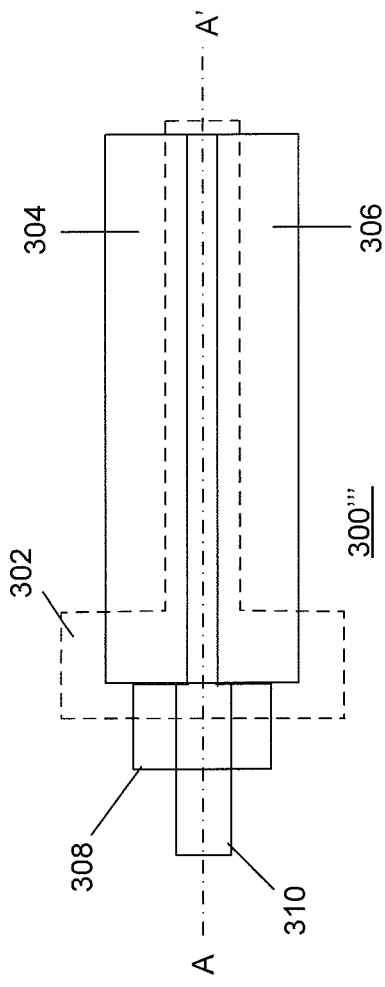
FIG. 3E is a simplified top view schematic of an improved SOI NMOSFET adapted to control accumulated charge and showing a cross-sectional view line A-A' taken along approximately a center of the SOI NMOSFET.

FIG. 3E is a simplified schematic diagram of a top view of an ACC SOI NMOSFET 300''' adapted to control accumulated charge in accordance with the present disclosure. The ACC NMOSFET 300''' is very similar in design and function to the ACC NMOSFETs described above with reference to FIGS. 3A-3D. FIG. 3E shows a dashed cross-sectional view line A-A' taken along the approximate center of the NMOSFET 300'''. This cross-sectional view is used herein to describe structural and performance characteristics of some exemplary prior art MOSFETS and some embodiments of the ACC NMOSFET that may occur as a result of the fabrication processes. Details of this cross-sectional view A-A' are now described with reference to FIG. 3F.

View line A-A' slices through the following component regions of the ACC NMOSFET 300''': the P+ electrical contact region 310, the ACS 308 (shown in FIG. 3E, but not shown in FIG. 3F), a P+ overlap region 310', a gate oxide 110, and a poly-silicon gate 302. In some embodiments, during the fabrication process, when the region 310 is doped with p-type dopant material, proximate the P− body region, some additional P+ doping may be implanted (i.e., the p-type dopant material may overlap) into the P+ overlap region 310' of the poly-silicon gate 302. In some embodiments, such overlapping is performed intentionally to ensure that all of the gate oxide 110 is completely covered by the P+ region (i.e., to ensure that no gap exists on the edge of the oxide 110 between the gate 302 and the P+ region 310). This, in turn, aids in providing a minimum impedance connection between the P+ region 310 and the body 312.

Figure 3F:
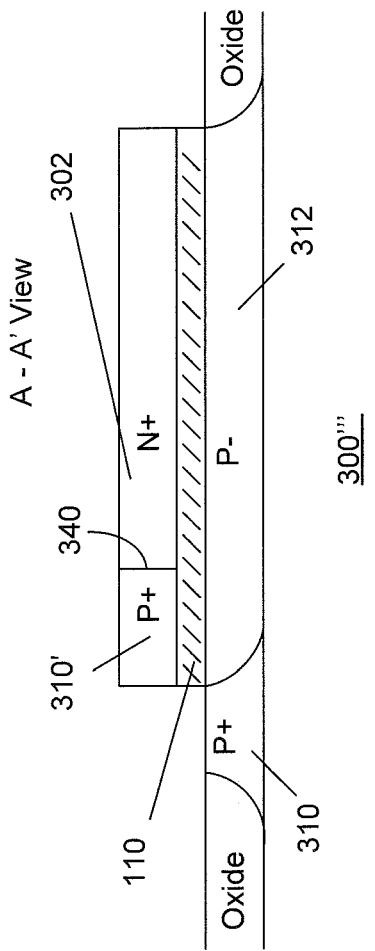
FIG. 3F is a cross-sectional view of the improved SOI NMOSET of FIG. 3E taken along the A-A' view line of FIG. 3E.

Although the present teachings encompass such embodiments described above, those skilled in the electronic device design and manufacturing arts shall recognize that such low-resistance connections are not required. Therefore, disadvantages associated with the embodiment shown in FIG. 3H, as described below in more detail, can be overcome by using other embodiments described herein (for example, the embodiments 300 and 300'''' described below with reference to FIGS. 3G and 3J, respectively), in which gaps are intentionally implemented between the P+ region 310 and the body 312. In one exemplary embodiment, the P+ overlap region 310' overlaps the oxide 110 by approximately 0.2-0.7 microns. Those skilled in the MOSFET design and manufacturing arts shall appreciate that other overlap region dimensions can be used in practicing the present disclosed method and apparatus. In some embodiments, as shown in FIG. 3F, for example, the remaining area over the gate oxide 110 and over the P− body is doped with n-type dopant material (i.e., it comprises an N+ region).

Referring again to FIG. 3F, owing to the presence of the P+ overlap region 310' over the gate oxide 110, over the body 312, and proximate an edge 340 of the poly-silicon gate 302, an increased threshold voltage region is created in the NMOSFET 300'''. More specifically, due to the P+ doping (in the P+ overlap region 310') proximate the edge 340 of the gate 302 over the channel region of the body 312, a region of increased threshold voltage is formed in that region of the MOSFET 300'''. The effects of the region of increased threshold voltage are now described in more detail with reference to FIGS. 3H and 3I.

Figure 3G:
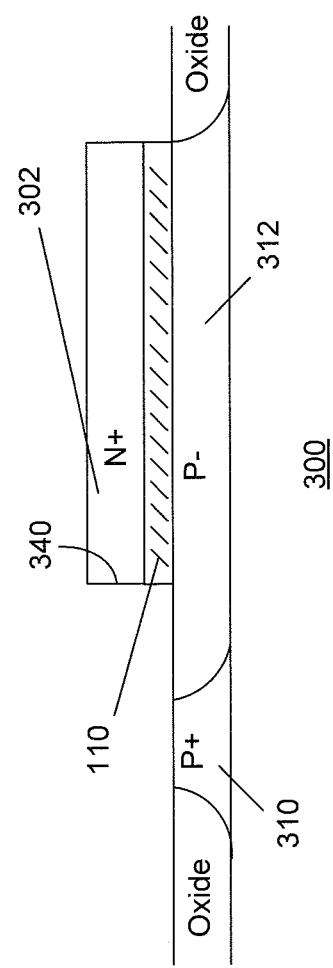
FIG. 3G is a cross-sectional view of the improved SOI NMOSET of FIGS. 3A-3B.
Figure 3H:
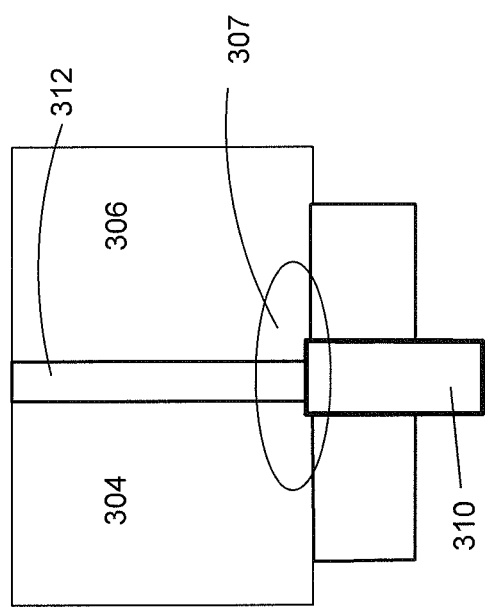
FIG. 3H is a simplified top view schematic of an SOI NMOSFET illustrating a region of increased threshold voltage that can occur in prior art MOSFETs and in some embodiments of the improved SOI MOSFET due to manufacturing processes.
Figure 3I:
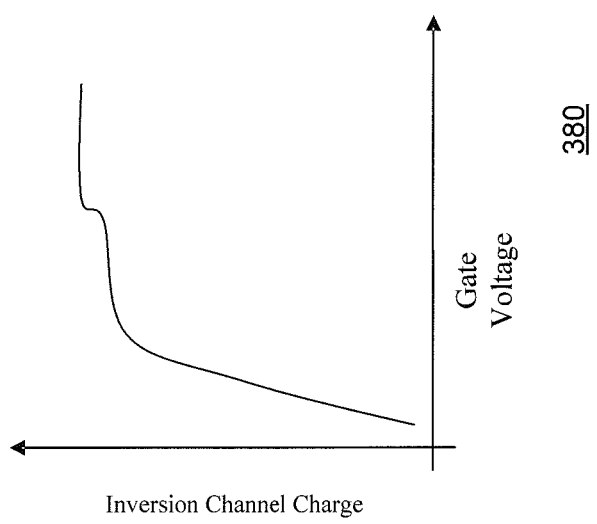
FIG. 3I is a plot of inversion channel charge as a function of applied gate voltage when a region of increased threshold voltage is present in an SOI MOSFET.

FIG. 3I shows a plot 380 of inversion channel charge versus applied gate voltage for an ACC NMOSFET. The plot 380 shown in FIG. 3I illustrates one effect of the above-described increased threshold voltage that can occur in prior art MOSFETs, and in some embodiments of the present ACC NMOSFETs due to certain manufacturing processes. As described in more detail below, the increased threshold voltage region, shown in FIG. 3H and described in more detail below, also occurs in prior art MOSFET designs due to the proximity of body ties to the FET body. As described below in more detail with reference to FIG. 3J, for example, the present disclosed method and apparatus can be used to reduce or eliminate the region of increased threshold voltage found in some prior art SOI MOSFET designs.

FIG. 3H shows one embodiment of an ACC NMOSFET without its gate contact, gate, and gate oxide being visible. The MOSFET region of increased threshold voltage described above with reference to FIGS. 3E and 3F is shown in FIG. 3H as occurring in the region encompassed by the ellipse 307. As will be well understood by those skilled in the electronic design and manufacturing arts, for the reasons set forth above with reference to FIGS. 3E and 3F, due to the increased threshold voltage, the region 307 of the ACC MOSFET shown in FIG. 3H effectively "turns on" after the rest of the ACC MOSFET channel region.

The increased threshold voltage can be reduced by reducing the size of the region 307. Eliminating the region 307 altogether eliminates the threshold voltage increase. Because the threshold voltage increase can increase harmonic and intermodulation distortion of the "on" state MOSFET, eliminating this effect improves MOSFET performance. The increased threshold voltage also has the detrimental effect of increasing the MOSFET on-resistance (i.e., the resistance presented by the MOSFET when it is in the on-state (conducting state), which detrimentally impacts the MOSFET insertion loss.

In one exemplary embodiment, as shown, for example in the embodiments of the ACC NMOSFET 300 described above with reference to FIGS. 3A and 3B, and as described below in more detail with reference to the cross-sectional view of the ACC MOSFET 300 of FIG. 3G, the detrimental effects associated with threshold voltage increase are mitigated or overcome by positioning the P+ region 310 a selected distance away from an edge of the poly-silicon gate 302. This approach is shown both in the top view of the ACC MOSFET 300 of FIG. 3A, and in the cross-sectional view of the ACC MOSFET 300 shown in FIG. 3G. As shown in the cross-sectional view of the ACC MOSFET 300 of FIG. 3G, the P+ region 310 does not extend all the way to the edge 340 of the poly-silicon gate 302. This is in stark contrast to the embodiment 300''' shown in FIG. 3F, where the P+ region 310' extends all the way to the gate edge 340. By positioning the P+ region 310 a distance away from the gate edge 340 as shown in the embodiment 300 of FIG. 3G, no P+ region is positioned proximate the poly-silicon gate 302 (i.e., there is no P+ region present in the poly-silicon gate 302).

This configuration of the P+ region 310 eliminates or greatly reduces the problems associated with threshold voltage increase as described above. As described above with reference to FIGS. 3A and 3B, and with reference to the comparisons to the prior art body contact references, the relatively high impedance of the ACS 308 P− region (shown in FIG. 3A) between the P+ region 310 and the gate 302 does not adversely affect the performance of the ACC NMOSFET 300. As described above, the accumulated charge can be effectively removed even using a relatively high impedance ACS connection.

In another exemplary embodiment, as described below with reference to FIG. 3J, the threshold voltage increase is removed by positioning the P+ region 310 (and the ACS 308) a distance away from the body 312. Because the electrical connectivity between the ACS 308 and the body 312 has relatively high impedance when the small region of P+ 310 is positioned a distance away from the body 312, this approach is never taught or suggested by the body contact prior art references (which require low impedance contacts as described above). This improved embodiment is described next with reference to FIG. 3J.

Figure 3K:
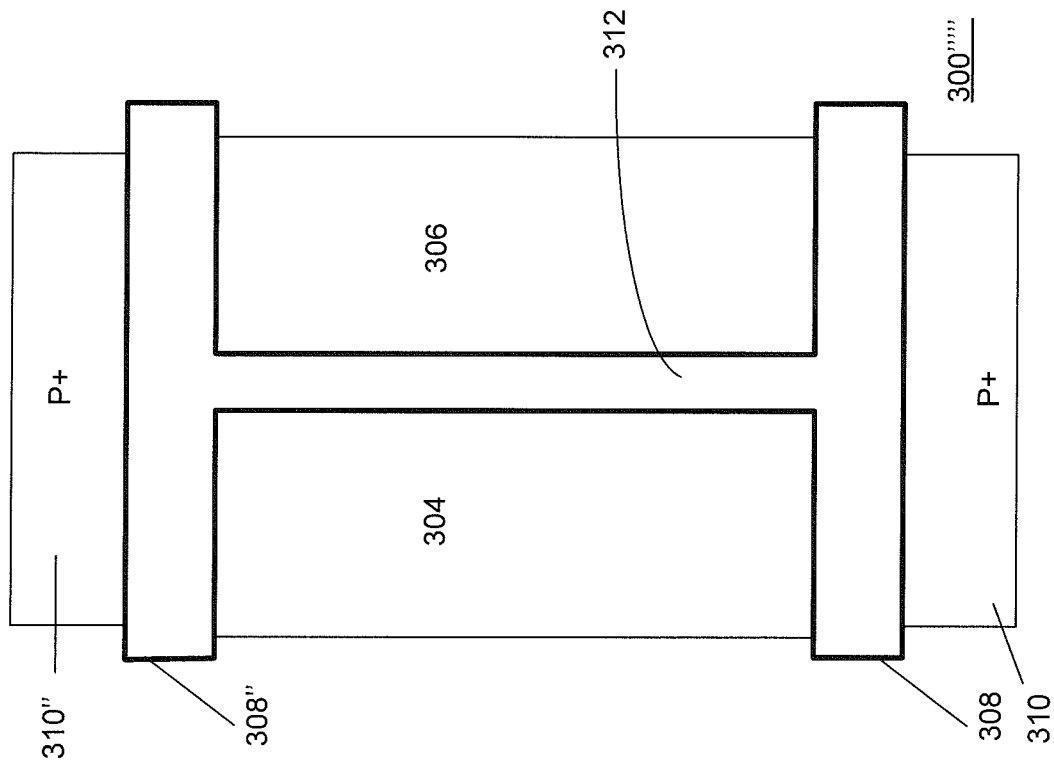
FIG. 3K is a simplified top view schematic of an improved SOI NMOSFET adapted to control accumulated charge and configured in an "H-gate" configuration.
Figure 3J:
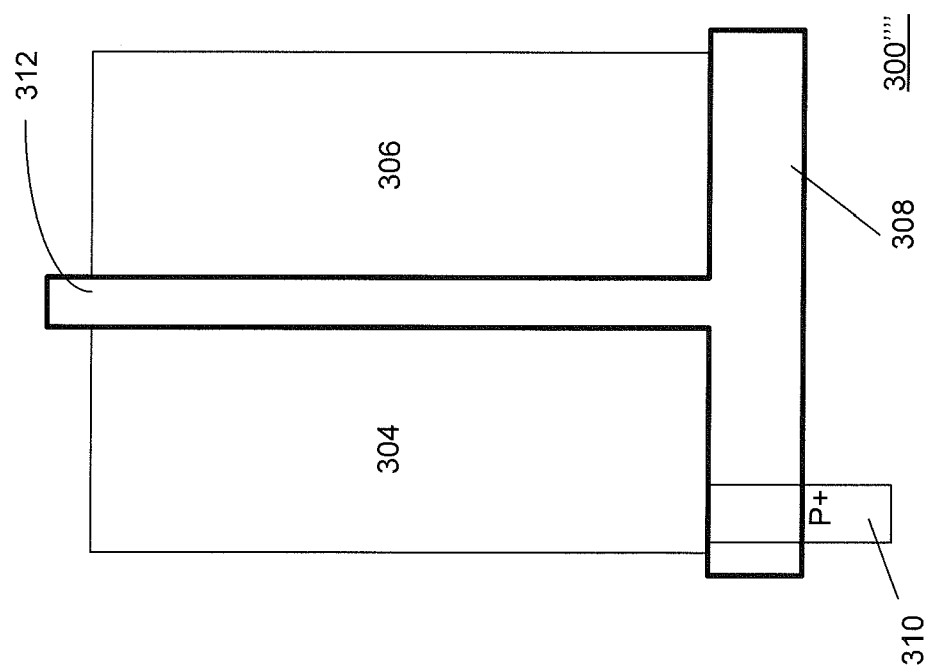
FIG. 3J is a simplified top view schematic of an improved SOI NMOSFET adapted to control accumulated charge and configured in a "T-gate" configuration.

FIG. 3J is a simplified top view schematic of another embodiment of an ACC SOI NMOSFET 300'''' adapted to control accumulated charge and configured in a "T-gate" configuration. FIG. 3J shows the ACC NMOSFET 300'''' without its gate contact 301, gate 302, and gate oxide being visible. The gate (not shown in FIG. 3J) and the body 312 are configured as "supporting" members of the "T-gate" configured ACC MOSFET 300'''' (i.e., they comprise the "bottom" portion of the "T-shaped" FET). These "supporting" members "support" the "supported" member of the T-gate configured MOSFET 300'''', which comprises the ACS 308 as shown in FIG. 3J (i.e., the ACS 308 comprises the "top" portion of the "T-shaped" FET). As shown in FIG. 3J, the ACC NMOSFET 300'''' includes a small P+ region 310 conjoined to an ACS 308. As shown in FIG. 3J, the P+ region 310 (and thus the ACS external electrical connection) is disposed a selected distance away from the body 312. The total impedance of the electrical connection from the body 312, through the ACS 308, and to the P+ region 310 is increased by positioning the P+ region 310 a selected distance away from the body 312. However, as described above, the present ACC NMOSFET 300'''' works perfectly well to remove accumulated charge even using relatively high impedance ACS connections. For the reasons described above with reference to FIGS. 3A and 3B, due to the nature of the accumulated charge when the NMOSFET 300'''' operates in the accumulated charge regime, the ACC NMOSFET 300'' does not require low impedance ACS electrical connections in order to remove accumulated charge from the body 312. Rather, an ACS connection of relatively large impedance may be used in practicing the present teachings, with corresponding improvements in NMOSFET performance as described above (e.g., reductions in parasitic capacitance as compared with prior art low impedance body contacts). However, in other embodiments, if desired, a low impedance ACS connection may be used to practice the disclosed method and apparatus for use in improving linearity characteristics of SOI MOSFETs.

Moreover, as described above with reference to FIG. 3I1, the embodiment of FIG. 3J improves device performance owing to the fact that the small P+ region 310 is positioned a distance away from the body 312. Because the small P+ region 310 is positioned a distance away from the body 312, the threshold voltage increase is reduced or entirely eliminated, together with the consequent adverse performance effects described above.

FIG. 3K is a simplified top view schematic of another embodiment of an ACC SOI NMOSFET 300''''' adapted to control accumulated charge and configured in an "H-gate" configuration. FIG. 3K shows the ACC NMOSFET 300''''' without its gate contact 301, gate 302, and gate oxide being visible. With the exception of some structural differences described herein, the ACC NMOSFET 300''''' is very similar in design and function to the ACC NMOSFETs described above with reference to FIGS. 3A-3D and 3J. As shown in FIG. 3K, the ACC NMOSFET 300''''' includes two ACSs, 308 and 308'', disposed at opposite ends of the H-gate ACC NMOSFET 300'''''. P+ regions 310 and 310'' are formed to abut their respective ACSs, 308 and 308'', and provide electrical contact thereto. In accordance with the disclosed method and apparatus, as described above, when the ACC NMOSFET 300''''' is biased to operate in the accumulated charge regime, the accumulated charge is removed or otherwise controlled via the two ACSs 308 and 308''.

It shall be understood by those skilled in the electronic device design arts that although the illustrated embodiment shows the ACSs 308 and 308'' extending approximately the entire width of the ACC NMOSFET 300''''', the ACSs 308 and 308'' may also comprise much narrower (or wider) regions, and still function perfectly well to remove or otherwise control the accumulated charge. Also, in some embodiments, it is not necessary that the impedance of the ACS 308 matches the impedance of the ACS 308''. It will further be understood by the skilled person that the ACSs 308 and 308" may comprise different sizes and configurations (i.e., rectangular, square, or any other convenient shape), and may also be positioned at various distances away from the body 312 (i.e., not necessarily the same distance away from the body 312). As described above with reference to FIG. 3J, when the ACS 308 is positioned a selected distance away from the body 312, the problems associated with threshold voltage increase are reduced or eliminated.

Four-Terminal ACC MOSFET Devices—Simple Circuit Configurations

The SOI NMOSFET 300 of FIGS. 3A and 3B may be implemented as a four terminal device, as illustrated schematically in FIG. 4A. As shown in the improved ACC SOI NMOSFET 300 of FIG. 4A, a gate terminal 402 is electrically coupled to the gate contact 301 (e.g., FIG. 3A) and is analogous to the gate terminal 302' shown in FIG. 3C. The gate contact 301 is electrically coupled to the gate 302 (e.g., FIGS. 3A and 3C). Similarly, a source terminal 404 is electrically coupled to the source 304 (e.g., FIGS. 3A-3C) and is analogous to the source terminal 304' of FIG. 3C. Similarly, a drain terminal 406 is electrically coupled to the drain 306 (e.g., FIGS. 3A-3C) and is analogous to the drain terminal 306' of FIG. 3C. Finally, the ACC NMOSFET 300 includes an ACS terminal 408 that is electrically coupled to the ACS 308 (e.g., see FIGS. 3A-3B, and FIGS. 3D, 3J-3K) via the region 310. Those skilled in the electronic design and manufacturing arts shall understand that the region 310 may be used in some embodiments to facilitate electrical coupling to the ACS 308 because, in some embodiments, it may be difficult to make a direct contact to a lightly doped region (i.e., the ACS 308). The ACS terminal 408 is analogous to the ACS terminal 308' shown in FIG. 3C.

Figure 4B:
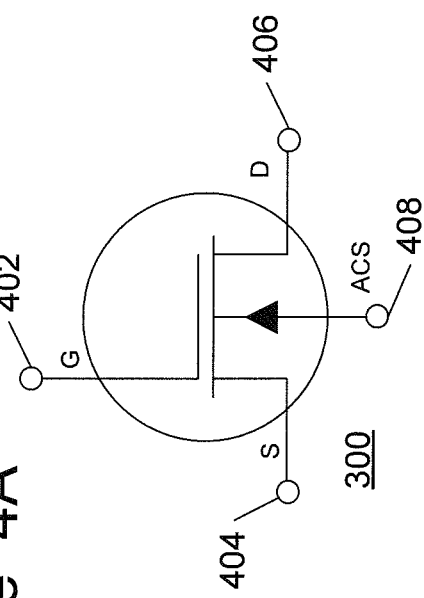
FIG. 4B is a simplified schematic of an improved SOI NMOSFET adapted to control accumulated charge, embodied as a four terminal device, wherein an accumulated charge sink (ACS) terminal is coupled to a gate terminal.

The ACC SOI NMOSFET 300 of FIG. 4A may be operated using various techniques and implemented in various circuits in order to control accumulated charge present in the FET when it is operating in an accumulated charge regime. For example, in one exemplary embodiment as shown in FIG. 4B, the gate and ACS terminals, 402 and 408, respectively, are electrically coupled together. In one embodiment of the simplified circuit shown in FIG. 4B, the source and drain bias voltages applied to the terminals 404 and 406, respectively, may be zero. If the gate bias voltage (Vg) applied to the gate terminal 402 is sufficiently negative with respect to the source and drain bias voltages applied to the terminals 404 and 406, and with respect to the threshold voltage $V_{th}$, (for example, if $V_{th}$ is approximately zero, and if Vg is more negative than approximately −1 V) the ACC NMOSFET 300 operates in the accumulated charge regime. As described above with reference to FIG. 3C, for example, when the MOSFET operates in this regime, accumulated charge (holes) may accumulate in the body of the NMOSFET 300.

Advantageously, the accumulated charge can be removed via the ACS terminal 408 by connecting the ACS terminal 408 to the gate terminal 402 as shown. This configuration ensures that when the FET 300 is in the off-state, it is held in the correct bias region to effectively remove or otherwise control the accumulated charge. As shown in FIG. 4B, connecting the ACS terminal 408 to the gate ensures that the same bias voltages are applied to both the gate (Vg) and the body (shown in FIG. 3C as "Vb" or "$V_{ACS}$"). Because the bias voltage $V_{ACS}$ is the same as the gate voltage Vg in this embodiment, the accumulated charge is no longer trapped below the gate oxide (by attraction to the gate bias Vg) because it is conveyed to the gate terminal 402 via the ACS terminal 408. The accumulated charge is thereby removed from the body via the ACS terminal 408.

In other exemplary embodiments, as described above with reference to FIG. 3C, for example, Vs and Vd may comprise nonzero bias voltages. According to these examples, Vg must be sufficiently negative to both Vs and Vd in order for Vg to be sufficiently negative to $V_{th}$ to turn the NMOSFET 300 off (i.e., operate the NMOSFET 300 in the off-state). When so biased, as described above, the NMOSFET 300 may enter the accumulated charge regime and thereby have accumulated charge present in the body. For this example, the voltage $V_{ACS}$ may also be selected to be equal to Vg by connecting the ACS terminal 408 to the gate terminal 402, thereby conveying the accumulated charge from the body of the ACC NMOSFET, as described above.

In another exemplary embodiment, as described above, the ACC NMOSFET 300 comprises a depletion mode device. In this embodiment, the threshold voltage, $V_{th}$ is, by definition, less than zero. For Vs and Vd both at zero volts, when a gate bias Vg sufficiently negative to $V_{th}$ is applied to the gate terminal 402 (for example, Vg more negative than approximately −1 V relative to $V_{th}$), holes may accumulate under the gate oxide and thereby comprise an accumulated charge. For this example, the voltage $V_{ACS}$ may also be selected to be equal to Vg by connecting the ACS terminal 408 to the gate terminal 402, thereby conveying the accumulated charge from the ACC NMOSFET as described above.

In some embodiments of the improved ACC SOI NMOSFET 300, such as that described above with reference to FIG. 4B, when the FET is biased on, diodes formed at the edge of the device (such as described above with reference to the interface between the ACS 308 and the drain 304 (and the source 306) as shown in FIG. 3D) may become forward biased thereby allowing current to flow into the source and drain regions. In addition to wasting power, this may introduce nonlinearity into the NMOSFET. The nonlinearity results because the current that flows as a result of the forward biased interface diodes comprises nonlinear current. As Vgs and Vgd are reduced in that region of the device, the on resistance Ron at the edge of the device is increased. As is well known, and for the reasons set forth above, if the interface diodes forming at the edge of the device become forward biased, the device on-state characteristics are consequently dramatically adversely affected. Those skilled in the electronic device design arts shall understand that the configuration shown in FIG. 4B limits application of a gate bias voltage Vgs to approximately 0.7 Volts. The simplified circuit shown in FIG. 4C can be used to overcome these problems.

Figure 4C:
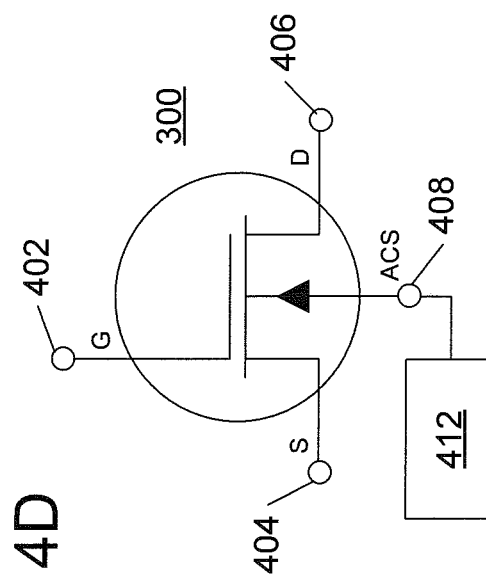
FIG. 4C is a simplified schematic of an improved SOI NMOSFET adapted to control accumulated charge, embodied as a four terminal device, wherein an accumulated charge sink (ACS) terminal is coupled to a gate terminal via a diode.

Another exemplary simplified circuit using the improved ACC SOI NMOSFET 300 is shown in FIG. 4C. As shown in FIG. 4C, in this embodiment, the ACS terminal 408 may be electrically coupled to a diode 410, and the diode 410 may, in turn, be coupled to the gate terminal 402. This embodiment may be used to prevent a positive current flow into the MOSFET body 312 caused by a positive Vg-to-Vs (or, equivalently, Vgs, where Vgs=Vg−Vs) bias voltage, as may occur, for example, when the SOI NMOSFET 300 is biased into an on-state condition.

As with the device shown in FIG. 4B, when biased off, the ACS terminal voltage $V_{ACS}$ comprises the gate voltage plus a voltage drop across the diode 410. At very low ACS terminal current levels, the voltage drop across the diode 410 typically also is very low (e.g., <<500 mV, for example, for a typical threshold diode). The voltage drop across the diode 410 can be reduced to approximately zero by using other diodes, such as a 0 Vf diode, for example. In one embodiment, reducing the voltage drop across the diode is achieved by increasing the diode 410 width. Additionally, maintaining the ACS-to-source or ACS-to-drain voltage (whichever bias voltage of the two bias voltages is lower) increasingly negative, also improves the linearity of the ACC MOSFET device 300.

When the SOI NMOSFET 300 is biased in an on condition, the diode 410 is reverse-biased, thereby preventing the flow of positive current into the source and drain regions. The reverse-biased configuration reduces power consumption and improves linearity of the device. The circuit shown in FIG. 4C therefore works well to remove accumulated charge from the ACC MOSFET body when the FET is in the off-state and is operated in the accumulated charge regime. It also permits almost any positive voltage to be applied to the gate voltage Vg. This, in turn, allows the ACC MOSFET to effectively remove accumulated charge when the device operates in the off-state, yet assume the characteristics of a floating body device when the device operates in the on-state.

With the exception of the diode 410 used to prevent the flow of positive current into the ACS terminal 408, exemplary operation of the simplified circuit shown in FIG. 4C is the same as the operation of the circuit described above with reference to FIG. 4B.

Figure 4D:
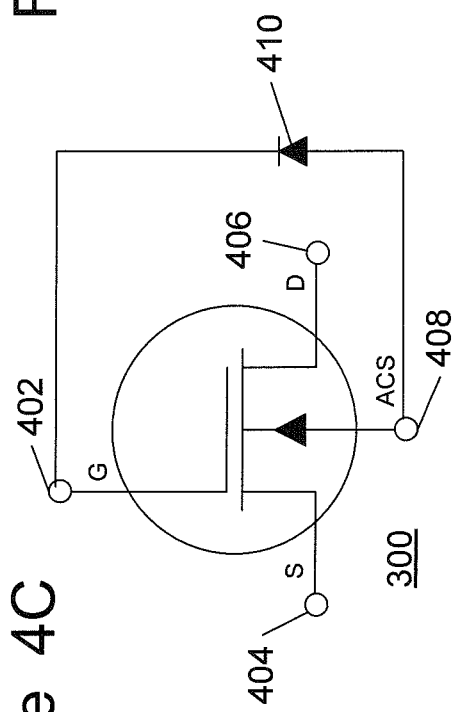
FIG. 4D is a simplified schematic of an improved SOI NMOSFET adapted to control accumulated charge, embodied as a four terminal device, wherein an accumulated charge sink (ACS) terminal is coupled to a control circuit.

In yet another embodiment, the ACS terminal 408 may be coupled to a control circuit 412 as illustrated in the simplified circuit of FIG. 4D. The control circuit 412 may provide a selectable ACS bias voltage $V_{ACS}$ that selectively controls the accumulated charge (i.e., the accumulated charge 120 described above with reference to FIG. 1). As shown in FIG. 4D, rather than having a local circuit provide the ACS bias voltage $V_{ACS}$ (e.g., as derived from the gate voltage Vg), in some embodiments the ACS bias voltage $V_{ACS}$ is produced by a separate source that is independent of the ACC MOSFET device 300. In the case of a switch (as described below in more detail with reference to FIG. 4E), the ACS bias voltage $V_{ACS}$ should be driven from a source having a high output impedance. For example, such a high output impedance source can be obtained using a large series resistor in order to ensure that the RF voltage is divided across the MOSFET and that the ACS bias voltage $V_{ACS}$ has Vds/2 "riding" on it, similarly to the gate voltage. This approach is described in more detail below with reference to FIG. 4E.

It may be desirable to provide a negative ACS bias voltage $V_{ACS}$ to the ACS terminal 408 when the SOI NMOSFET 300 is biased into an accumulated charge regime. In this exemplary embodiment, the control circuit 412 may prevent positive current flow into the ACS terminal 408 by selectively maintaining an ACS bias voltage $V_{ACS}$ that is consistently negative with respect to both the source and drain bias voltages. In particular, the control circuit 412 may be used to apply an ACS bias voltage that is equal to or more negative than the lesser of Vs and Vd. By application of such an ACS bias voltage, the accumulated charge is thereby removed or otherwise controlled.

In the exemplary embodiment of the simplified circuit shown in FIG. 4D, the source and drain bias voltages applied to the terminals 404 and 406, respectively, may be zero. If the gate bias voltage (Vg) applied to the gate terminal 402 is sufficiently negative with respect to the source and drain bias voltages applied to the terminals 404 and 406, and with respect to $V_{th}$, (for example, if $V_{th}$ is approximately zero, and if Vg is more negative than approximately −1 V) the ACC NMOSFET 300 operates in the accumulated charge regime, and the accumulated charge (holes) may accumulate in the body of the ACC NMOSFET 300. Advantageously, the accumulated charge can be removed via the ACS terminal 408 by connecting the ACS terminal 408 to the control circuit 412 as shown. In order to ensure that the accumulated charge is conveyed from the body of the ACC NMOSFET 300, the ACS bias voltage $V_{ACS}$ that is applied to the ACS terminal 408 should be equal to or more negative than the gate voltage and more negative than the lesser of Vs and Vd. Because the accumulated charge 120 is conveyed to the bias voltage $V_{ACS}$ applied to the ACS terminal 408 by the control circuit 412, the accumulated charge does not remain trapped under the gate oxide due to attraction to the gate bias voltage Vg.

In other embodiments, Vs and Vd may comprise bias voltages that are other than zero. According to these examples, Vg must be sufficiently negative to both Vs and Vd in order for Vg to be sufficiently negative to $V_{th}$, in order to bias the NMOSFET 300 in the off-state. This allows the accumulation of accumulated charge under the gate oxide. For this example, the ACS bias voltage $V_{ACS}$ may be selected to be equal to or more negative than the lesser of Vs and Vd by connecting the ACS terminal 408 to the control circuit 412 to provide selected ACS bias voltages, thereby conveying the accumulated charge from the ACC NMOSFET 300.

In other embodiments, if the ACC NMOSFET 300 of FIG. 4D comprises a depletion mode device, $V_{th}$ is, by definition, less than zero. For Vs and Vd both at zero volts, when a gate bias Vg sufficiently negative to $V_{th}$ is applied (for example, Vg more negative than approximately −1 V relative to $V_{th}$), holes may accumulate under the gate oxide. For this example, the ACS bias voltage $V_{ACS}$ that is applied to the ACS terminal 408 may also be selected to be equal to or more negative than the lesser of Vs and Vd by connecting the ACS terminal 408 to the control circuit 412 and thereby provide the desired ACS bias voltages $V_{ACS}$ that are necessary to remove the accumulated charge from the ACC NMOSFET 300.

Figure 4E:
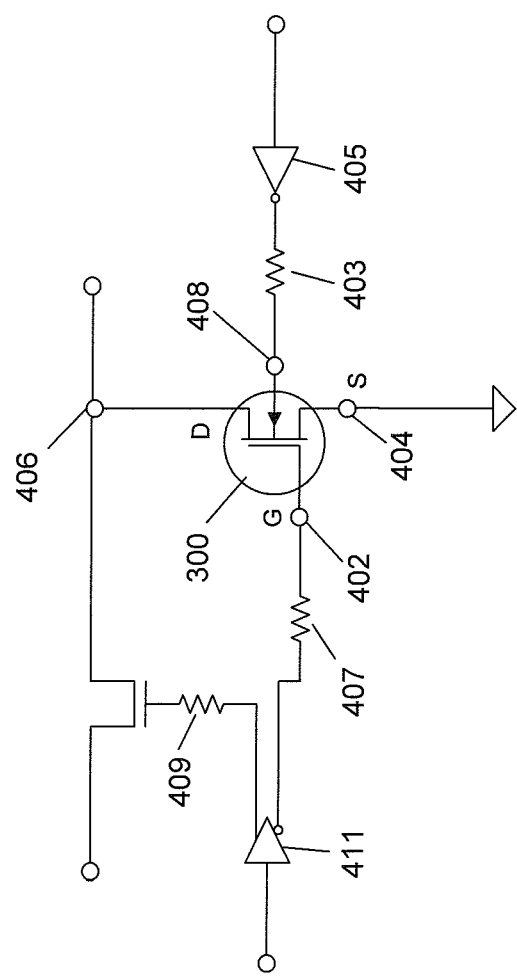
FIG. 4E is a simplified schematic of an exemplary RF switch circuit implemented using the four terminal ACC NMOSFET of FIG. 4D, wherein the ACS terminal is driven by an external bias source.

As described above, in one embodiment, instead of having the control circuit 412 provide a bias to the ACS terminal 408 as shown in FIG. 4D, the ACS terminal 408 can be driven by a separate bias source circuit, as shown, for example, in the embodiment of FIG. 4E. In one exemplary circuit implementation, as exemplified in the circuit of FIG. 4E, in an RF switch circuit, the separate $V_{ACS}$ source has a high output impedance element 403 which ensures that the RF voltage is divided across the ACC NMOSFET 300, and which further ensures that the voltage applied to the ACS terminal 408 has Vds/2 applied thereon, similar to the voltage Vgs that is applied to the gate terminal 402. In one exemplary embodiment, an inverter 405 is configured in series with the high output impedance element 403 and supplied by GND and $-V_{DD}$. In one exemplary embodiment, $-V_{DD}$ is readily derived from a convenient positive voltage supply. It could, however, comprise an even more negative voltage for improved linearity (i.e., it can be independent of the gate voltage).

In another embodiment, the circuit shown in FIG. 4C can be modified to include a clamping circuit configured in series with an ACS terminal 408. Such an exemplary embodiment is shown in FIG. 4F. Under certain operating conditions, current that flows out of the ACC NMOSFET 300, conveying the accumulated charge from the body of the ACC NMOSFET 300, via the ACS terminal 408 is sufficiently high such that it causes problems in the biasing circuitry (i.e., under some conditions the ACS current is so high that the biasing circuitry cannot adequately sink the current flowing out of the body of the ACC NMOSFET 300). As shown in the circuit of FIG. 4F, one exemplary embodiment solves this problem by interrupting the flow of ACS current out of the body of the ACC NMOSFET 300, and thereby returning the ACC NMOSFET 300 to a floating body condition.

In one exemplary circuit, as shown in FIG. 4F, a depletion-mode FET 421 is configured in series between the ACS terminal 408 and a diode 410. In this exemplary circuit, the depletion-mode FET 421 includes a gate terminal that is electrically connected to the FET's source terminal. In this configuration, the depletion-mode FET 421 functions to clip or limit the current that flows from the ACS terminal 408 when the ACC MOSFET operates in the accumulated charge regime. More specifically, the depletion-mode FET 421 enters saturation upon reaching a predefined threshold. The current leaving the body of the ACC MOSFET is thereby limited by the saturation current of the FET 421. In some embodiments, the predefined saturation threshold may optionally be adjusted to change the point at which clamping occurs, such as by selecting a higher threshold voltage, which results in a lower maximum current and earlier clamping.

In some embodiments, such as for example in an RF switch circuit, the gate terminal 402 and the ACS terminal 408 follow Vds at half the rate (Vds/2) of Vds. At high Vds excursions, Vgs may approach the threshold voltage Vth, resulting in increased Ids leakage current. In some cases, such a leakage current exits the ACS terminal 408 and can overwhelm associated circuitry (e.g., a negative voltage generator). Hence, the circuit shown in FIG. 4F solves or otherwise mitigates these problems. More specifically, by coupling the FET 421 in series between the ACS terminal 408 and the diode 410, the current that exits the ACS terminal 408 is limited to the saturation current of the FET 421.

In yet another exemplary embodiment, the simplified circuit shown in FIG. 4C can be modified to include an AC shorting capacitor placed in parallel with the diode 410. The simplified circuit of FIG. 4G can be used to compensate for certain undesirable nonlinearities present in a full circuit application. In some embodiments, due to parasitics present in the MOSFET layout, nonlinearity characteristics existing in the diode 410 of FIG. 4C may introduce undesirable nonlinearities in a full circuit implementation. As the diode is in place to provide DC bias conditions and is not intended to have any AC signals across it, it may be desirable in some embodiments to take steps to mitigate the effects of any AC signal present across the diode 410.

Figure 4G:
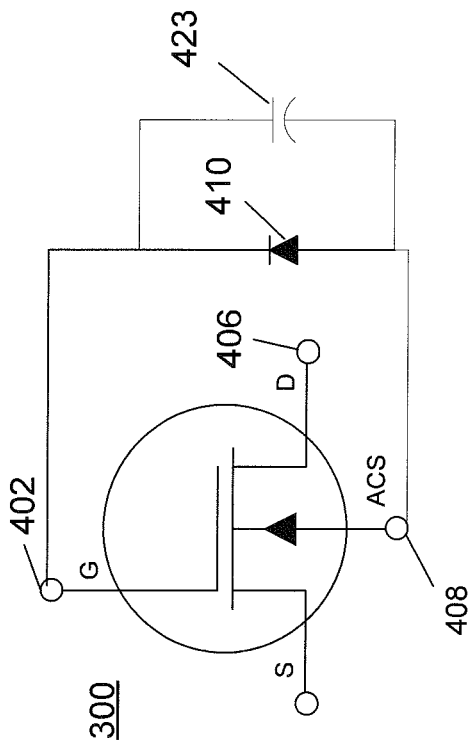
FIG. 4G is a simplified schematic of an improved SOI NMOSFET adapted to control accumulated charge, embodied as a four terminal device, wherein an accumulated charge sink (ACS) terminal is coupled to a gate terminal via a diode in parallel with a capacitor.
Figure 4F:
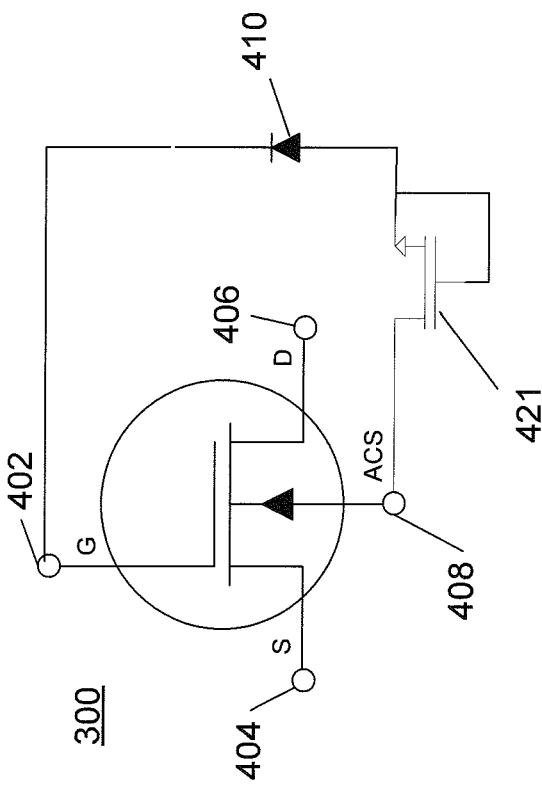
FIG. 4F is a simplified schematic of an improved SOI NMOSFET adapted to control accumulated charge, embodied as a four terminal device, wherein an accumulated charge sink (ACS) terminal is coupled to a clamping circuit.

As shown in the simplified circuit of FIG. 4G, the circuit of FIG. 4C has been modified to include an AC shorting capacitor 423 wherein the AC shorting capacitor 423 is configured in parallel across the diode 410. The AC shorting capacitor 423 is placed in parallel with the diode 410 to ensure that nonlinearities of the diode 410 are not excited by an AC signal. In some exemplary circuits, such as in an RF switch, the AC shorting capacitor 423 does not impact the higher level full circuit, as the gate terminal 402 and the ACS terminal 408 typically have the same AC signal applied (i.e., AC equipotential).

In some circuit embodiments, body nodes of a multi-finger FET implementation may be connected to one another (using, for example, metal or silicon), overlapping the source fingers. On another side of the FET implementation, gate nodes may be are connected to one another (using, for example, metal or silicon) overlapping the drain fingers. As a result of this FET implementation, additional capacitance may result between the source and body (S-B), and further additional capacitance may result between the drain and gate (D-G). These additional capacitances may degrade the symmetry of the intrinsic device. Under AC excitation, this results in the gate terminal following the drain terminal more closely, and the body terminal following the source terminal more closely, which effectively creates an AC signal across the diode 410, which can excite nonlinearities of the diode 410 as described above. Using the exemplary embodiment shown in FIG. 4G, parasitic nonlinear excitation due to the overlapping fingers is mitigated.

Figure 4H:
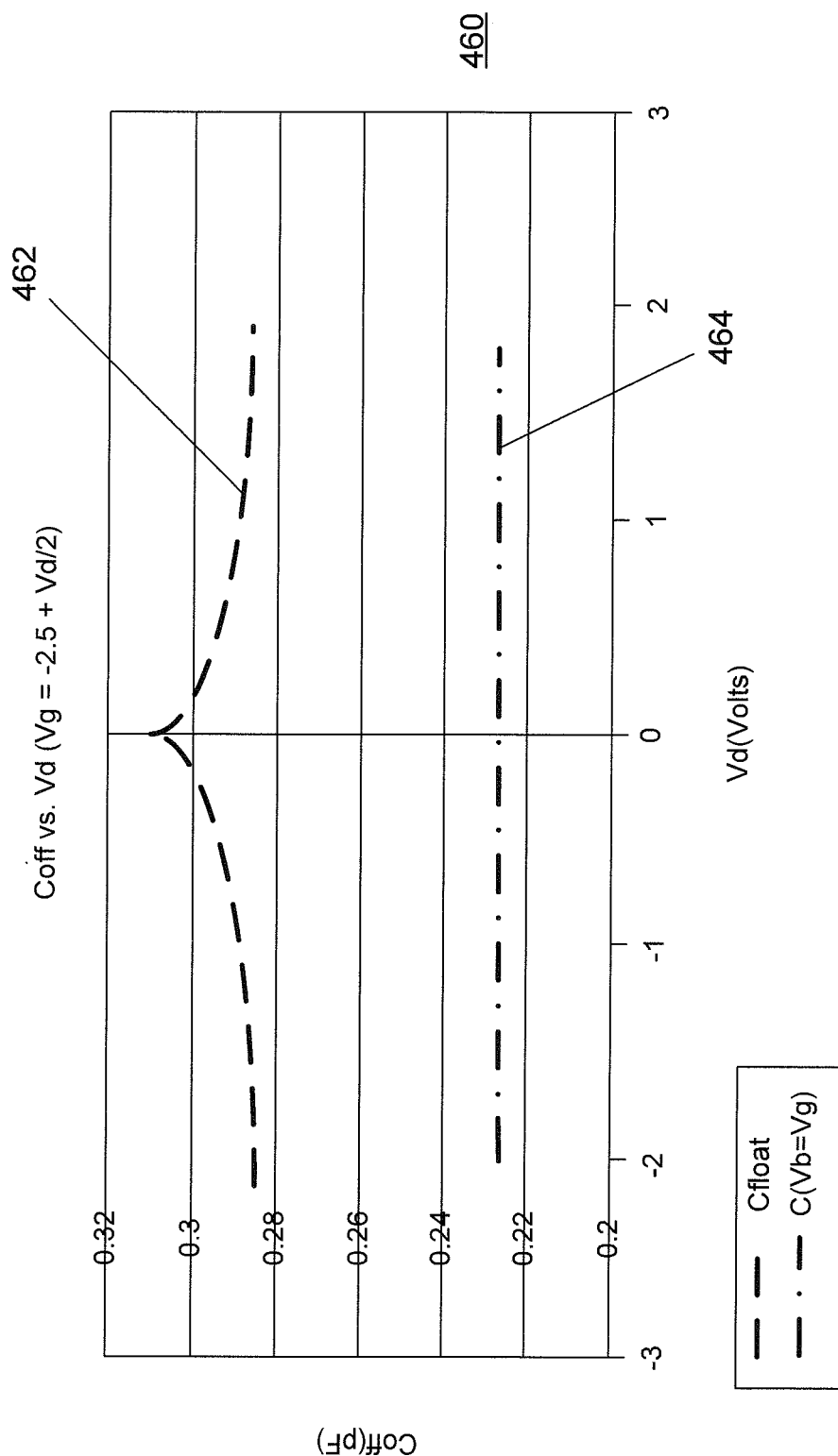
FIG. 4H shows plots of the off-state capacitance ($C_{off}$) versus applied drain-to-source voltages for SOI MOSFETs operated in the accumulated charge regime, wherein a first plot shows the off-state capacitance $C_{off}$ of a prior art SOI MOSFET, and wherein a second plot shows the off-state capacitance $C_{off}$ of the improved ACC SOI MOSFET made in accordance with the present teachings.

Improved $C_{off}$ Performance Characteristics of ACC MOSFETs Made in Accordance with the Present Disclosed Method and Apparatus FIG. 4H is a plot 460 of the off-state capacitance ($C_{off}$) versus an applied drain-to-source voltage of an SOI MOSFET when an AC signal is applied to the MOSFET (the plot 460 is relevant to an exemplary 1 mm wide MOSFET, though similar plots result using wider and narrower devices). In one embodiment, a gate voltage equals −2.5 Volts+Vd/2, and Vs equals 0. A first plot 462 shows the off-state capacitance $C_{off}$ of a typical prior art NMOSFET operating within the accumulated charge regime and thereby having an accumulated charge as described above with reference to FIG. 1. As shown in FIG. 4H, the off-state capacitance $C_{off}$ shown in plot 462 of the prior art FET is voltage-dependent (i.e., it is nonlinear) and peaks when Vd=0 Volts. A second plot 464 illustrates the off-state capacitance $C_{off}$ of an improved ACC SOI MOSFET made in accordance with the present teachings, wherein the accumulated charge is conveyed from the ACC MOSFET, thereby reducing, controlling and/or eliminating the accumulated charge from the ACC MOSFET body. As shown in FIG. 4H, the off-state capacitance $C_{off}$ shown in plot 464 of the ACC SOI MOSFET is not voltage-dependent (i.e., it is linear).

As described above with reference to FIG. 2A, by controlling, reducing or eliminating the accumulated charge, the impedance 212 of the NMOSFET body 312 (FIG. 3C, and shown as the MOSFET body 114 in the electrical model of FIG. 2A) is increased to a very large value. This increase in the impedance 212 of the MOSFET body reduces the contribution to $C_{off}$ caused by the impedance of the junctions 218 and 220 (FIG. 2A), thereby reducing the overall magnitude of $C_{off}$ and the nonlinear effects associated with the impedances of the junctions 218 and 220. Plot 464 illustrates how the present teachings advantageously reduce both the nonlinearity and overall magnitude of the off-state capacitance $C_{off}$ of the MOSFET. The reduced nonlinearity and magnitude of the off-state capacitance $C_{off}$ improves the performance of circuits using MOSFETs operating in an accumulated charge regime, such as RF switching circuits. Exemplary RF switching circuits implemented with the ACC MOSFETs described above with reference to FIGS. 4A-4G are now described with reference to FIGS. 5A-5D.

Figure 5A:
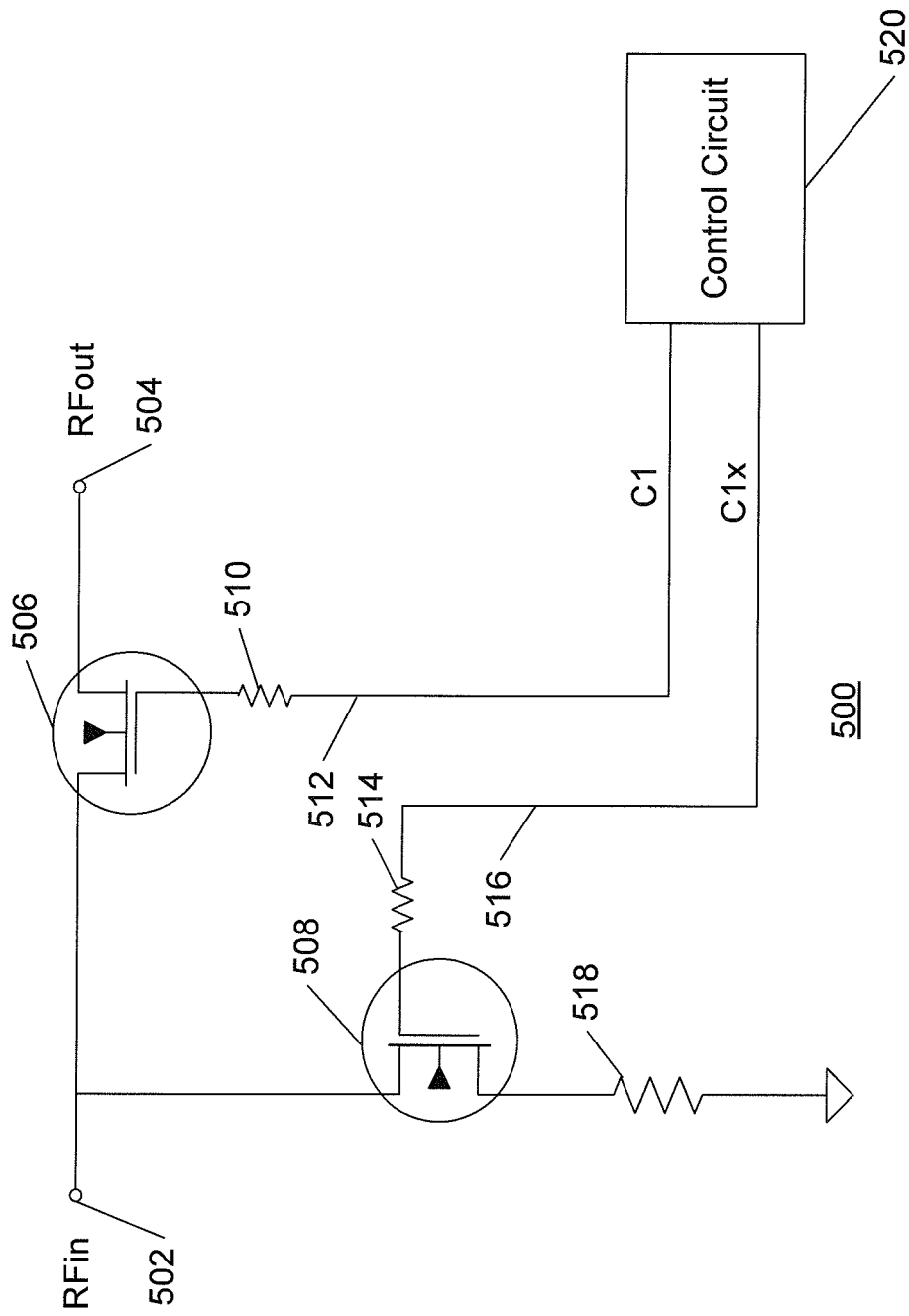
FIG. 5A is a schematic of an exemplary prior art single pole, single throw (SPST) radio frequency (RF) switch circuit.

Exemplary Improved Performance RF Switch Implementations Using ACC SOI MOSFETs in Accordance with the Present Teachings FIG. 5A shows a schematic diagram of a single pole, single throw (SPST) RF switch circuit 500 in accordance with prior art. The RF switch circuit 500 is one example of a general class of well-known RF switch circuits. Similar RF switch circuits are described in the following co-pending and commonly assigned U.S. Applications and Patent: Provisional Application No. 60/651,736, filed Feb. 9, 2005, entitled "UNPOWERED SWITCH AND BLEEDER CIRCUIT;" application Ser. No. 10/922,135, filed Aug. 18, 2004, pending, which is a continuation application of application Ser. No. 10/267,531, filed Oct. 8, 2002, which issued Oct. 12, 2004 as U.S. Pat. No. 6,804,502, entitled "SWITCH CIRCUIT AND METHOD OF SWITCHING RADIO FREQUENCY SIGNALS". application Ser. No. 10/267,531, filed Oct. 8, 2002, which issued Oct. 12, 2004 as U.S. Pat. No. 6,804,502 claims the benefit of U.S. Provisional Application No. 60/328,353, filed Oct. 10, 2001. All of the above-cited applications and issued patent set forth above are hereby incorporated by reference herein as if set forth in full for their teachings on RF switch circuits including SOI MOSFET switch circuits.

Referring again to FIG. 5A, a switching SOI NMOSFET 506 is adapted to receive an RF input signal "RFin" at an input terminal 502. The switching SOI MOSFET 506 is electrically coupled to selectively couple the RFin input signal to an output terminal 504 (i.e., thereby convey an RF output signal Rfout at the output terminal 504). In the exemplary embodiment, the switching SOI NMOSFET 506 is controlled by a first control signal C1 that is conveyed by a control line 512 through a gate resistor 510 (optionally included for suppression of parasitic RF coupling). The control line 512 is electrically coupled to a control circuit 520, which generates the first control signal C1.

Referring again to FIG. 5A, a shunting SOI NMOSFET 508 is adapted to receive the RF input signal RFin at its drain terminal, and to selectively shunt the input signal RFin to ground via an optional load resistor 518. The shunting SOI NMOSFET 508 is controlled by a second control signal C1x which is conveyed by a control line 516 through a gate resistor 514 (optionally included for suppression of parasitic RF coupling and for purposes of voltage division). The control line 516 is electrically coupled to the control circuit 520, which generates the second control signal C1x.

The terms "switching" and "shunting", as pertains to the transistors shown in FIG. 5A and also described below with reference to the RF switch circuits of FIGS. 5B-5D, 6, 8, and 9, are used interchangeably herein with the terms "switch" and "shunt", respectively. For example, the switching transistor 506 (and all of its analogous switching transistors described below in FIGS. 5B-5D, 6, 8, and 9) is also referred to herein as the "switch" transistor. Similarly, the shunting transistor 508 (and all of its analogous shunting transistors described below in FIGS. 5B-5D, 6, 8, and 9) is also referred to herein as the "shunt" transistor. The terms "switch" and "switching" (and similarly the terms "shunt" and "shunting"), when used to describe the RF switch circuit transistors, are used interchangeably herein. Further, as described below in more detail with reference to FIG. 6, those skilled in the RF switching design and fabrication arts shall recognize that although the switch and shunt transistors are shown in FIGS. 5A-5D and FIG. 9 as comprising a single MOSFET, it shall be understood that they may comprise transistor groupings comprising one or more MOSFET transistors.

It will also be appreciated by those skilled in RF switch circuits that all of the exemplary switch circuits may be used "bi-directionally," wherein the previously described input ports function as output ports, and vice versa. That is, although an exemplary RF switch may be described herein as having one or more input ports (or nodes) and one or more output ports (or nodes), this description is for convenience only, and it will be understood that output ports may, in some applications, be used to input signals, and input ports may, in some applications, be used to output signals. The RF switch circuits described with reference to FIGS. 2B, 4E, 5A-5D, 6, 8 and 9 are described herein as having "input" and "output" ports (or "nodes") that input and output RF signals, respectively. For example, as described below in more detail with reference to FIG. 9, RF input node 905 and RF input node 907 are described below as inputting RF signals RF1 and RF2 respectively. RFC common port 903 is described below as providing an RF common output signal. Those skilled in the RF switch circuit design arts shall recognize that the RF switch is bidirectional, and that the previously described input ports function perfectly well as output ports, and vice versa. In the example of the RF switch of FIG. 9, the RFC common port can be used to input an RF signal which is selectively output by the RF nodes 905 and 907.

Referring again to FIG. 5A, the first and second control signals, C1 and C1x, respectively, are generated so that the switching SOI NMOSFET 506 operates in an on-state when the shunting SOI NMOSFET 508 operates in an off-state, and vice versa. These control signals provide the gate bias voltages Vg to the gate terminals of the NMOSFETs 506 and 508. When either of the NMOSFETs 506 or 508 is biased to select the transistor off-state, the respective Vg must comprise a sufficiently large negative voltage so that the respective NMOSFET does not enter, or approach, an on-state due to the time varying applied voltages of the RF input signal RFin. The maximum power of the RF input signal RFin is thereby limited by the maximum magnitude of the gate bias voltage Vg (or, more generally, the gate-to-source operating voltage, Vgs) that the SOI NMOSFETs 506 and 508 can reliably sustain. For RF switching circuits such as those exemplified herein, the magnitude of Vgs(max)=|Vg|+|Vds(max)/2|, where Vds=Vd−Vs, and Vds(max) comprises the maximum Vds due to the high-power input signal voltage levels associated with the RF input signal RFin.

Exemplary bias voltages for the switching and shunting SOI NMOSFETs 506 and 508, respectively, may include the following: with $V_{th}$ approximately zero volts, Vg, for the on-state, of +2.5 V, and Vg, for the off-state, of −2.5 V. For these bias voltages, the SOI NMOSFETs may eventually operate in an accumulated charge regime when placed into their off-states. In particular, and as described above with reference to FIG. 2B, when the switching NMOSFET 506 is in the on-state, and the shunting NMOSFET 508 is biased in the off-state, the output signal RFout may become distorted by the nonlinear behavior of the off capacitance $C_{off}$ of the shunting NMOSFET 508 caused by the accumulated charge. Advantageously, the improved ACC MOSFETs made in accordance with the present teachings can be used to improve circuit performance, especially as it is adversely affected by the accumulated charge.

Figure 5B:
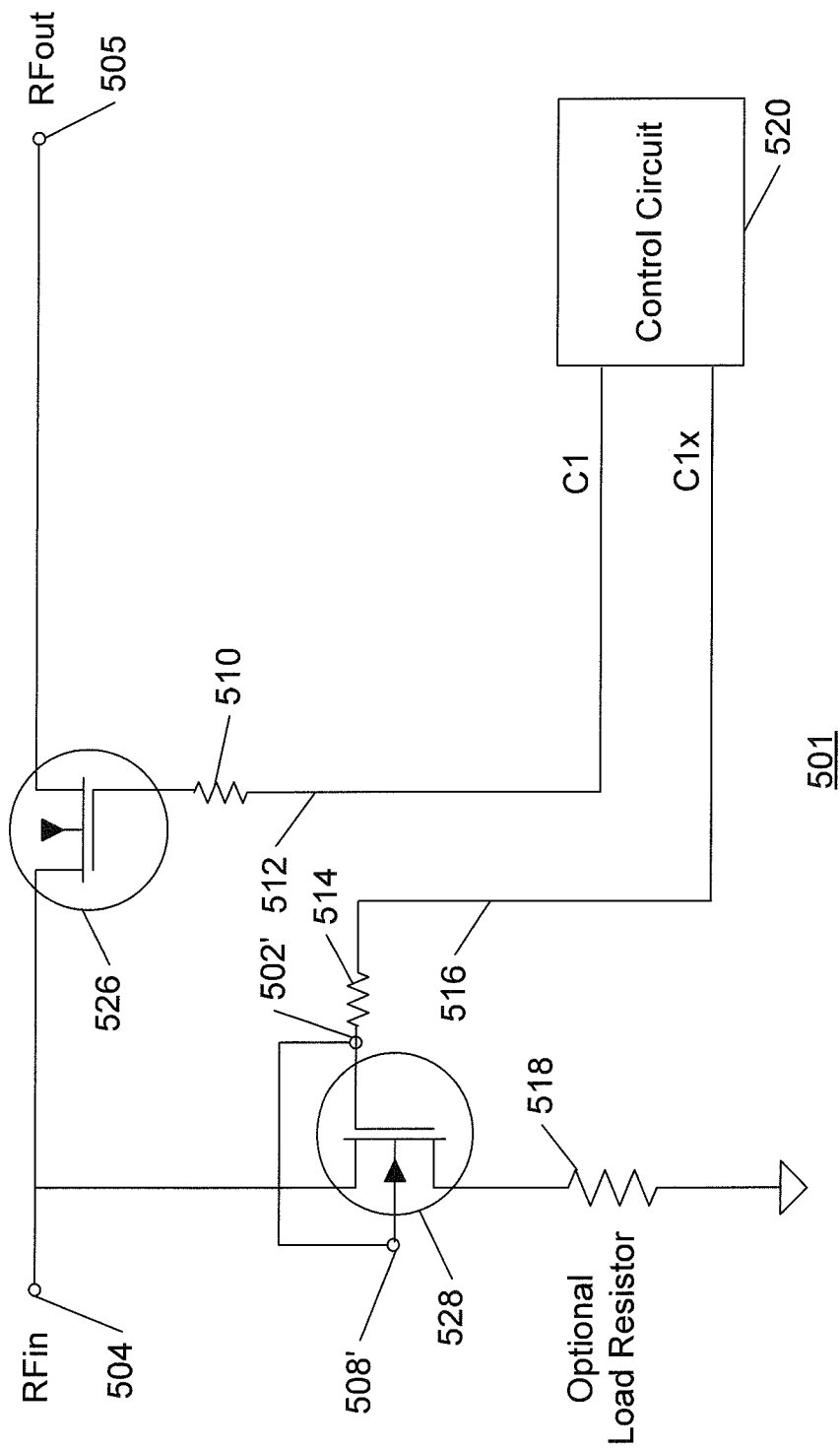
FIG. 5B is a schematic of an RF switch circuit adapted for improved performance using accumulated charge control, wherein the gate of a shunting SOI NMOSFET is coupled to an accumulated charge sink (ACS) terminal.

FIG. 5B is a schematic of an improved RF circuit 501 adapted for higher performance using the present accumulated charge reduction and control techniques. The switch circuit 501 differs from the prior art circuit 500 (FIG. 5A) in that the shunting NMOSFET 508 is replaced by a shunting ACC NMOSFET 528 made in accordance with the present teachings. The shunting ACC NMOSFET 528 is analogous to the ACC NMOSFET described above with reference to FIGS. 4A and 4B. Similarly, the gate, source, drain and ACC terminals of the shunting ACC NMOSFET 528 are analogous to the respective terminals of the ACC NMOSFET 300. With the exception of the improved switch performance afforded by the improved shunting ACC NMOSFET 528, the operation of the RF switch circuit 501 is very similar to the operation of the RF switch circuit 500 described above with reference to FIG. 5A.

Exemplary bias voltages for the switching NMOSFET 526 and the shunting ACC NMOSFET 528 may include: with $V_{th}$ approximately zero, Vg, for the on-state, of +2.5 V, and Vg, for the off-state, of −2.5 V. For these bias voltages, the SOI NMOSFETs may operate in an accumulated charge regime when placed into the off-state. However, when the switching NMOSFET 526 is in the on-state and the shunting ACC NMOSFET 528 is in the off-state, the output signal RFout at the output terminal 505 will not be distorted by nonlinear behavior of the off-state capacitance $C_{off}$ of the improved shunting ACC NMOSFET 528 due to the accumulated charge. When the shunting ACC NMOSFET 528 operates in the accumulated charge regime, the accumulated charge is removed via the ACS terminal 508'. More specifically, because the gate terminal 502' of the shunting ACC NMOSFET 528 is connected to the ACS terminal 508', the accumulated charge is removed or otherwise controlled as described above in reference to the simplified circuit of FIG. 4B. The control of the accumulated charge improves performance of the switch 501 by improving the linearity of the off transistor, shunting ACC NMOSFET 528, and thereby reducing the harmonic and intermodulation distortion of the RF output signal Rfout generated at the output terminal 505.

Figure 5C:
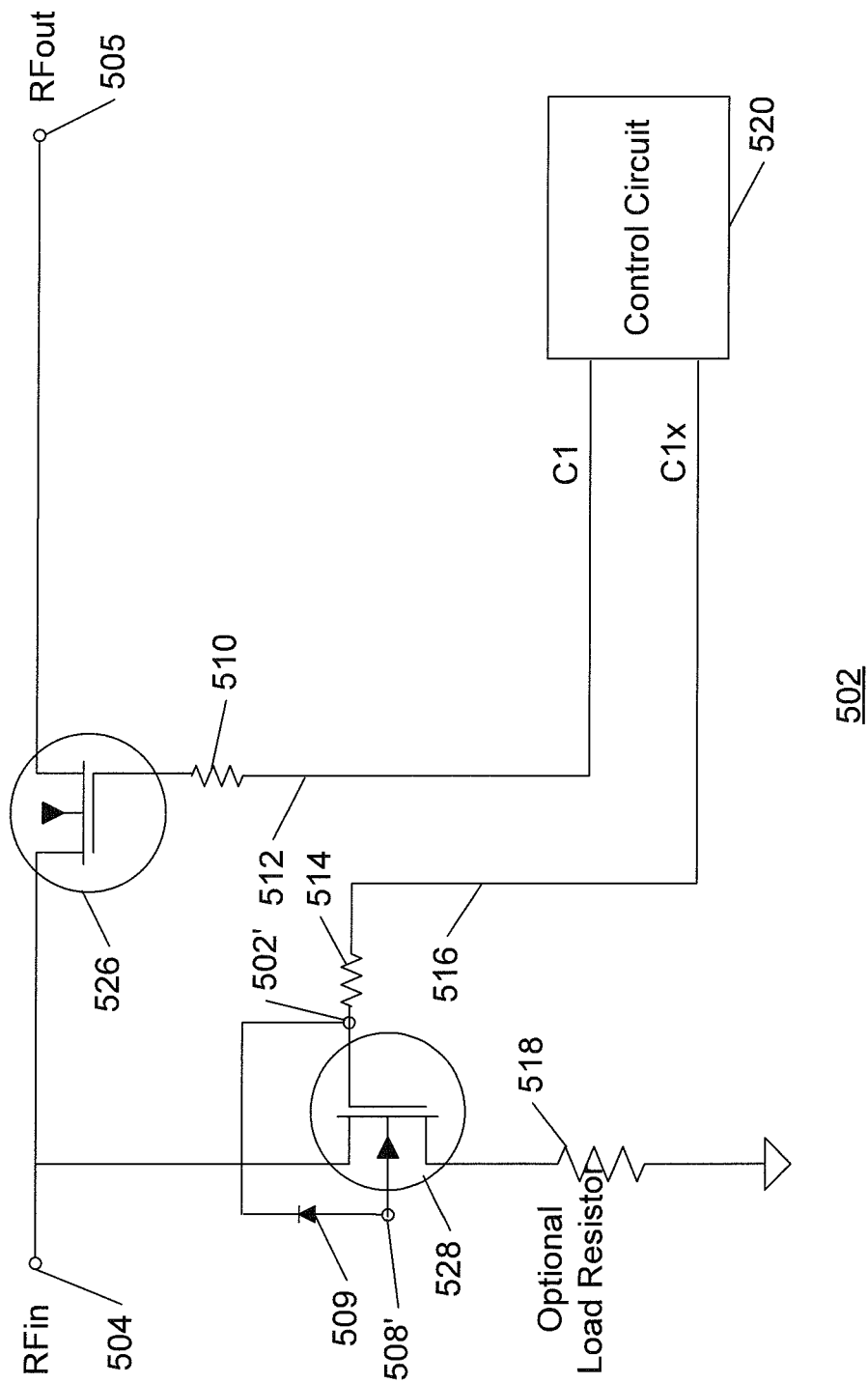
FIG. 5C is a schematic of an RF switch circuit adapted for improved performance using accumulated charge control, wherein the gate of a shunting SOI NMOSFET is coupled to an accumulated charge sink (ACS) terminal via a diode.

FIG. 5C is a schematic of another embodiment of an improved RF switch circuit 502 adapted for higher performance using the accumulated charge control techniques of the present disclosure. The switch circuit 502 differs from the prior art circuit 500 (FIG. 5A) in that the NMOSFET 508 is replaced by an ACC NMOSFET 528 made in accordance with the present teachings. The ACC NMOSFET 528 is analogous to the ACC NMOSFET 300 described above with reference to FIGS. 4A and 4C. Similarly, the gate, source, drain and ACC terminals of the ACC NMOSFET 528 are analogous to the respective terminals of the ACC NMOSFETs 300 described above with reference to FIGS. 4A and 4C. With the exception of the improved switch performance afforded by the improved ACC NMOSFET 528, the operation of the switch circuit 502 is very similar to the operations of the switch circuits 500 and 501 described above with reference to FIGS. 5A and 5B, respectively.

Exemplary bias voltages for the NMOSFET 526 and the ACC NMOSFET 528 may include the following: with $V_{th}$ approximately zero volts, Vg, for the on-state, of +2.5 V, and Vg, for the off-state, of −2.5 V. For these bias voltages, the SOI NMOSFETs 526, 528 may operate in an accumulated charge regime when placed into an off-state. However, when the NMOSFET 526 is in the on-state and the ACC NMOSFET 528 is in the off-state, the output signal RFout will not be distorted by nonlinear behavior of the off-state capacitance $C_{off}$ of the ACC NMOSFET 528 due to the accumulated charge. Because the gate terminal 502' of the ACC NMOSFET 528 is connected to the ACS terminal 508' via a diode 509, the accumulated charge is entirely removed, reduced or otherwise controlled, as described above with reference to FIG. 4C. Similar to the improved switch 501 described above with reference to FIG. 5B, control of the accumulated charge improves performance of the switch 502 by improving the linearity of the off transistor, 528, and thereby reducing the harmonic and intermodulation distortion of the RF output signal Rfout output of the RF output terminal 505. Connection of the diode 509 as shown may be desired in some embodiments for suppression of positive current flow into the ACC NMOSFET 528 when it is biased into an on-state, as described above with reference to FIG. 4C.

Figure 5D:
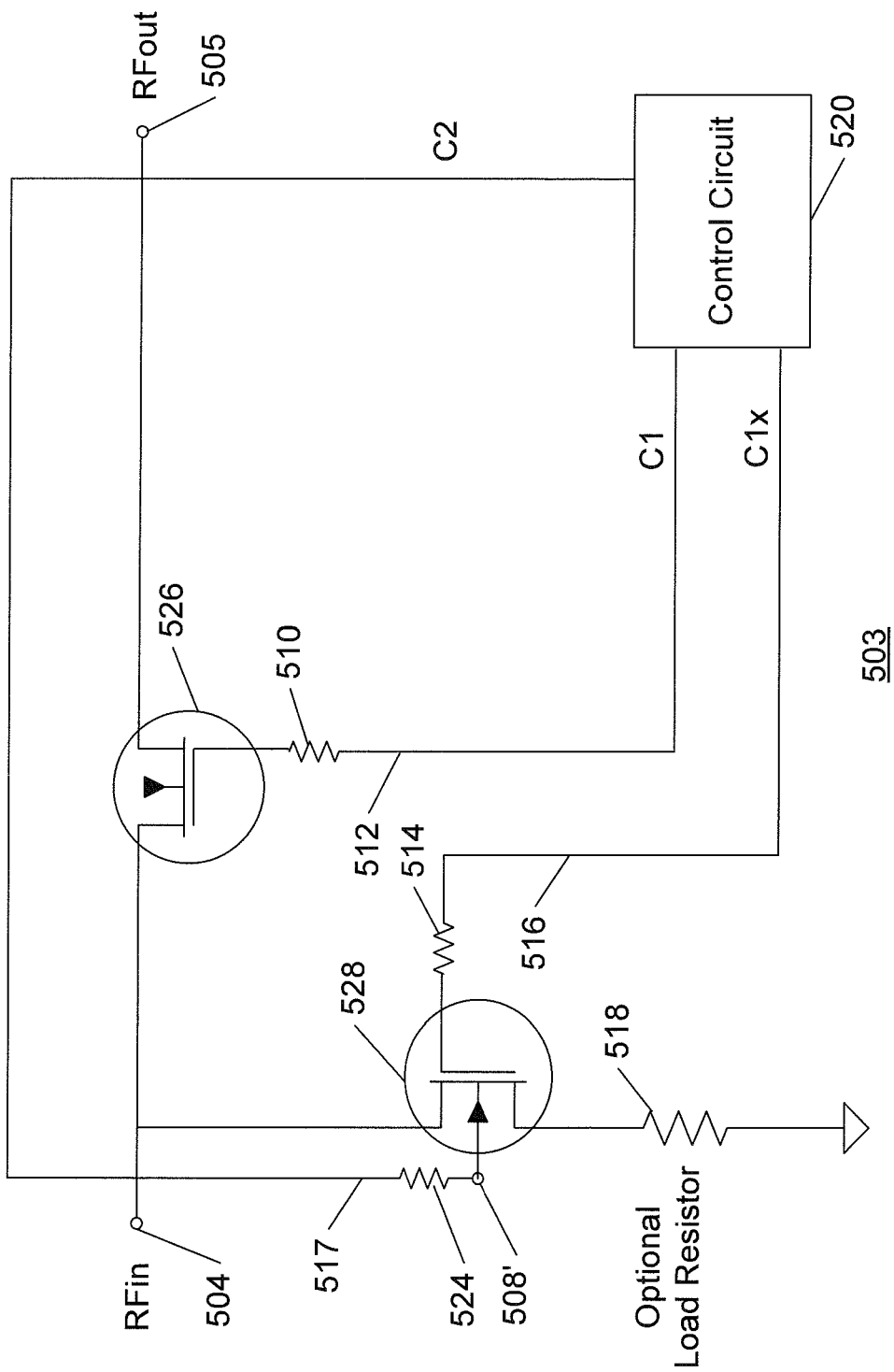
FIG. 5D is a schematic of an RF switch circuit adapted for improved performance using accumulated charge control, wherein the accumulated charge sink (ACS) terminal is coupled to a control circuit.

FIG. 5D is a schematic of another embodiment of an improved RF switch circuit 503 adapted for higher performance using the present accumulated charge control techniques. The switch circuit 503 differs from the prior art circuit 500 (FIG. 5A) in that the NMOSFET 508 of FIG. 5A is replaced by an ACC NMOSFET 528 made in accordance with the present teachings. The ACC NMOSFET 528 is analogous to the ACC NMOSFET described above with reference to FIGS. 4A and 4D. With the exception of the improved switch performance afforded by the improved ACC NMOSFET 528, the operation of the switch circuit 503 is very similar to the operations of the switch circuits 500, 501 and 502 described above with reference to FIGS. 5A-5C, respectively.

Exemplary bias voltages for the NMOSFET 526 and the ACC NMOSFET 528 may include the following: with $V_{th}$ approximately zero volts, Vg, for the on-state, of +2.5 V, and Vg, for the off-state, of −2.5 V. For these bias voltages, the SOI NMOSFETs 526, 528 may operate in an accumulated charge regime when placed into the off-state. However, when the NMOSFET 526 is in the on-state and the ACC NMOSFET 528 is in the off-state, the output signal RFout produced at the output terminal 505 will not be distorted by the nonlinear behavior of the off-state capacitance $C_{off}$ of the ACC NMOSFET 528 due to the accumulated charge. When the NMOSFET 528 operates in the accumulated charge regime, the accumulated charge is removed via the ACS terminal 508'. More specifically, because the ACS terminal 508' of the ACC NMOSFET 528 is electrically coupled to the control circuit 520 via the control line 517 (i.e., controlled by the control signal "C2" as shown), the accumulated charge can be eliminated, reduced or otherwise controlled by applying selected bias voltages to the ACS terminal 508' as described above with reference to FIG. 4D. Those skilled in the arts of electronic circuit design shall understand that a wide variety of bias voltage signals can be applied to the ACS terminal for the purpose of reducing or otherwise controlling the accumulated charge. The specific bias voltages may be adapted for use in a particular application. The control of the accumulated charge improves performance of the switch 503 by improving the linearity of the off-state transistor, 528, and thereby reducing the harmonic and intermodulation distortion of the RF output signal Rfout generated at the output terminal 505.

In the circuits described above with respect to FIGS. 5B-5D, the switching SOI MOSFETs 526 are shown and described as implemented using SOI MOSFETs of the prior art (i.e., they do not comprise ACC MOSFETs and therefore do not have an ACS terminal). Those skilled in the electronic device design arts shall understand and appreciate that in other embodiments of the disclosed method and apparatus, the prior art switching SOI MOSFETs 526 may be replaced, as desired or required, by ACC SOI MOSFETs made in accordance with the present disclosure. For example, in some embodiments of RF switches implemented using the ACC MOSFET of the present teachings, the RF switch comprises a single-pole double-throw RF switch. In this embodiment, the switching SOI MOSFETs (e.g., analogous to the switching SOI MOSFETs 526 described above with reference to FIGS. 5B-5D) may comprise ACC SOI MOSFETs. Such an implementation prevents nonlinear behavior of the off-state switching SOI MOSFETs (which is turned off when it is not selected as an input "pole") from detrimentally affecting the output of the RF signal as switched through the selected "pole". Implementation of the RF switches using switching ACC MOSFETs reduces the magnitude, drift, and voltage dependency of the off capacitance $C_{off}$ of the switching transistors. Consequently, and as described above in more detail, the switch performance characteristics, such as its isolation, insertion loss and drift characteristics, are also improved. This implementation is described in more detail below with reference to the RF switch circuit shown in FIG. 9. Many other examples will be apparent to those skilled in the arts of electronic circuits.

For example, as set forth above, although the exemplary RF switches have been described as being implemented using ACC SOI NMOSFET devices, they can also be implemented using ACC SOI PMOSFET devices. Further, although single-pole single-throw, and single-pole double-throw RF switches have been described above as examples of RF switches implemented in accordance with the present teachings, the present application encompasses any variation of single-pole multi-throw, multi-pole single-throw, and multi-pole multi-throw RF switch configurations. Those skilled in the RF switch design and fabrication arts shall recognize and appreciate that the present teachings can be used in implementing any convenient RF switch configuration design.

Exemplary RF Switch Implementation Using Stacked Transistors

In the exemplary embodiments of RF switch circuits described above, the switch circuits are implemented using a single SOI NMOSFET (e.g., the single SOI NMOSFET 506 of FIG. 5A, and the single SOI NMOSFET 526 of FIGS. 5B-5D) that selectively couples or blocks (i.e., electrically opens the circuit connection) the RF input signal to the RF output. Similarly, in the exemplary embodiments described above with reference to FIGS. 5A-5D, a single SOI NMOSFET (e.g., the single SOI NMOSFET 508 of FIG. 5A, and ACC SOI NMOSFET 528 of FIGS. 5B-5D) is used to shunt (FET in the on-state) or block (FET in the off-state) the RF input signal to ground. Commonly assigned U.S. Pat. No. 6,804,502, entitled "SWITCH CIRCUIT AND METHOD OF SWITCHING RADIO FREQUENCY SIGNALS", issued Oct. 12, 2004, describes RF switch circuits using SOI NMOSFETs implemented with stacked transistor groupings that selectively couple and block RF signals.

Figure 6:
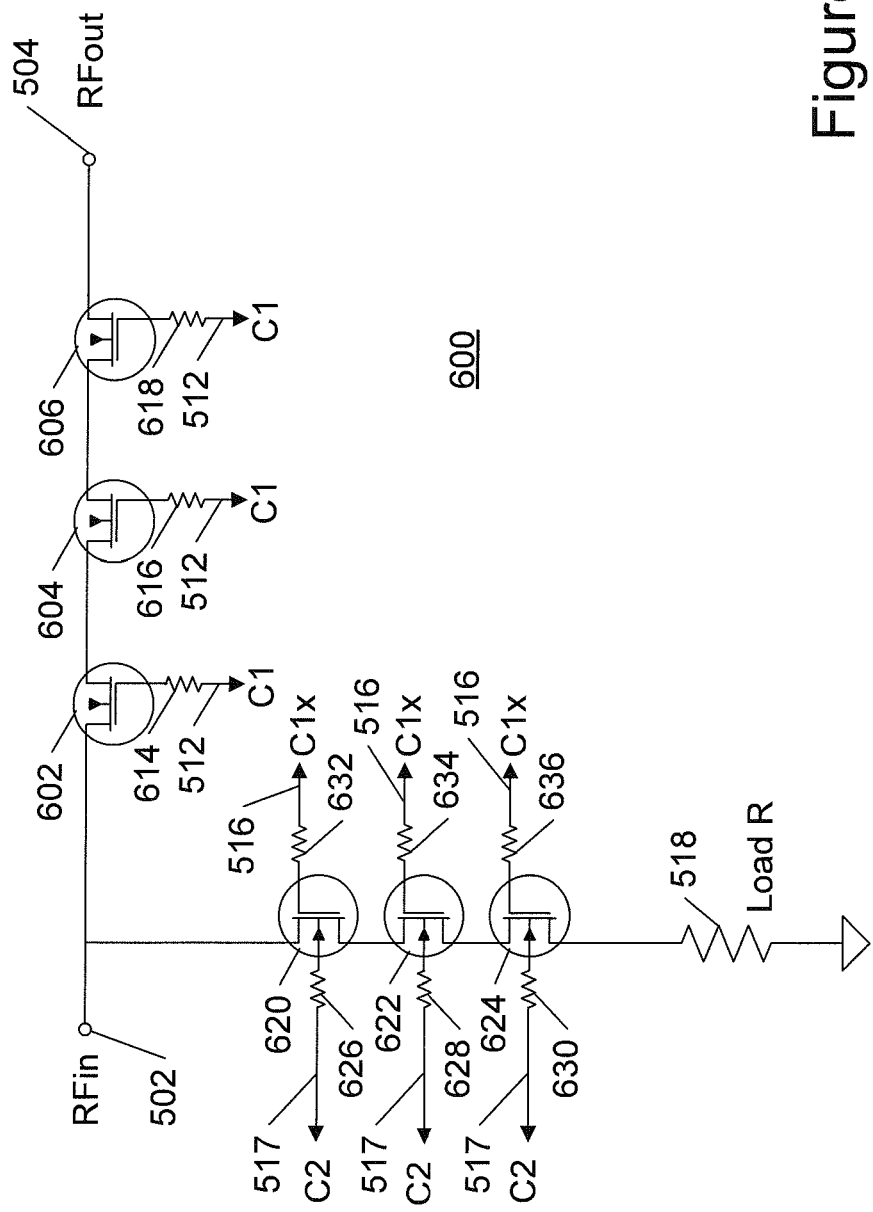
FIG. 6 is a schematic of an RF switch circuit including stacked MOSFETs, adapted for improved performance using accumulated charge control, wherein the accumulated charge sink (ACS) terminals of the shunting stacked MOSFETs are coupled to a control signal.

One example of how stacked NMOSFETs may be implemented in accordance with the teachings of the present disclosure is illustrated in FIG. 6. An RF switch circuit 600 is analogous to the RF switch circuit 503 of FIG. 5D, wherein the single SOI NMOSFET 526 is replaced by a stack of SOI NMOSFETs 602, 604 and 606. Similarly, the single ACC SOI NMOSFET 528 is replaced by a stack of ACC SOI NMOSFETs 620, 622 and 624. The control signal C2 is provided to the ACS terminals of the ACC SOI NMOSFETs 620, 622 and 624 via optional resistors 626, 628, and 630, respectively. The resistors 626, 628, and 630 may optionally be included in order to suppress parasitic RF signals between the stacked ACC SOI NMOSFETs 620, 622, and 624, respectively. The RF switch circuit 600 operates analogously to the operation of the RF switch circuit 503 described above with reference to FIG. 5D.

Three stacked ACC SOI NMOSFETs are shown in each ACC NMOSFET stack in the exemplary stacked RF switch circuit 600 of FIG. 6. A plurality of three ACC NMOSFETs is shown for illustrative purposes only, however, those skilled in the integrated circuit design arts will understand that an arbitrary plurality may be employed according to particular circuit requirements such as power handling performance, switching speed, etc. A smaller or larger plurality of stacked ACC NMOSFETs may be included in a stack to achieve a desired operating performance.

Other stacked RF switch circuits, adapted for accumulated charge control, analogous to the circuits described above with reference to FIGS. 5B-5D, may also be employed. Implementations of such circuits shall be obvious from the teachings above to those skilled in the electronic device design arts, and therefore are not described further herein. Moreover, is shall be obvious to those skilled in the electronic device design arts that, although a symmetrically stacked (i.e., having an equal number of shunting and switching transistors) RF switch is shown in the stacked RF switch of FIG. 6, the present inventive ACC method and apparatus is not so limited. The present teachings can be applied in implementing both symmetrically and asymmetrically stacked (having an unequal number of shunting and switching transistors) RF switches. The designer will readily understand how to use the ACC MOSFETs of the present disclosure in implementing asymmetrical, as well as symmetrical, RF switch circuits.

Exemplary Method of Operation

Figure 7:
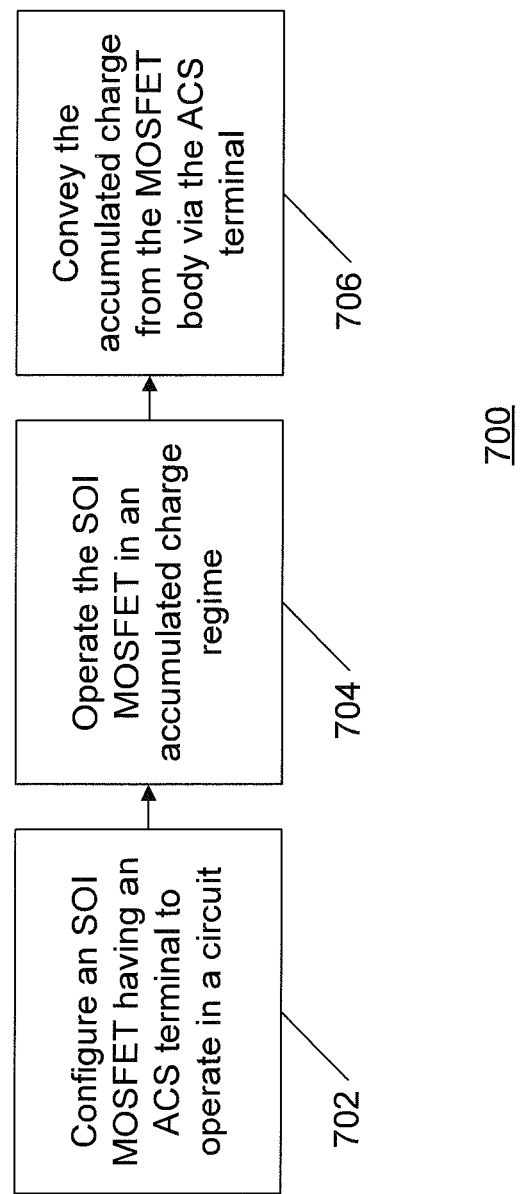
FIG. 7 shows a flowchart of an exemplary method of improving the linearity of an SOI MOSFET device using an accumulated charge sink in accordance with the present disclosure.

FIG. 7 illustrates an exemplary method 700 of improving the linearity of an SOI MOSFET having an accumulated charge sink (ACS) in accordance with the present disclosure. The method 700 begins at a STEP 702, whereat an ACC SOI MOSFET having an ACS terminal is configured to operate in a circuit. The ACS terminal may be operatively coupled to the gate of the SOI MOSFET (as described above with reference to FIGS. 4B, 4C, 5B and 5C), or to a control circuit (as described above with reference to FIGS. 4D and 5D). In other embodiments, the ACS terminal may be operatively coupled to any convenient accumulated charge sinking mechanism, circuit, or device as is convenient to the circuit or system designer. The method then proceeds to a step 704.

At the STEP 704, the ACC SOI MOSFET is controlled, at least part of the time, so that it operates in an accumulated charge regime. In most embodiments, as described above, the ACC MOSFET is operated in the accumulated charge regime by applying bias voltages that place the FET in an off-state condition. In one exemplary embodiment, the ACC SOI MOSFET comprises' an ACC SOI NMOSFET that is configured as part of a shunting circuit of an RF switch. According to this exemplary embodiment, the SOI NMOSFET may be operated in an accumulated charge regime after the shunting circuit is placed into an off-state by applying a negative bias voltage to the gate terminal of the ACC NMOSFET.

The method then proceeds to a STEP 706, whereat the accumulated charge that has accumulated in the channel region of the ACC MOSFET is removed or otherwise controlled via the ACS terminal. In this embodiment, the accumulated charge is conveyed to another circuit terminal and is thereby reduced or otherwise controlled. One such exemplary circuit terminal that can be used to convey the accumulated charge from the MOSFET body comprises a gate terminal of the ACC MOSFET (see, e.g., the description above with reference to FIGS. 4B, 4C, 5B and 5C). Another exemplary circuit terminal that can be used to remove or otherwise control the accumulated charge comprises the terminal of a control circuit (see, e.g., FIGS. 4D and 5D). As described in more detail above, removing or otherwise controlling the accumulated charge in the ACC MOSFET body improves the linearity of the off-state ACC MOSFET, which reduces the harmonic distortion and IMD of signals affected by the ACC MOSFET, and which, in turn, improves circuit and system performance In RF switch circuits, improvements (in both linearity and magnitude) are made to the off capacitance of shunting ACC MOSFET devices, which, in turn, improves the performance of the RF switch circuits. In addition to other switch performance characteristics, the harmonic and intermodulation distortions of the RF switch are reduced using the ACC method and apparatus of the present teachings.

Figure 8:
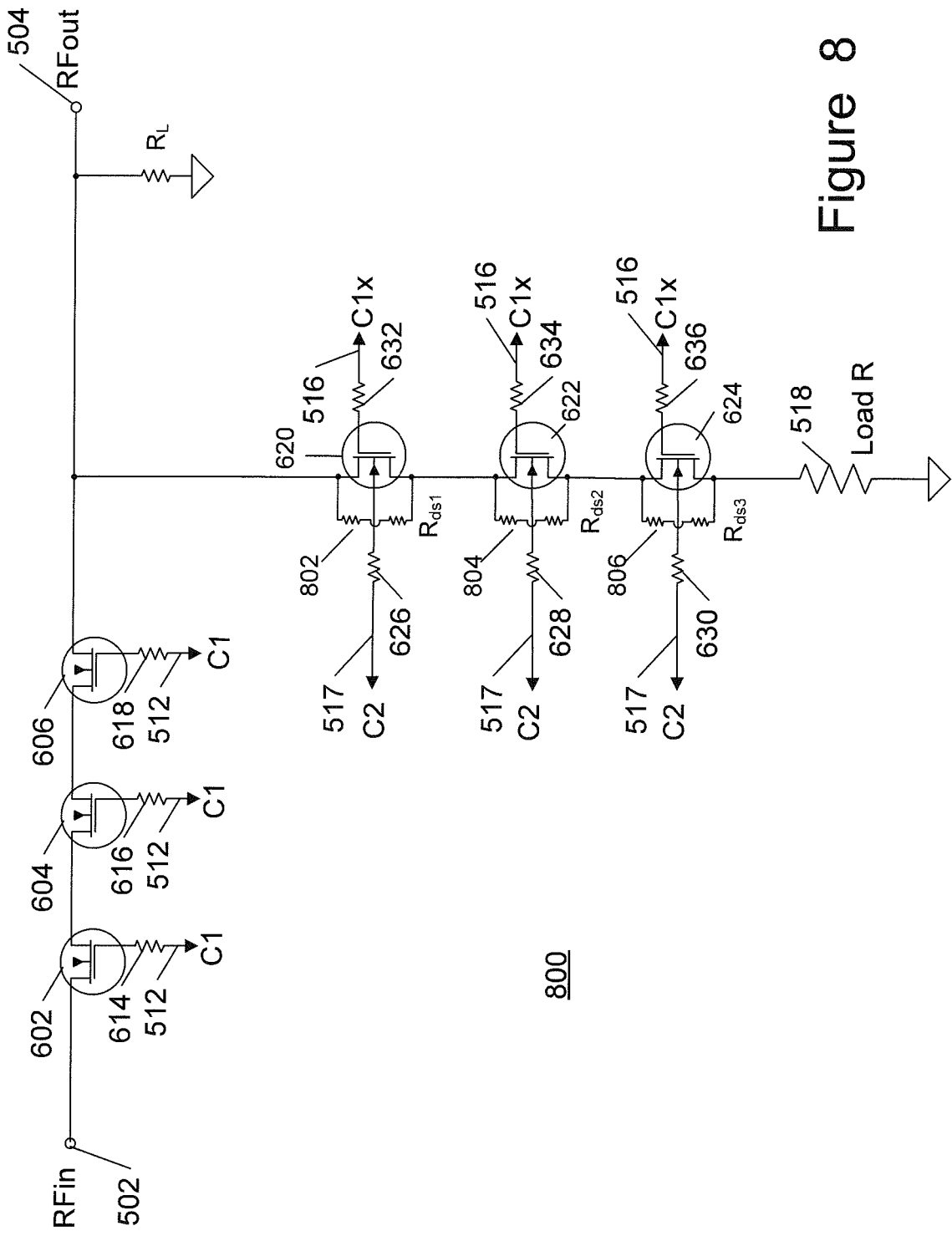
FIG. 8 shows a simplified circuit schematic of an exemplary embodiment of an RF switch circuit made in accordance with the present disclosure, wherein the RF switch circuit includes drain-to-source resistors between the drain and source of the ACC MOSFETs.
Figure 9:
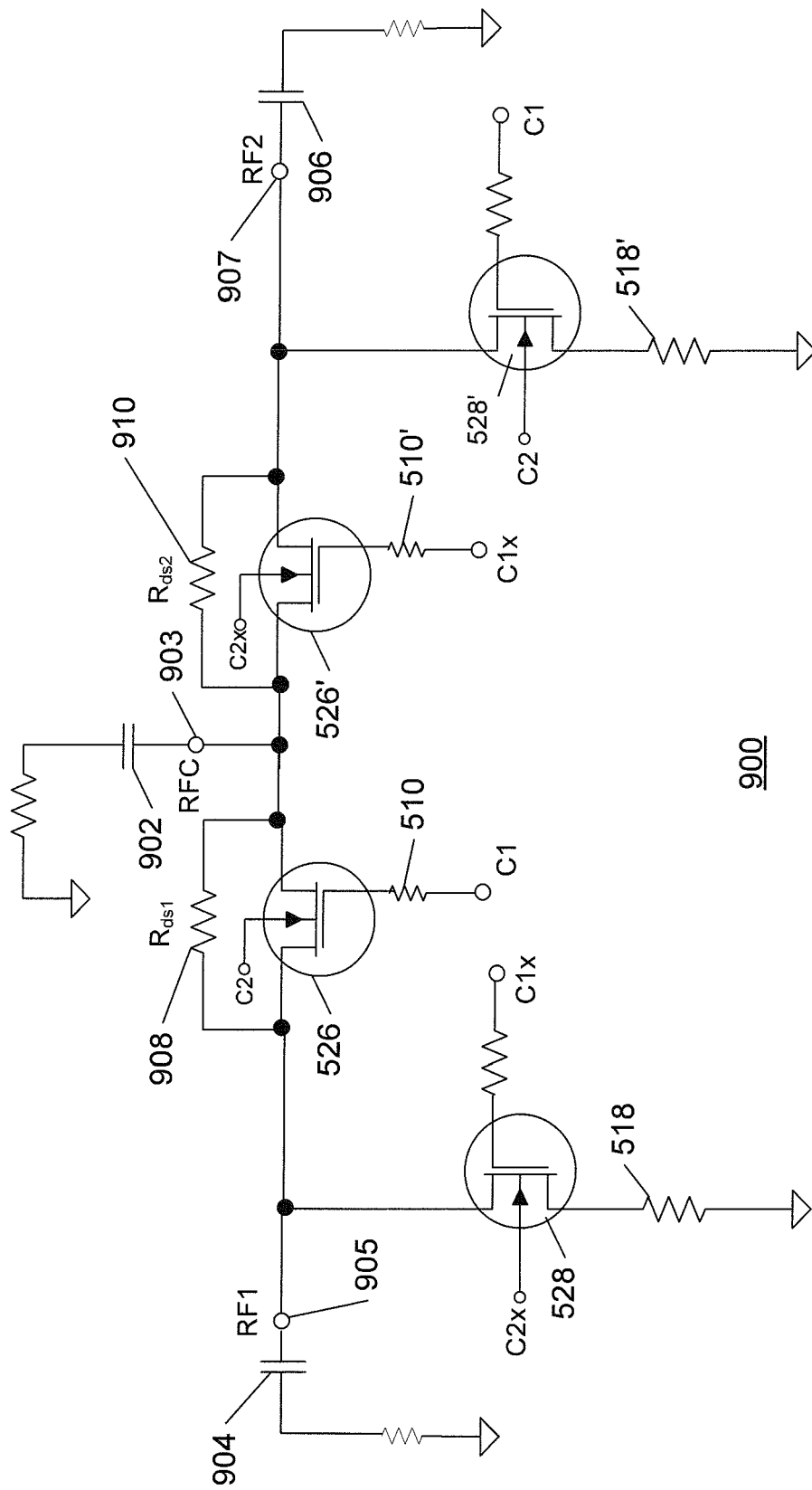
FIG. 9 shows a simplified schematic of an exemplary single-pole double-throw (SPDT) RF switch circuit made in accordance with the present disclosure, wherein drain-to-source resistors are shown across the switching ACC SOI MOSFETs.

FIGS. 8 and 9 show schematics of additional exemplary embodiments of RF switching circuits made in accordance with the disclosed method and apparatus for use in improving linearity of MOSFETs having an ACS. As described in more detail below with reference to FIGS. 8 and 9, in some exemplary embodiments of RF switch circuits made in accordance with the present disclosure, it may be desirable to include drain-to-source resistors, Rds, and thereby improve some switch performance characteristics when the switch is used in a particular application. These exemplary RF switch circuits are now described in more detail.

Exemplary RF Switch Implementations Using Stacked Transistors Having Source to Drain Resistors FIG. 8 shows one exemplary embodiment of an RF switch circuit 800 made in accordance with the present disclosure. As shown in FIG. 8, some embodiments of RF switches made in accordance with the present disclosure may include drain-to-source ($R_{ds}$) resistors electrically connected to the respective sources and drains of the ACC MOSFETs. For example, the exemplary switch 800 of FIG. 8 includes drain-to-source $R_{ds}$ resistors 802, 804, and 806 electrically connected to the respective sources and drains of the shunting ACC SOI NMOSFETs 620, 622, and 624, respectively. Motivation for use of the drain-to-source $R_{ds}$ resistors is now described.

As shall be appreciated by skilled persons from the present teachings, removal of the accumulated charge via the ACS terminal causes current to flow from the body of the ACC SOI MOSFET. For example, when a hole current flows from the body of an ACC SOI MOSFET via the ACS, an equal electron current flows to the FET source and/or drain. For some circuits (e.g., the RF switch circuit of FIG. 8), the sources and/or drains of the ACC SOI NMOSFETs are connected to other SOI NMOSFETs. Because off-state SOI NMOSFETs have a very high impedance (e.g., in the range of 1 Gohm for a 1 mm wide SOI NMOSFET), even a very small drain-to-source current (e.g., in the range of 1 nA) can result in an unacceptably large drain-to-source voltage Vds across the ACC SOI NMOSFET in satisfaction of Kirchhoff's well known current and voltage laws. In some embodiments, such as that shown in the RF switch circuits of FIGS. 8 and 9, such resultant very large drain-to-source voltages Vds undesirably impacts reliability and linearity of the ACC SOI NMOSFET. The drain-to-source resistors $R_{ds}$ provide a path between the ACC FET drain and source whereby currents associated with controlling the accumulated charge may be conducted away from the sources and drains of ACC SOI NMOSFETs when implemented in series with high impedance elements such as other ACC SOI NMOSFETs.

Exemplary operating voltages for the NMOSFETs 602-606 of FIG. 8, and the ACC NMOSFETs 620-624, may include the following: $V_{th}$ approximately zero volts, Vg, for the on-state, of +2.5 V, and Vg, for the off-state, of −2.5 V. In an exemplary embodiment, the ACC SOI NMOSFET 622 of FIG. 8 may have a width of 1 mm, and an electron-hole pair generation rate for accumulated charge producing a current of 10 pA/μm for operation in the accumulated charge regime. For the electron current supplied equally by the source and drain, and an impedance of the ACC SOI NMOSFETs 620 and 622 on the order of 1 Gohm, then an unacceptable bias of −5 V would result on the source and drain of the ACC SOI NMOSFET 622 without the presence of $R_{ds}$ resistors 802 and 806. This bias voltage would also be applied to the interior nodes of the ACC SOI NMOSFETs 620 and 624.

Even currents smaller than the exemplary currents may produce adverse affects on the operation of the RF switching circuit 800 by reducing Vgs and/or Vgd of the ACC SOI MOSFETs 620-624 in the off-state, thereby reducing the power handling capability and reliability of the circuit by increasing leakage (e.g., when either Vgs or Vgd approaches $V_{th}$), by increasing hot-carrier damage caused by excess leakage, etc. Linearity of the MOSFETs is also degraded by reducing Vgs and/or Vgd when either value approaches $V_{th}$.

Exemplary values for the $R_{ds}$ resistors 802 to 806 may be selected in some embodiments by selecting a value approximately equal to the resistance of the gate resistors 632-636 divided by the number of ACC SOI NMOSFETs in the stack (in the exemplary embodiment, there are three ACC FETs in the stack). More generally, the value of the $R_{ds}$ resistors may be equal to the gate resistor value divided by the number of ACC SOI NMOSFETs in the stack. In one example, a stack of eight ACC SOI NMOSFETs may have gate resistors of 80 kohm and $R_{ds}$ resistors of 10 kohm.

In some embodiments, the $R_{ds}$ resistors may be selected so that they do not adversely affect switch performance characteristics, such as, for example, the insertion loss of the switch 800 due to the off-state ACC SOI NMOSFETs. For example, for a net shunt resistance greater than 10 kohm, the insertion loss is increased by less than 0.02 dB.

In other embodiments, the $R_{ds}$ resistors may be implemented in circuits comprising a single ACC SOI MOSFET (as contrasted with the stacked shunting configuration exemplified in FIG. 8 by the shunting ACC FETs 620, 622 and 624). For example, such circuits may be desirable if there are other high-impedance elements configured in series with an ACC SOI MOSFET that may cause a significant bias voltage to be applied to the source or drain as a result of the current flow created when removing or otherwise controlling accumulated charge. One exemplary embodiment of such a circuit is shown in FIG. 9.

FIG. 9 shows an exemplary single-pole double-throw (SPDT) RF switch circuit 900 made in accordance with the present teachings. As shown in FIG. 9, a DC blocking capacitor 904 is connected to a first RF input node 905 that receives a first RF input signal RF1. Similarly, a DC blocking capacitor 906 is connected to a second RF input node 907 that receives a second RF input signal RF2. Further, a DC blocking capacitor 902 is electrically connected to an RF common output node 903 that provides an RF common output signal (RFC) selectively conveyed to the node RFC 903 by the switch circuit 900 from either the first RF input node 905 or the second RF input node 907 (i.e., RFC either outputs RF1 or RF2, depending upon the operation of the switch as controlled by the control signals C1 and C1x described below in more detail).

A first control signal C1 is provided to control the operating states of the ACC SOI NMOSFETs 526 and 528' (i.e., C1 selectively operates the FETs in the on-state or the off-state). Similarly, a second control signal C1x is provided to control the operating states of the ACC SOI NMOSFETs 528 and 526'. As is well known, and as described for example in the above incorporated commonly assigned U.S. Pat. No. 6,804,502, the control signals C1 and C1x are generated so that the ACC SOI NMOSFETs 526 and 528' are in an on-state when the ACC SOI NMOSFETs 528 and 526' are in an off-state, and vice versa. This configuration allows the RF switch circuit 900 to selectively convey either the signal RF1 or RF2 to the RF common output node 903.

A first ACS control signal C2 is configured to control the operation of the ACS terminals of the SOI NMOSFETs 526 and 528'. A second ACS control signal C2x is configured to control the ACS terminals of the ACC SOI NMOSFETs 528 and 526'. The first and second ACS control signals, C2 and C2x, respectively, are selected so that the ACSs of the associated and respective NMOSFETs are appropriately biased in order to eliminate, reduce, or otherwise control their accumulated charge when the ACC SOI NMOSFETs operate in an accumulated charge regime.

As shown in the RF switch circuit 900 of FIG. 9, in some embodiments, an $R_{ds}$ resistor 908 is electrically connected between the source and drain of the switching ACC NMOSFET 526. Similarly, in some embodiments, an $R_{ds}$ resistor 910 is electrically connected between the source and drain of the switching ACC NMOSFET 526'. According to this example, the circuit 900 is operated so that either the shunting ACC NMOSFET 528 or the shunting ACC NMOSFET 528' operate in an on-state at any time (i.e., at least one of the input signals RF1 at the node 905 or RF2 at the node 907 is always conveyed to the RFC node 903), thereby providing a low-impedance path to ground for the node 905 or 907, respectively. Consequently, either the $R_{ds}$ resistor 908 or the $R_{ds}$ resistor 910 provides a low-impedance path to ground from the RF common node 903, thereby preventing voltage bias problems caused as a result of ACC current flow into the nodes 903, 905 and 907 that might otherwise be caused when using the DC blocking capacitors 902, 904 and 906.

Additional Exemplary Benefits Afforded by the ACC MOSFETs of the Present Disclosure As described above, presence of the accumulated charge in the bodies of the SOI MOSFETs can adversely affect the drain-to-source breakdown voltage (BVDSS) performance characteristics of the floating body MOSFETs. This also has the undesirable effect of worsening the linearity of off-state MOSFETs when used in certain circuits such as RF switching circuits. For example, consider the shunting SOI NMOSFET 528 shown in FIG. 9. Further consider the case wherein the shunting NMOSFET 528 is implemented with a prior art SOI NMOSFET, rather than with the ACC NMOSFET made in accordance with the present teachings. Assume that the RF transmission line uses a 50-ohm system. With small signal inputs, and when the NMOSFET 528 operates in an off-state, the prior art off-state shunting NMOSFET 528 may introduce harmonic distortion and/or intermodulation distortion in the presence of multiple RF signals This will also introduce a noticeable loss of signal power.

When sufficiently large signals are input that cause the NMOSFET 528 to enter a BVDSS regime, some of the RF current is clipped, or redirected through the NMOSFET 528 to ground, resulting in a loss of signal power. This current "clipping" causes compression behavior that can be shown, for instance, in a RF switch "Pout vs. Pin" plot. This is frequently characterized by P1 dB, wherein the insertion loss is increased by 1.0 dB over the small-signal insertion loss. This is an obvious indication of nonlinearity of the switch. In accordance with the present disclosed method and apparatus, removing, reducing or otherwise controlling the accumulated charge increases the BVDSS point. Increases to the BVDSS point of the NMOSFET 528 commensurately increases the large-signal power handling of the switch. As an example, for a switch, doubling the BVDSS voltage of the ACC NMOSFET increases the P1 dB point by 6 dB. This is a significant accomplishment as compared with the prior art RF switch designs.

In addition, as described above in more detail, presence of the accumulated charge in SOI MOSFET body adversely impacts the magnitude of Coff and also takes time to form when the FET is switched from an on-state to an off-state. In terms of switch performance, the nonlinearity of $C_{off}$ adversely impacts the overall switch linearity performance (as described above), and the magnitude of $C_{off}$ adversely affects the small-signal performance parameters such as insertion loss, insertion phase (or delay), and isolation. By reducing the magnitude of $C_{off}$ using the present disclosed method and apparatus, the switch (implemented with ACC MOSFETs) has reduced insertion loss due to lowered parasitic capacitance, reduced insertion phase (or delay), again due to lowered parasitic capacitance, and increased isolation due to less capacitive feedthrough.

The ACC MOSFET also improves the drift characteristic of SOI MOSFETs as pertains to the drift of the small-signal parameters over a period of time. As the SOI MOSFET takes some time to accumulate the accumulated charge when the switch is off, the $C_{off}$ capacitance is initially fairly small. However, over a period of time while operated in the accumulated charge regime, the off-state capacitance $C_{off}$ increases toward a final value. The time it takes for the NMOSFET to reach a full accumulated charge state depends on the electron-hole pair (EHP) generation mechanism. Typically, this time period is on the order of approximately hundreds of milliseconds for thermal EHP generation at room temperature, for example. During this charge-up time period, the insertion loss and insertion phase increase. Also, during this time period, the isolation decreases. As is well known, these are undesirable phenomena in standard SOI MOSFET devices. These problems are alleviated or otherwise mitigated using the ACC NMOSFETs and related circuits described above.

In addition to the above-described benefits afforded by the disclosed ACC MOSFET method and apparatus, the disclosed techniques also allow the implementation of SOI MOSFETs having improved temperature performance, improved sensitivity to Vdd variations, and improved sensitivity to process variations. Other improvements to the prior art SOI MOSFETs afforded by the present disclosed method and apparatus will be understood and appreciated by those skilled in the electronic device design and manufacturing arts.

Exemplary Fabrication Methods

In one embodiment of the present disclosure, the exemplary RF switches described above may be implemented using a fully insulating substrate semiconductor-on-insulator (SOI) technology. Also, as noted above, in addition to the commonly used silicon-based systems, some embodiments of the present disclosure may be implemented using silicon-germanium (SiGe), wherein the SiGe is used equivalently in place of silicon.

In some exemplary embodiments, the MOSFET transistors of the present disclosure may be implemented using "Ultra-Thin-Silicon (UTSi)" (also referred to herein as "ultrathin silicon-on-sapphire") technology. In accordance with UTSi manufacturing methods, the transistors used to implement the inventive methods disclosed herein are formed in an extremely thin layer of silicon in an insulating sapphire wafer. The fully insulating sapphire substrate enhances the performance characteristics of the inventive RF circuits by reducing the deleterious substrate coupling effects associated with non-insulating and partially insulating substrates. For example, insertion loss improvements may be realized by lowering the transistor on-state resistances and by reducing parasitic substrate conductance and capacitance. In addition, switch isolation is improved using the fully insulating substrates provided by UTSi technology. Owing to the fully insulating nature of silicon-on-sapphire technology, the parasitic capacitance between the nodes of the RF switches is greatly reduced as compared with bulk CMOS and other traditional integrated circuit manufacturing technologies.

Examples of and methods for making silicon-on-sapphire devices that can be implemented in the MOSFETs and circuits described herein, are described in U.S. Pat. No. 5,416,043 ("Minimum charge FET fabricated on an ultrathin silicon on sapphire wafer"); U.S. Pat. No. 5,492,857 ("High-frequency wireless communication system on a single ultrathin silicon on sapphire chip"); U.S. Pat. No. 5,572,040 ("High-frequency wireless communication system on a single ultrathin silicon on sapphire chip"); U.S. Pat. No. 5,596,205 ("High-frequency wireless communication system on a single ultrathin silicon on sapphire chip"); U.S. Pat. No. 5,600,169 ("Minimum charge FET fabricated on an ultrathin silicon on sapphire wafer"); U.S. Pat. No. 5,663,570 ("High-frequency wireless communication system on a single ultrathin silicon on sapphire chip"); U.S. Pat. No. 5,861,336 ("High-frequency wireless communication system on a single ultrathin silicon on sapphire chip"); U.S. Pat. No. 5,863,823 ("Self-aligned edge control in silicon on insulator"); U.S. Pat. No. 5,883,396 ("High-frequency wireless communication system on a single ultrathin silicon on sapphire chip"); U.S. Pat. No. 5,895,957 ("Minimum charge FET fabricated on an ultrathin silicon on sapphire wafer"); U.S. Pat. No. 5,920,233 ("Phase locked loop including a sampling circuit for reducing spurious side bands"); U.S. Pat. No. 5,930,638 ("Method of making a low parasitic resistor on ultrathin silicon on insulator"); U.S. Pat. No. 5,973,363 ("CMOS circuitry with shortened P-channel length on ultrathin silicon on insulator"); U.S. Pat. No. 5,973,382 ("Capacitor on ultrathin semiconductor on insulator"); and U.S. Pat. No. 6,057,555 ("High-frequency wireless communication system on a single ultrathin silicon on sapphire chip"). All of these referenced patents are incorporated herein in their entirety for their teachings on ultrathin silicon-on-sapphire integrated circuit design and fabrication.

Similarly to other bulk and SOI CMOS processes, an SOS enhancement mode NMOSFET, suitable for some embodiments of the present disclosure, may, in some embodiments, be fabricated with a p-type implant into the channel region with n-type source and drain regions, and may have a threshold voltage of approximately +500 mV. The threshold voltage is directly related to the p-type doping level, with higher doping resulting in higher thresholds. Similarly, the SOS enhancement mode PMOSFET may, in some exemplary embodiments, be implemented with an n-type channel region and p-type source and drain regions. Again, the doping level defines the threshold voltage with higher doping resulting in a more negative threshold.

In some exemplary embodiments, an SOS depletion-mode NMOSFET, suitable for some embodiments of the present disclosure, may be fabricated by applying the p-type channel-implant mask to the n-type transistor, resulting in a structure that has n-type channel, source, and drain regions and a negative threshold voltage of approximately −500 mV. Similarly, in some exemplary embodiments, a suitable depletion-mode PMOSFET may be implemented by applying the n-type channel-implant mask to the p-type transistor, resulting in a structure that has p-type channel, source, and drain regions and a positive threshold voltage of approximately +500 mV.

As noted in the background section above, the present ACC MOSFET apparatus can also be implemented using any convenient semiconductor-on-insulator technology, included, but not limited to, silicon-on-insulator, silicon-on-sapphire, and silicon-on-bonded wafer technology. One such silicon-on-bonded wafer technique uses "direct silicon bonded" (DSB) substrates. Direct silicon bond (DSB) substrates are fabricated by bonding and electrically attaching a film of single-crystal silicon of differing crystal orientation onto a base substrate. Such implementations are available from the Silicon Genesis Corporation headquartered in San Jose, Calif. As described at the Silicon Genesis Corporation website (publicly available at "www.sigen.com"), silicon-on-bonded wafer techniques include the so-called Nano-Cleave™ bonding process which can be performed at room temperature. Using this process, SOI wafers can be formed with materials having substantially different thermal expansion coefficients, such as in the manufacture of Germanium-on-Insulator wafers (GeOI). Exemplary patents describing silicon-on-bonded wafer implementations are as follows: U.S. Pat. No. 7,056,808, issued Jun. 6, 2006 to Henley, et al.; U.S. Pat. No. 6,969,668, issued Nov. 29, 2005 to Kang, et al.; U.S. Pat. No. 6,908,832, issued Jun. 21, 2005 to Farrens et al.; U.S. Pat. No. 6,632,724, issued Oct. 14, 2003 to Henley, et al. and U.S. Pat. No. 6,790,747, issued Sep. 14, 2004 to Henley, et al. All of the above-cited patents are incorporated by reference herein for their teachings on techniques and methods of fabricating silicon devices on bonded wafers.

A reference relating to the fabrication of enhancement-mode and depletion-mode transistors in SOS is "CMOS/SOS/LSI Switching Regulator Control Device," Orndorff, R. and Butcher, D., Solid-State Circuits Conference, Digest of Technical Papers, 1978 IEEE International, Volume XXI, pp. 234-235, February 1978. The "Orndorff" reference is hereby incorporated in its entirety herein for its techniques on the fabrication of enhancement-mode and depletion-mode SOS transistors.

Embodiments of Methods and Apparatuses for Improving Linearity Characteristics in Accordance with the Present CIP The present CIP describes methods and apparatuses for improving linearity characteristics of ACC FETs. Persons skilled in the art of electronics devices will appreciate that the teachings herein apply equally to NMOSFETs and PMOSFETs and other similar devices. For simplicity, the embodiments and examples presented herein for illustrative purposes may include only NMOSFETs, unless otherwise noted. By making well known changes to dopants, charge carriers, polarity of bias voltages, etc., persons skilled in the art of electronic devices will easily understand how these embodiments and examples may be adapted for use with PMOSFETs and other similar devices.

Research shows that the above-described ACC field-effect-transistors (FETs) exhibit linearity sensitivity when the ACC FETs are in an OFF state. This linearity sensitivity is in large part caused by body-gate potential difference when the ACC FET is turned OFF. This sensitivity is most clearly defined as degradation in second and third order inter-modulation harmonic distortion, although it may encompass other signal degradation as well. In many implementations, body-to-gate voltage ($V_{BG}$) is set according to the diode voltage drop, a value that is dependent on body current. Because body current has a delta of several orders of magnitude, $V_{BG}$ likewise varies accordingly. Evidence suggests that parasitic MOS capacitance in the ACS region causes the observed linearity sensitivity. In order to overcome the current sensitivity to linearity, various combinations of two methods are described that provide improvement in the linearity characteristics of the above-described ACC FETs.

The methods and apparatus described herein provide improvements to FET linearity characteristics by modifying the above-described accumulated charge control (ACC) FETs. Harmonic performance is improved using the presently disclosed improved methods and apparatus. In this improved method of using ACSs to improve harmonic performance, the body-to-gate potential sensitivity provides an impetus for providing improved solutions. Because the implant within the ACS itself generates harmonic interference at the desired range of operating voltage in the above described methods and apparatus, an improved method and apparatus is defined as an optimization of using ACSs to improve even and odd harmonics.

An overview of two methods providing linearity improvement is now presented. The first method comprises controlling the doping levels and the doping materials of the implant (also referred to herein as "improved body contact") in the ACS region, so that the worst case harmonic peak is shifted away from standard or desired operating conditions. This method is described in additional detail in the section below entitled "Modification to ACS Implant." The second method comprises providing a structure that cancels, in part or entirely, the voltage drop across parasitic capacitance between the body and the gate of the MOSFET having an ACS. In such a structure, voltages across non-linear parasitic capacitance teens are consequently set to zero, which advantageously nullifies the generation of non-linearity altogether. This method is described in additional detail in the section below entitled "Dual ACS Device Implementation with AC short."

Modification to ACS Implant

By altering the doping type and the doping levels of the implant in the ACS region, the worst-case peak deviating from linearity can be moved away from standard operating conditions. More specifically, modifications of the implants can move the worst-case harmonic peak either to more negative bias voltages, or closer to zero bias condition. Because each direction has its advantages and disadvantages, there is room for tunability to the application specifications. Characterization of a variety of implants would provide for the desired tunability in future applications.

In silicon processes, selecting different types of the implant and tuning the implant levels will shift the worst-case harmonic peak away from desired operating conditions. More accurately, this shifts the body voltage worst-case harmonics peak away from approximate operational voltage magnitudes to values more or less than operational voltages (a shift from $V_{B_{worst}} \sim V_{B_{operational}}$ to $V_{B_{worst}} < V_{B_{operational}}$ or $V_{B_{worst}} > V_{B_{operational}}$). The N-type and P-type implants are standard process applicable. Even and odd harmonic improvements were seen throughout all testing results.

Figure 10B:
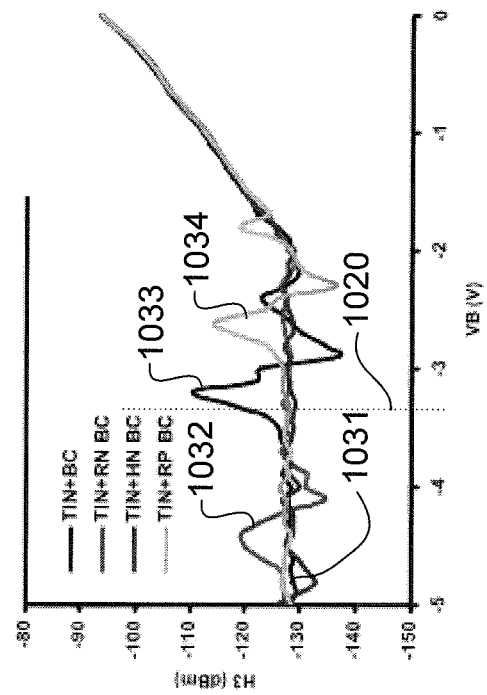
FIG. 10B shows the third order harmonic response on an ACC MOSFET with various dopants and dopant levels in the ACS region.
Figure 10A:
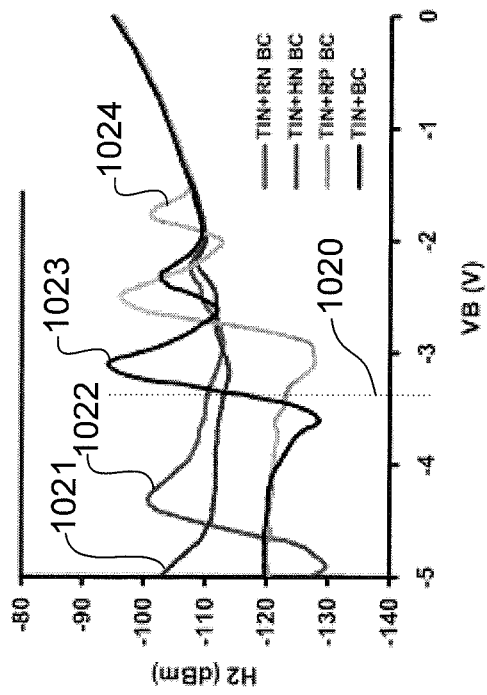
FIG. 10A shows the second order harmonic response on an ACC MOSFET with various dopants and dopant levels in the ACS region.

FIGS. 10A and 10B show the harmonic response of an ACC MOSFET versus body bias voltage with various types of dopants and dopant levels adjustment of the implant in the ACS region. FIG. 10A shows the second harmonic response and FIG. 10B shows the third harmonic response, where vertical line 1020 in both figures represents the operational gate bias voltage of approximately −3.3 volts. Note that in FIGS. 10A and 10B, TIN (thick oxide intrinsic NMOSFET) refers to the processes in which a thick oxide was used to fabricate the NMOSFET under test and the device is an intrinsic NMOSFET. The testing results presented in FIGS. 10A and 10B demonstrate how adjusting the implant in the ACS region shifts the curves of the harmonic responses from the results of an NMOSFET without any engineering in the ACS implant which correspond to Curve 1023 in FIG. 10A and Curve 1033 in FIG. 10B. As shown by FIGS. 10A and 10B, a significant nonlinear response (i.e., a "harmonic wrinkle") occurs around the operational voltage of the device due to the formation of a parasitic MOS capacitor in the ACS region which is turned on when the bias voltage difference between gate and body terminals is approximately zero. Curve 1021 in FIG. 10A and Curve 1031 in FIG. 10B show the results from heavily doped P-type implant in the ACS region. Curve 1022 in FIG. 10A and Curve 1032 in FIG. 10B show the results from lightly doped P-type implant. Curve 1023 in FIG. 10A and Curve 1033 in FIG. 10B show the results from lightly-doped N-type implant. As can be seen from FIGS. 10A and 10B, P-type implants push the worst case harmonic peak toward more negative operational voltage region, while N-type implants push the peak closer to zero bias condition.

As briefly discussed above, the non-linear harmonic response is believed to arise from the parasitic MOS capacitance in the ACS region. Adjusting the implant in the ACS region allows for the voltage threshold in which the parasitic MOS capacitor is turned on to be moved out of the desired operational voltage range to achieve a linear or near-linear response within the specified operating range.

By selecting and controlling the dopant material and dopant levels in the ACS region, undesirable harmonic responses can be moved away from the operational regions of an ACC MOSFET. The adjustment of the implant in the ACS region may be done with nearly any embodiment of an ACC MOSFET in nearly any configuration, such as those discussed above with reference to FIGS. 3A to 3J. Also, as is well-known to those skilled in the electronic device design arts, in other embodiments, an ACC NMOSFET or ACC PMOSFET can be implemented by selecting the appropriate dopant materials used to implement the various FET component regions and then tuning the dopant level of the ACS region to achieve the desired harmonic response.

Dual ACS Device Implementation with AC Short

In accordance with the present method and apparatus, a dual ACS (or "body contact") device retains similarities to a standard H-gate FET device (such as the device shown in FIG. 3K), however, the following proposed layout maintains minimum size connections for the ACS regions contact with the body region. This allows for layouts to be created at the minimum edge of polysilicon spacing, which is easily achieved when the contact is removed.

Figure 15:
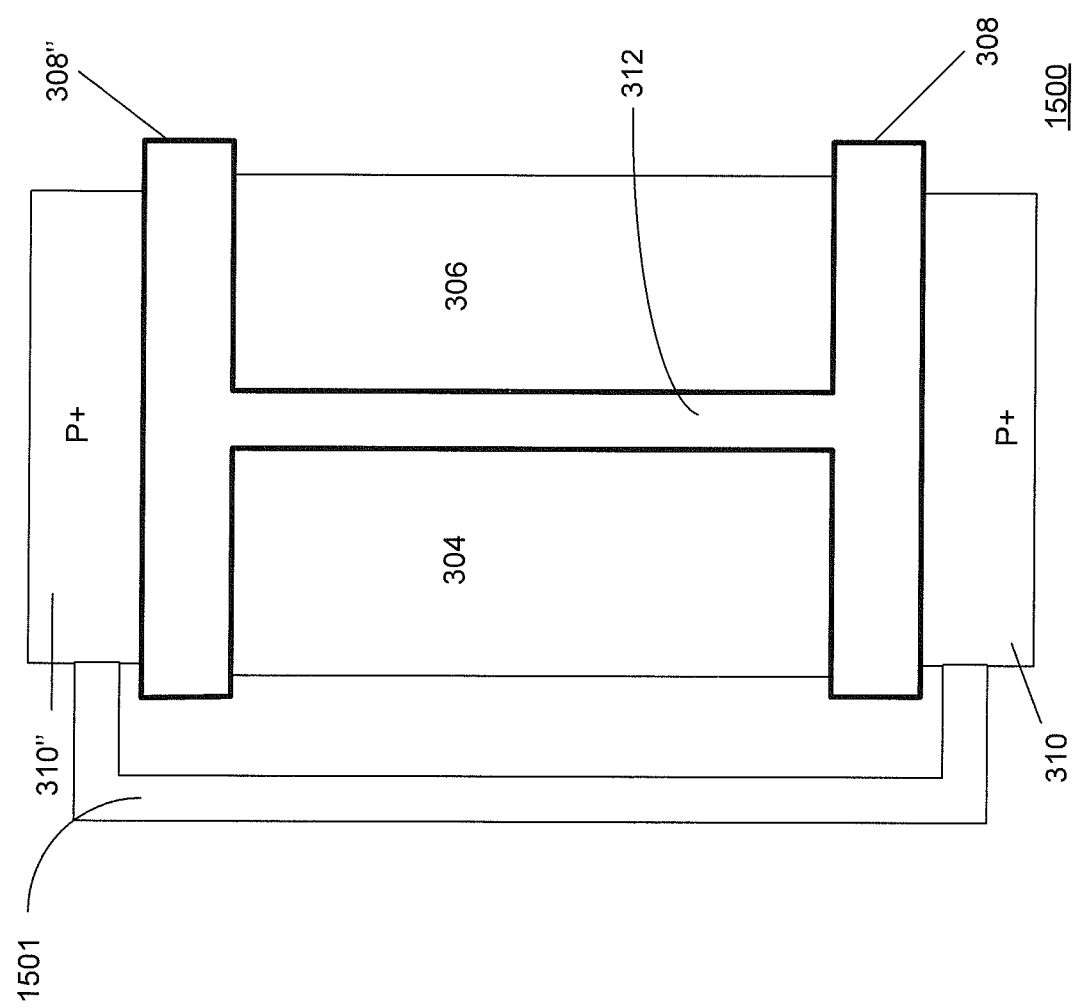
FIG. 15 shows an exemplary simplified layout of a dual body ACS ACC MOSFET with an AC short made in accordance with the present methods and apparatus.

The new H-gate type device is defined by an AC short between the dual-sided ACS regions at the bottom of the FET stack. Because each of the ACS regions on each side of the stack is independently radio-frequency coupled by parasitic capacitance to the gate polysilicon, second-order intermodulation distortion harmonics improve dramatically with symmetry. Because the body contacts on either side of the stack are shorted together, and thus jointly coupling to the gate polysilicon, there is a cancellation of voltage across $C_{BG}$. This cancellation of voltage sets the voltage across nonlinear capacitances to 0V, voiding the generation of nonlinearity altogether. FIG. 15 shows an exemplary simplified layout of a dual body ACS ACC MOSFET with an AC short.

FIG. 15 is similar to the structure of the MOSFET shown in FIG. 3K, except that FIG. 15 shows the addition of an AC short structure. FIG. 15K is a simplified top view schematic of an embodiment of an ACC SOI NMOSFET adapted to control accumulated charge and configured in an "H-gate" configuration. FIG. 3K shows the ACC NMOSFET 1500 without its gate contact 301, gate 302, and gate oxide being visible. With the exception of some structural differences described herein, the ACC NMOSFET 1500 is very similar in design and function to the ACC NMOSFETs described above with reference to FIGS. 3A-3D and 3J. As shown in FIG. 15, the ACC NMOSFET 1500 includes two ACSs, 308 and 308", disposed at opposite ends of the H-gate ACC NMOSFET 1500. P+ electrical contact regions 310 and 310" are formed to abut their respective ACSs, 308 and 308", and provide electrical contact thereto. In accordance with the disclosed method and apparatus, as described above, when the ACC NMOSFET 1500 is biased to operate in the accumulated charge regime, the accumulated charge present in the body 312 is removed or otherwise controlled via the two ACSs 308 and 308". FIG. 15 shows an AC short structure 1501 electrically connecting the two ACSs, 308 and 308", through their respective electrical contact regions 310 and 310". Essentially, the AC short structure 1501 shorts the two ACSs, 308 and 308", together. The AC short structure 1501 may be provided by a metal layer or a conductive semiconductor layer or other methods or techniques.

By evening parasitic capacitance on the source and drain sides of the device (due to symmetry), and connecting the symmetrical body contacts (with the H-gate AC short), 20 to 30 dB improvements in second and third order harmonics versus their worst-case spikes are observed. Also, the layout lowered harmonic body-to-gate potential difference sensitivity.

Figure 11A:
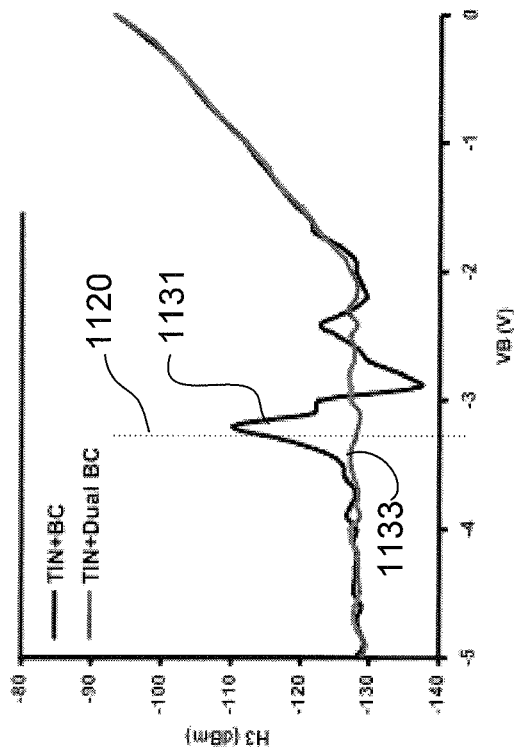
FIGS. 11A and 11B show respectively the second- and third-order harmonic responses of an AC shorted dual ACS ACC MOSFET and a single ACS ACC MOSFET versus body bias voltage without any engineering in the ACS implant of both devices.
Figure 11B:
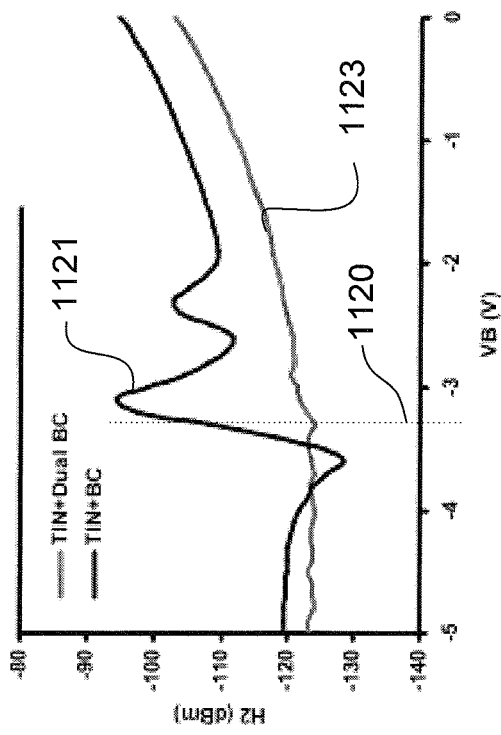

It is also noted that the AC short can be made by any of the interconnect methods, direct or inductive. An example of a direct connection is by use of a metal layer. An example of an inductive connection is use of P+ routing FIGS. 11A and 11B show respectively the second- and third-order harmonic responses of an AC shorted dual ACS ACC MOSFET and a single ACS ACC MOSFET versus body bias voltage without any engineering in the ACS implant of both devices. In FIG. 11A, curve 1121 represents the second-order harmonic response of a single ACS ACC MOSFET with a spike (i.e., a "harmonic wrinkle") around the operating voltage of the device (indicated by line 1120). On the other hand, Curve 1123 represents the harmonic response of an AC shorted dual ACS ACC MOSFET where the spike is almost completely removed. Similar trend can also be observed in terms of third-order harmonic response as shown in FIG. 11B. Together, FIGS. 11A and 11B demonstrate that, the AC shorted dual ACS ACC MOSFET provides an effective way to almost completely remove the harmonic spike (and the accumulation of degrading harmonics) observed in an ACC MOSFET with ACS other than shifting the position of the harmonic spike with the adjustment of the implant in the ACS region.

Figure 13:
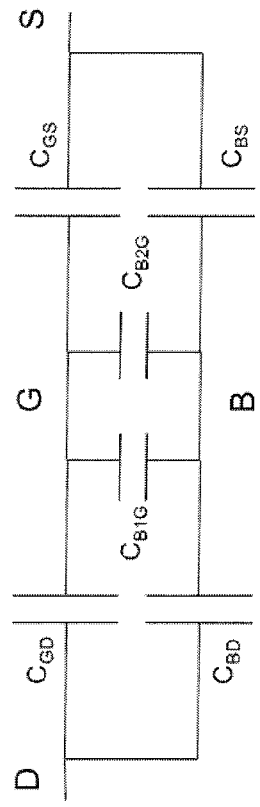
FIG. 13 shows a schematic of an exemplary H-gate dual body contact (ACS) FET device with the AC short shown at the bottom of the FET device.
Figure 12:
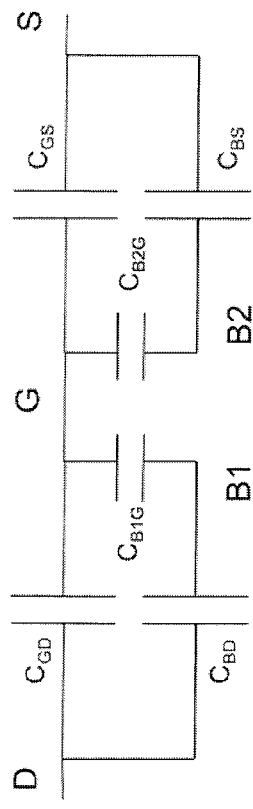
FIG. 12 shows a schematic of an exemplary H-gate dual body contact (ACS) FET device without an AC short present at the bottom of the FET device.

To illustrate the importance of the AC shorted configuration in a dual ACS ACC MOSFET, FIG. 12 shows a schematic of an exemplary H-gate dual body contact (ACS) FET device without an AC short present at the bottom of the FET device while FIG. 13 shows a schematic of an exemplary H-gate dual body contact (ACS) FET device with the AC short shown at the bottom of the FET device. As exemplified in FIG. 12, with dual ACS but without the AC short, better second-order harmonics is still expected due to symmetry of the switch operation compared to the configuration with single ACS. However, worse third-order harmonics are expected due to the finite voltage difference between the common gate and the individual ACS region which doubles the harmonics contribution compared to the configuration with single ACS if the capacitors between the gate and the ACS regions exhibit nonlinear responses.

With the AC short and balanced capacitances, the voltage difference between the body and the gate is forced to be zero due to the voltage balance. (That is, $C_{GD}=C_{GS}$ and $C_{BD}=C_{BS}$, causing $V_{BG}=0V$). If $V_{BG}=0$, then even if $C_{BG}$ is nonlinear, there is no voltage across the capacitor to generate C(V) nonlinearity.

Figures 14A, 14B:
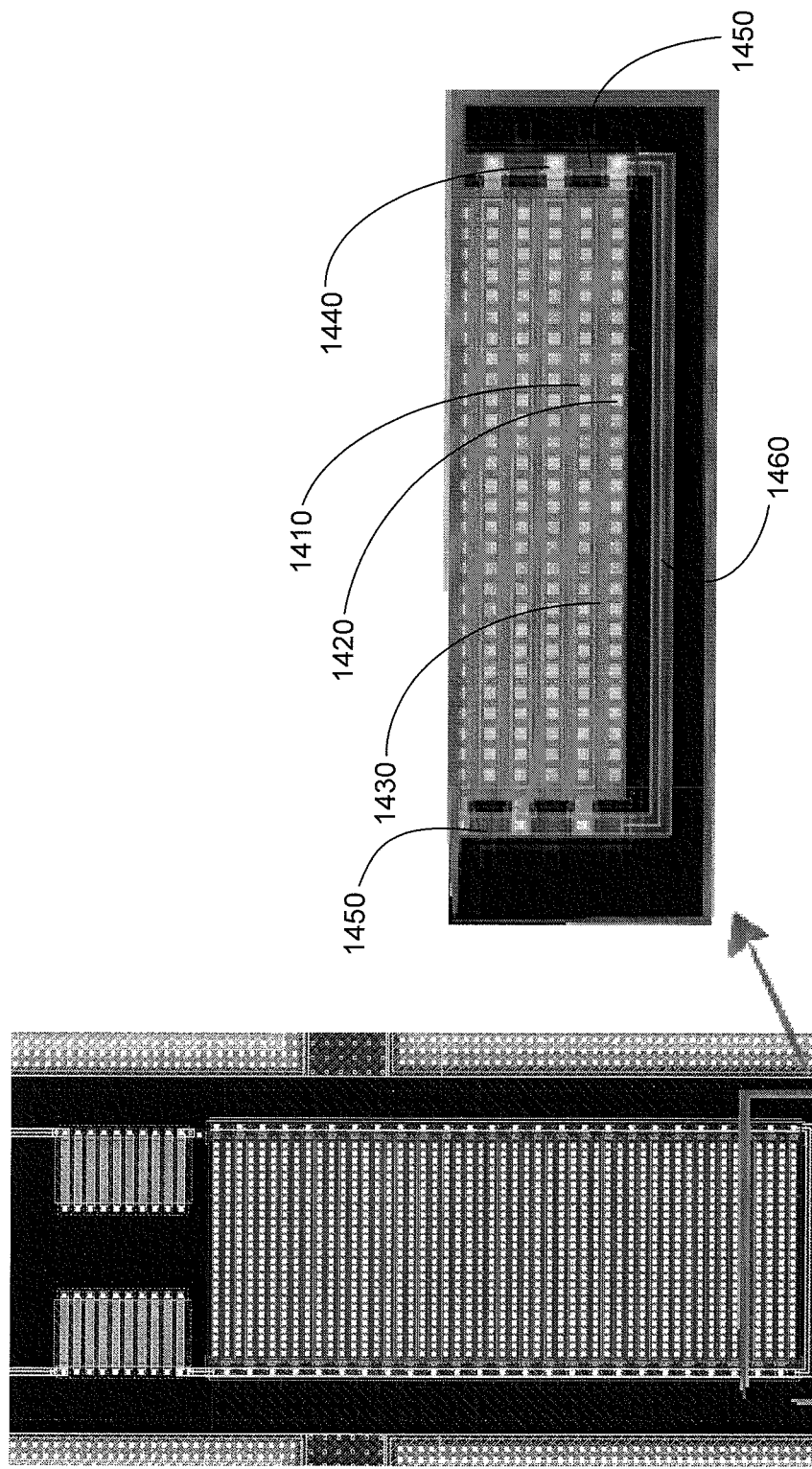
FIG. 14A shows an exemplary dual ACS contact test structure layout in accordance with the present methods and apparatus.
FIG. 14B shows a magnified version of the AC short shown at the bottom of the FET stack shown in FIG. 14A.

FIGS. 14A and 14B show exemplary dual ACS contact test structure layouts in accordance with the present methods and apparatus. FIG. 14B shows a magnified version of the AC short shown at the bottom of the FET stack shown in FIG. 14A. FIG. 14A shows an array of contact vias for source and drain regions where the MOSFET is structured as many small segments of source, drain, and gate regions to provide for desired performance. FIG. 14B shows a row of source region contact vias (shown as the row of small squares where one square is labeled as 1410) and a row of drain region contact vias (shown as the row of small squares where one square is labeled as 1420). The gray area in between the source region contact vias and the drain regions contact vias 1430 is the gate region. Electrical contact to the ACS regions (not shown in FIG. 14B) is provided by ACS electrical contacts 1440 at each end of the gate regions 1430. The ACS electrical contacts 1440 are connected together by body bus bars 1450. A shorting electrical connection to the ACS electrical contacts is provided by a metalized AC short 1460.

The effectiveness of the AC short in reducing the linearity sensitivity of the dual ACS contact MOSFET may be improved by controlling certain layout dependent characteristics. These layout dependent characteristics include controlling layout dependent critical capacitances. These critical capacitances include the following: (1) $C_{GS}$ should be the same as $C_{GD}$; and (2) $C_{BS}$ should be the same as $C_{BD}$; and (3) $C_{GG}$ and $C_{BB}$ should be negligible. Also, for FETs with many fingers, if symmetric, parasitics should be almost identical. Such capacitances may be achieved through a layout where the source and drain are symmetric with respect to a horizontal line passing through a center of the gate. Layout connections may also improve the effectiveness of the AC short. Preferably, contacts to the ACS regions on both sides of the MOSFET should be connected together through a low impedance path. In the layout shown in FIG. 14B, a second metal layer connects the body bus bars 1450 on either side of the structure.

2D and 3D Symmetric "N"-Body Contact Device Implementation with AC Short

The ideology behind a two-dimensionally symmetric dual ACS (body contact) FET device with an AC short can be extended to a triple-body contact device, quadruple contact device, and so on, up to an "N"-body contact device, as long as two dimensional symmetry is maintained. An N-body contact device may also be thought of as an annular device. Also, should devices be made in three dimensional layers, that is, a series of stacked, two dimensional devices, approximated as three dimensional vis-à-vis a summation technique, again, so long as symmetry is maintained, shorting the three dimensionally layered n-body contacts together will produce better second and third order harmonics.

As indicated above, embodiments according to the present invention are not limited to a single ACS region contacting the MOSFET body at one end of the body or dual ACS regions contacting the MOSFET body at both ends of the body. Alternative MOSFET architectures according to embodiments of the present invention may allow for multiple ACS regions to contact the MOSFET body in a variety of orientations. Preferably, the ACS regions are disposed in a symmetric manner so as to maximize the cancellation of voltage across $C_{BG}$ when shorting the ACS regions, which provides for reduction of the second order harmonic. The multiple ACS regions are also preferably disposed close to the Gate oxide, where the accumulated charges are located. As indicated above, MOSFET architectures may also comprise three dimensional structures. Again, embodiments of the present invention having three dimensional structures may have multiple ACS regions contacting the MOSFET body. ACS regions in such a three dimensional structure are preferably disposed in a symmetric manner.

Still other embodiments of the present invention may use both the method described above of controlling the doping type and doping level of the ACS region and the method described above of shorting the ACS regions to achieve a linearity improvement in a MOSFET. Note also that an electrical contact region or regions to the ACS region may comprise the same material as the ACS region, that is, the two regions may be coextensive. In other embodiments, the two regions may be different materials, such as shown in FIG. 14B, where electrical contacts to the ACS regions are made via a metal layer. In still other embodiments, electrical contact regions and ACS regions may comprise regions doped at different levels and/or doped with different materials.

Electrical connections to MOSFETs incorporating either or both of the described method of controlling the ACS region implant and the AC short may be made in the manner described above in regard to FIGS. 4A through 4G and FIGS. 5A through 5D. For example, an electrical connection may be made from each ACS region to the MOSFET gate, such as shown in FIG. 4B and described above. Embodiments of MOSFETs incorporating the described methods may also be utilized in electrical circuits as described above in regard to FIGS. 6, 8 and 9 and other circuits where such MOSFETS provide desired performance.

The foregoing Detailed Description of exemplary and preferred embodiments is presented for purposes of illustration and disclosure in accordance with the requirements of the law. It is not intended to be exhaustive nor to limit the invention to the precise form or forms described, but only to enable others skilled in the art to understand how the invention may be suited for a particular use or implementation. The possibility of modifications and variations will be apparent to practitioners skilled in the art.

No limitation is intended by the description of exemplary embodiments which may have included tolerances, feature dimensions, specific operating conditions, engineering specifications, or the like, and which may vary between implementations or with changes to the state of the art, and no limitation should be implied therefrom. In particular it is to be understood that the disclosures are not limited to particular compositions or biological systems, which can, of course, vary. This disclosure has been made with respect to the current state of the art, but also contemplates advancements and that adaptations in the future may take into consideration of those advancements, namely in accordance with the then current state of the art. It is intended that the scope of the invention be defined by the Claims as written and equivalents as applicable. It is also to be understood that the terminology used herein is for the purpose of describing particular embodiments only, and is not intended to be limiting. Reference to a claim element in the singular is not intended to mean "one and only one" unless explicitly so stated. As used in this specification and the appended claims, the singular forms "a," "an," and "the" include plural referents unless the content clearly dictates otherwise. The term "several" includes two or more referents unless the content clearly dictates otherwise. Unless defined otherwise, all technical and scientific terms used herein have the same meaning as commonly understood by one of ordinary skill in the art to which the disclosure pertains.

Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising step(s) for . . . "

A number of embodiments of the disclosure have been described. Nevertheless, it will be understood that various modifications may be made without departing from the spirit and scope of the present disclosure. Accordingly, other embodiments are within the scope of the following claims.

What is claimed is:

1. A method of operating a module, the module including at least one integrated circuit chip comprising a plurality of series N-type metal oxide semiconductor (NMOS) field effect transistors configured in a series connected stack configuration that comprises at least one series NMOS field effect transistor including a body, wherein the body of the at least one field effect transistor is electrically coupled to at least two accumulated charge sinks and wherein the at least two accumulated charge sinks are coupled through a path having low impedance, the at least one series NMOS field effect transistor either to pass an RF signal in a series enable state or to not pass the RF signal in a series disable state, the method further comprising:

electrically biasing the body of the at least one series NMOS field effect transistor of the module in the series disable state to have a voltage level substantially more negative than the lowest voltage level of the following: ground, a DC voltage level of a source of the at least one series NMOS field effect transistor of the module, and a DC voltage level of a drain of the at least one series NMOS field effect transistor of the module.

2. The method of claim 1, wherein the electrically biasing the body of the at least one series NMOS field effect transistor in the series disable state comprises respectively electrically biasing a plurality of bodies of the plurality of series NMOS field effect transistors in the series disable state, wherein the bodies of the plurality of series NMOS field effect transistors are respectively electrically coupled to at least two accumulated charge sinks and wherein the at least two accumulated charge sinks are respectively coupled through a path having low impedance.

3. The method of claim 2, wherein the respectively electrically biasing the plurality of bodies of the plurality of series NMOS field effect transistors comprises respectively electrically biasing the plurality of bodies of the plurality of series NMOS field effect transistors for a circuit operable in an RF switch on the at least one integrated circuit chip, which is implemented in silicon on insulator (SOI) technology.

4. The method of claim 3, wherein the respectively electrically biasing the plurality of bodies of the plurality of series NMOS field effect transistors on the at least one integrated circuit chip, which is implemented in the SOI technology, comprises respectively electrically biasing the plurality of bodies of the plurality of series NMOS field effect transistors on the at least one integrated circuit chip, which is implemented in the SOI technology, comprising a substrate including a thin film silicon layer with a thickness less than 150 nm.

5. The method of claim 3, wherein the respectively electrically biasing the plurality of bodies of the plurality of series NMOS field effect transistors on the at least one integrated circuit chip, which is implemented in the SOI technology, comprises respectively electrically biasing the plurality of bodies of the plurality of series NMOS field effect transistors on the at least one integrated circuit chip, which is implemented in the SOI technology, comprising a thin film silicon layer on an insulating layer with sources and drains of respective NMOS field effect transistors of the plurality extending through the entire thickness of the thin film silicon layer to the insulating layer.

6. The method of claim 3, wherein the electrically biasing the plurality of bodies of the plurality of series NMOS field effect transistor in the series disable state comprises respectively electrically biasing the plurality of bodies of the plurality of series NMOS field effect transistors in the series disable state to have a voltage level substantially more negative than the lowest voltage level of the following: ground, the DC voltage level of the sources of the plurality of series NMOS field effect transistors of the module, and the DC voltage level of the drains of the plurality of series NMOS field effect transistors of the module, comprises at least improving the linearity of the plurality of series NMOS field effect transistors.

7. The method of claim 2, wherein the at least one integrated circuit chip comprises one or more additional pluralities of series N-type metal oxide semiconductor (NMOS) field effect transistors respectively in one or more additional series connected stack configurations;
and further comprising: respectively electrically biasing one or more additional pluralities of bodies of the one or more additional pluralities of series NMOS field effect transistors in the series disable state, wherein the bodies of the one or more additional pluralities of series NMOS field effect transistors are respectively electrically coupled to at least two accumulated charge sinks and wherein the at least two accumulated charge sinks are respectively coupled through a path having low impedance, wherein the bodies of the one or more additional pluralities of series NMOS field effect transistors are respectively electrically biased to have a voltage level substantially more negative than the lowest voltage level of the following: ground, the DC voltage level of the sources of the one or more additional pluralities of series NMOS field effect transistors of the module, and the DC voltage level of the drains of the one or more additional pluralities of series NMOS field effect transistors of the module.

8. The method of claim 7, wherein the respectively electrically biasing the one or more additional pluralities of bodies of the one or more additional pluralities of series NMOS field effect transistors comprises respectively electrically biasing the one or more additional pluralities of bodies of the one or more additional pluralities of series NMOS field effect transistors for a circuit operable in an RF switch on the at least one integrated circuit chip, which is implemented in silicon on insulator (SOI) technology.

9. The method of claim 7, wherein the respectively electrically biasing the one or more additional pluralities of bodies of the one or more additional pluralities of series NMOS field effect transistors comprises at least improving the linearity of the one or more additional pluralities of series NMOS field effect transistors.

10. A method of operating a communication device, the communication device including at least one integrated circuit chip comprising a plurality of series N-type metal oxide semiconductor (NMOS) field effect transistors configured in a series connected stack configuration that comprises at least one series NMOS field effect transistor including a body, wherein the body of the at least one field effect transistor is electrically coupled to at least two accumulated charge sinks and wherein the at least two accumulated charge sinks are coupled through a path having low impedance, the at least one series NMOS field effect transistor either to pass an RF signal in a series enable state or to not pass the RF signal in a series disable state, the method further comprising:
electrically biasing the body of the at least one series NMOS field effect transistor of the communication device in the series disable state to have a voltage level substantially more negative than the lowest voltage level of the following: ground, the DC voltage level of the source of the at least one series NMOS field effect transistor of the communication device, and the DC voltage level of the drain of the at least one series NMOS field effect transistor of the communication device.

11. The method of claim 10, wherein the electrically biasing the body of the at least one series NMOS field effect transistor in the disable state comprises respectively electrically biasing a plurality of bodies of the plurality of series NMOS field effect transistors in the series disable state, wherein the bodies of the plurality of series NMOS field effect transistors are respectively electrically coupled to at least two accumulated charge sinks and wherein the at least two accumulated charge sinks are respectively coupled through a path having low impedance.

12. The method of claim 11, wherein the respectively electrically biasing the plurality of bodies of the plurality of series NMOS field effect transistors comprises respectively electrically biasing the plurality of bodies of the plurality of series NMOS field effect transistors for a circuit operable in an RF switch on the at least one integrated circuit chip, which is implemented in silicon insulator (SOI) technology.

13. The method of claim 12, wherein the respectively electrically biasing the plurality of bodies of the plurality of series NMOS field effect transistors on the at least one integrated circuit chip, which is implemented in SOI technology, comprises respectively electrically biasing the plurality of bodies of the plurality of series NMOS field effect transistors on the at least one integrated circuit chip, which is implemented in the SOI technology, comprising a substrate including a thin film silicon layer with a thickness less than 150 nm.

14. The method of claim 12, wherein the respectively electrically biasing the plurality of bodies of the plurality of series NMOS field effect transistors on the at least one integrated circuit chip, which is implemented in the SOI technology, comprises respectively electrically biasing the plurality of bodies of the plurality of series NMOS field effect transistors on the at least one integrated circuit chip, which is implemented in the SOI technology, comprising a thin film silicon layer on an insulating layer with sources and drains of respective NMOS field effect transistors of the plurality extending through the entire thickness of the thin film silicon layer to the insulating layer.

15. The method of claim 12, wherein the electrically biasing the bodies of the plurality of series NMOS field effect transistor in the series disable state comprises respectively electrically biasing the plurality of bodies of the plurality of series NMOS field effect transistors in the series disable state to have a voltage level substantially more negative than the lowest voltage level of the following: ground, the DC voltage level of the sources of the plurality of series NMOS field effect transistors of the communication device, and the DC voltage level of the drains of the plurality of series NMOS field effect transistors of the communication device, comprises at least improving the linearity of the plurality of series NMOS field effect transistors.

16. The method of claim 11, wherein the at least one integrated circuit chip comprises one or more additional pluralities of series N-type metal oxide semiconductor (NMOS) field effect transistors respectively in one or more additional series connected stack configurations;
and further comprising: respectively electrically biasing one or more additional pluralities of bodies of the one or more additional pluralities of series NMOS field effect transistors in the series disable state, wherein the bodies of the one or more additional pluralities of series NMOS field effect transistors are respectively electrically coupled to at least two accumulated charge sinks and wherein the at least two accumulated charge sinks are respectively coupled through a path having low impedance, wherein the bodies of the one or more additional pluralities of series NMOS field effect transistors are respectively electrically biased to have a voltage level substantially more negative than the lowest voltage level of the following: ground, the DC voltage level of the sources of the one or more additional pluralities of series NMOS field effect transistors of the communication device, and the DC voltage level of the drains of the one or more additional pluralities of series NMOS field effect transistors of the communication device, comprises at least improving the linearity of the one or more additional pluralities of series NMOS field effect transistors.

17. The method of claim 16, wherein the respectively electrically biasing the one or more additional pluralities of bodies of the one or more additional pluralities of series NMOS field effect transistors comprises respectively electrically biasing the one or more additional pluralities of bodies of the one or more additional pluralities of series NMOS field effect transistors for a circuit operable in an RF switch on the at least one integrated circuit chip, which is implemented in silicon on insulator (SOI) technology.

18. The method of claim 17, wherein the respectively electrically biasing the one or more additional pluralities of bodies of the one or more additional pluralities of series NMOS field effect transistors comprises at least improving the linearity of the one or more other pluralities of series NMOS field effect transistors.

19. A method of operating a module, the module including at least one integrated circuit chip comprising a plurality of shunt N-type metal oxide semiconductor (NMOS) field effect transistors configured in a series connected stack configuration that comprises at least one shunt NMOS field effect transistor including a body, wherein the body of the at least one field effect transistor is electrically coupled to at least two accumulated charge sinks and wherein the at least two accumulated charge sinks are coupled through a path having low impedance, the at least one shunt NMOS field effect transistor either to shunt an RF port to ground in a shunt enable state or to not shunt the RF port to ground in a shunt disable state, the method further comprising:
electrically biasing the body of the at least one shunt NMOS field effect transistor of the module in the shunt disable state to have a voltage level substantially more negative than the lowest voltage level of the following: ground, a DC voltage level of a source of the at least one shunt NMOS field effect transistor of the module, and a DC voltage level of a drain of the at least one shunt NMOS field effect transistor of the module.

20. The method of claim 19, wherein the electrically biasing the body of the at least one shunt NMOS field effect transistor in the shunt disable state comprises respectively electrically biasing a plurality of bodies of the plurality of shunt NMOS field effect transistors in the shunt disable state; wherein the bodies of the plurality of shunt NMOS field effect transistors are respectively electrically coupled to at least two accumulated charge sinks and wherein the at least two accumulated charge sinks are respectively coupled through a path having low impedance.

21. The method of claim 20, wherein the respectively electrically biasing the plurality of bodies of the plurality of shunt NMOS field effect transistors comprises respectively electrically biasing the plurality of bodies of the plurality of shunt NMOS field effect transistors for a circuit operable in an RF switch on the at least one integrated circuit chip, which is implemented in silicon on insulator (SOI) technology.

22. The method of claim 21, wherein the respectively electrically biasing the plurality of bodies of the plurality of shunt NMOS field effect transistors on the at least one integrated circuit chip, which is implemented in the SOI technology, comprises respectively electrically biasing the plurality of bodies of the plurality of shunt NMOS field effect transistors on the at least one integrated circuit chip, which is implemented in the SOI technology, comprising a substrate including a thin film silicon layer with a thickness less than 150 nm.

23. The method of claim 21, wherein the respectively electrically biasing the plurality of bodies of the plurality of shunt NMOS field effect transistors on the at least one integrated circuit chip, which is implemented in the SOI technology, comprises respectively electrically biasing the plurality of bodies of the plurality of shunt NMOS field effect transistors on the at least one integrated circuit chip, which is implemented in the SOI technology, comprising a thin film silicon layer on an insulating layer with sources and drains of respective NMOS field effect transistors of the plurality extending through the entire thickness of the thin film silicon layer to the insulating layer.

24. The method of claim 21, wherein the electrically biasing the body of the at last one shunt NMOS field effect transistor in the shunt disable state comprises respectively electrically biasing a plurality of bodies of the plurality of shunt NMOS field effect transistors in the shunt disable state to have a voltage level substantially more negative than the lowest voltage level of the following: ground, the DC voltage level of the sources of the plurality of shunt NMOS field effect transistors of the module, and the DC voltage level of the drains of the plurality of shunt NMOS field effect transistors of the module, comprises at least improving the linearity of the plurality of shunt NMOS field effect transistors.

25. A method of operating a communication device, the communication device including at least one integrated circuit chip that comprises a plurality of shunt N-type metal oxide semiconductor (NMOS) field effect transistors configured in a series connected stack configuration comprising at least one shunt NMOS field effect transistor including a body, wherein the body of the at least one field effect transistor is electrically coupled to at least two accumulated charge sinks and wherein the at least two accumulated charge sinks are coupled through a path having low impedance, the at least one shunt NMOS field effect transistor either to shunt an RF port to ground in a shunt enable state or to not shunt the RF port to ground in a shunt disable state, the method further comprising:

electrically biasing the body of the at least one shunt NMOS field effect transistor of the communication device in the shunt disable state to have a voltage level substantially more negative than the lowest voltage level of the following: ground, a DC voltage level of a source of the at least one shunt NMOS field effect transistor of the communication device, and a DC voltage level of a drain of the at least one shunt NMOS field effect transistor of the communication device.

26. The method of claim 25, wherein the electrically biasing the body of the at least one shunt NMOS field effect transistor in the shunt disable state comprises respectively electrically biasing a plurality of bodies of the plurality of shunt NMOS field effect transistors in the shunt disable state; wherein the bodies of the plurality of shunt NMOS field effect transistors are respectively electrically coupled to at least two accumulated charge sinks and wherein the at least two accumulated charge sinks are respectively coupled through a path having low impedance.

27. The method of claim 26, wherein the respectively electrically biasing the plurality of bodies of the plurality of shunt NMOS field effect transistors comprises respectively electrically biasing the plurality of bodies of the plurality of shunt NMOS field effect transistors of a circuit operable in an RF switch on the at least one integrated circuit chip, which is implemented in silicon on insulator (SOI) technology.

28. The method of claim 27, wherein the respectively electrically biasing the plurality of bodies of the plurality of shunt NMOS field effect transistors on the at least one integrated circuit chip, which is implemented in SOI technology, comprises respectively electrically biasing the plurality of bodies of the plurality of shunt NMOS field effect transistors on the at least one integrated circuit chip, which is implemented in the SOI technology, comprising a substrate including a thin film silicon layer with a thickness less than 150 nm.

29. The method of claim 27, wherein the respectively electrically biasing the plurality of bodies of the plurality of shunt NMOS field effect transistors on the at least one integrated circuit chip, which is implemented in the SOI technology, comprises respectively electrically biasing the plurality of bodies of the plurality of shunt NMOS field effect transistors on the at least one integrated circuit chip, which is implemented in the SOI technology, comprising a thin film silicon layer on an insulating layer with sources and drains of respective NMOS field effect transistors of the plurality extending through the entire thickness of the thin film silicon layer to the insulating layer.

30. The method of claim 27, wherein the electrically biasing the body of the at least one shunt NMOS field effect transistor in the shunt disable state comprises respectively electrically biasing a plurality of bodies of the plurality of shunt NMOS field effect transistors in the shunt disable state to have a voltage level substantially more negative than the lowest voltage level of the following: ground, the DC voltage level of the sources of the plurality of shunt NMOS field effect transistors of the communication device, and the DC voltage level of the drains of the plurality of shunt NMOS field effect transistors of the communication device, comprises at least improving the linearity of the plurality of shunt NMOS field effect transistors.

* * * * *